US009613713B2

(12) United States Patent
Shirakawa et al.

(10) Patent No.: US 9,613,713 B2
(45) Date of Patent: *Apr. 4, 2017

(54) SEMICONDUCTOR MEMORY DEVICE

(71) Applicant: KABUSHIKI KAISHA TOSHIBA, Tokyo (JP)

(72) Inventors: Masanobu Shirakawa, Chigasaki (JP); Takuya Futatsuyama, Yokohama (JP); Koji Hosono, Fujisawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,560

(22) Filed: Jun. 28, 2016

(65) Prior Publication Data

US 2016/0307638 A1 Oct. 20, 2016

Related U.S. Application Data

(63) Continuation-in-part of application No. 14/645,740, filed on Mar. 12, 2015.

(30) Foreign Application Priority Data

Sep. 16, 2014 (JP) .................................. 2014-188192

(51) Int. Cl.
*G11C 16/34* (2006.01)
*G11C 16/26* (2006.01)
(Continued)

(52) U.S. Cl.
CPC ...... *G11C 16/3459* (2013.01); *G11C 11/5628* (2013.01); *G11C 11/5642* (2013.01); *G11C 16/0483* (2013.01); *G11C 16/26* (2013.01)

(58) Field of Classification Search
CPC ............................ G11C 16/3459; G11C 16/26
(Continued)

(56) References Cited

U.S. PATENT DOCUMENTS 7,852,675 B2 12/2010 Maejima
8,233,323 B2 7/2012 Hishida et al.
(Continued)

FOREIGN PATENT DOCUMENTS

JP 2010-40109 2/2010
JP 2011-258289 12/2011
(Continued)

OTHER PUBLICATIONS

Office Action issued Aug. 29, 2016 in Taiwanese Patent Application No. 104106916 (with English translation).

*Primary Examiner* — Hoai V Ho
*Assistant Examiner* — Muna A Techane
(74) *Attorney, Agent, or Firm* — Oblon, McClelland, Maier & Neustadt, L.L.P.

(57) ABSTRACT

According to one embodiment, a semiconductor memory device includes: first and second memory cells; first and second word lines coupled to the first and second memory cells, respectively. When data is read from the first memory cell, first and second voltages are applied to the first word line. A voltage of the second word line varies continuously by a first potential difference with time while the first voltage is applied to the first word line, and the voltage of the first word line varies continuously by a second potential difference with time while the second voltage is applied to the first word line.

16 Claims, 104 Drawing Sheets

(51) Int. Cl.
*G11C 16/04* (2006.01)
*G11C 11/56* (2006.01)

(58) Field of Classification Search
USPC .............................................. 365/185.11, 72
See application file for complete search history.

(56) References Cited

U.S. PATENT DOCUMENTS

| | | | |
|---|---|---|---|
| 8,372,720 B2 | 2/2013 | Fukuzumi et al. | |
| 8,514,627 B2 | 8/2013 | Itagaki et al. | |
| 8,952,426 B2 | 2/2015 | Maejima | |
| 2011/0007572 A1* | 1/2011 | Ueno | G11C 11/5628 |
| | | | 365/185.22 |
| 2011/0284946 A1 | 11/2011 | Kiyotoshi | |
| 2011/0305089 A1 | 12/2011 | Abe et al. | |
| 2012/0069667 A1* | 3/2012 | Shirakawa | G11C 11/5628 |
| | | | 365/185.17 |
| 2012/0069678 A1 | 3/2012 | Arai et al. | |
| 2012/0307557 A1 | 12/2012 | Itagaki | |
| 2013/0003454 A1 | 1/2013 | Edahiro et al. | |
| 2013/0329495 A1* | 12/2013 | Shiino | G11C 16/0483 |
| | | | 365/185.09 |

FOREIGN PATENT DOCUMENTS

| | | |
|---|---|---|
| JP | 2012-69203 | 4/2012 |
| JP | 2013-12267 | 1/2013 |
| JP | 2013-254542 | 12/2013 |

* cited by examiner

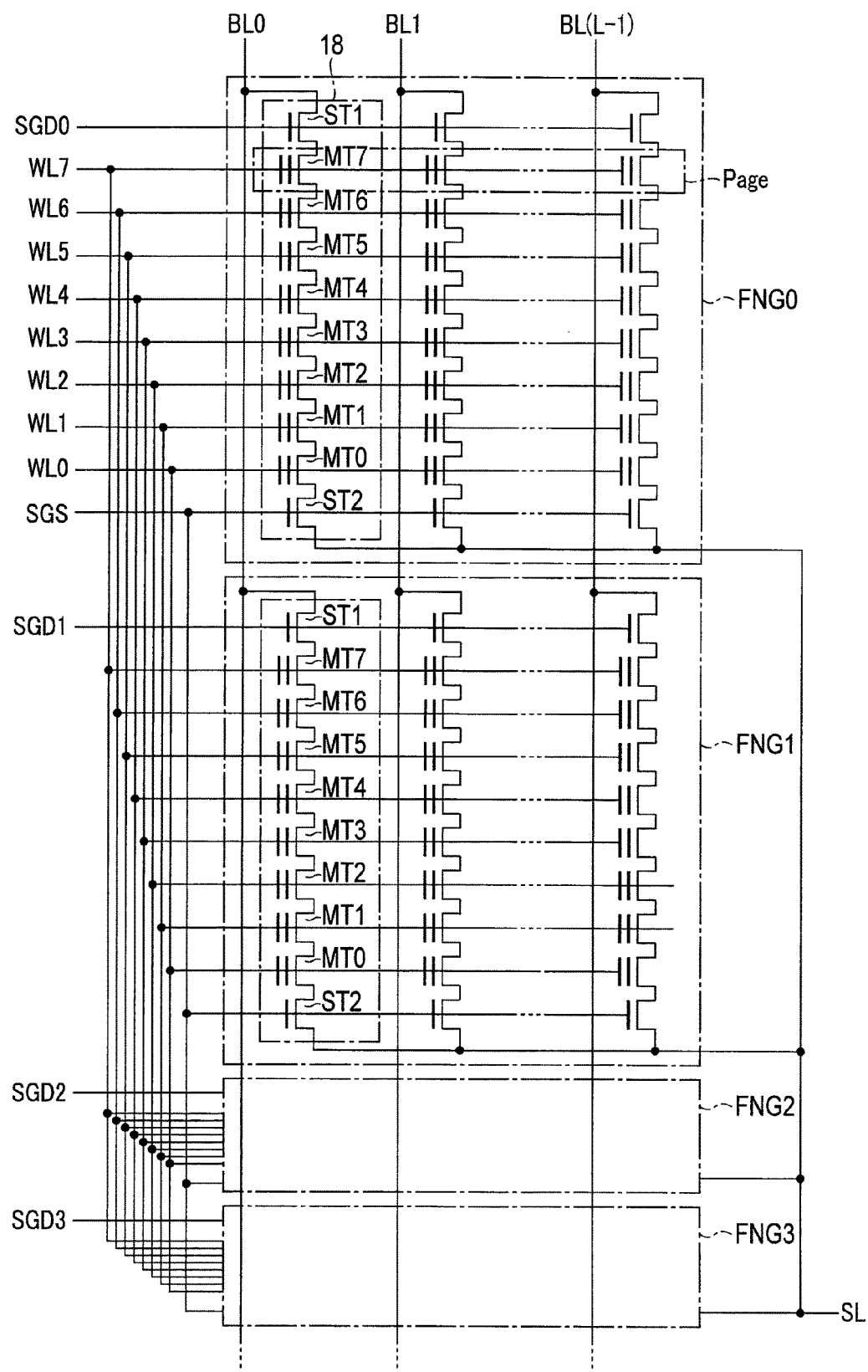
F I G. 2

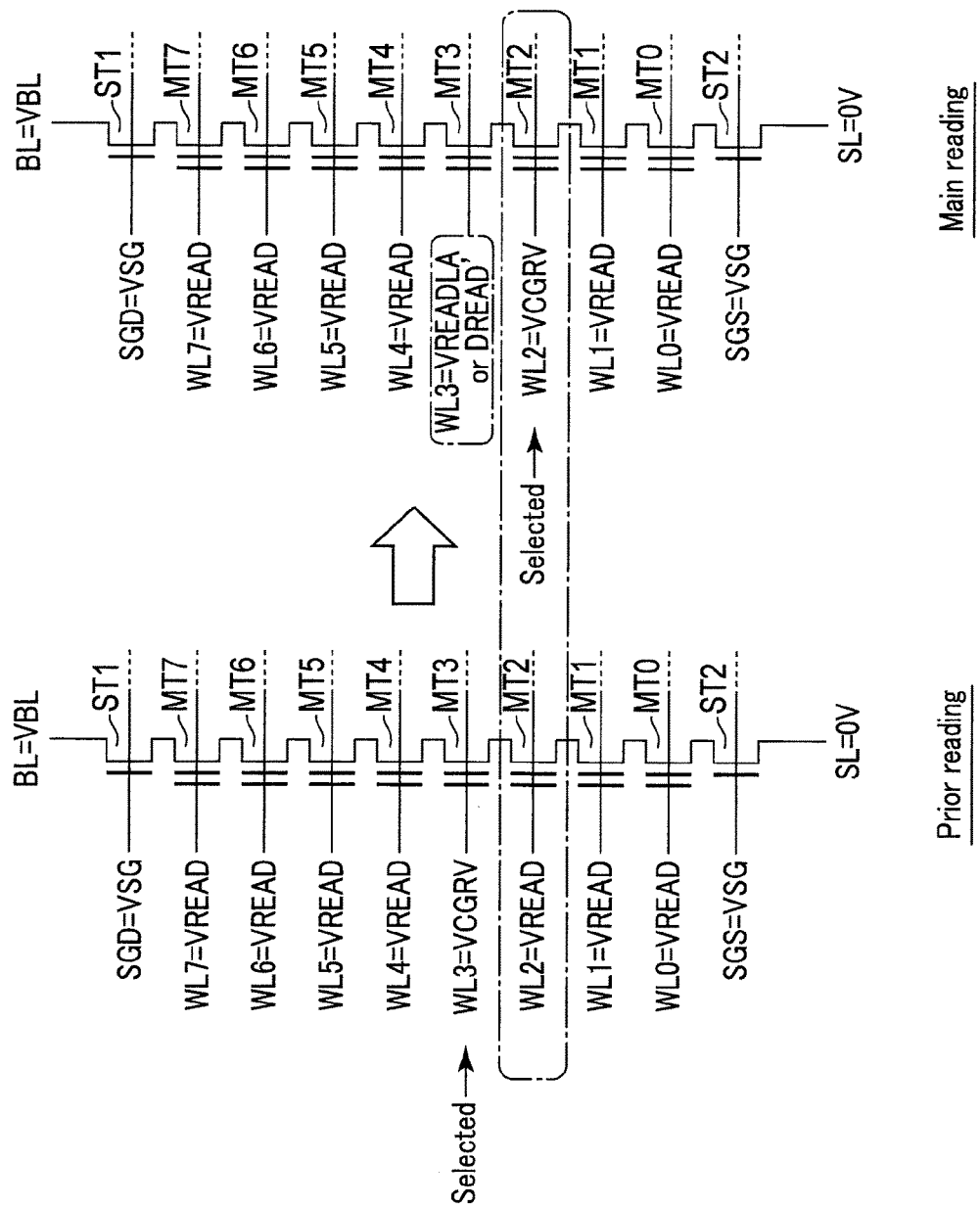
F I G. 7

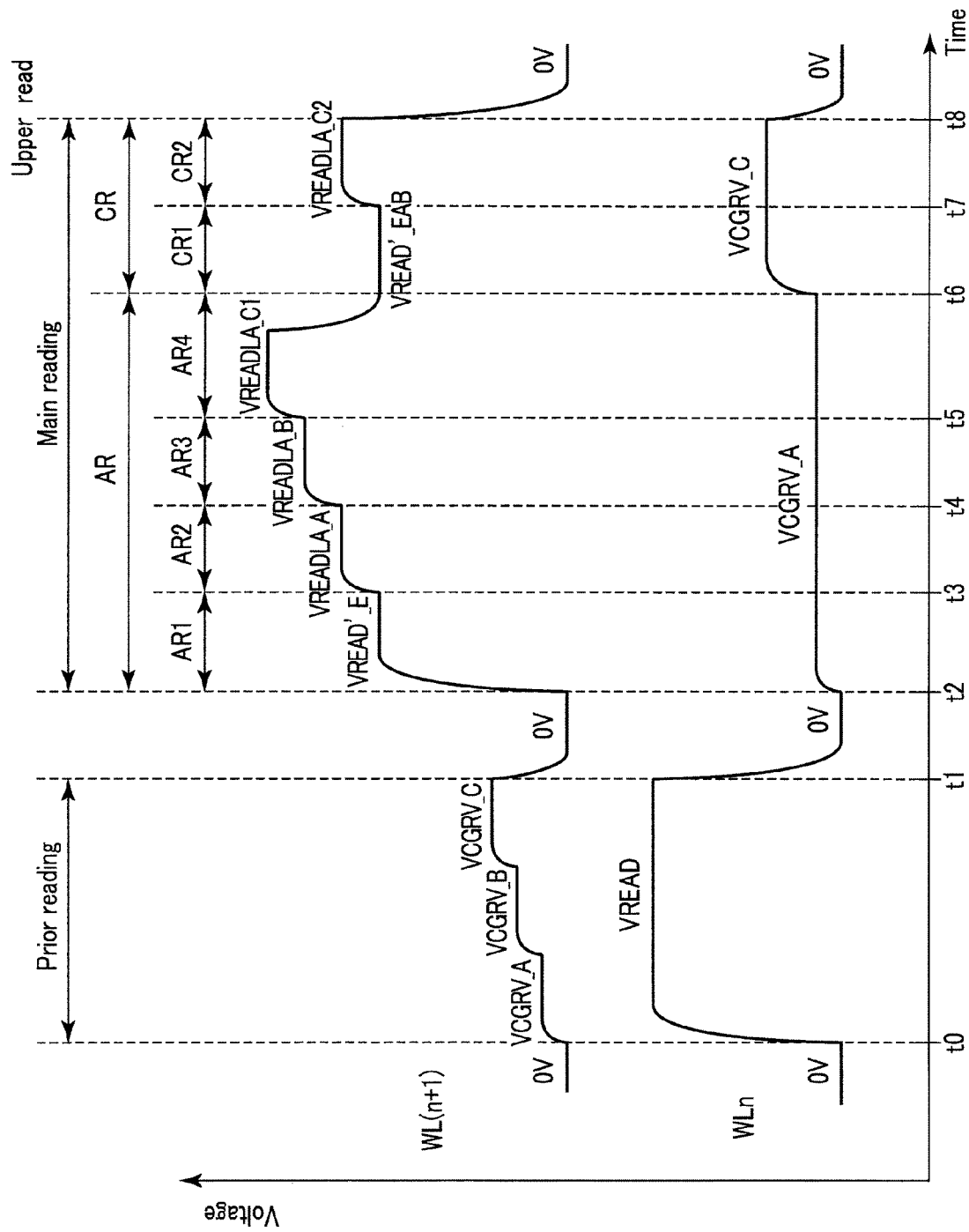
F I G. 8

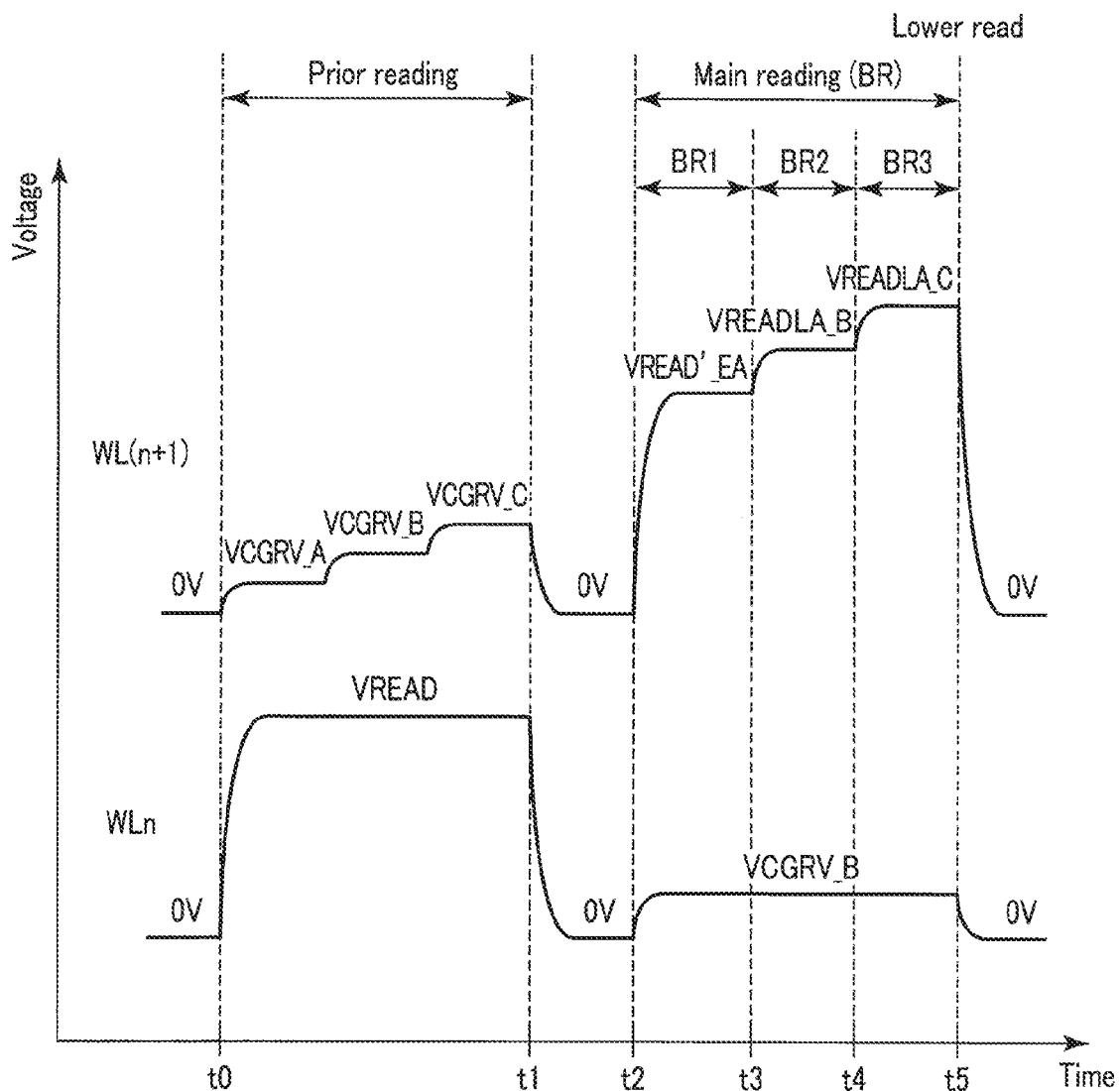
F I G. 10

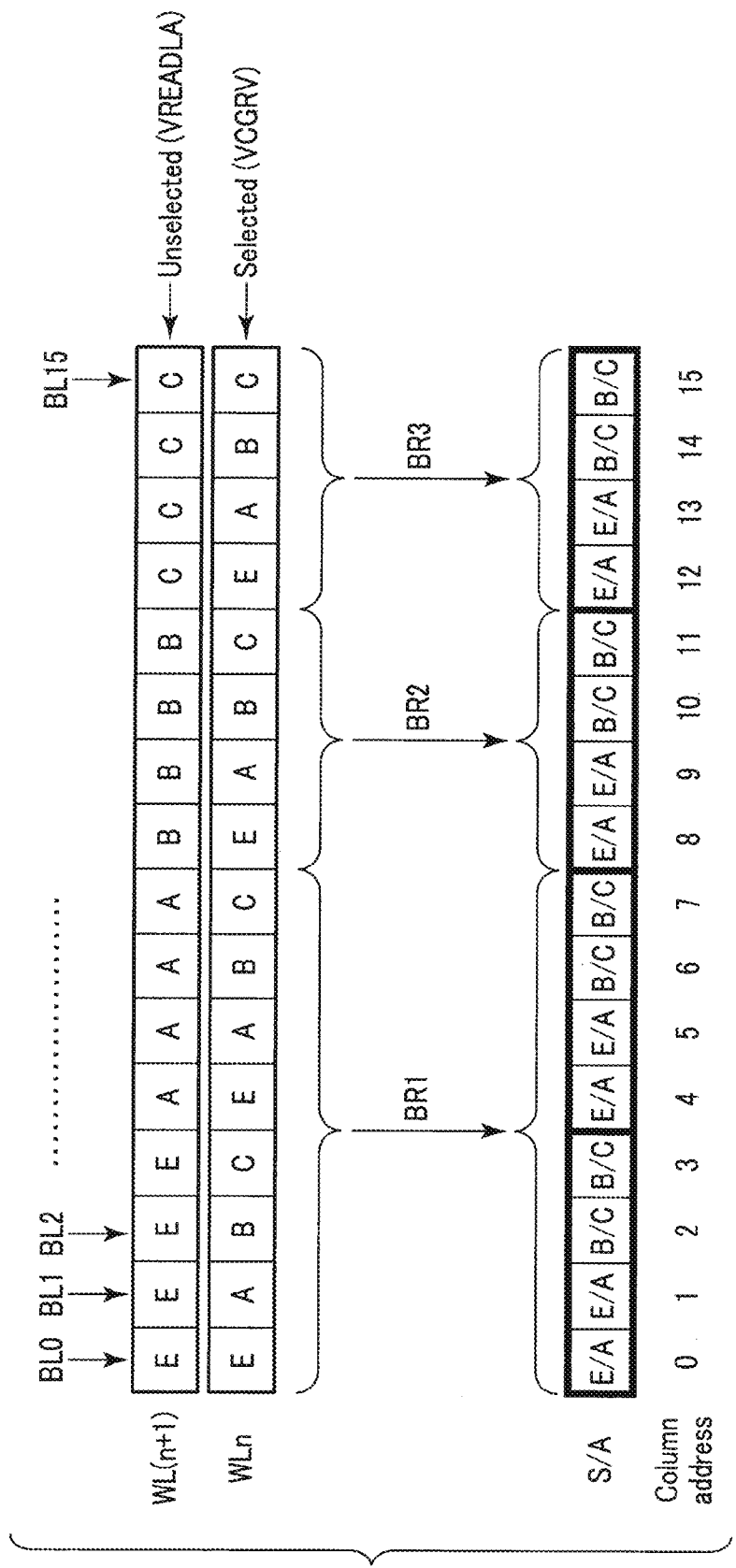
F I G. 11

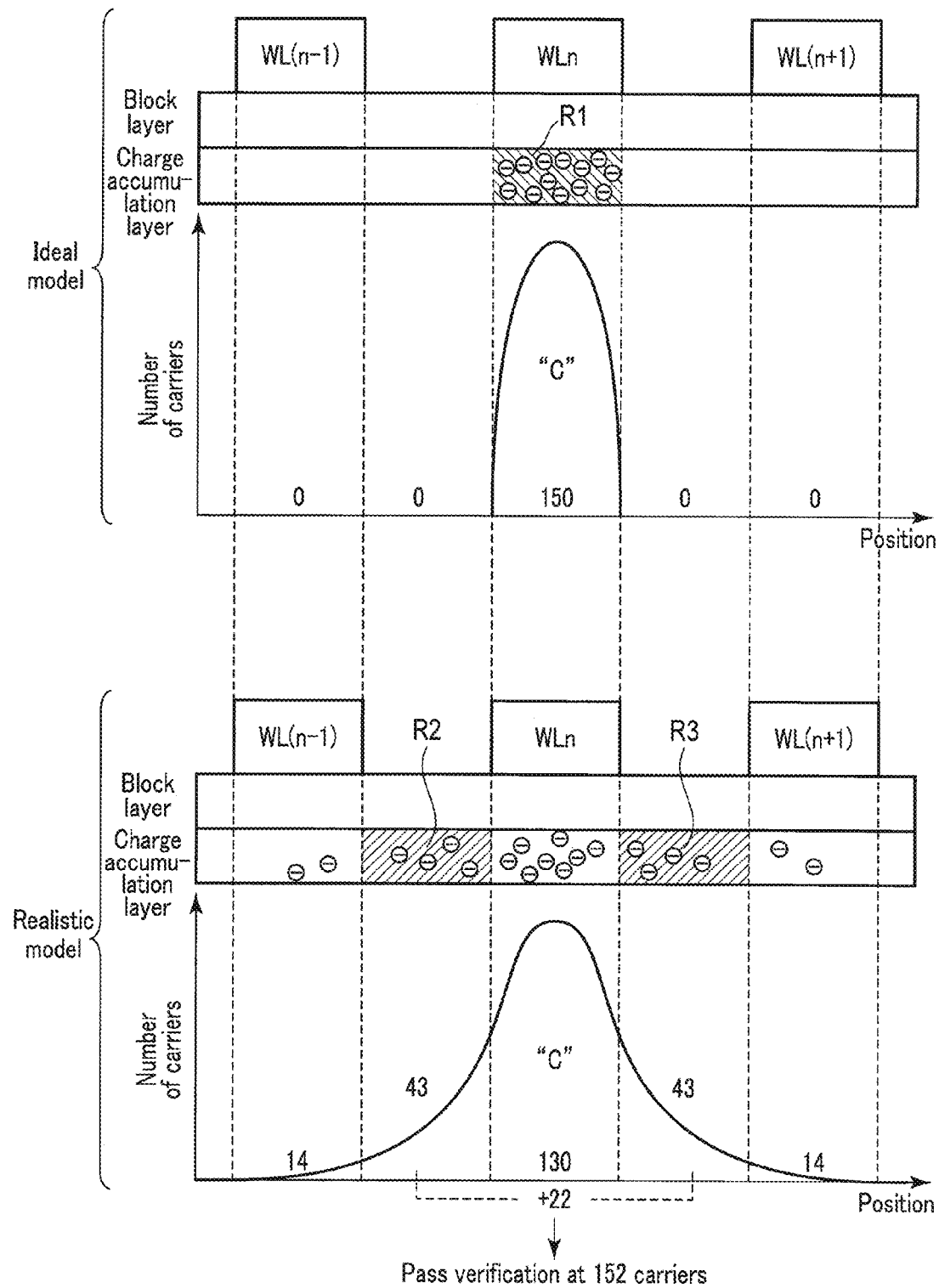
F I G. 14

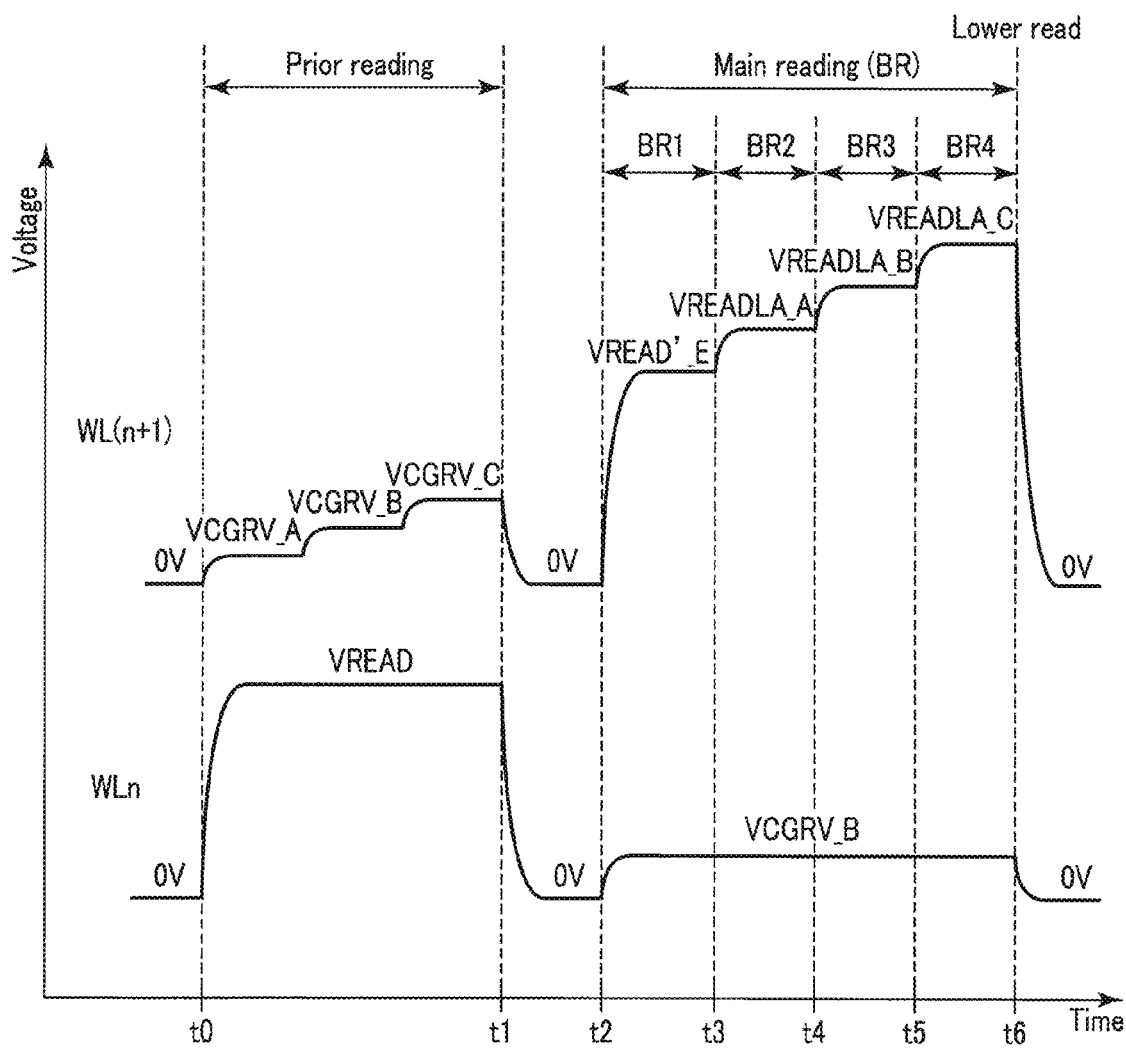
F I G. 20

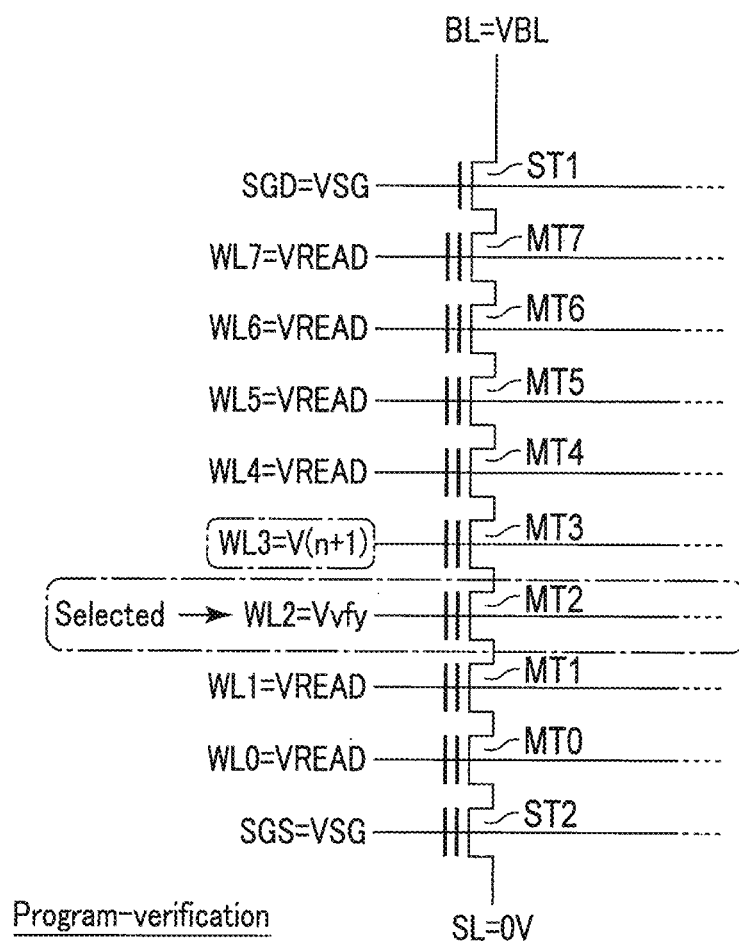
F I G. 24

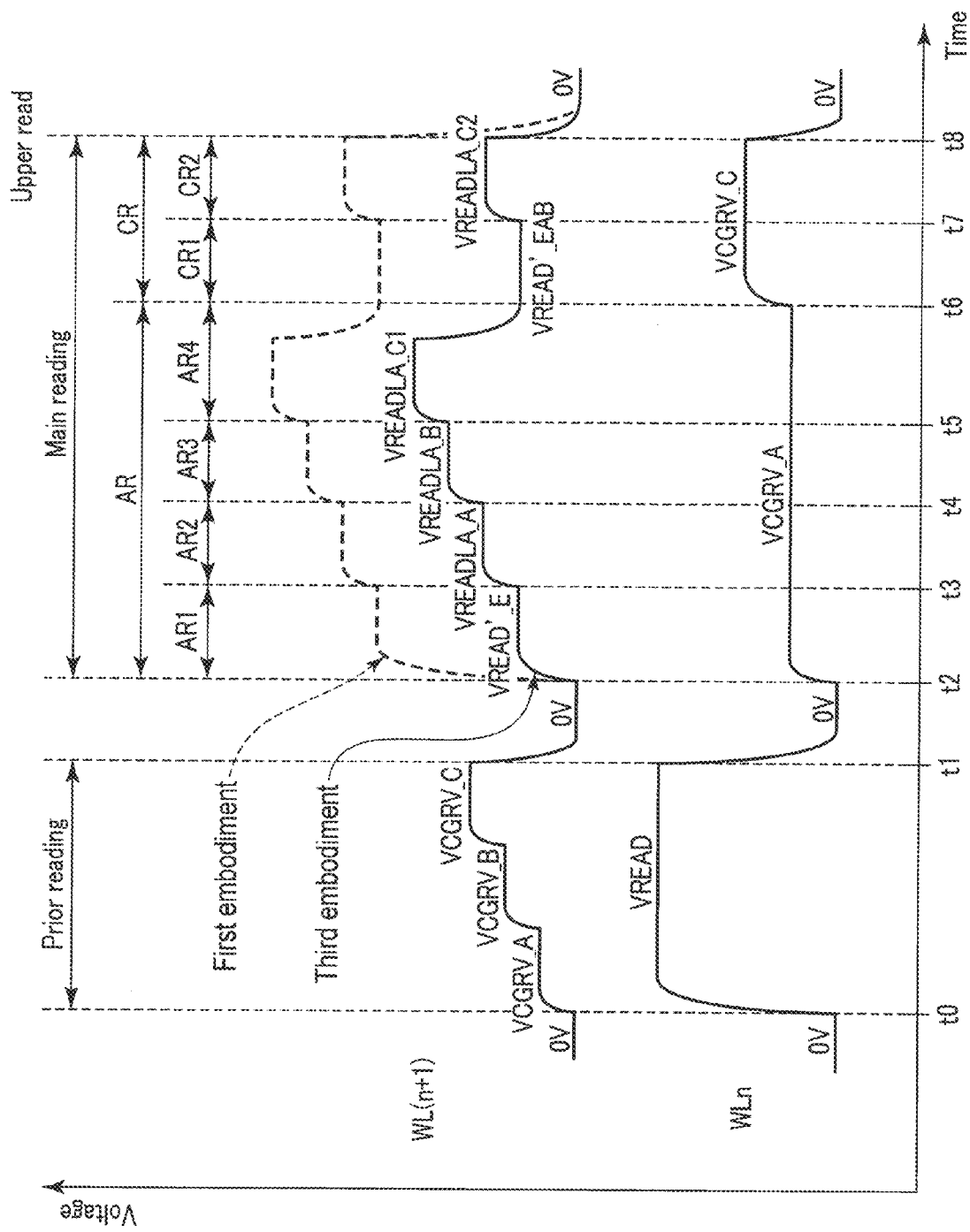
F I G. 26

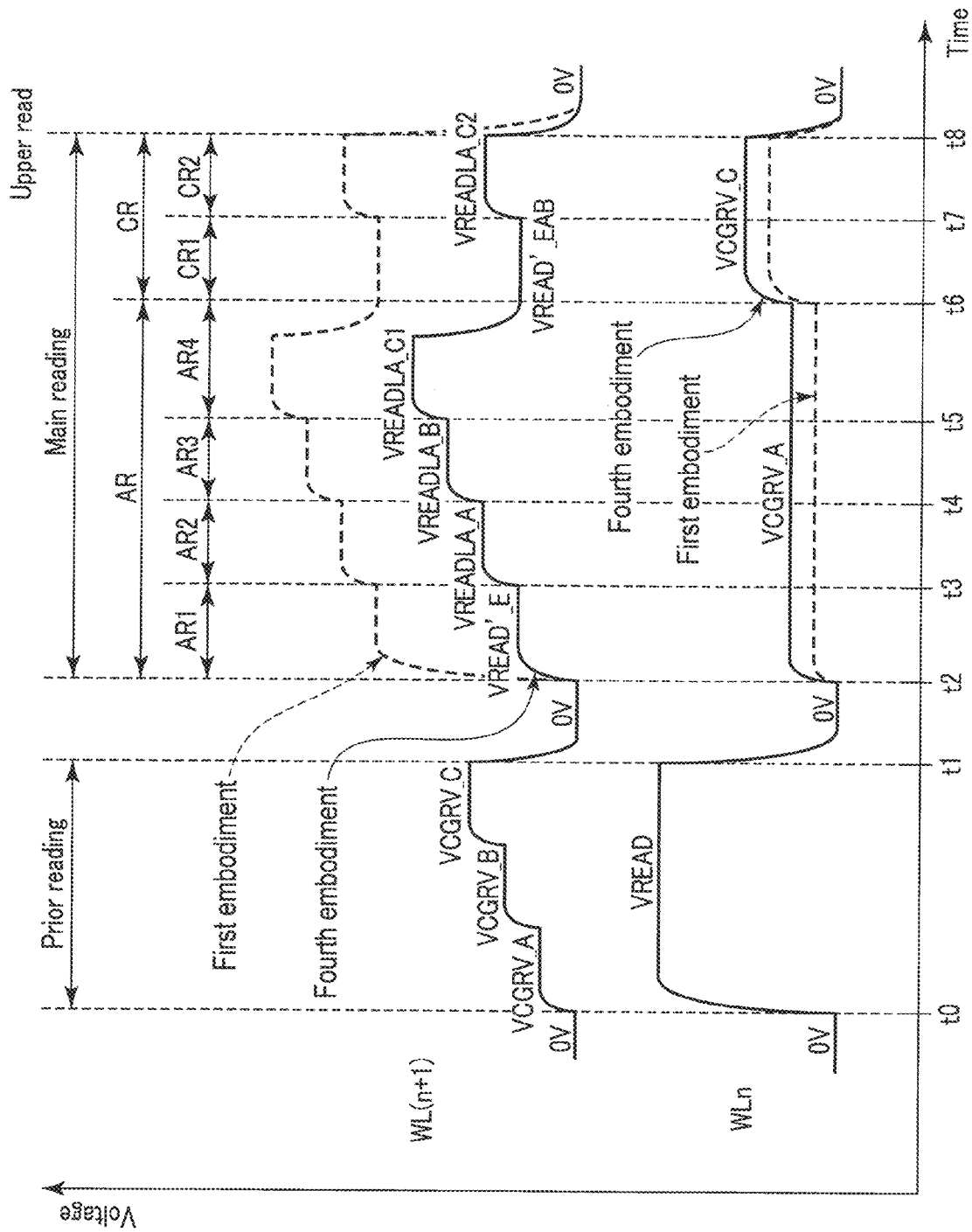
F I G. 31

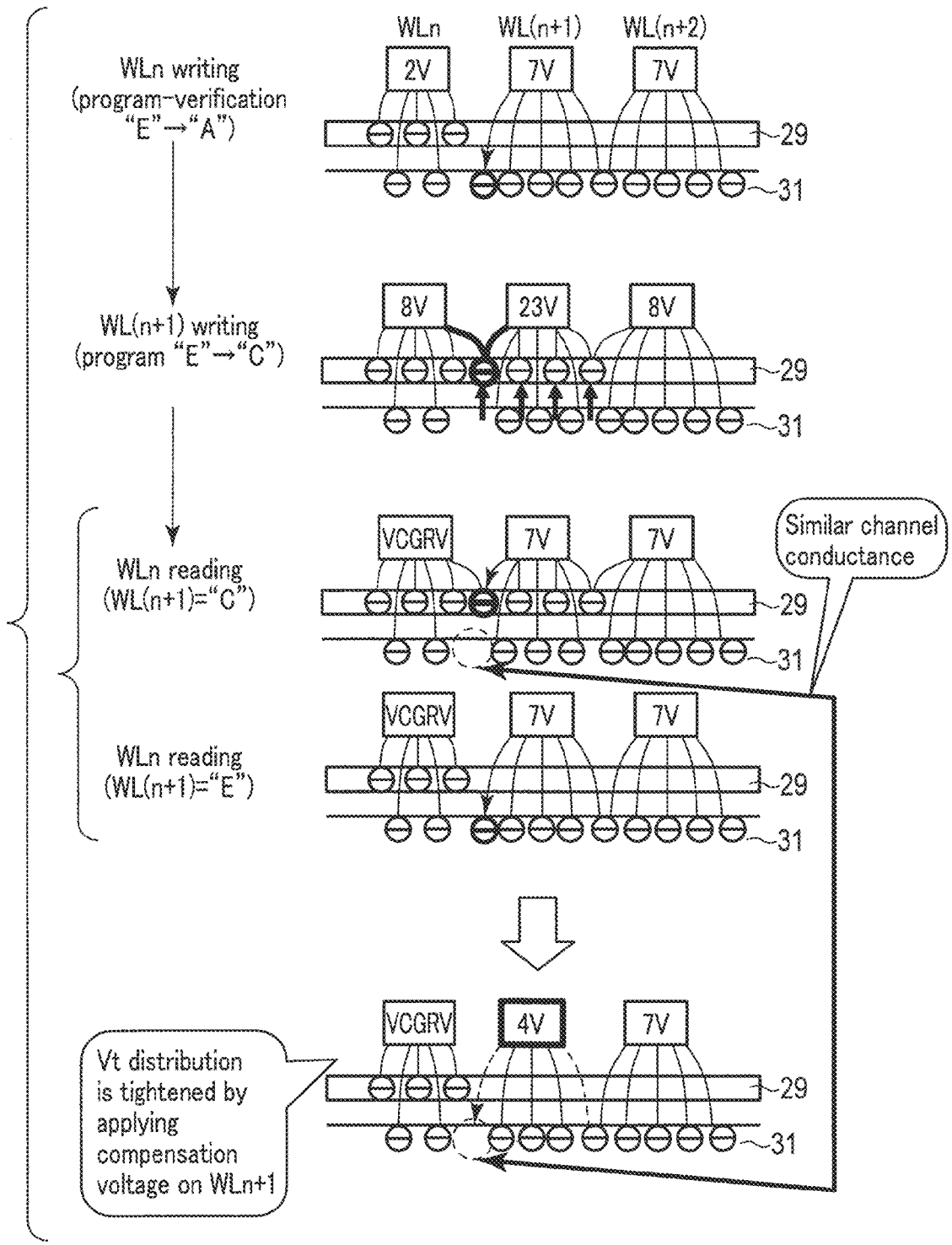
F I G. 33

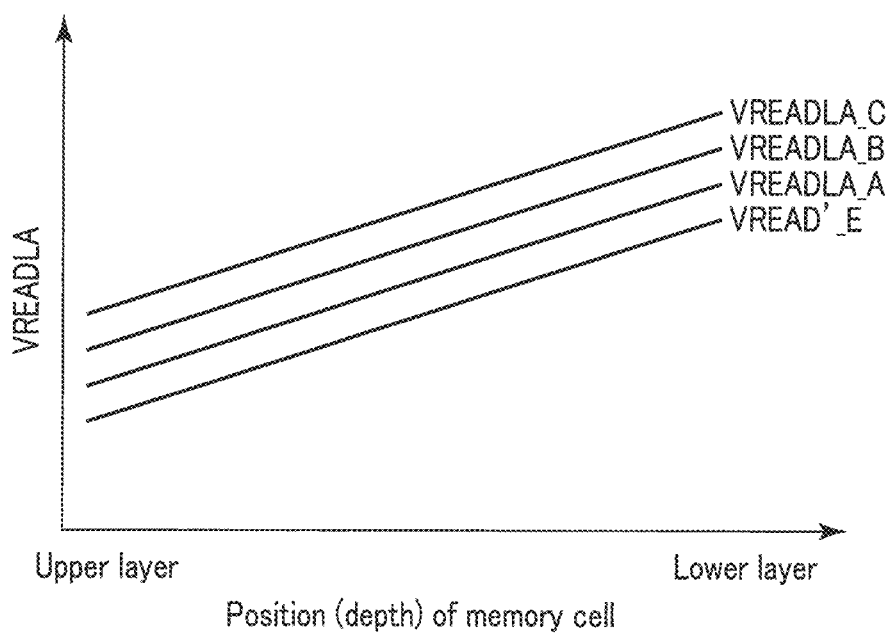
F I G. 34

| | VREAD'_E | VREADLA_A | VREADLA_B | VREADLA_C |
|---|---|---|---|---|
| Upper layer | ΔVE_upper | ΔVA_upper | ΔVB_upper | ΔVC_upper |
| Middle layer | ΔVE_mid | ΔVA_mid | ΔVB_mid | ΔVC_mid |
| Lower layer | ΔVE_low | ΔVA_low | ΔVB_low | ΔVC_low |

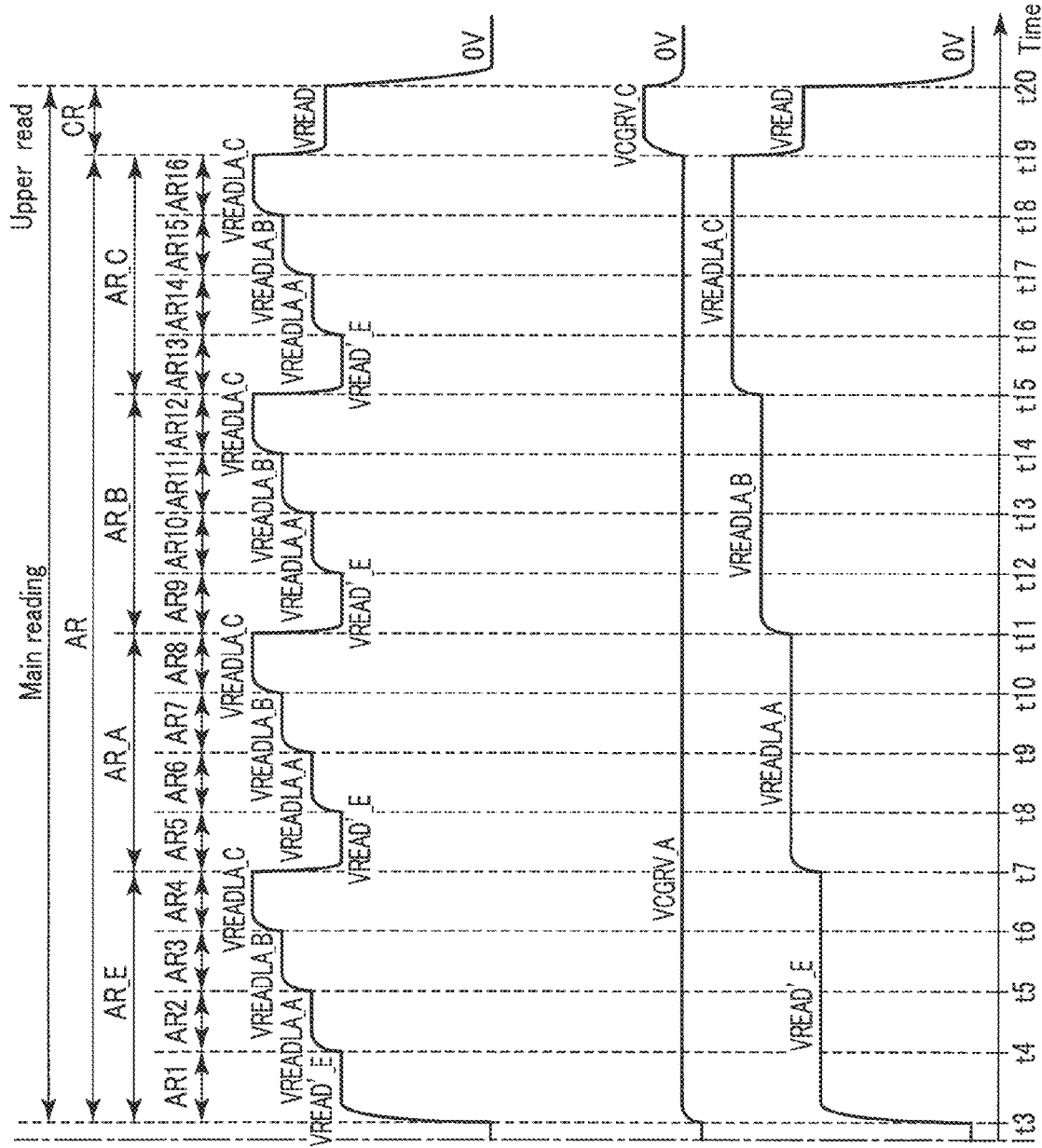
F I G. 45B

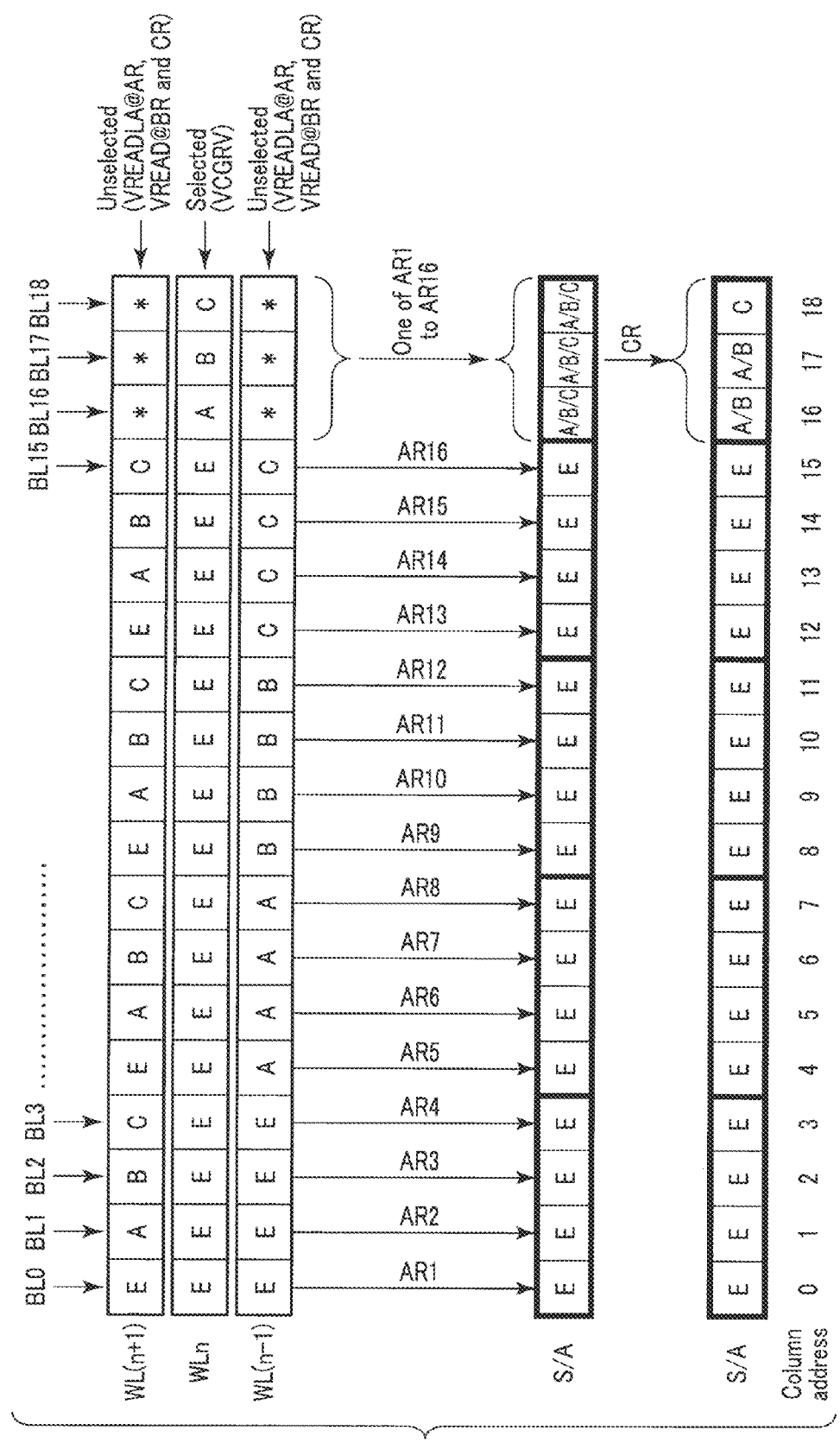
F I G. 46

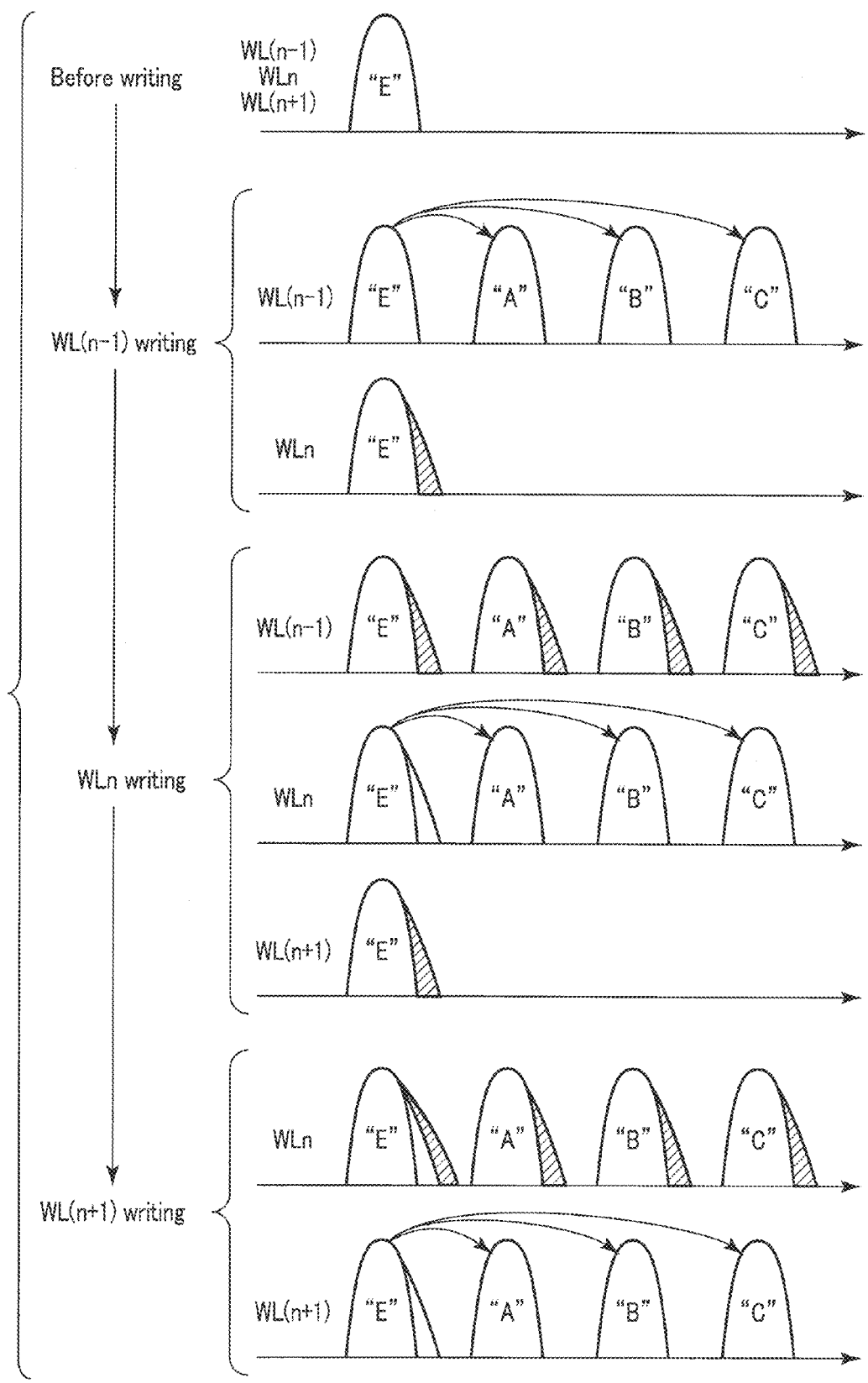
F I G. 47

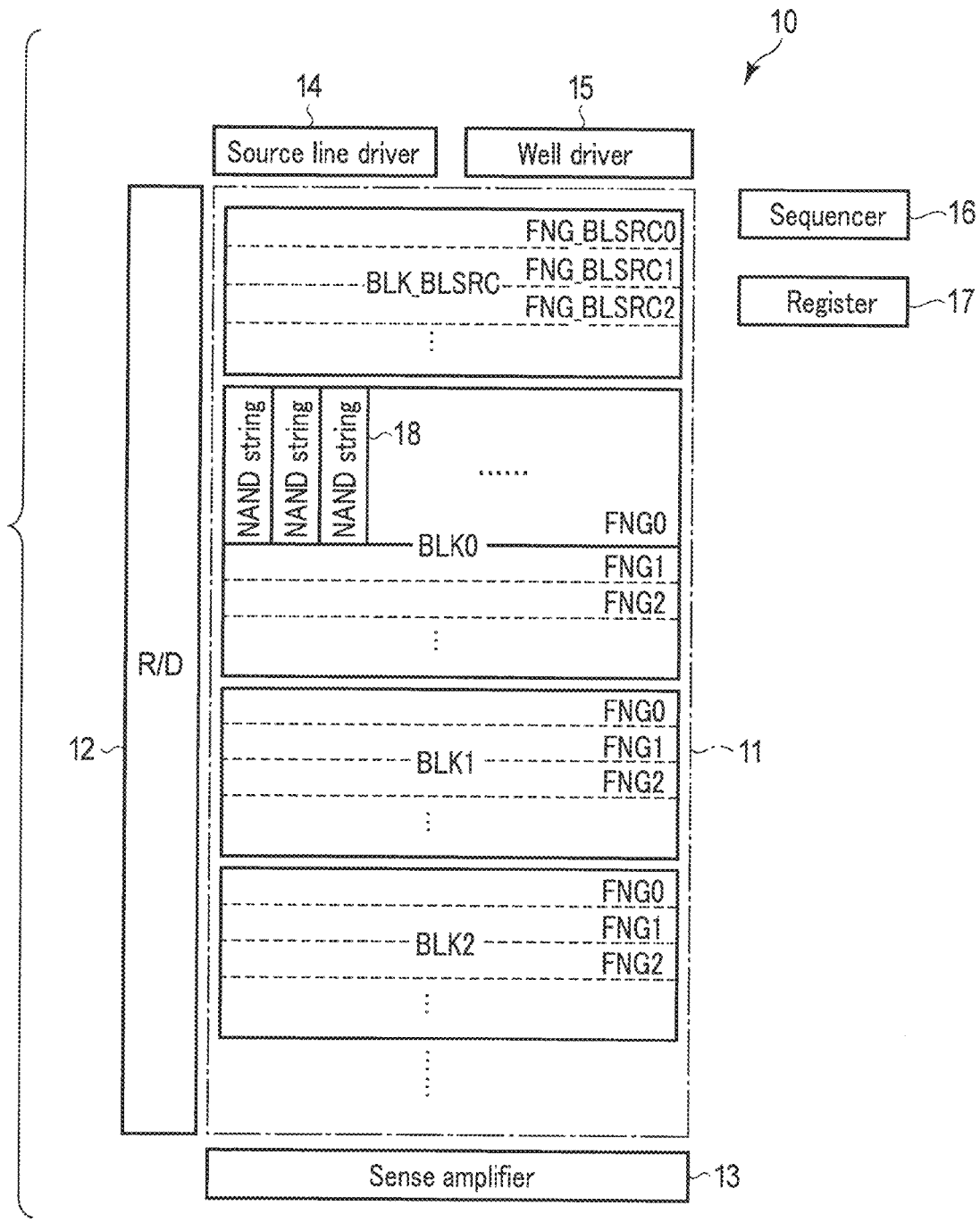
F I G. 50

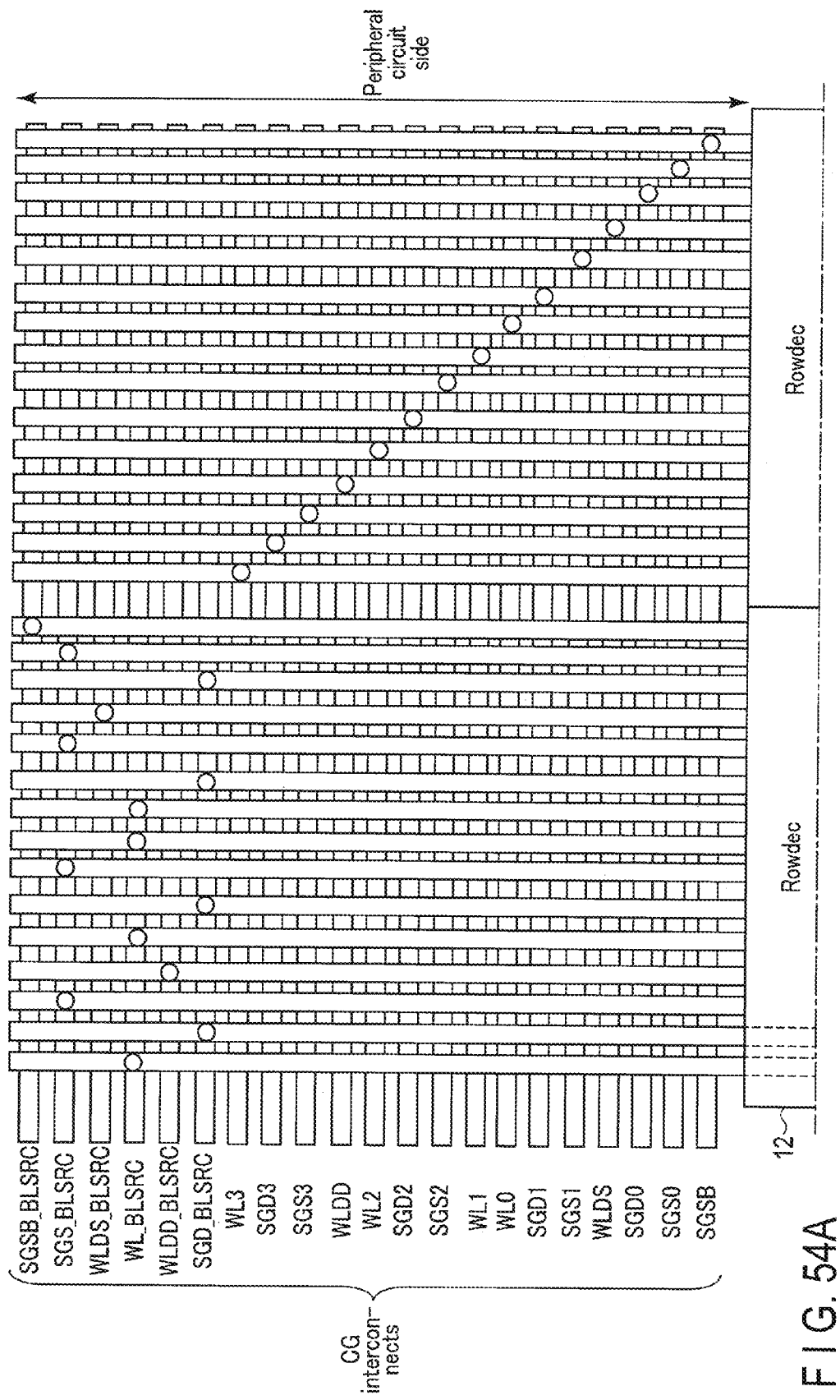
F I G. 54A

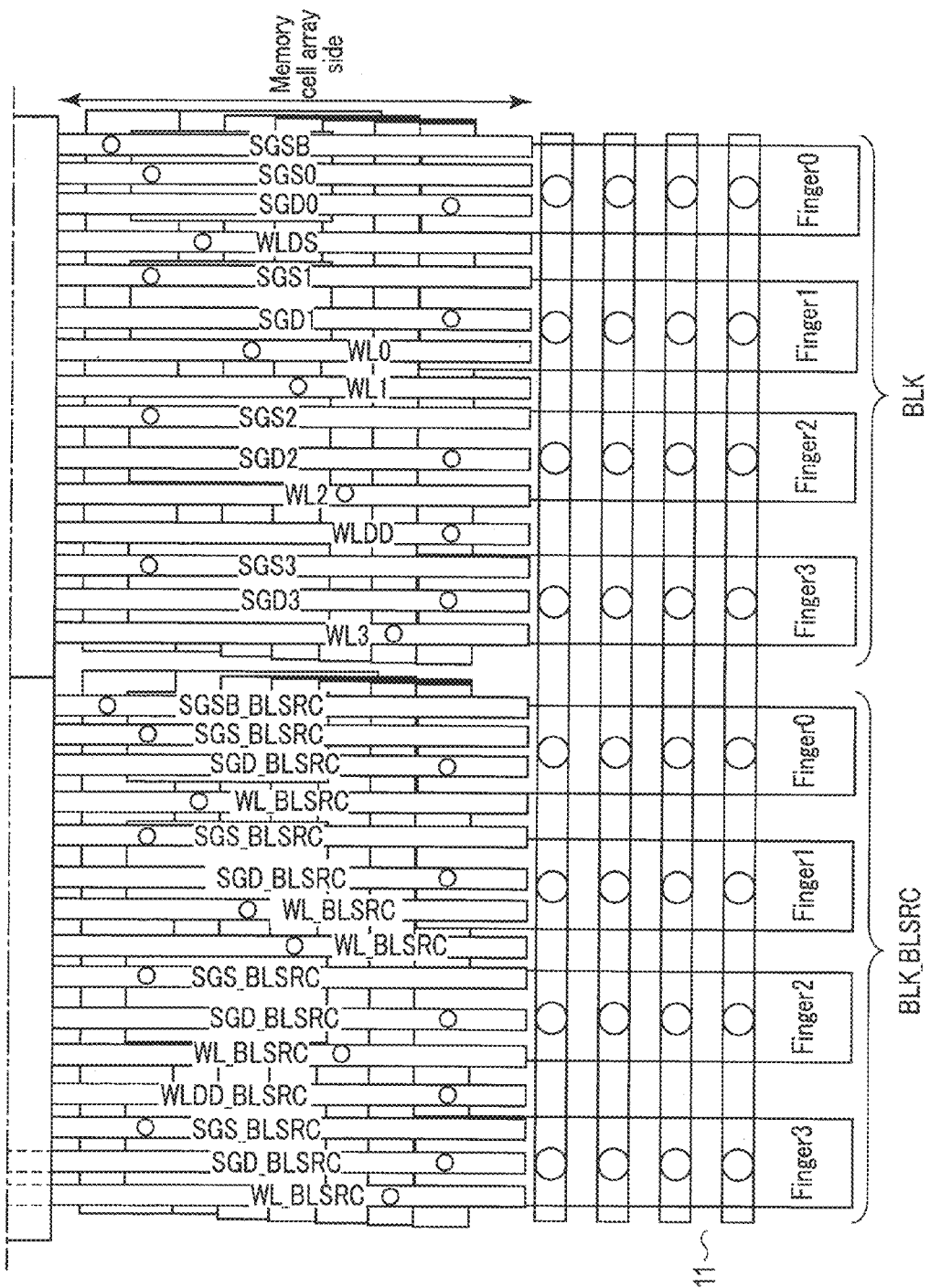
F I G. 54B

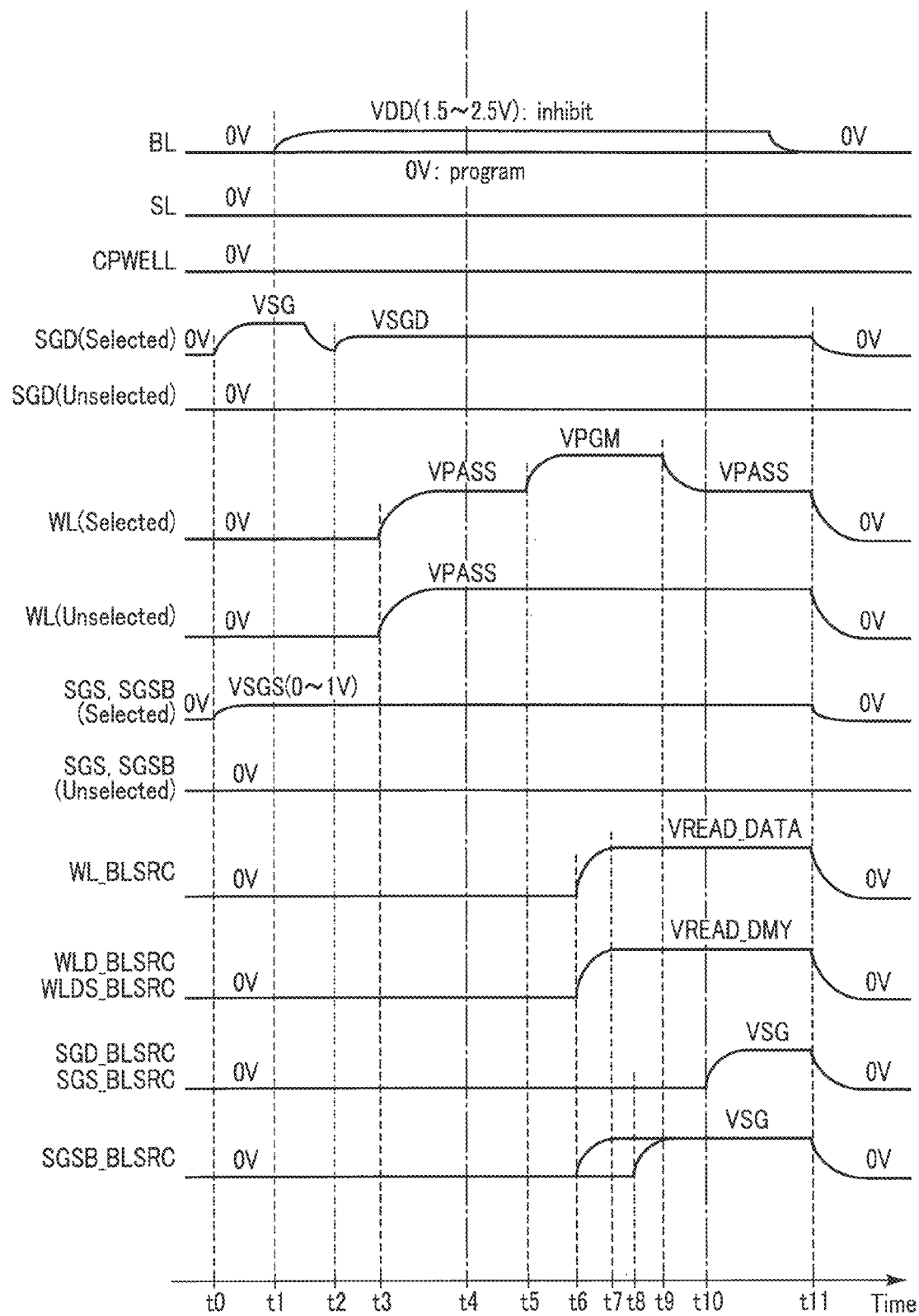
F I G. 55

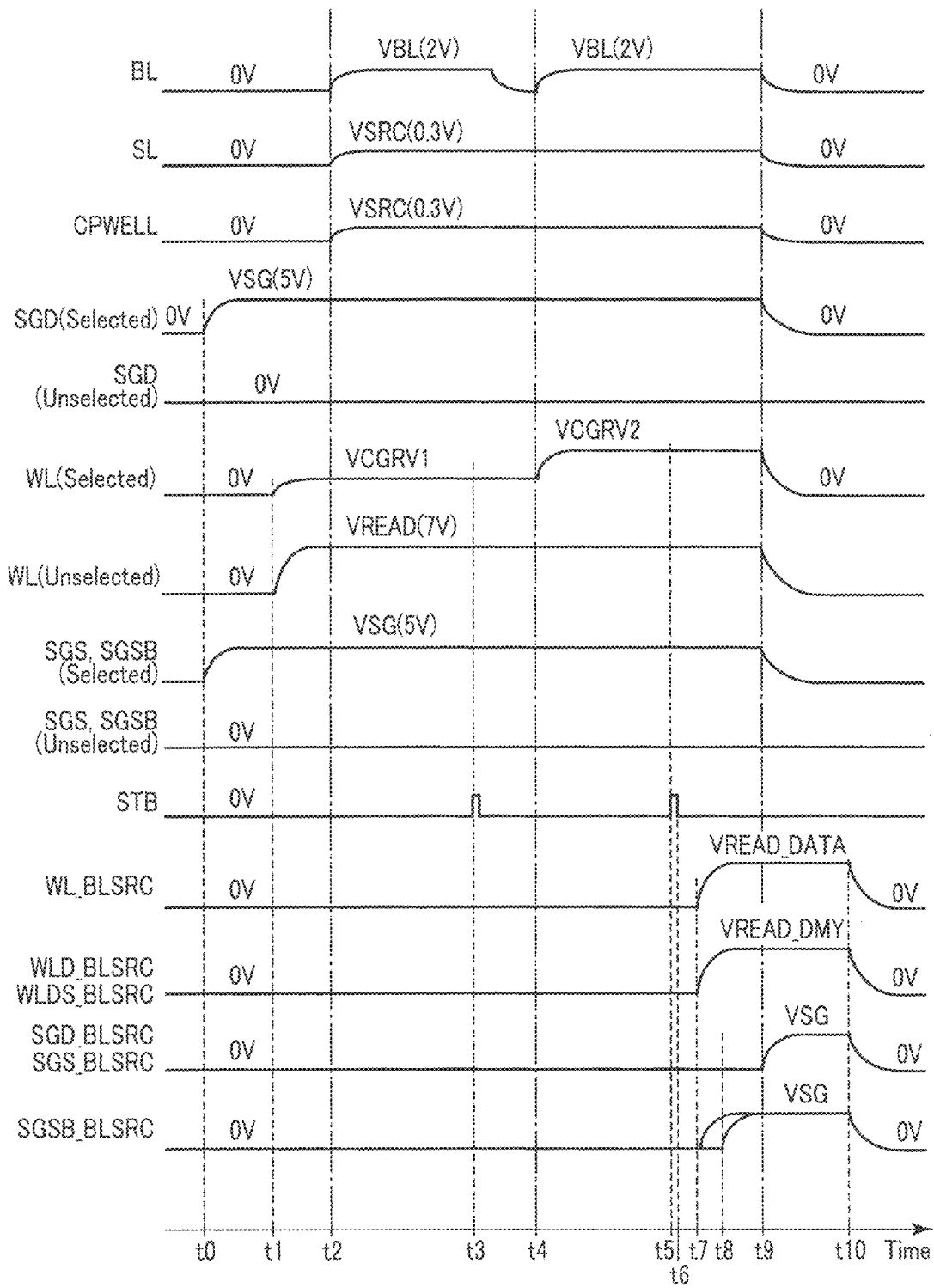
F I G. 56

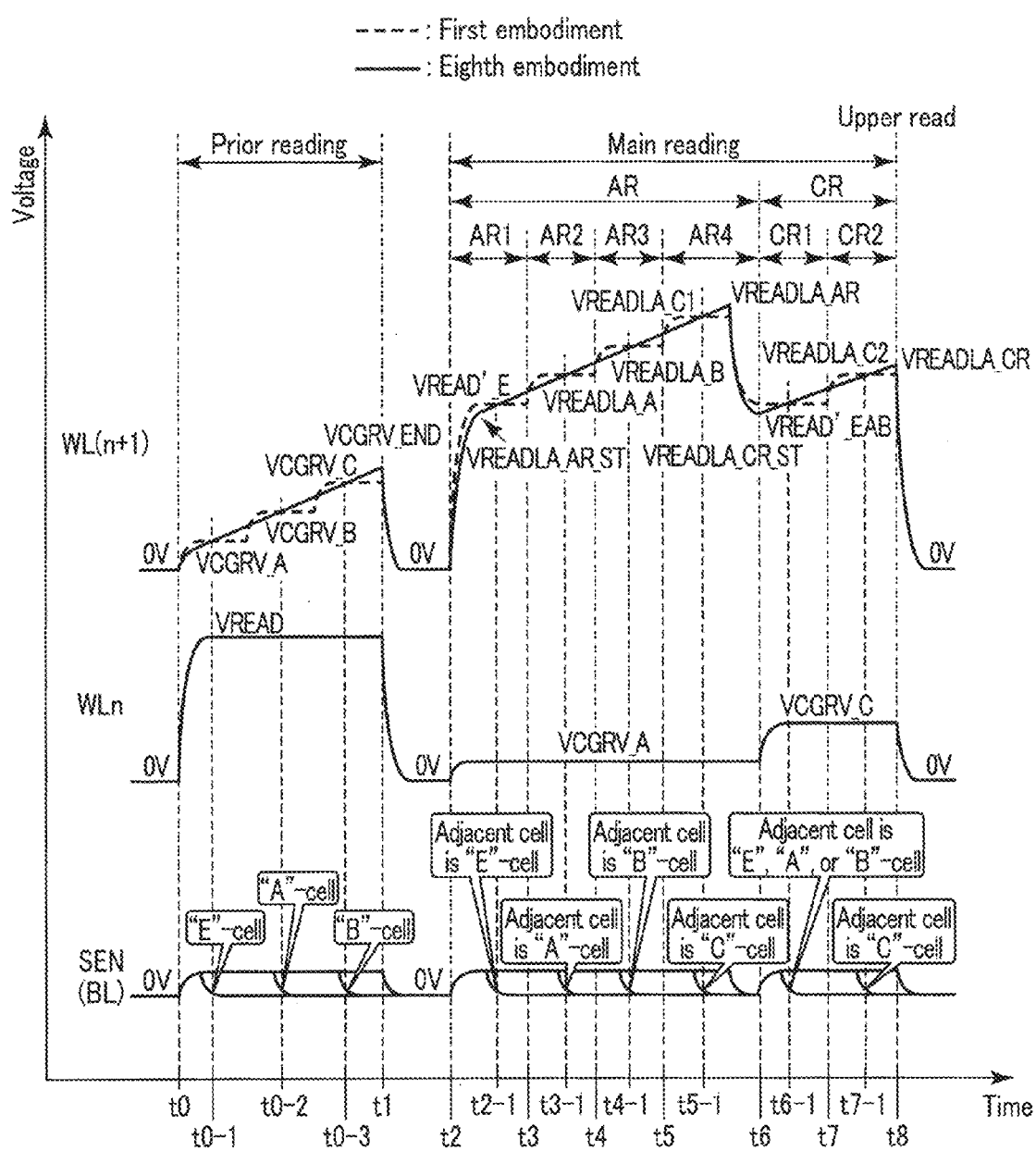
F I G. 58

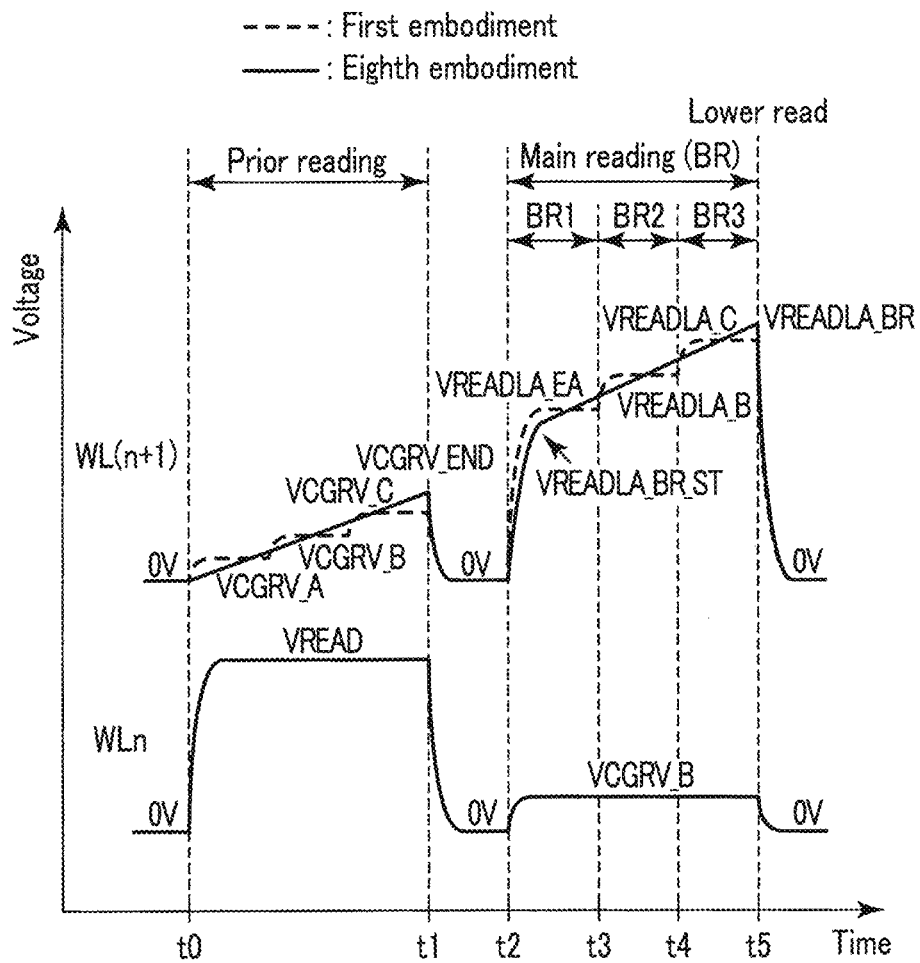
F I G. 59

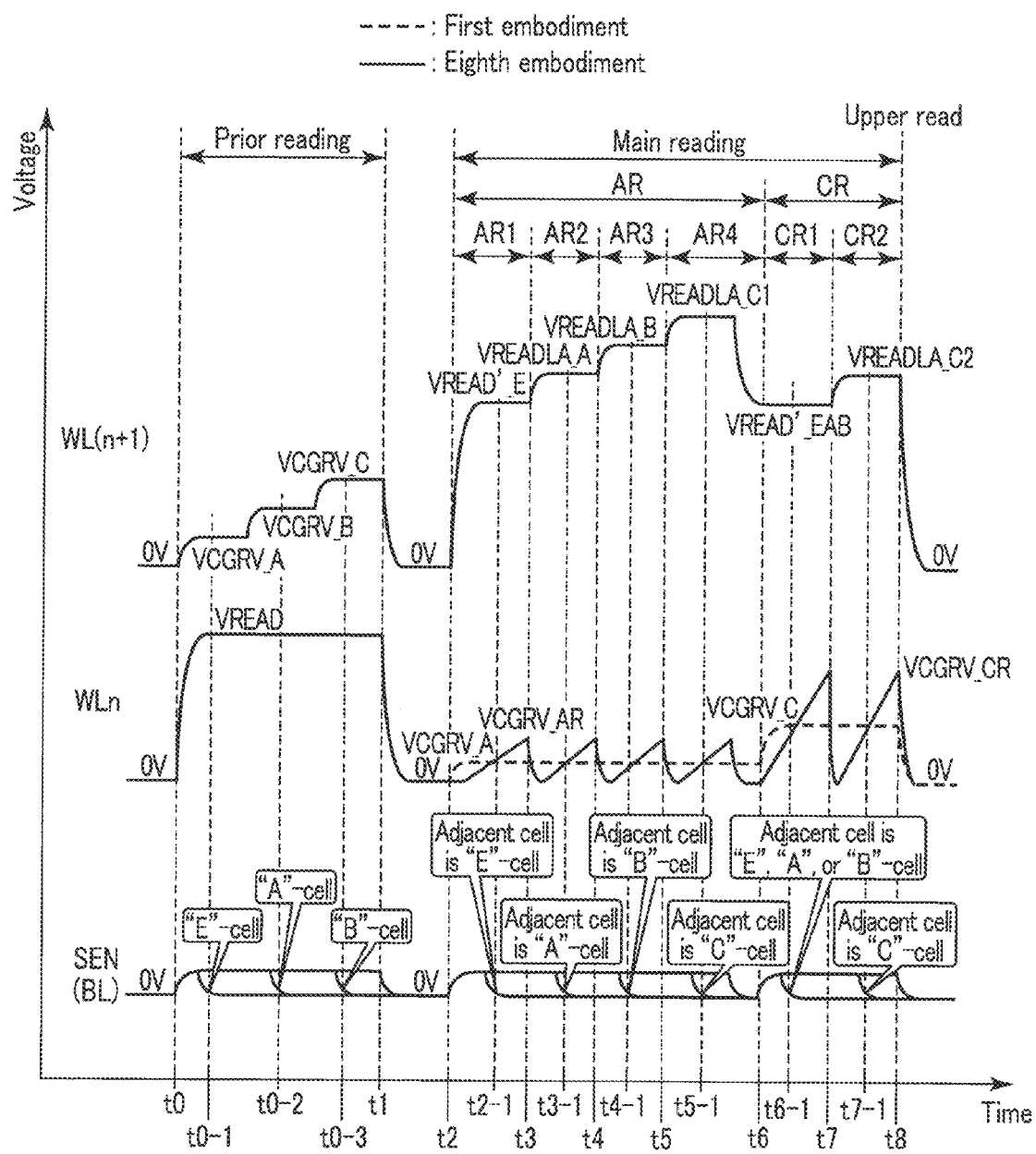
F I G. 61

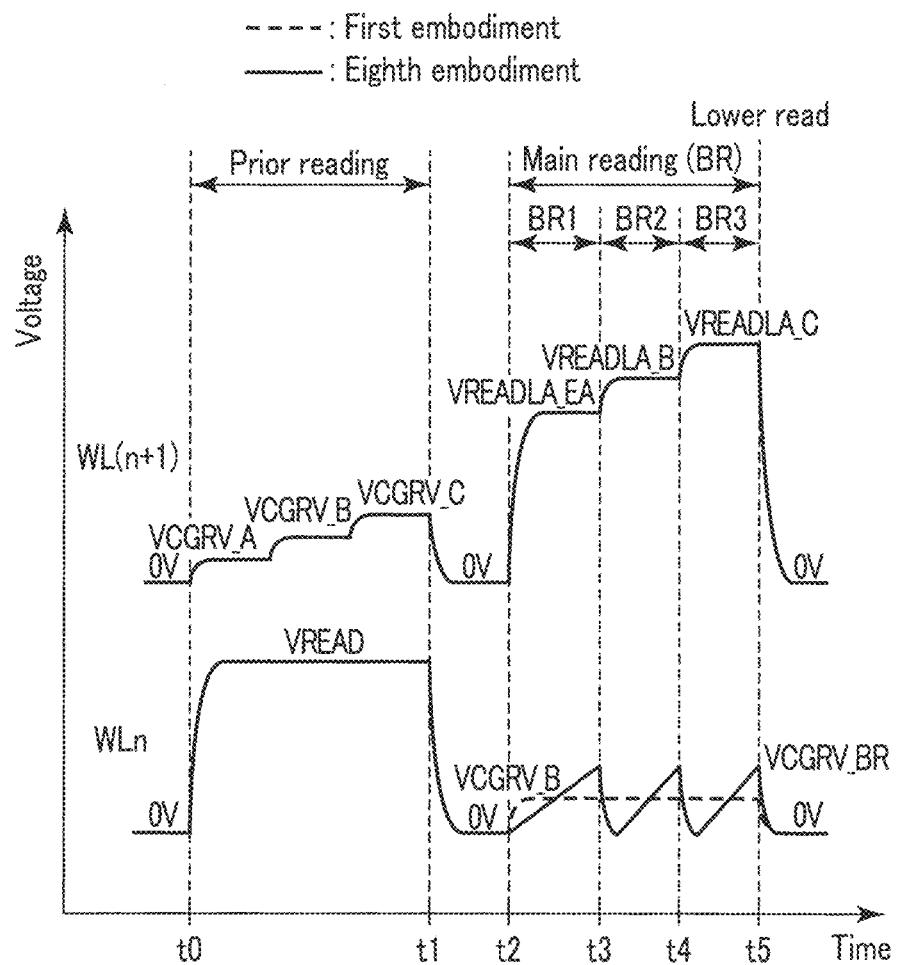
F I G. 62

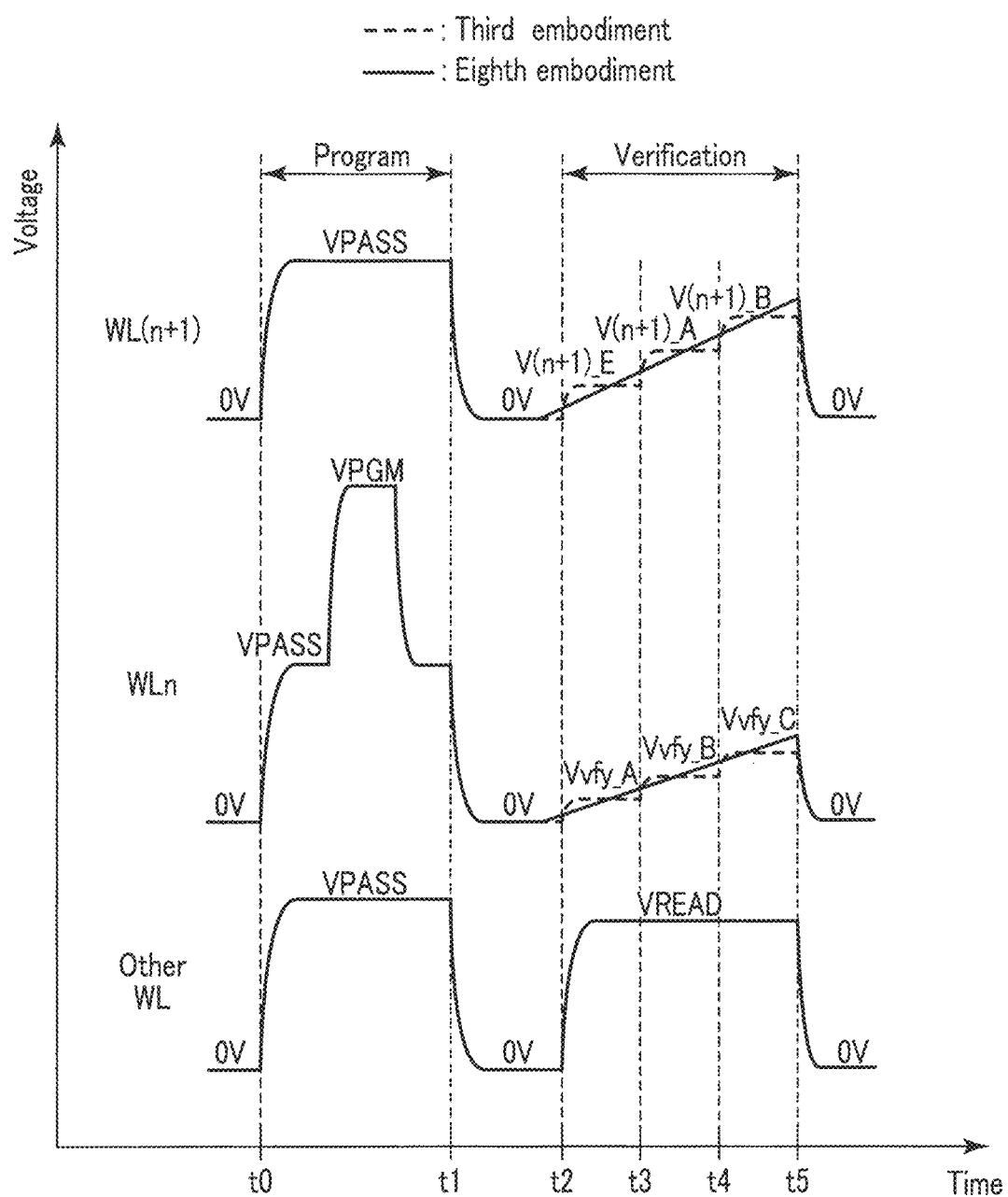
F I G. 63

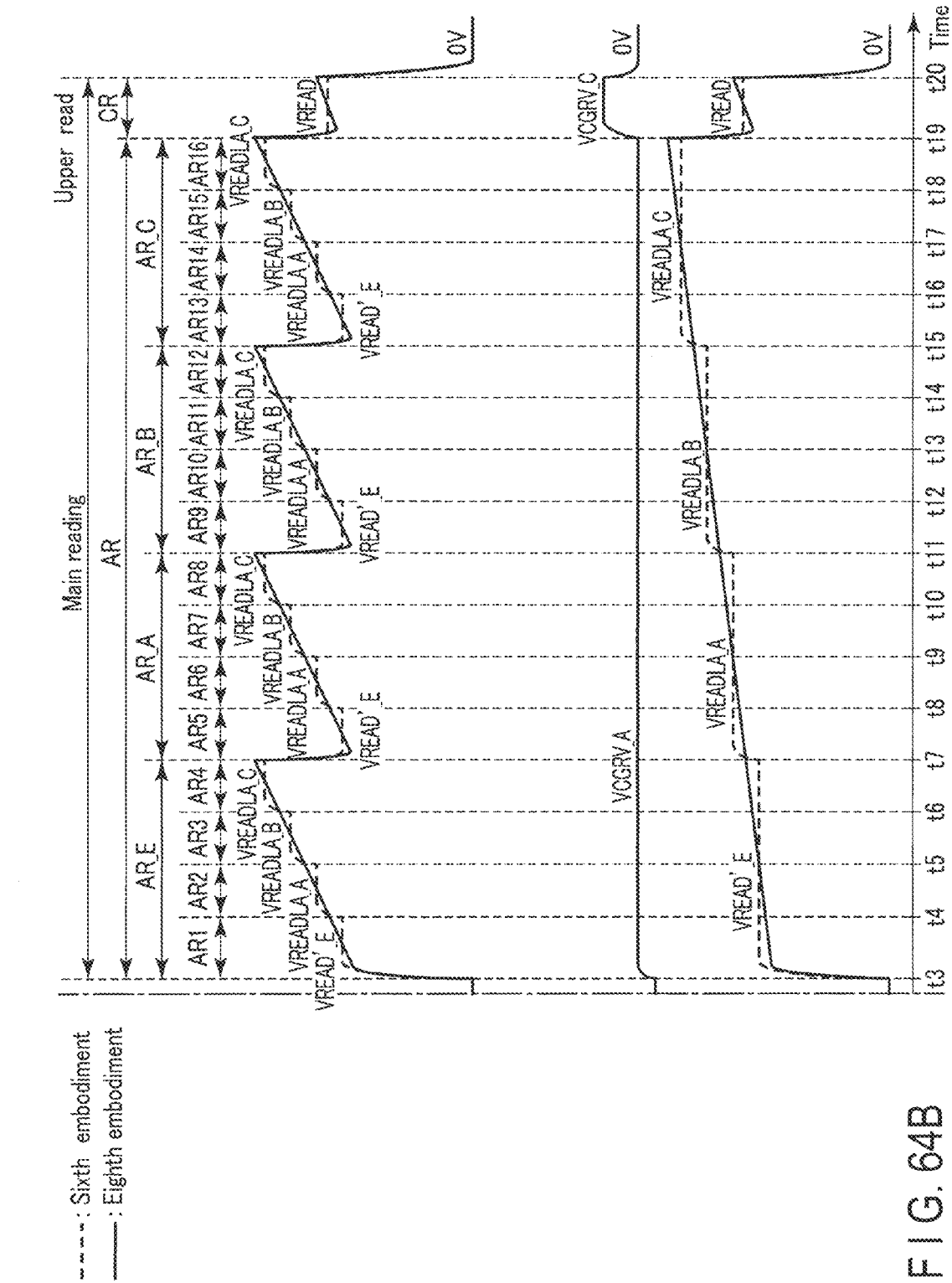
F I G. 64B

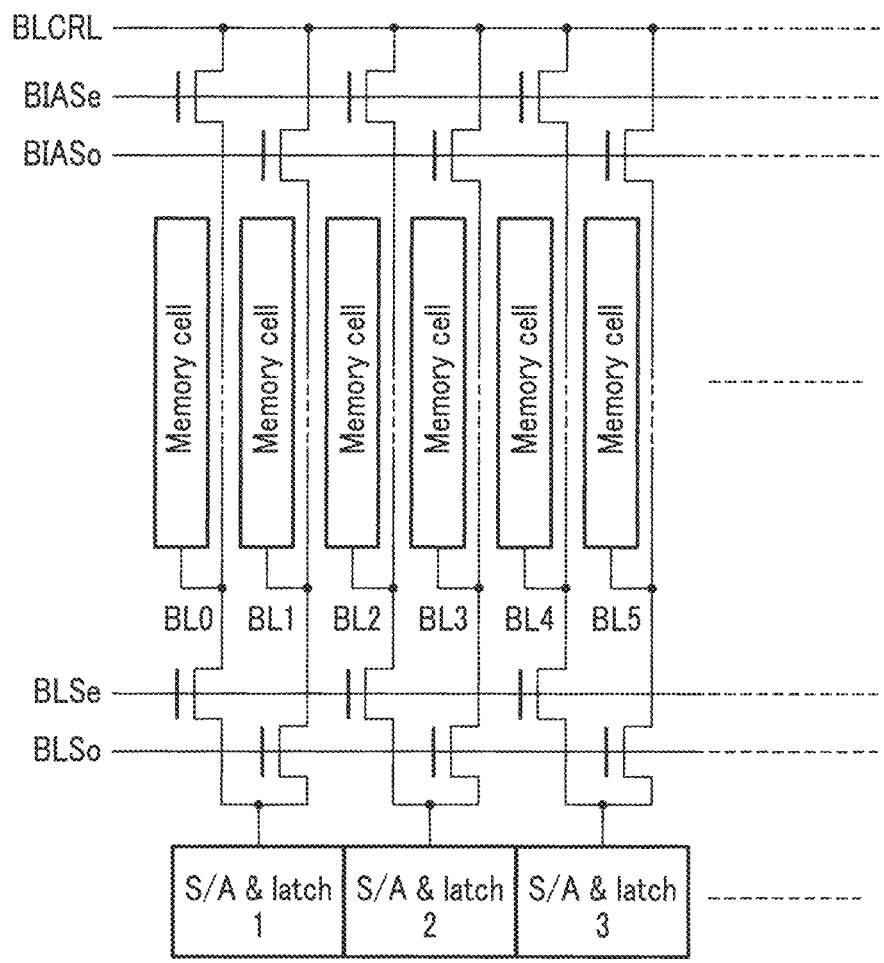
F I G. 65

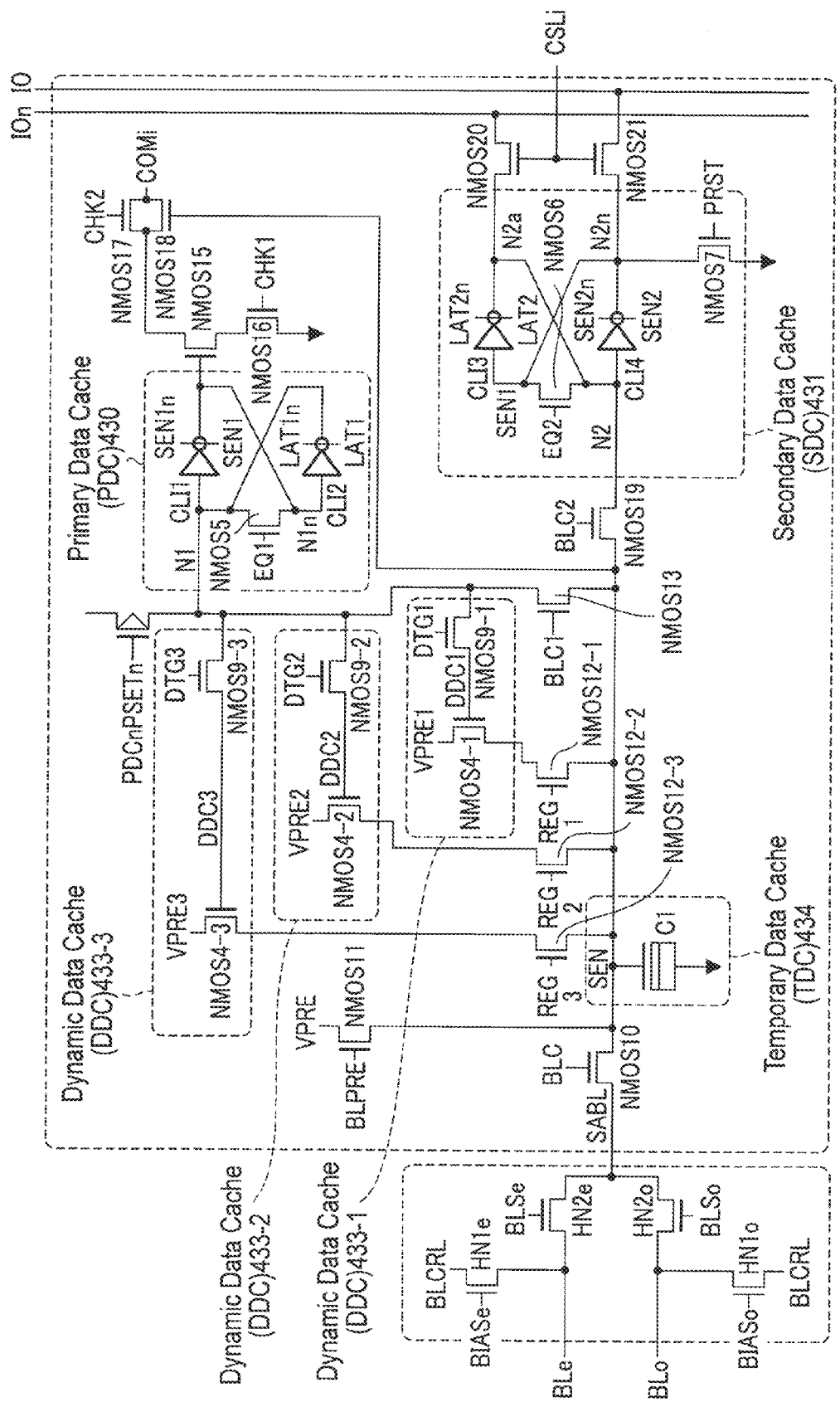
F I G. 66

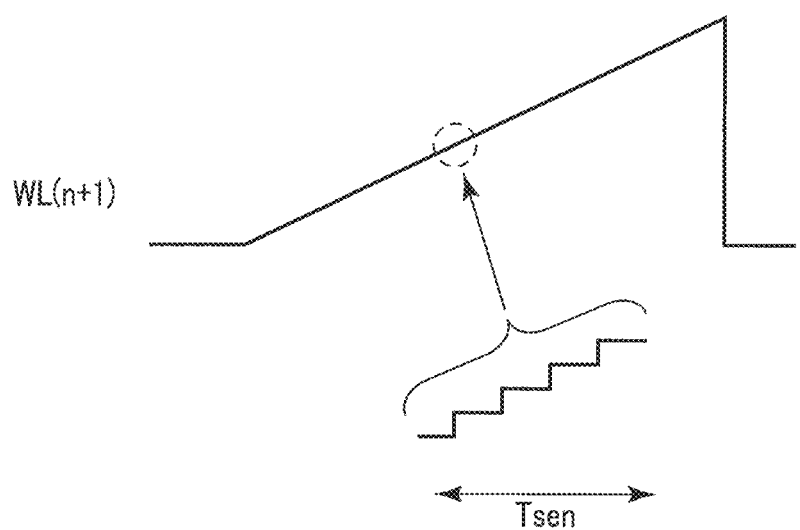
F I G. 68

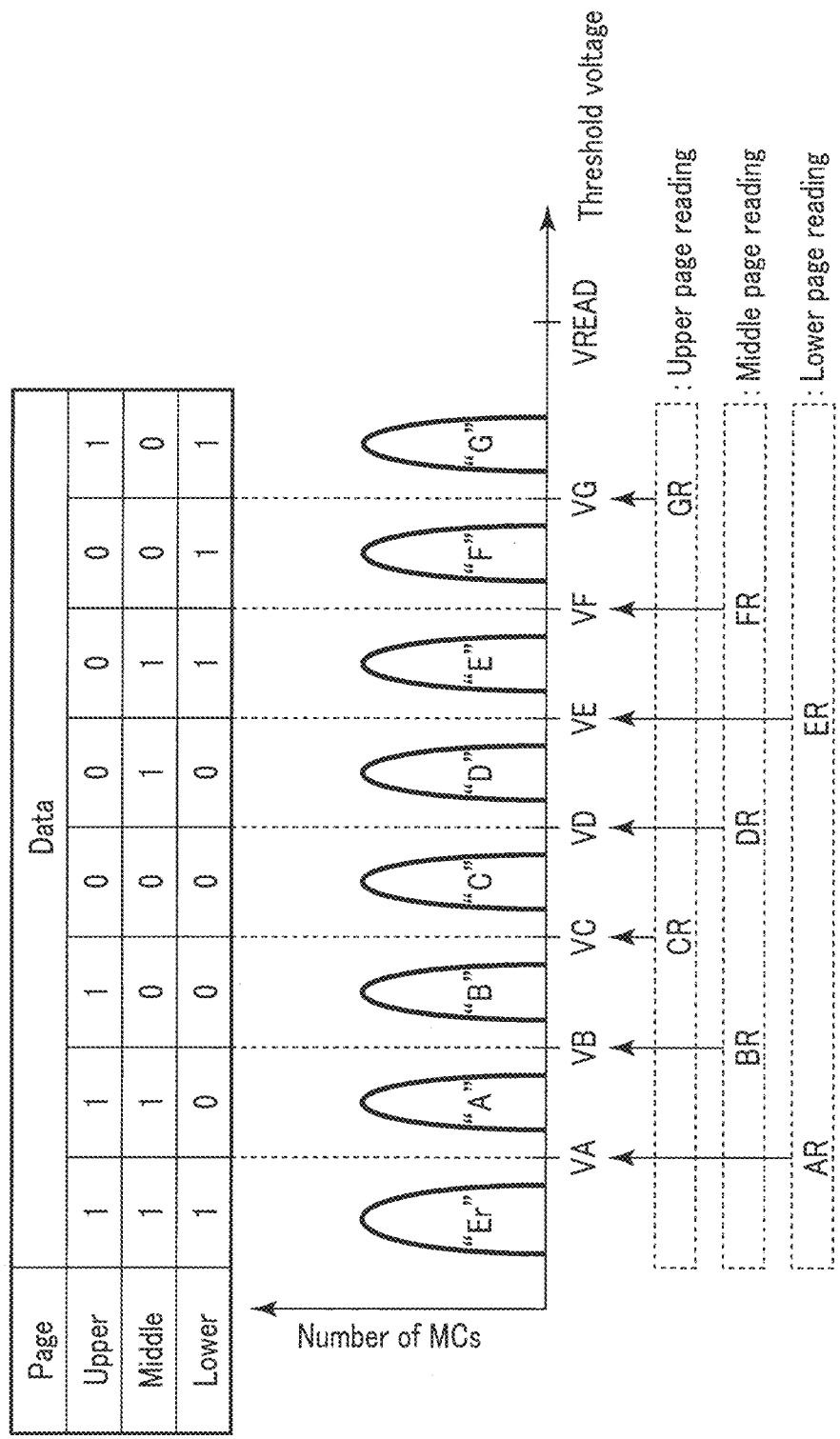
F I G. 69

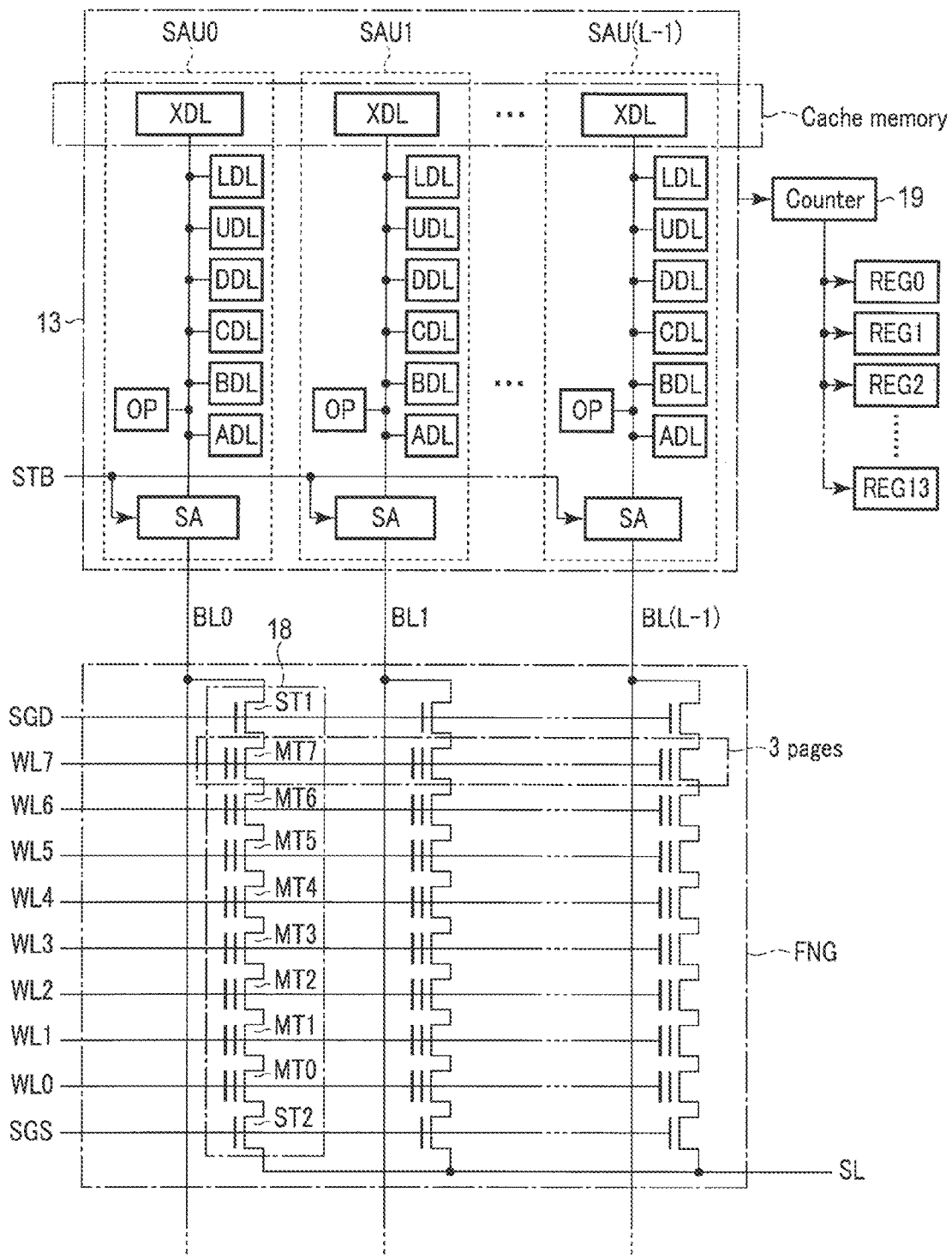
F I G. 70

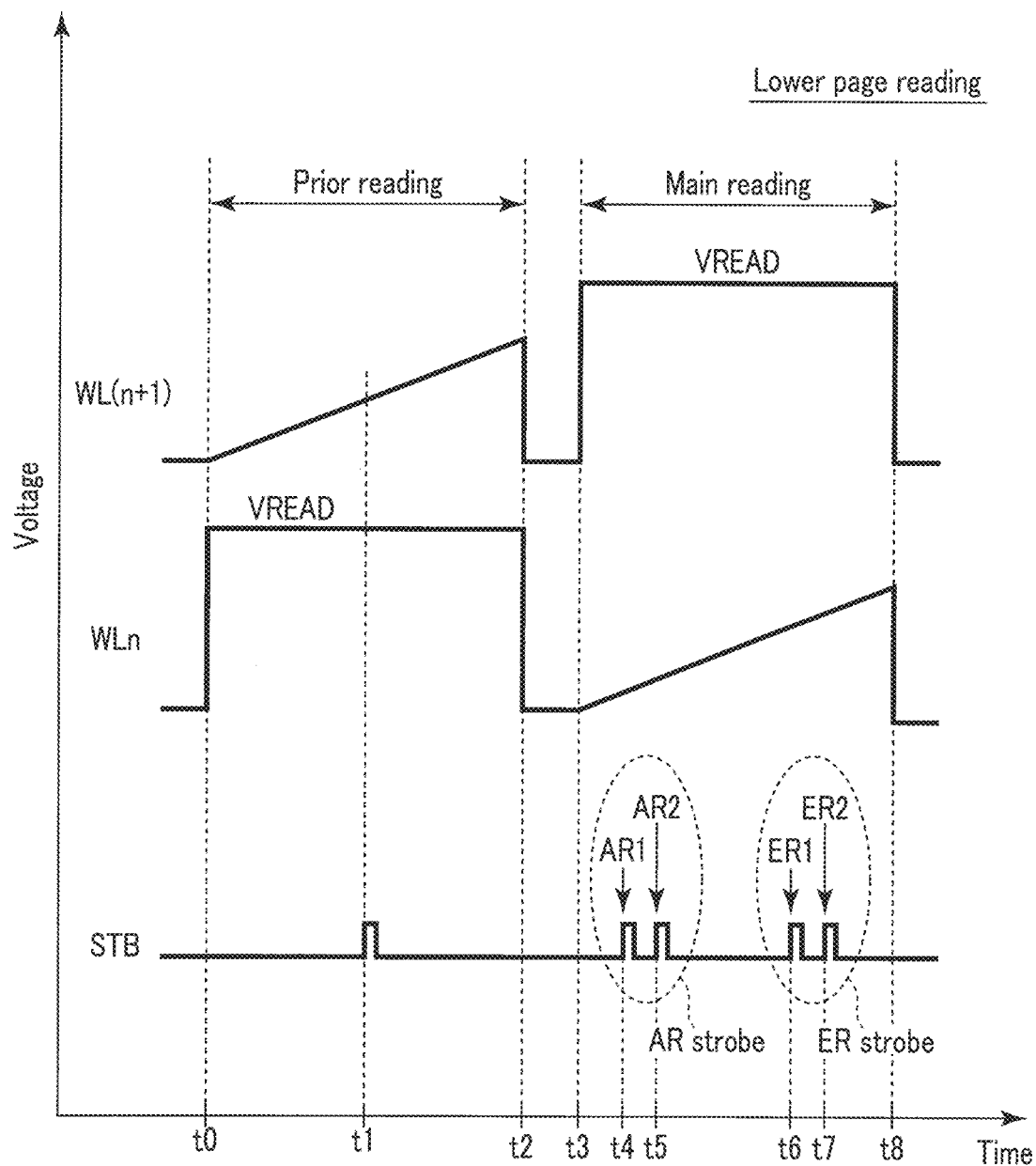
F I G. 72

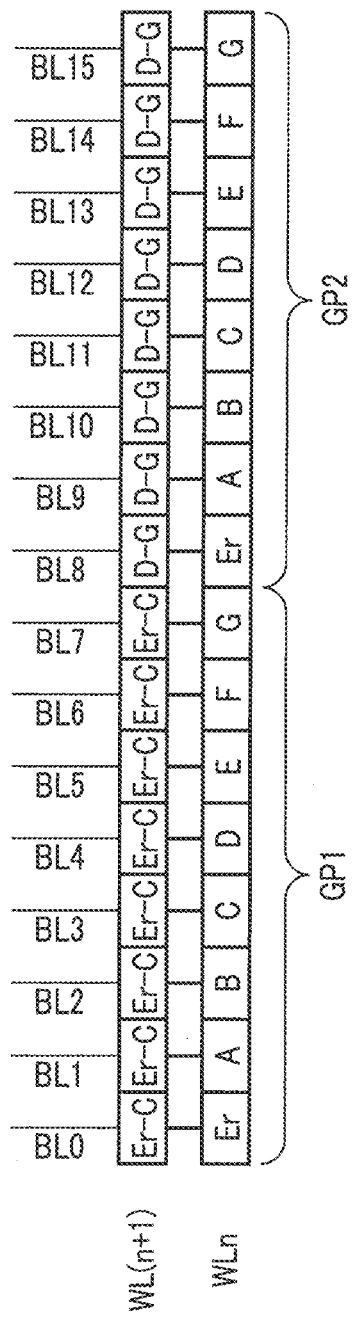
F I G. 73

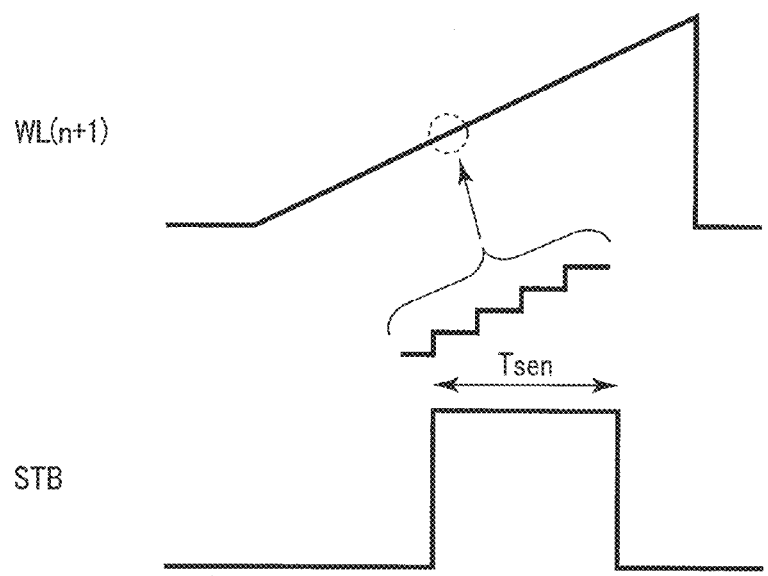
F I G. 75
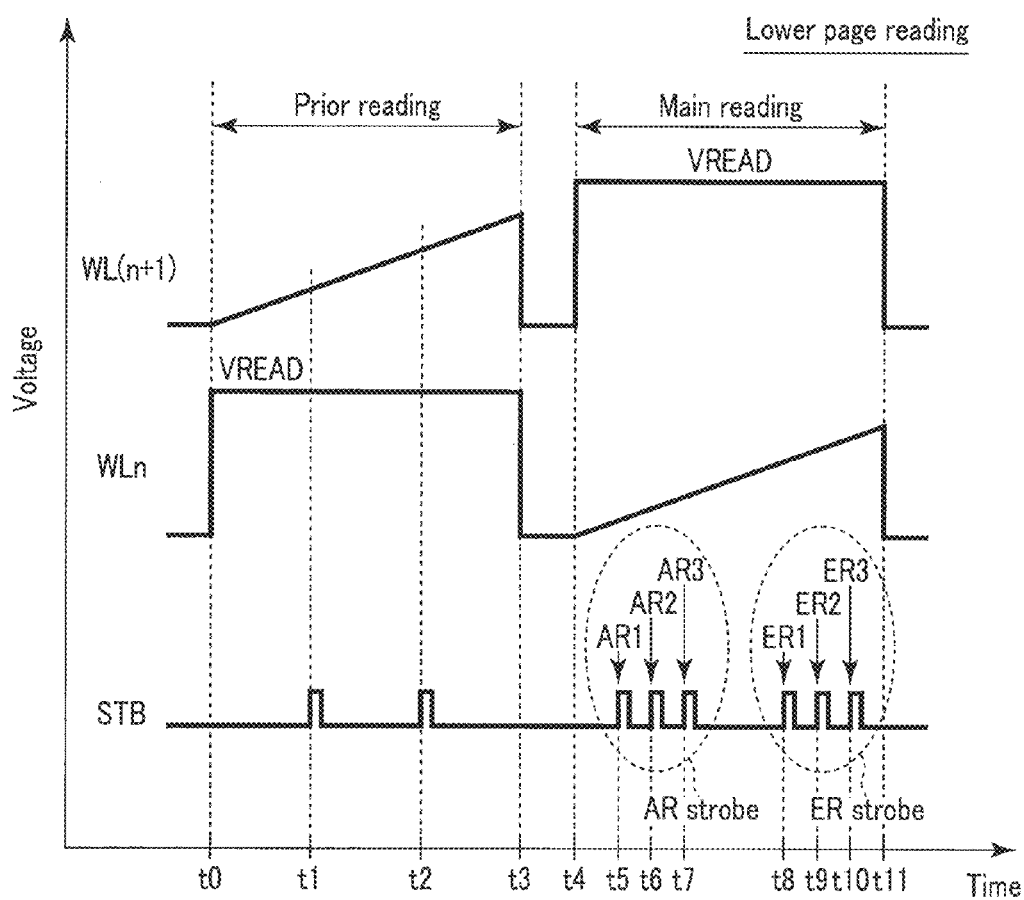
F I G. 76

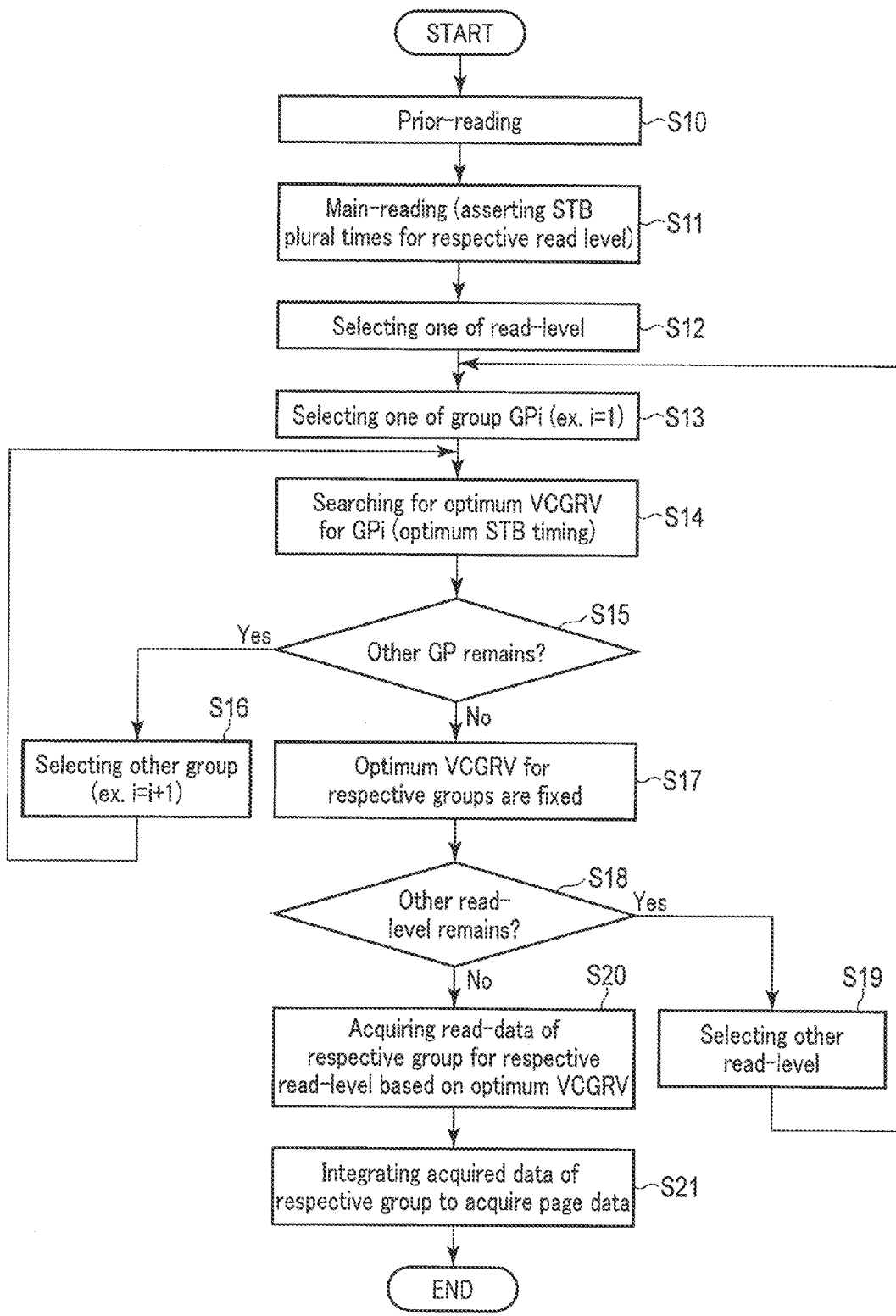
F I G. 79

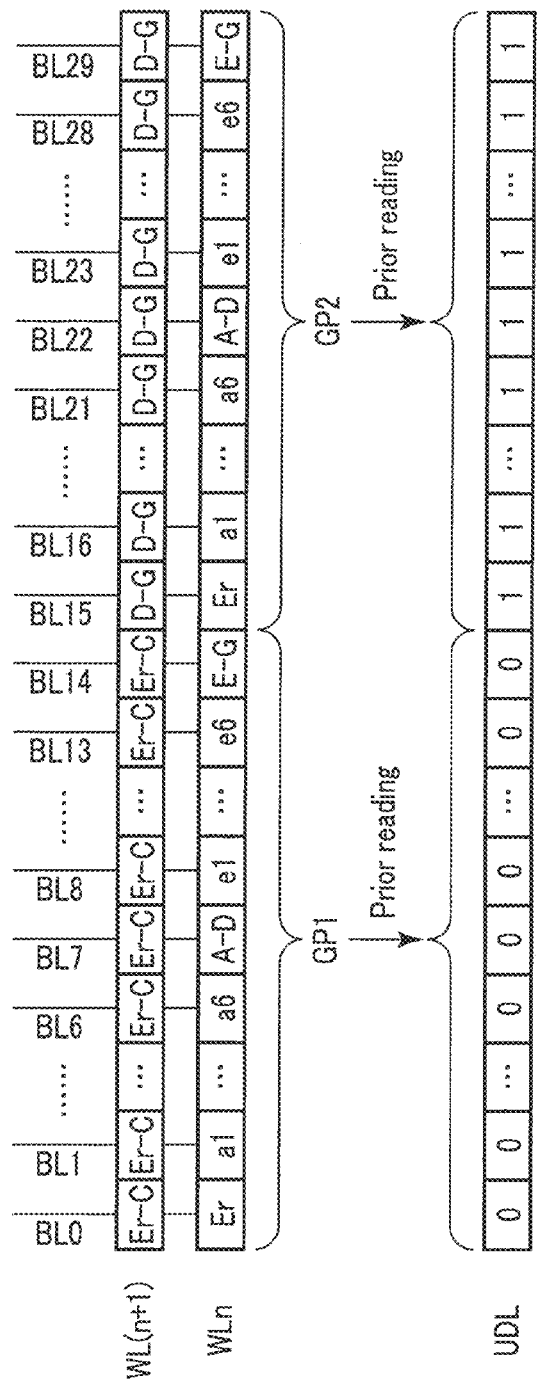

| | BL0 | BL1 | BL2 | BL3 | BL4 | BL5 | BL6 | BL7 | BL8 | BL9 | BL10 | BL11 | BL12 | BL13 | BL14 |
|---|---|---|---|---|---|---|---|---|---|---|---|---|---|---|---|
| WLn | Er | a1 | a2 | a3 | a4 | a5 | a6 | A-D | e1 | e2 | e3 | e4 | e5 | e6 | E-G |

↓ AR5

| | | | | | | | | | | | | | | | |
|---|---|---|---|---|---|---|---|---|---|---|---|---|---|---|---|
| SA | 0 | 0 | 0 | 0 | 0 | 1 | 1 | 1 | 1 | 1 | 1 | 1 | 1 | 1 | 1 |
| CDL | 0 | 0 | 0 | 0 | 1 | 0 | 0 | 0 | 0 | 0 | 0 | 0 | 0 | 0 | 0 |
| LDL | 1 | 1 | 1 | 1 | 1 | 0 | 0 | 0 | 0 | 0 | 0 | 0 | 0 | 0 | 0 |

F I G. 88

| | BL0 | BL1 | BL2 | BL3 | BL4 | BL5 | BL6 | BL7 | BL8 | BL9 | BL10 | BL11 | BL12 | BL13 | BL14 |
|---|---|---|---|---|---|---|---|---|---|---|---|---|---|---|---|
| WLn | Er | a1 | a2 | a3 | a4 | a5 | a6 | A-D | e1 | e2 | e3 | e4 | e5 | e6 | E-G |

↓ AR6

| | | | | | | | | | | | | | | | |
|---|---|---|---|---|---|---|---|---|---|---|---|---|---|---|---|
| SA | 0 | 0 | 0 | 0 | 0 | 0 | 1 | 1 | 1 | 1 | 1 | 1 | 1 | 1 | 1 |
| ADL | 0 | 1 | 0 | 1 | 0 | 1 | 0 | 0 | 0 | 0 | 0 | 0 | 0 | 0 | 0 |
| BDL | 0 | 0 | 1 | 1 | 0 | 0 | 0 | 0 | 0 | 0 | 0 | 0 | 0 | 0 | 0 |
| CDL | 0 | 0 | 0 | 0 | 1 | 1 | 0 | 0 | 0 | 0 | 0 | 0 | 0 | 0 | 0 |
| LDL | 1 | 1 | 1 | 1 | 1 | 1 | 0 | 0 | 0 | 0 | 0 | 0 | 0 | 0 | 0 |

F I G. 89

| | BL0 | BL1 | BL2 | BL3 | BL4 | BL5 | BL6 | BL7 | BL8 | BL9 | BL10 | BL11 | BL12 | BL13 | BL14 |
|---|---|---|---|---|---|---|---|---|---|---|---|---|---|---|---|
| WLn | Er | a1 | a2 | a3 | a4 | a5 | a6 | A-D | e1 | e2 | e3 | e4 | e5 | e6 | E-G |

↓ AR7

| | | | | | | | | | | | | | | | |
|---|---|---|---|---|---|---|---|---|---|---|---|---|---|---|---|
| SA | 0 | 0 | 0 | 0 | 0 | 0 | 0 | 0 | 1 | 1 | 1 | 1 | 1 | 1 | 1 |
| ADL | 0 | 1 | 0 | 1 | 0 | 1 | 0 | 0 | 0 | 0 | 0 | 0 | 0 | 0 | 0 |
| BDL | 0 | 0 | 1 | 1 | 0 | 0 | 1 | 0 | 0 | 0 | 0 | 0 | 0 | 0 | 0 |
| CDL | 0 | 0 | 0 | 0 | 1 | 1 | 1 | 0 | 0 | 0 | 0 | 0 | 0 | 0 | 0 |
| LDL | 1 | 1 | 1 | 1 | 1 | 1 | 1 | 0 | 0 | 0 | 0 | 0 | 0 | 0 | 0 |

F I G. 90

| | BL0 | BL1 | BL2 | BL3 | BL4 | BL5 | BL6 | BL7 | BL8 | BL9 | BL10 | BL11 | BL12 | BL13 | BL14 |
|---|---|---|---|---|---|---|---|---|---|---|---|---|---|---|---|
| WLn | Er | a1 | a2 | a3 | a4 | a5 | a6 | A-D | e1 | e2 | e3 | e4 | e5 | e6 | E-G |

↓ ER1

| | | | | | | | | | | | | | | | |
|---|---|---|---|---|---|---|---|---|---|---|---|---|---|---|---|
| SA | 0 | 0 | 0 | 0 | 0 | 0 | 0 | 0 | 1 | 1 | 1 | 1 | 1 | 1 | 1 |
| DDL | 0 | 0 | 0 | 0 | 0 | 0 | 0 | 1 | 0 | 0 | 0 | 0 | 0 | 0 | 0 |
| LDL | 1 | 1 | 1 | 1 | 1 | 1 | 1 | 1 | 0 | 0 | 0 | 0 | 0 | 0 | 0 |

F I G. 91

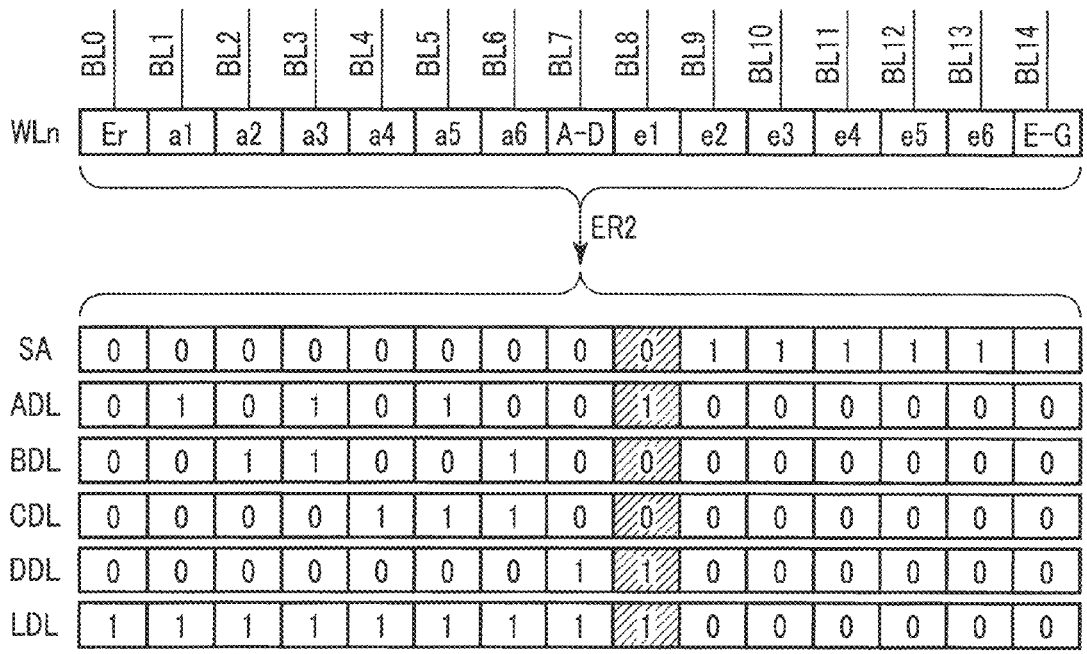
F I G. 92
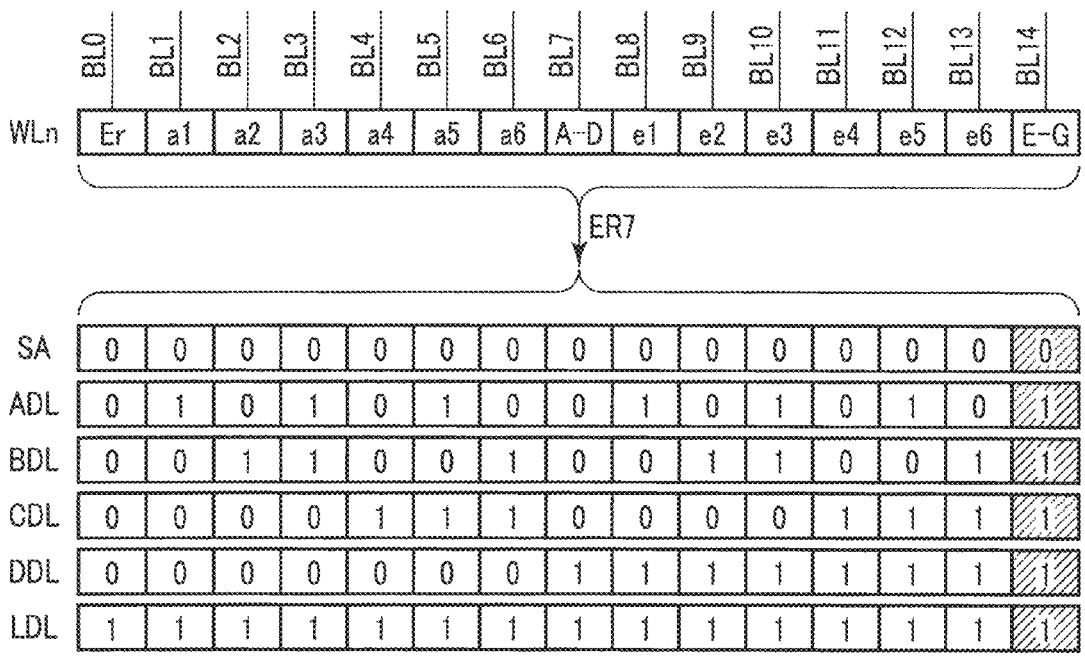
F I G. 93

| | BL0 | BL1 | BL2 | BL3 | BL4 | ...... | BL13 | BL14 | BL15 | BL16 | BL17 | BL18 | BL19 | ...... | BL28 | BL29 |
|---|---|---|---|---|---|---|---|---|---|---|---|---|---|---|---|---|
| ADL | 0 | 1 | 0 | 1 | 0 | ... | 0 | 1 | 0 | 1 | 0 | 1 | 0 | ... | 0 | 1 |
| BDL | 0 | 0 | 1 | 1 | 0 | ... | 1 | 1 | 0 | 0 | 1 | 1 | 0 | ... | 1 | 1 |
| CDL | 0 | 0 | 0 | 0 | 1 | ... | 1 | 1 | 0 | 0 | 0 | 0 | 1 | ... | 1 | 1 |
| DDL | 0 | 0 | 0 | 0 | 0 | ... | 1 | 1 | 0 | 0 | 0 | 0 | 0 | ... | 1 | 1 |
| UDL | 0 | 0 | 0 | 0 | 0 | ... | 0 | 0 | 1 | 1 | 1 | 1 | 1 | ... | 1 | 1 |
| LDL | 0 | 1 | 0 | 0 | 0 | ... | 0 | 0 | 0 | 0 | 0 | 0 | 0 | ... | 0 | 0 |

| | BL0 | BL1 | BL2 | BL3 | BL4 | ...... | BL13 | BL14 | BL15 | BL16 | BL17 | BL18 | BL19 | ...... | BL28 | BL29 |
|---|---|---|---|---|---|---|---|---|---|---|---|---|---|---|---|---|
| ADL | 0 | 1 | 0 | 1 | 0 | ... | 0 | 1 | 0 | 1 | 0 | 1 | 0 | ... | 0 | 1 |
| BDL | 0 | 0 | 1 | 1 | 0 | ... | 1 | 1 | 0 | 0 | 1 | 1 | 0 | ... | 1 | 1 |
| CDL | 0 | 0 | 0 | 0 | 1 | ... | 1 | 1 | 0 | 0 | 0 | 0 | 1 | ... | 1 | 1 |
| DDL | 0 | 0 | 0 | 0 | 0 | ... | 1 | 1 | 0 | 0 | 0 | 0 | 0 | ... | 1 | 1 |
| UDL | 0 | 0 | 0 | 0 | 0 | ... | 0 | 0 | 1 | 1 | 1 | 1 | 1 | ... | 1 | 1 |
| LDL | 0 | 0 | 1 | 0 | 0 | ... | 0 | 0 | 0 | 0 | 0 | 0 | 0 | ... | 0 | 0 |

| | |
|---|---|
| REG0 | The number of cells with "Er" level in GP1 |
| REG1 | The number of cells with "a1" level in GP1 |
| REG2 | The number of cells with "a2" level in GP1 |
| REG3 | The number of cells with "a3" level in GP1 |
| REG4 | The number of cells with "a4" level in GP1 |
| REG5 | The number of cells with "a5" level in GP1 |
| REG6 | The number of cells with "a6" level in GP1 |
| REG7 | The number of cells with "A-D" level in GP1 |
| REG8 | The number of cells with "e1" level in GP1 |
| REG9 | The number of cells with "e2" level in GP1 |
| REG10 | The number of cells with "e3" level in GP1 |
| REG11 | The number of cells with "e4" level in GP1 |
| REG12 | The number of cells with "e5" level in GP1 |
| REG13 | The number of cells with "e6" level in GP1 |

| REG0 | The number of cells with "Er" level in GP2 |
|---|---|
| REG1 | The number of cells with "a1" level in GP2 |
| REG2 | The number of cells with "a2" level in GP2 |
| REG3 | The number of cells with "a3" level in GP2 |
| REG4 | The number of cells with "a4" level in GP2 |
| REG5 | The number of cells with "a5" level in GP2 |
| REG6 | The number of cells with "a6" level in GP2 |
| REG7 | The number of cells with "A-D" level in GP2 |
| REG8 | The number of cells with "e1" level in GP2 |
| REG9 | The number of cells with "e2" level in GP2 |
| REG10 | The number of cells with "e3" level in GP2 |
| REG11 | The number of cells with "e4" level in GP2 |
| REG12 | The number of cells with "e5" level in GP2 |
| REG13 | The number of cells with "e6" level in GP2 |

F I G. 105

4th STB

| WLn | Er | a1 | a2 | a3 | a4 | a5 | a6 | A-D | e1 | e2 | e3 | e4 | e5 | e6 | E-G |
|---|---|---|---|---|---|---|---|---|---|---|---|---|---|---|---|
| | BL0 | BL1 | BL2 | BL3 | BL4 | BL5 | BL6 | BL7 | BL8 | BL9 | BL10 | BL11 | BL12 | BL13 | BL14 |
| ADL | 0 | 1 | 0 | 1 | 0 | 1 | 0 | 0 | 1 | 0 | 1 | 0 | 1 | 0 | 1 |
| BDL | 0 | 0 | 1 | 1 | 0 | 0 | 1 | 0 | 0 | 1 | 1 | 0 | 0 | 1 | 1 |
| CDL | 0 | 0 | 0 | 0 | 1 | 1 | 1 | 0 | 0 | 0 | 0 | 1 | 1 | 1 | 1 |
| DDL | 0 | 0 | 0 | 0 | 0 | 0 | 0 | 1 | 1 | 1 | 1 | 1 | 1 | 1 | 1 |
| UDL | 0 | 0 | 0 | 0 | 0 | 0 | 0 | 0 | 0 | 0 | 0 | 0 | 0 | 0 | 0 |
| LDL | 1 | 1 | 1 | 1 | 0 | 0 | 0 | 0 | 0 | 0 | 0 | 0 | 0 | 0 | 0 |

F I G. 106

| WLn | Er | a1 | a2 | a3 | a4 | a5 | a6 | A-D | e1 | e2 | e3 | e4 | e5 | e6 | E-G |
|---|---|---|---|---|---|---|---|---|---|---|---|---|---|---|---|
| | BL0 | BL1 | BL2 | BL3 | BL4 | BL5 | BL6 | BL7 | BL8 | BL9 | BL10 | BL11 | BL12 | BL13 | BL14 |
| ADL | 0 | 1 | 0 | 1 | 0 | 1 | 0 | 0 | 1 | 0 | 1 | 0 | 1 | 0 | 1 |
| BDL | 0 | 0 | 1 | 1 | 0 | 0 | 1 | 0 | 0 | 1 | 1 | 0 | 0 | 1 | 1 |
| CDL | 0 | 0 | 0 | 0 | 1 | 1 | 1 | 0 | 0 | 0 | 0 | 1 | 1 | 1 | 1 |
| DDL | 0 | 0 | 0 | 0 | 0 | 0 | 0 | 1 | 1 | 1 | 1 | 1 | 1 | 1 | 1 |
| UDL | 0 | 0 | 0 | 0 | 0 | 0 | 0 | 0 | 0 | 0 | 0 | 0 | 0 | 0 | 0 |
| LDL | 1 | 1 | 1 | 1 | 0 | 0 | 0 | 0 | 0 | 0 | 0 | 1 | 1 | 1 | 1 |

11th STB ↓ (above e3/BL11)

F I G. 107

| WLn | Er | a1 | a2 | a3 | a4 | a5 | a6 | A-D | e1 | e2 | e3 | e4 | e5 | e6 | E-G |
|---|---|---|---|---|---|---|---|---|---|---|---|---|---|---|---|
| | BL0 | BL1 | BL2 | BL3 | BL4 | BL5 | BL6 | BL7 | BL8 | BL9 | BL10 | BL11 | BL12 | BL13 | BL14 |
| XDL | 1 | 1 | 1 | 1 | 0 | 0 | 0 | 0 | 0 | 0 | 0 | 1 | 1 | 1 | 1 |

F I G. 108

5th STB ↓

| WLn | Er | a1 | a2 | a3 | a4 | a5 | a6 | A-D | e1 | e2 | e3 | e4 | e5 | e6 | E-G |
|---|---|---|---|---|---|---|---|---|---|---|---|---|---|---|---|
| | BL15 | BL16 | BL17 | BL18 | BL19 | BL20 | BL21 | BL22 | BL23 | BL24 | BL25 | BL26 | BL27 | BL28 | BL29 |
| ADL | 0 | 1 | 0 | 1 | 0 | 1 | 0 | 0 | 1 | 0 | 1 | 0 | 1 | 0 | 1 |
| BDL | 0 | 0 | 1 | 1 | 0 | 0 | 1 | 0 | 0 | 1 | 1 | 0 | 0 | 1 | 1 |
| CDL | 0 | 0 | 0 | 0 | 1 | 1 | 1 | 0 | 0 | 0 | 0 | 1 | 1 | 1 | 1 |
| DDL | 0 | 0 | 0 | 0 | 0 | 0 | 0 | 1 | 1 | 1 | 1 | 1 | 1 | 1 | 1 |
| UDL | 1 | 1 | 1 | 1 | 1 | 1 | 1 | 1 | 1 | 1 | 1 | 1 | 1 | 1 | 1 |
| LDL | 1 | 1 | 1 | 1 | 1 | 0 | 0 | 0 | 0 | 0 | 0 | 0 | 0 | 0 | 0 |

FIG. 109

12th STB ↓

| WLn | Er | a1 | a2 | a3 | a4 | a5 | a6 | A-D | e1 | e2 | e3 | e4 | e5 | e6 | E-G |
|---|---|---|---|---|---|---|---|---|---|---|---|---|---|---|---|
| | BL15 | BL16 | BL17 | BL18 | BL19 | BL20 | BL21 | BL22 | BL23 | BL24 | BL25 | BL26 | BL27 | BL28 | BL29 |
| ADL | 0 | 1 | 0 | 1 | 0 | 1 | 0 | 0 | 1 | 0 | 1 | 0 | 1 | 0 | 1 |
| BDL | 0 | 0 | 1 | 1 | 0 | 0 | 1 | 0 | 0 | 1 | 1 | 0 | 0 | 1 | 1 |
| CDL | 0 | 0 | 0 | 0 | 1 | 1 | 1 | 0 | 0 | 0 | 0 | 1 | 1 | 1 | 1 |
| DDL | 0 | 0 | 0 | 0 | 0 | 0 | 0 | 1 | 1 | 1 | 1 | 1 | 1 | 1 | 1 |
| UDL | 1 | 1 | 1 | 1 | 1 | 1 | 1 | 1 | 1 | 1 | 1 | 1 | 1 | 1 | 1 |
| LDL | 1 | 1 | 1 | 1 | 1 | 0 | 0 | 0 | 0 | 0 | 0 | 0 | 1 | 1 | 1 |

FIG. 110

| WLn | Er | a1 | a2 | a3 | a4 | a5 | a6 | A-D | e1 | e2 | e3 | e4 | e5 | e6 | E-G |
|---|---|---|---|---|---|---|---|---|---|---|---|---|---|---|---|
| | BL15 | BL16 | BL17 | BL18 | BL19 | BL20 | BL21 | BL22 | BL23 | BL24 | BL25 | BL26 | BL27 | BL28 | BL29 |
| XDL | 1 | 1 | 1 | 1 | 1 | 0 | 0 | 0 | 0 | 0 | 0 | 0 | 1 | 1 | 1 |

FIG. 111

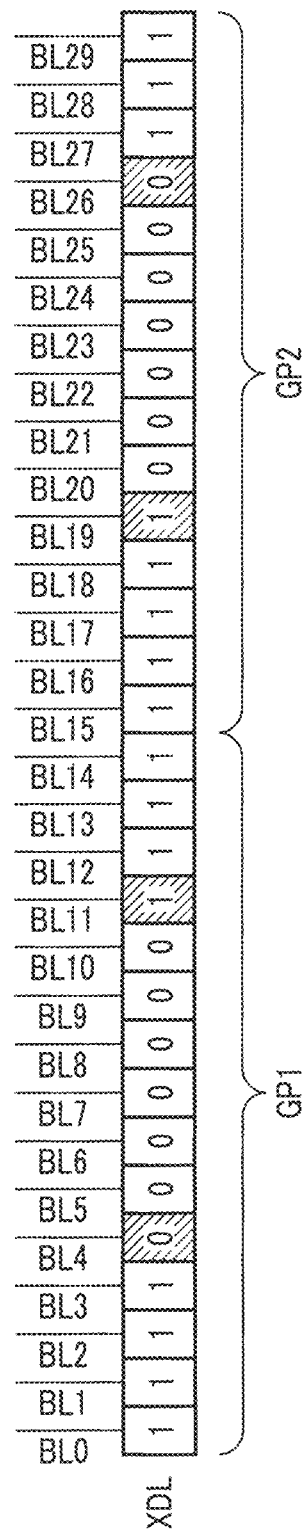
F I G. 112

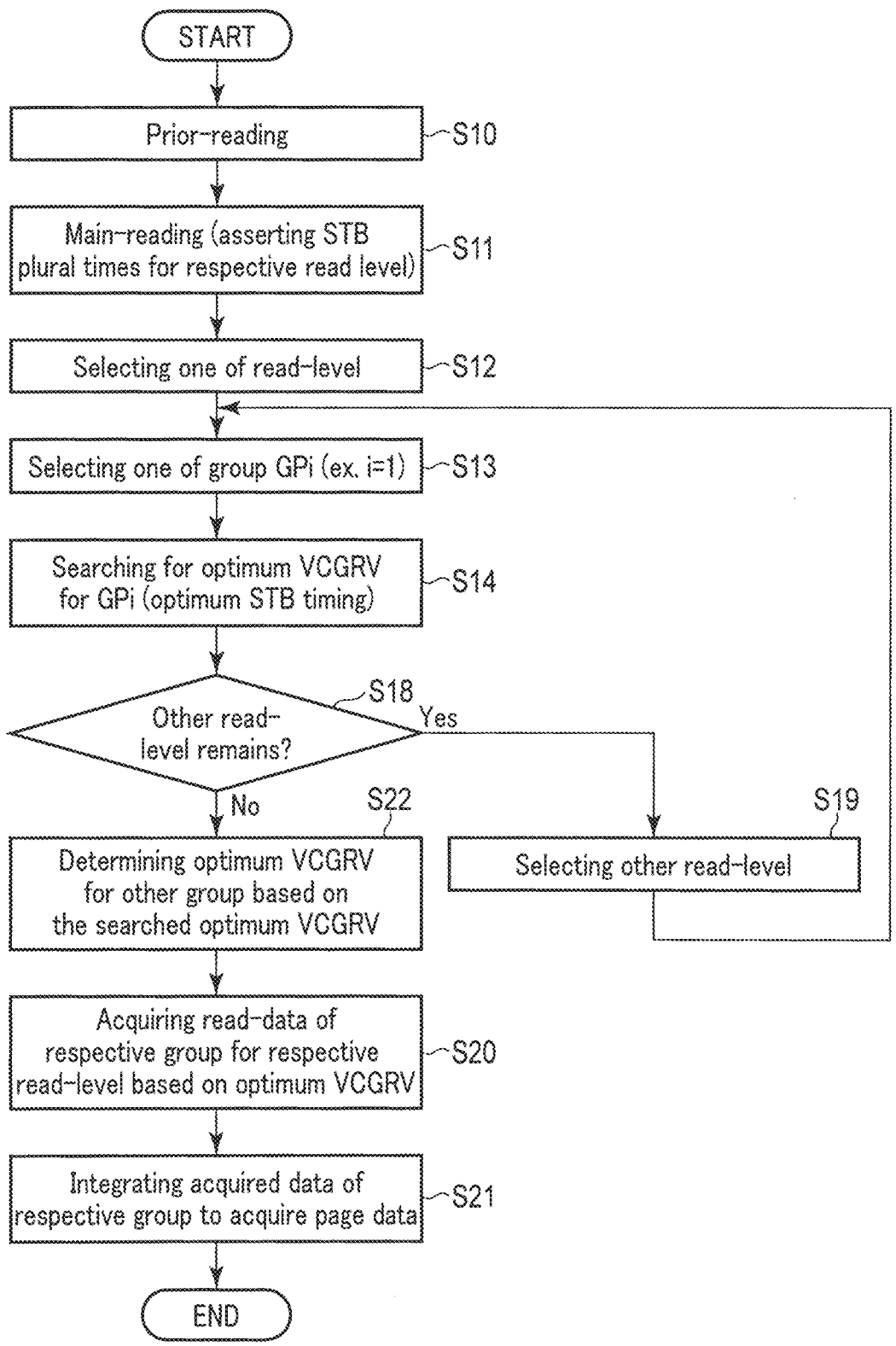
F I G. 113

| Read target page | Read level | Adjacent WL Vth | Low (Er, A) | Middle (B-E) | High (F, G) |
|---|---|---|---|---|---|
| Lower page | AR | WL(n+1) | +0 | +1 | +2 |
| | | WL(n-1) | +0 | +1 | +2 |
| | ER | WL(n+1) | +0 | +1 | +2 |
| Middle page | BR,DR,FR | WL(n+1) | +0 | +1 | +2 |
| Upper page | CR,GR | WL(n+1) | +0 | +1 | +2 |

F I G. 115

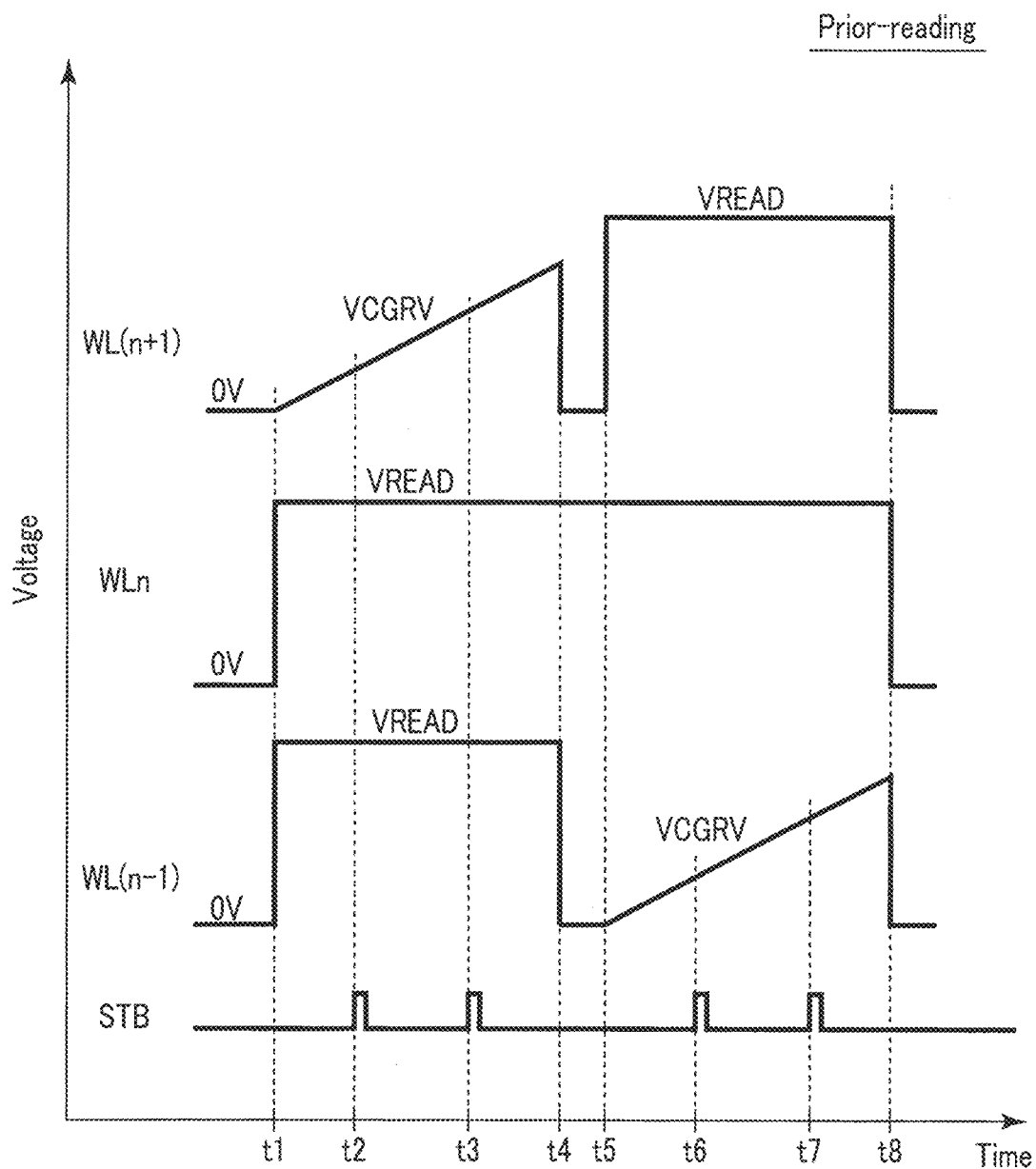
F I G. 116

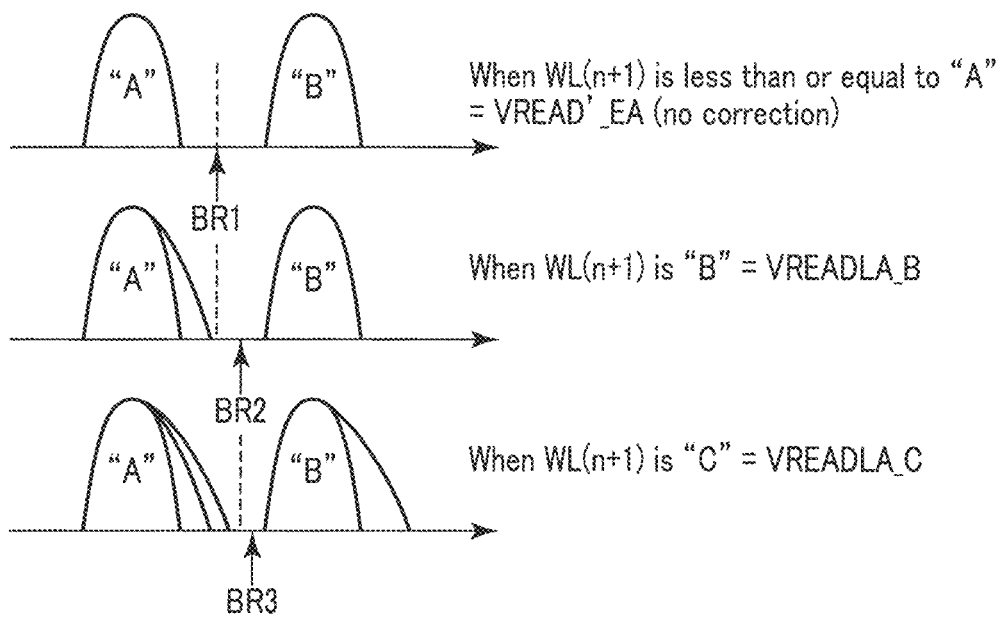
F I G. 120
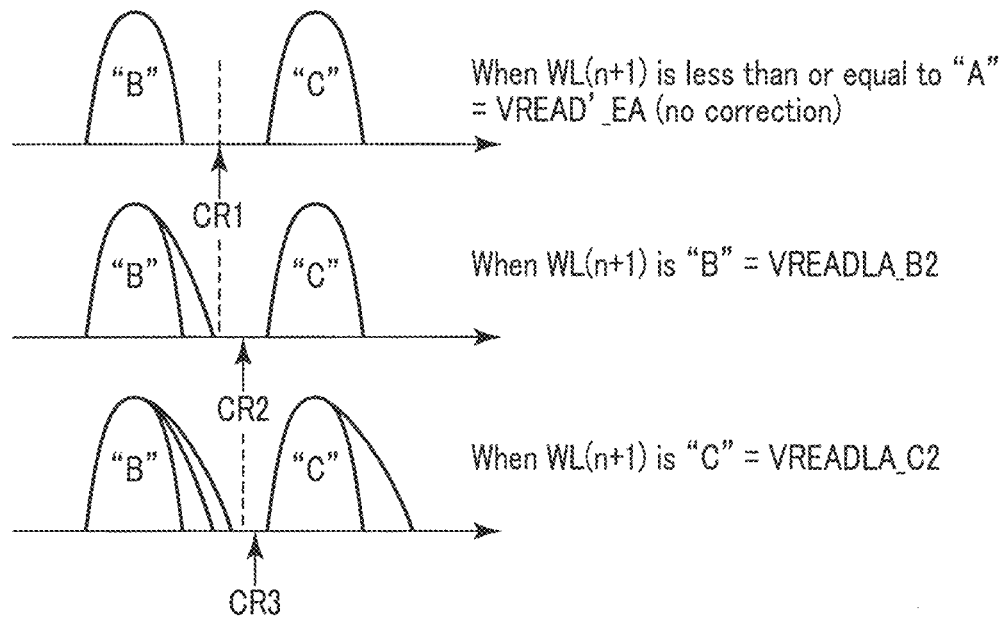
F I G. 121

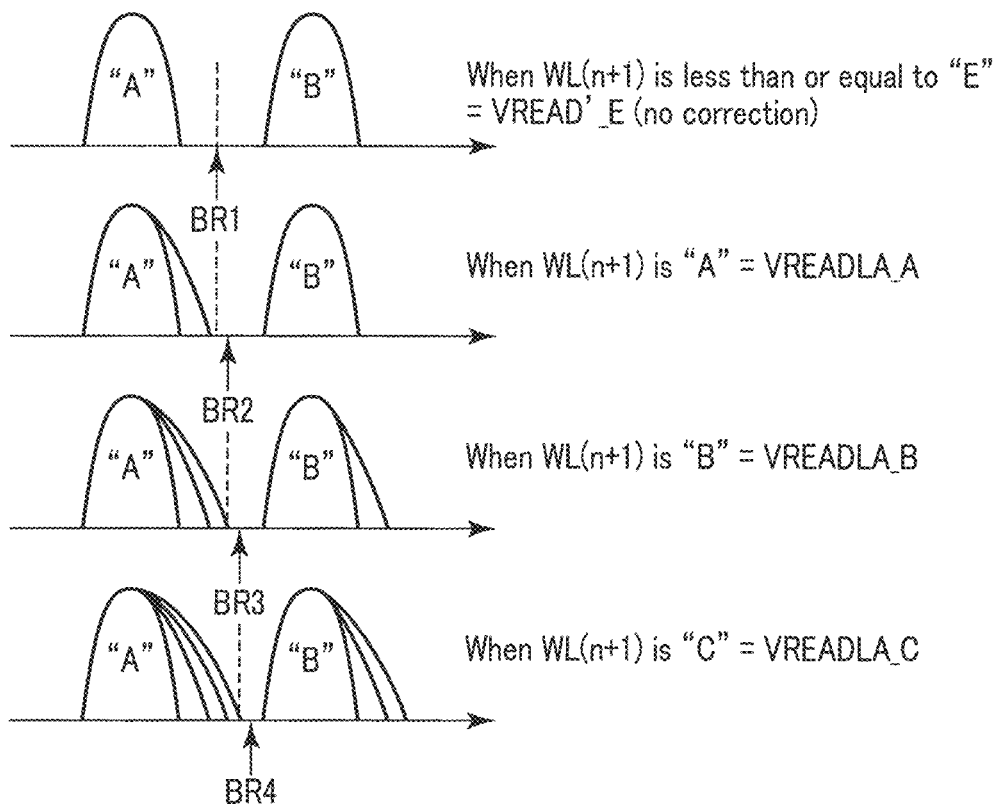
F I G. 122

| | VREAD'_E | VREADLA_A | VREADLA_B | VREADLA_C |
|---|---|---|---|---|
| WL0 | ΔVE0 | ΔVA0 | ΔVB0 | ΔVC0 |
| WL1 | ΔVE1 | ΔVA1 | ΔVB1 | ΔVC1 |
| WL2 | ΔVE2 | ΔVA2 | ΔVB2 | ΔVC2 |
| WL3 | ΔVE3 | ΔVA3 | ΔVB3 | ΔVC3 |
| ⋮ | ⋮ | ⋮ | ⋮ | ⋮ |

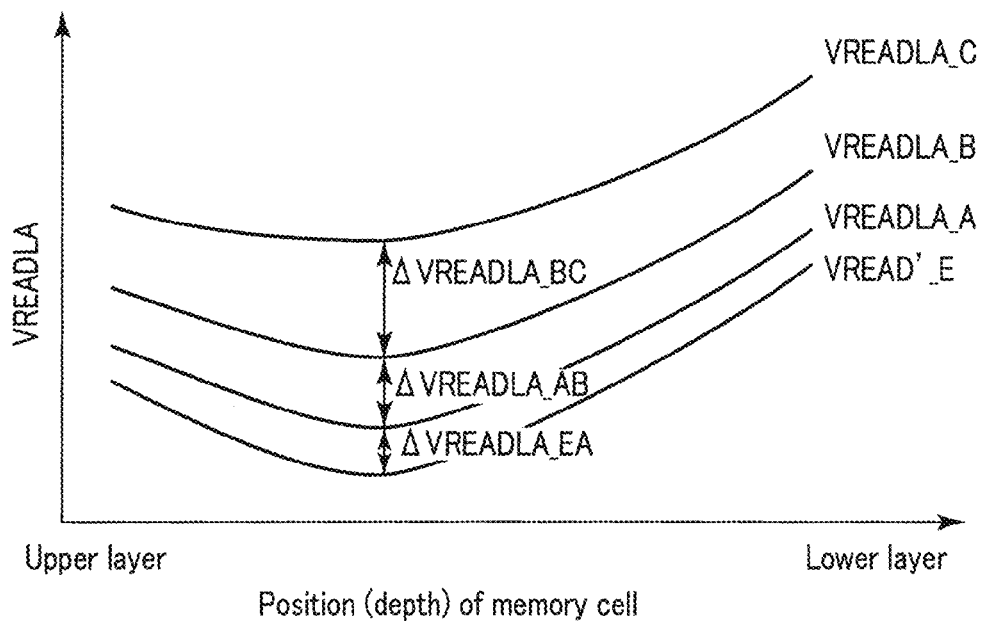
F I G. 127
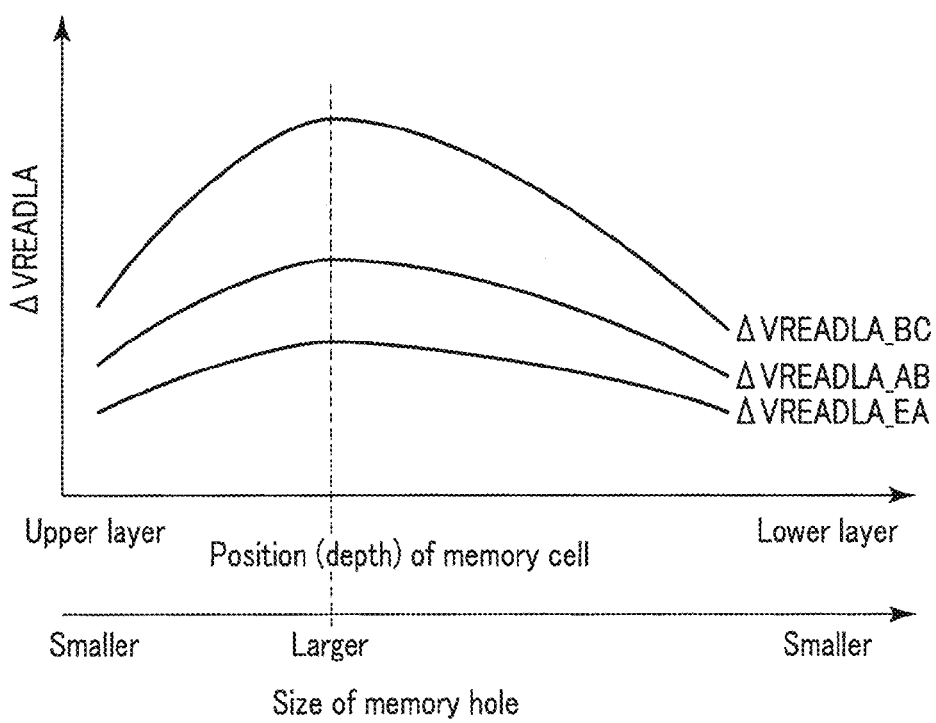
F I G. 128

SEMICONDUCTOR MEMORY DEVICE

CROSS-REFERENCE TO RELATED APPLICATIONS

This application is a Continuation-in-Part Application of U.S. patent application Ser. No. 14/645,740, filed Mar. 12, 2015 and based upon and claims the benefit of priority from Japanese Patent Application No. 2014-188192, filed Sep. 16, 2014, the entire contents of all of which are incorporated herein by reference.

FIELD

Embodiments described herein relate generally to a semiconductor memory device.

BACKGROUND

A NAND flash memory in which memory cells are three-dimensionally arrayed has been known.

BRIEF DESCRIPTION OF THE DRAWINGS

FIG. 2 and FIG. 3 are a circuit diagram and a sectional view of a memory cell array of the semiconductor memory device according to the first embodiment, respectively;

FIG. 7 is a circuit diagram of the NAND string of the semiconductor memory device according to the first embodiment and shows voltages applied to the respective interconnects during data reading;

FIG. 8 is a timing chart showing the changes of word line voltages during data reading of the semiconductor memory device according to the first embodiment;

FIG. 10 is a timing chart showing the changes of the word line voltages during data reading of the semiconductor memory device according to the first embodiment;

FIG. 11 is a schematic diagram showing page data and data fixed in a latch circuit in a sense amplifier during lower bit reading of the semiconductor memory device according to the first embodiment;

FIG. 12 to FIG. 16 are schematic diagrams showing models of charge distributions during writing, respectively;

FIG. 20 is a timing chart showing the changes of the word line voltages during data reading of the semiconductor memory device according to the second embodiment;

FIG. 24 is a circuit diagram of a NAND string of the semiconductor memory device according to a third embodiment and shows voltages applied to the respective interconnects during a data-verification;

FIG. 26 is a timing chart showing the changes of the word line voltages during data reading of the semiconductor memory device according to the third embodiment;

FIG. 31 is a timing chart showing the changes of the word line voltages during data writing of the semiconductor memory device according to a fourth embodiment;

FIG. 33 is a schematic diagram showing the state of a charge in a partial area of the NAND string of the semiconductor memory device according to the fourth embodiment;

FIG. 34 and FIG. 35 are graphs showing layer dependence of voltages VREADLA of the semiconductor memory device according to a fifth embodiment, respectively;

FIG. 36 is a conceptual diagram of a correction table of the semiconductor memory device according to the fifth embodiment;

FIG. 45A and FIG. 45B are timing charts showing the changes of the word line voltages during data reading of the semiconductor memory device according to a sixth embodiment;

FIG. 46 is a schematic diagram showing page data and data fixed in a latch circuit in a sense amplifier during upper bit reading of the semiconductor memory device according to the sixth embodiment;

FIG. 47 is a schematic diagram showing the variation of the threshold distribution of the memory cells;

FIG. 50 is a block diagram of a semiconductor memory device according to a seventh embodiment;

FIG. 54A and FIG. 54B are plan views showing details of an area A1 in FIG. 53;

FIG. 55 and FIG. 56 are timing charts of various signals during data writing and reading of the semiconductor memory device according to the seventh embodiment, respectively;

FIG. 58 to FIG. 62 are timing charts showing the changes of the word line voltages during data reading of a semiconductor memory device according to an eighth embodiment;

FIG. 63 is a timing chart showing the changes of the word line voltages during data writing of the semiconductor memory device according to the eighth embodiment;

FIG. 64A and FIG. 64B are timing charts showing the changes of the word line voltages during data reading of the semiconductor memory device according to the eighth embodiment;

FIG. 65 is a block diagram of the semiconductor memory device according to the eighth embodiment;

FIG. 66 is a circuit diagram of a sense circuit according to a ninth embodiment;

FIG. 68 is an enlarged view of voltage changes of a word line WL(n+1);

FIG. 69 is a diagram showing a relation between threshold distributions that can be adopted by memory cells according to a tenth embodiment and a read operation;

FIG. 70 is a block diagram of a semiconductor memory device according to the tenth embodiment;

FIG. 72 is a timing chart showing the word line voltages and the strobe signal during reading according to the tenth embodiment;

FIG. 73 and FIG. 74 are schematic diagrams showing page data and data retained in a sense amplifier during low-order page reading of the semiconductor memory device according to the tenth embodiment;

FIG. 75 is an enlarged view the voltage changes of the word line WL(n+1) and the strobe signal;

FIG. 76 is a timing chart showing the word line voltages and the strobe signal during reading according to an eleventh embodiment;

FIG. 79 is a flow chart of the read operation according to the eleventh embodiment;

FIG. 82 to FIG. 99 are schematic diagrams showing the page data and data retained in the sense amplifier during low-order page reading of the semiconductor memory device according to the twelfth embodiment;

FIG. 100 is a diagram showing data in a register during low-order page reading of the semiconductor memory device according to the twelfth embodiment;

Figures 102, 103:
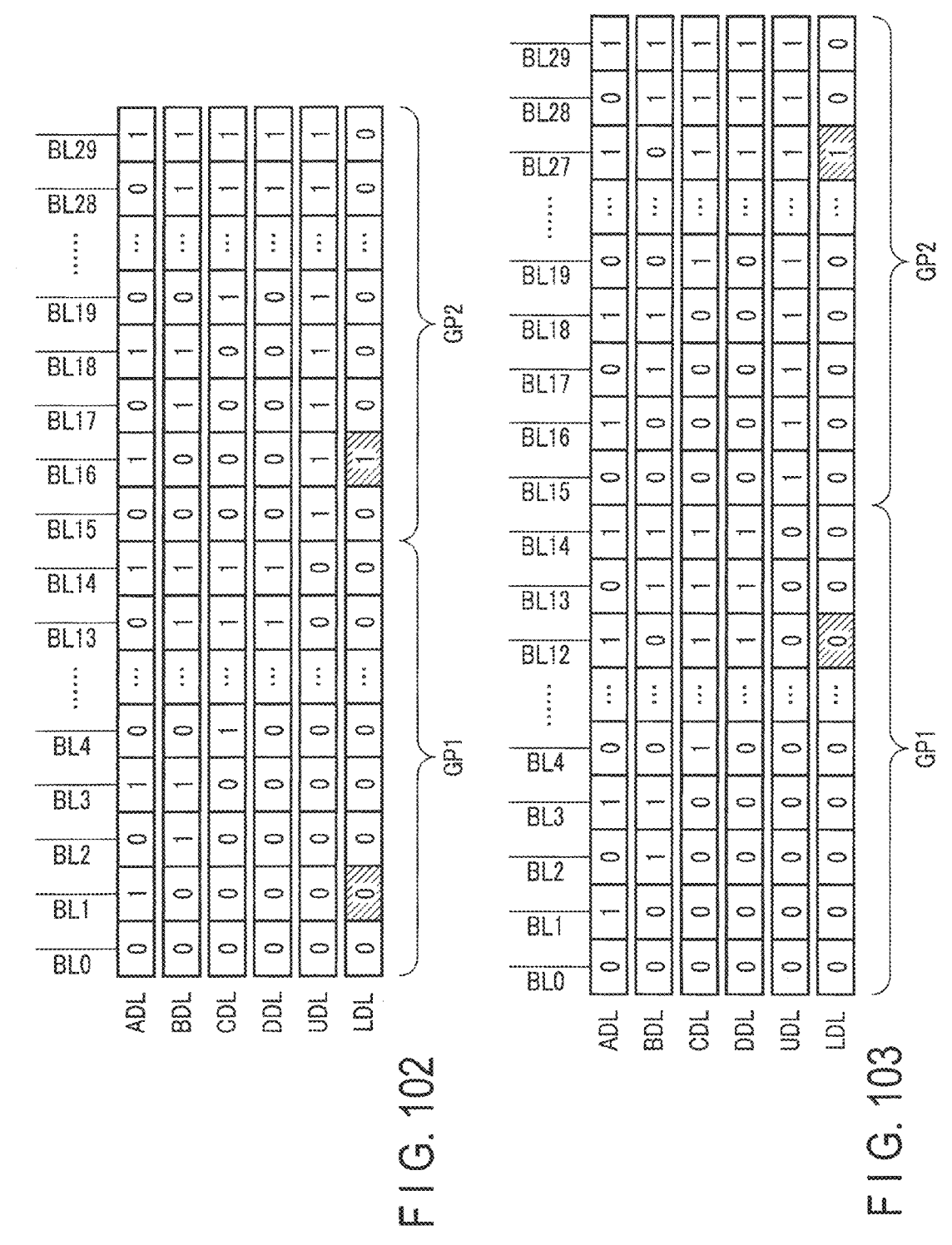

FIG. 101 to FIG. 104 are schematic diagrams showing the data retained in the sense amplifier during low-order page reading of the semiconductor memory device according to the twelfth embodiment;

FIG. 105 is a diagram showing the data in the register during low-order page reading of the semiconductor memory device according to the twelfth embodiment;

FIG. 106 to FIG. 112 are schematic diagrams showing the data retained in the sense amplifier during low-order page reading of the semiconductor memory device according to the twelfth embodiment;

FIG. 113 is a flow chart of the read operation according to a thirteenth embodiment;

FIG. 115 is a diagram showing the concept of the read operation according to the thirteenth embodiment; and FIG. 116 and FIG. 117 are timing charts showing the threshold voltages of memory cells, the word line voltages and the strobe signal during reading according to the thirteenth embodiment.

FIG. 118 to FIG. 120 are conceptual diagrams of corrective reading of the semiconductor memory device according to the first embodiment, respectively;

FIG. 121 and FIG. 122 are conceptual diagrams of corrective reading of the semiconductor memory device according to the second embodiment, respectively;

FIG. 127 is a graph showing layer dependence of the voltages VREADLA of the semiconductor memory device according to a modification of the fifth embodiment; and FIG. 128 is a graph showing layer dependence of change amounts of the voltages VREADLA of the semiconductor memory device according to the fifth embodiment.

DETAILED DESCRIPTION

In general, according to one embodiment, a semiconductor memory device includes: a first memory cell; a second memory cell adjacent to the first memory cell; a first word line coupled to the first memory cell; and a second word line coupled to the second memory cell. When data is read from the first memory cell, a first voltage and a second voltage different from the first voltage are applied to the first word line. A voltage applied to the second word line varies continuously by a first potential difference with time while the first voltage is applied to the first word line. The voltage applied to the second word line varies continuously by a second potential difference different from the first potential difference with time while the second voltage is applied to the first word line.

1. First Embodiment

A semiconductor memory device according to a first embodiment is described. A three-dimensionally stacked NAND flash memory in which memory cells are stacked above a semiconductor substrate is described below by way of example as the semiconductor memory device.

1.1 Regarding Configuration of NAND Flash Memory

First, the configuration of the NAND flash memory is described.

1.1.1 Regarding Overall Configuration of NAND Flash Memory

Figure 1:
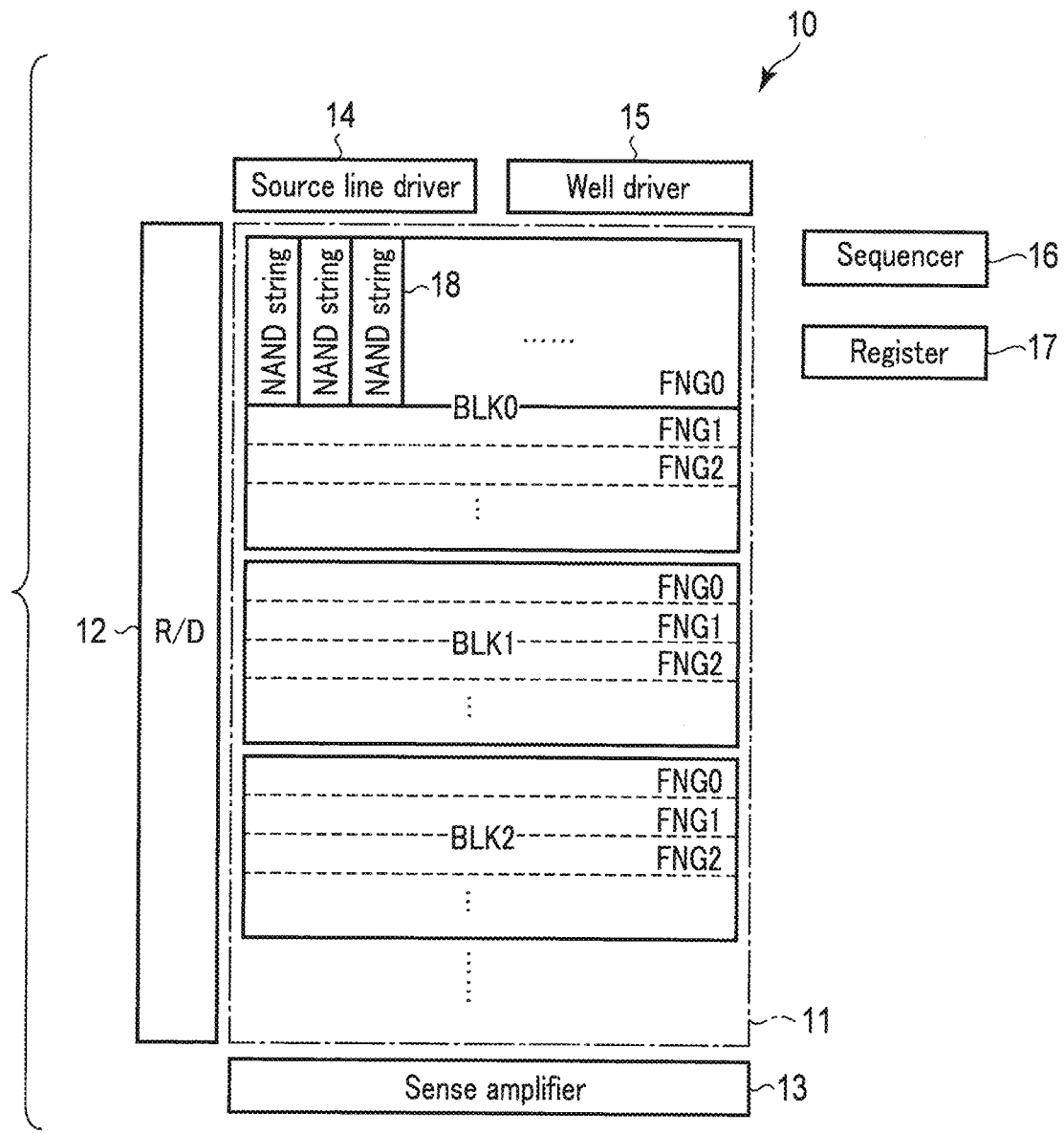
FIG. 1 is a block diagram of a semiconductor memory device according to a first embodiment.

FIG. 1 is a block diagram of the NAND flash memory according to the present embodiment. As shown, a NAND flash memory 10 includes a memory cell array 11, a row decoder 12, a sense amplifier 13, a source line driver 14, a well driver 15, a sequencer 16, and a register 17.

The memory cell array 11 includes blocks BLK (BLK0, BLK1, BLK2, . . . ) each of which is a set of nonvolatile memory cells associated with word lines and bit lines. The block BLK serves as an erase unit, and data in the same block BLK are collectively erased. Each of the blocks BLK includes sets (these are referred to as fingers FNG (FNG0, FNG1, FNG2, . . . )) of NAND strings 18 in which the memory cells are connected in series. The number of blocks in the memory cell array 11 and the number of fingers in one block BLK are arbitrary. The data erasing operation may be executed in units of a region equal to or smaller than the block BLK. The data erasing operation is described in U.S. patent application Ser. No. 13/235,389, filed Sep. 18, 2011, entitled "NONVOLATILE SEMICONDUCTOR MEMORY DEVICE", U.S. patent application Ser. No. 12/694,690, filed Jan. 27, 2010, entitled "NON-VOLATILE SEMICONDUCTOR STORAGE DEVICE", and U.S. patent application Ser. No. 13/483,610, filed May 30, 2012, entitled "NONVOLATILE SEMICONDUCTOR MEMORY DEVICE AND DATA ERASE METHOD THEREOF", the entire contents of which are hereby expressly incorporated by reference herein.

The row decoder 12 decodes a block address and a page address to select one of the word lines in the corresponding block. The row decoder 12 then applies necessary voltages to the selected word line and unselected word lines.

During data reading, the sense amplifier 13 senses data read from the memory cells to the bit line. During data writing, the sense amplifier 13 transfers write data to the memory cells. Data is read and written in the memory cell array 11 in units of a page.

The source line driver 14 applies a voltage to a source line.

The well driver 15 applies a voltage to a well region in which the NAND strings 18 are formed.

The register 17 holds various signals. For example, the register 17 holds the status of a data write or erase operation, and thereby informs a controller of whether the operation has been normally completed. Alternatively, the register 17 can hold a command or an address received from a controller 200, and also hold various tables.

The sequencer 16 controls the overall operation of the NAND flash memory 10.

1.1.2 Regarding Memory Cell Array 11

Now, details of the configuration of the memory cell array 11 are described. FIG. 2 is a circuit diagram of one block BLK. The other blocks BLK are similar in configuration.

As shown, the block BLK includes, for example, four fingers FNG (FNG0 to FNG3). Each of the fingers FNG includes the NAND strings 18.

Each of the NAND strings 18 includes, for example, 8 memory cell transistors MT (MT0 to MT7), and selection transistors ST (ST1 and ST2). A dummy transistor may be provided between the memory cell transistor MT and the selection transistor ST, and such an example will be described later in a seventh embodiment.

The memory cell transistor MT includes a control gate and a charge storage layer, and holds data in a nonvolatile manner. The number of the memory cell transistors MT is not limited to 8, and may be, for example, 16, 32, 64, and 128. The number is not limited. The memory cell transistors MT are arranged so that their current paths are connected in series between the selection transistors ST1 and ST2. The current path of the memory cell transistor MT7 at one end of the serial connection is connected to one end of the current path of the selection transistor ST1, and the current path of the memory cell transistor MT0 at the other end is connected to one end of the current path of the selection transistor ST2.

The gates of the selection transistors ST1 of the fingers FNG0 to FNG3 are connected to selection gate lines SGD0 to SGD3, respectively. On the other hand, the gates of the selection transistors ST2 are connected in common to the same selection gate line SGS among the fingers. The control gates of the memory cell transistors MT0 to MT7 in the same block are connected in common to word lines WL0 to WL7, respectively.

That is to say, while the word lines WL0 to WL7 and the selection gate line SGS are connected in common among the fingers FNG0 to FNG3 in the same block BLK, the selection gate lines SGD are independent for the fingers FNG0 to FNG3 even in the same block.

The other ends of the current paths of the selection transistors ST1 of the NAND strings 18 in the same row among the NAND strings 18 arranged in matrix in the memory cell array 11 are connected in common to one of bit lines BL (BL0 to BL(L−1), (L−1) is a natural number equal to or more than 1). That is to say, the bit line BL connects the NAND strings 18 in common among the blocks BLK. The other ends of the current paths of the selection transistors ST2 are connected in common to a source line SL. For example, the source line SL connects the NAND strings 18 in common among the blocks.

Data is collectively read and written in the memory cell transistors MT connected in common to one of the word lines WL in one of the fingers FNG in one of the blocks. This unit is called the "page".

Figure 3:
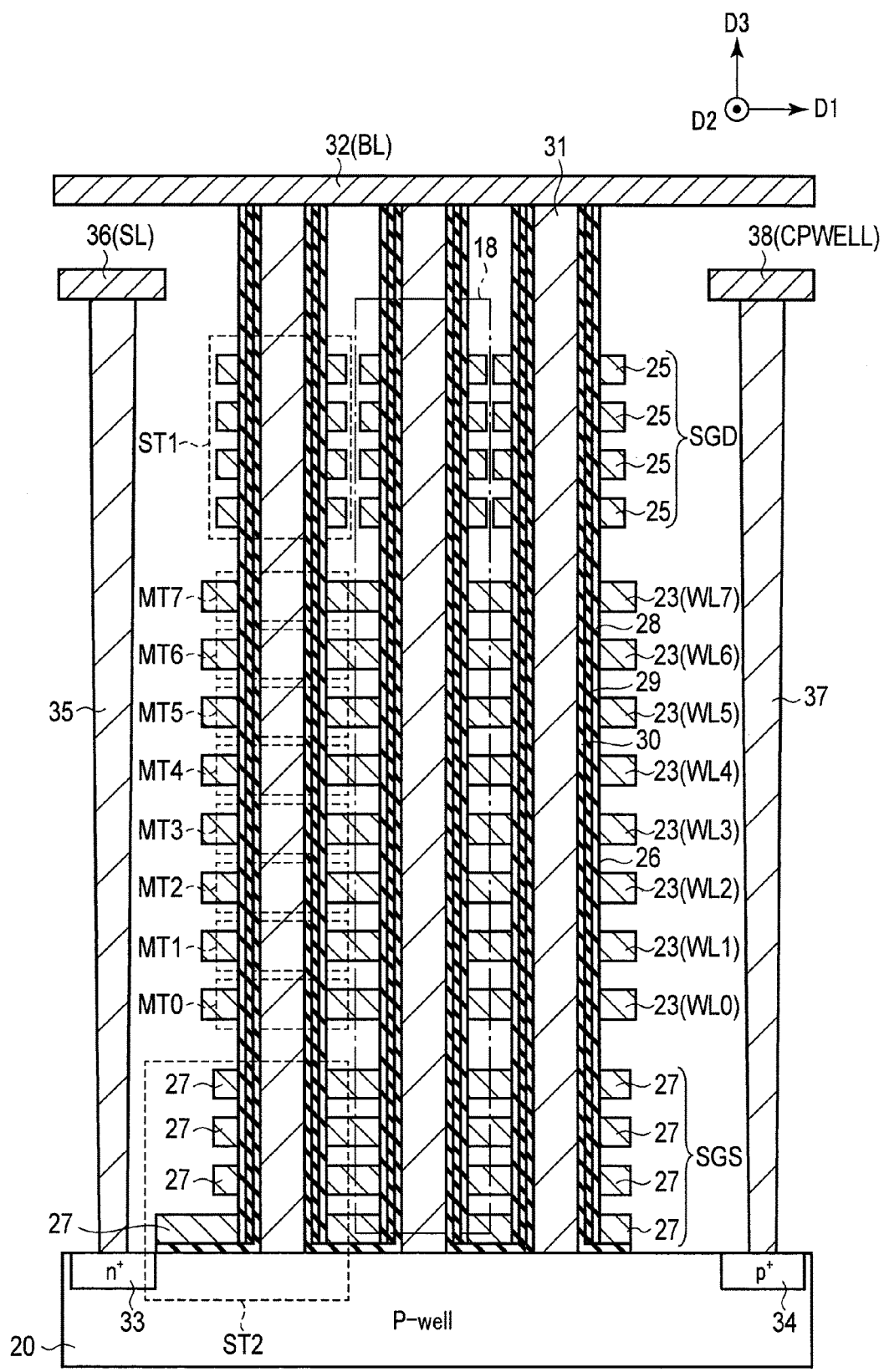

FIG. 3 is a sectional view of a partial area of the memory cell array 11 according to the present embodiment. As shown, the NAND strings 18 are provided on a p-type well region 20. That is to say, interconnect layers 27 which function as the selection gate lines SGS, interconnect layers 23 which function as the word lines WL, and interconnect layers 25 which function as the selection gate lines SGD are provided above the p-type well region 20.

A memory hole 26 which reaches the well region 20 through the interconnect layers 25, 23, and 27 is made. A block insulating film 28, a charge storage layer 29 (insulating film), and a gate insulating film 30 are sequentially provided on the side surface of the memory hole 26, and the memory hole 26 is further filled with an electrically conductive film 31. The conductive film 31 functions as the current path of the NAND string 18, and is an area where a channel is formed during the operations of the memory cell transistors MT and the selection transistors ST.

The multiple (four in this example) interconnect layers 27 provided in each of the NAND strings 18 are electrically connected in common, and are connected to the same selection gate line SGS. That is to say, the four interconnect layers 27 substantially function as a gate electrode of one selection transistor ST2. The same also applies to the selection transistor ST1 (four selection gate lines SGD).

According to the configuration described above, the selection transistor ST2, the memory cell transistors MT, and the selection transistor ST1 are sequentially stacked on the well region 20, in each of the NAND strings 18.

In the example shown in FIG. 3, the selection transistor ST includes the charge storage layer 29 in the same manner as the memory cell transistor MT. However, the selection transistor ST does not substantially function as a memory cell to hold data, but functions as a switch. Therefore, a threshold at which the selection transistor ST is switched on/off may be controlled by the charging of the charge storage layer 29.

A interconnect layer 32 which functions as the bit line BL is provided at the upper end of the conductive film 31. The bit line BL is connected to the sense amplifier 13.

Furthermore, an $n^+$-type impurity diffusion layer 33 and a $p^+$-type impurity diffusion layer 34 are provided in the surface of the well region 20. A contact plug 35 is provided on the diffusion layer 33, and an interconnect layer 36 which functions as the source line SL is provided on the contact plug 35. A contact plug 37 is provided on the diffusion layer 34, and an interconnect layer 38 which functions as a well interconnect line CPWELL is provided on the contact plug 37. The interconnect layers 36 and 38 are higher than the selection gate line SGD, and are formed in a layer lower than the interconnect layer 32.

The configurations described above are arrayed in the depth direction of the drawing of FIG. 3, and the finger FNG is formed by a set of the NAND strings 18 arranged in the depth direction. The interconnect layers 27 functioning as the selection gate lines SGS included in the same block are connected in common to one another. That is to say, the gate insulating film 30 is also formed on the well region 20 between the adjacent NAND strings 18, and the semiconductor layer 27 and the gate insulating film 30 adjacent to the diffusion layer 33 are formed up to the vicinity of the diffusion layer 33.

Therefore, when the selection transistor ST2 is turned on, a channel formed in the selection transistor ST2 electrically connects the memory cell transistor MT0 to the diffusion layer 33. A potential can be provided to the conductive film 31 by applying a voltage to the well interconnect line CPWELL.

The configuration of the memory cell array 11 may be some other configuration. That is to say, the configuration of the memory cell array 11 is described in, for example, U.S. patent application Ser. No. 12/407,403, filed Mar. 19, 2009 "Three-dimensionally stacked nonvolatile semiconductor memory". The configuration is also described in, for example, U.S. patent application Ser. No. 12/406,524, filed Mar. 18, 2009 "Three-dimensionally stacked nonvolatile semiconductor memory", U.S. patent application Ser. No. 12/679,991, filed Mar. 25, 2010 "Nonvolatile semiconductor memory device and manufacturing method of the same", and U.S. patent application Ser. No. 12/532,030, filed Mar. 23, 2009 "Semiconductor memory and manufacturing method of the same". The entire contents of these patent applications are incorporated herein by reference.

1.1.3 Regarding Threshold Distribution of Memory Cell Transistor

Figure 4:
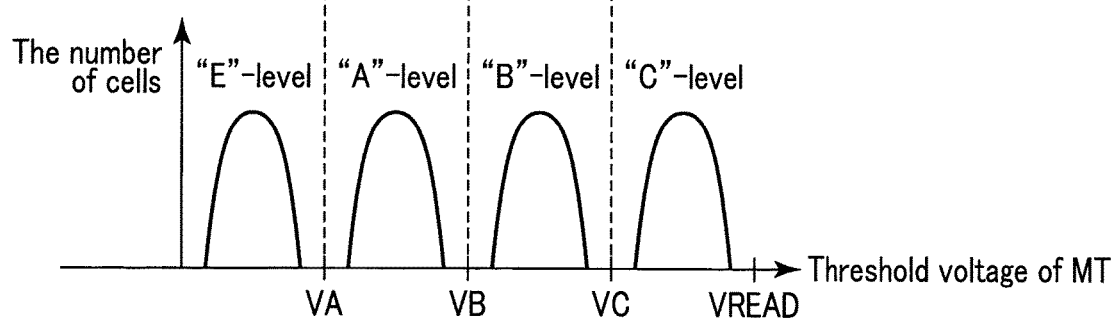
FIG. 4 is a graph showing a threshold distribution of memory cells of the semiconductor memory device according to the first embodiment.

FIG. 4 shows data and a threshold distribution that can be taken by the memory cell transistor MT according to the present embodiment.

As shown, each of the memory cell transistors MT can hold, for example, two-bit data depending on its threshold. The two-bit data are, for example, "11", "01", "00", and "10" in ascending order of threshold.

The threshold of the memory cell which holds the data "11" is at an "E"-level. The E-level is a threshold at which the charge storage layer is discharged and data is erased, and is a positive or negative value (e.g., less than a voltage VA).

The data "01", "00", and "10" corresponds to thresholds at which the charge storage layer is charged and data is written. The threshold of the memory cell which holds the data "01" is at an "A"-level, and is higher than the E-level (e.g., equal to or more than the voltage VA and less than a voltage VB, VA<VB). The threshold of the memory cell which holds the data "00" is at a "B"-level, and is higher than the A-level (e.g., equal to or more than the voltage VB and less than a voltage VC, VB<VC). The threshold of the memory cell which holds the data "10" is at a "C"-level, and is higher than the B-level (e.g., equal to or more than the voltage VC).

The relation between the two-bit data and the threshold is not limited to the above relations. For example, the data "11" may correspond to the "C"-level, and a suitable relation therebetween can be selected.

1.2 Regarding Data Write Operation

Figure 5:
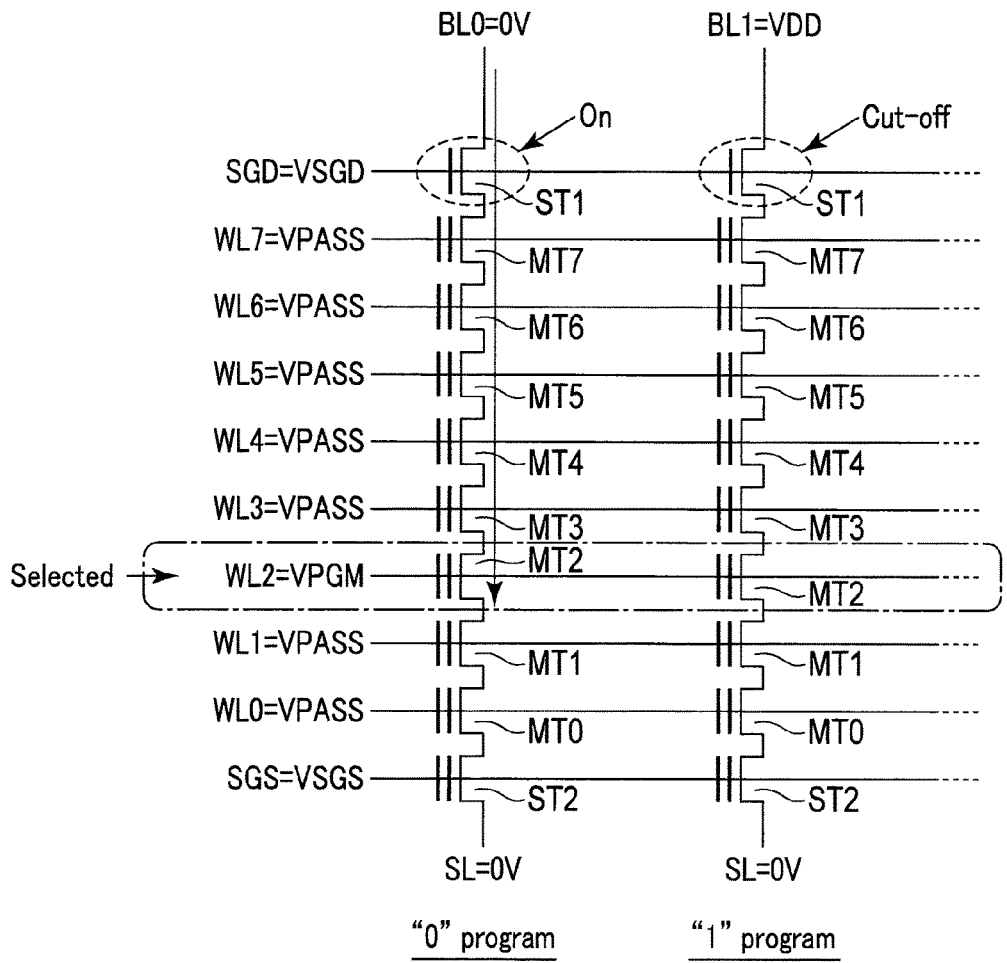
FIG. 5 is a circuit diagram of a NAND string of the semiconductor memory device according to the first embodiment and shows voltages applied to the respective interconnects during data program.

Now, a data write operation according to the present embodiment is briefly described. FIG. 5 is a circuit diagram of the NAND string 18 during data programming, and shows voltages applied to respective interconnects.

As shown, the sense amplifier 13 applies 0 V or a positive voltage VDD to the bit line BL in accordance with write data. That is to say, the sense amplifier 13 applies, for example, 0 V to the bit line BL when charging the charge storage layer to raise the threshold level from the "E"-level to the "A"-level or more (this is referred to as "0" programming). On the other hand, the sense amplifier 13 applies the positive voltage VDD to the bit line BL when maintaining the threshold level at the "E"-level (this is referred to as "1" programming).

Furthermore, the row decoder 12 selects, for example, the word line WL2, applies a positive high voltage VPGM (e.g., 20 V) to the selected word line WL2, and applies a positive voltage VPASS to the other unselected word lines WL0, WL1, and WL3 to WL7. The voltage VPGM is a high voltage for changing the charge storage layer by FN tunneling. The voltage VPASS is a voltage which turns on the memory cell transistor MT regardless of the held data and which prevents erroneous writing into unselected memory cell transistors as will be described later, and VPGM>VPASS.

The row decoder 12 applies a positive voltage VSGD to the selection gate line SGD of the selected finger FNG, and applies VSGS (e.g., 0 to 0.3 V) to the selection gate line SGS.

As a result, the memory cell transistors MT0 to MT7 are turned on. The selection transistor ST1 corresponding to the bit line BL to which 0 V is applied is turned on, and the selection transistor ST1 corresponding to the bit line BL to which VDD is applied is cut off. The selection transistor ST2 is turned off.

Therefore, in the NAND string 18 in which the selection transistor ST1 is turned on, 0 V is transferred to the channel of the memory cell transistor MT2 connected to the selected word line WL2. Thus, the charge storage layer is charged by FN tunneling, and the threshold of the memory cell transistor MT2 is raised. On the other hand, in the NAND string in which the selection transistor ST1 is cut off, the channel of the memory cell transistor MT is electrically floating, and is capacitive-coupled with the word line WL so that its potential rises to a voltage close to VPASS. As a result, in the memory cell transistor MT2, a potential difference between the control gate and the channel is reduced, the charge storage layer is not charged, and the threshold level of the memory cell transistor MT2 is maintained (or the amount of the charging of the charge storage layer can be reduced to a significantly small amount, so that the variation of the threshold level is reduced, and substantially no data is written).

Figure 6:
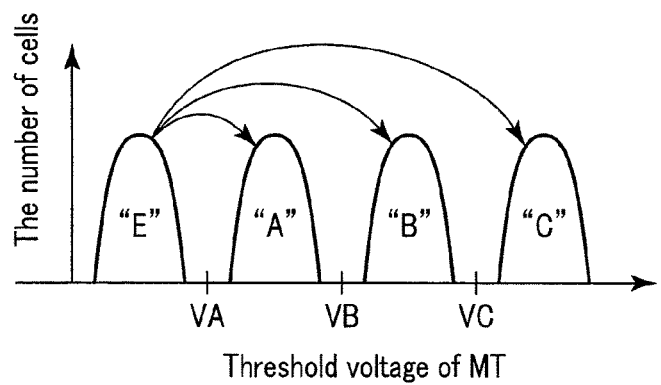
FIG. 6 is a graph showing threshold distributions of the memory cells of the semiconductor memory device according to the first embodiment.

FIG. 6 shows the variation of a threshold voltage during data writing according to the present embodiment. The data writing is a combination of a program operation which uses the voltage VPGM to vary the threshold and a verification operation which checks whether the threshold has risen to a desired level accordingly.

In this example, verification levels used to write the "A"-level, the "B"-level, and the "C"-level are consistently VA, VB, and VC, respectively. That is to say, a technique such as two-stage writing used in a NAND flash memory that uses an electric conductor as a charge storage layer is not used.

In the two-stage writing, initially, in the first writing, the threshold of the memory cell transistor MT to be written to the "E" and "A"-levels is maintained at the "E"-level, and the threshold of the memory cell transistor MT to be written to the "B"- and "C"-levels is written to, for example, an "LM"-level which is an intermediate level between VA and VC. A voltage VLM between VA and VB is used as the verification level. In the second writing, writing from the "LM"-level to the "B"-level and the "C"-level is then performed.

In this example, this "LM"-level is not used, and if a desired threshold level is the "C"-level, VC is used as the verification level from the beginning to perform writing. The same also applies to the "A"-level and the "B"-level.

1.3 Regarding Data Read Operation

Now, a read operation according to the present embodiment is described.

1.3.1 Regarding Flow of Read Operation

A rough flow of the read operation is described with reference to FIG. 7.

FIG. 7 is a circuit diagram of the NAND string 18 during the read operation, and shows the voltages of the respective interconnects. FIG. 7 also illustrates how data is read from the memory cell transistor MT2 connected to the word line WL2.

As shown, the read operation roughly includes "prior-reading" and "main-reading". The prior-reading is an operation to read data from the memory cell transistor MT connected to the word line WL3 which neighbors, on the drains side, the word line WL2 to originally read data from. The main-reading is an operation to read data from the word line WL2 originally targeted for reading. In the main-reading, a voltage VREADLA which is different from voltages applied to the other unselected word lines WL is applied to the unselected word line WL3 targeted for the prior-reading.

During the prior-reading, the sense amplifier 13 supplies a current to the bit line BL, and precharges the bit line BL with, for example, a voltage VBL. The row decoder 12 applies a positive voltage VCGRV to the selected word line WL3, and applies a positive voltage VREAD to the other unselected word lines WL0 and WL2, and WL4 to WL7. The voltage VCGRV changes with data to be read, and is, for example, one of the voltages VA, VB, and VC described with reference to FIG. 4. The voltage VREAD is a voltage to switch on the memory cell transistor MT regardless of the held data, and VCGRV<VREAD.

The row decoder 12 applies a positive voltage VSG to the selection gate lines SGD and SGS of the selected finger FNG.

As a result, the selection transistor ST and the memory cell transistors MT0 to MT2 and MT4 to MT7 are turned on, and the memory cell transistor MT3 is turned on if the threshold voltage of transistor MT3 is lower than VCGRV, otherwise the transistor MT3 is turned off. In the prior-reading, VCGRV is sequentially raised, and data is read to the sense amplifier 13 from the memory cell transistor MT connected to the word line WL3.

The main-reading is different from the prior-reading in that the voltages VREADLA and VREAD' are applied to the unselected word line WL3 adjacent to the selected word line WL2. The voltage VREADLA is a voltage to turn on the memory cell transistor MT regardless of the held data in the same manner as the voltage VREAD. The voltage VREADLA is for compensating the influence of a threshold variation caused by a later-described inter-cell interference, and is different in value from VREAD. Depending on the degree of the inter-cell interference, it is possible that VREADLA>VREAD or VREADLA<VREAD. VREAD' is a voltage which is lower than the voltages VREADLA and VREAD and which turns on the memory cell transistor MT. However, VREAD' is not for compensating the threshold variation caused by the inter-cell interference.

In contrast to the voltage VREAD, the voltage VREADLA is stepped up for each level of the data held in the memory cell transistor MT3 during the read operation. Upon every step-up, data read from the corresponding memory cell transistor MT2 is strobed in the sense amplifier 13.

1.3.2 Regarding Details of Read Operation

Details of the above read operation are described. When each of the memory cell transistors MT can hold two or more bits of data, the above-mentioned main-reading is performed bit by bit. In the case described in this example, the memory cell transistor MT holds two-bit data as has been described with reference to FIG. 4. The main-reading for each of the bits (a lower bit and a upper bit) of the two-bit data is independently performed. In the upper bit reading, the bit (memory cell transistor MT) holding the "E"-level and the bit holding the "C"-level are specified. In the lower bit reading, it is specified whether each bit is less than or equal to the "A"-level (i.e., holds either the "E"-level or the "A"-level) or is equal to or more than the "B"-level (i.e., holds either the "B"-level or the "C"-level).

<Regarding Upper Bit Reading>

Firstly, upper bit reading is described with reference to FIG. 8. FIG. 8 is a timing chart showing the potential changes of the word line WLn (n is a natural number equal to or more than 1) targeted for reading and the word line WL(n+1) adjacent thereto on the drain side during the upper bit reading in the prior-reading and the main-reading.

As shown, the sequencer 16 first performs the prior-reading (times t0 to t1). In the prior-reading, the row decoder 12 selects the word line WL(n+1) and then sequentially applies voltages VCGRV_A, VCGRV_B, and VCGRV_C to WL(n+1) (n is the number of the selected word line, and is one of 0 to 6 in this example). The voltages VCGRV_A, VCGRV_B, and VCGRV_C may be, for example, the voltages VA, VB, and VC shown in FIG. 4. The row decoder 12 applies the voltage VREAD to the word line WLn and the other unselected word lines WL. As a result, data in all the memory cell transistors MT connected to the word line WL(n+1) in the selected finger FNG are determined, and held in, for example, the sense amplifier 13 or the sequencer 16.

The sequencer 16 then performs the main-reading (upper bit reading). In the example shown in FIG. 8, reading to specify whether each bit has a threshold at the "E"-level or a threshold equal to or more than the "A"-level (i.e., each bit has a threshold at one of the "A"-level, the "B"-level, and the "C"-level) (this is referred to as a read operation AR) is performed.

In the read operation AR, the row decoder 12 applies the voltage VCGRV_A (e.g., VA) to the selected word line WLn. The row decoder 12 also sequentially applies voltages VREAD'_E, VREADLA_A, VREADLA_B, and VREADLA_C1 to the unselected word lines WL(n+1) (the respective periods are referred to as periods AR1, AR2, AR3, and AR4). For example, VREAD'_E<VREADLA_A<VREADLA_B<VREADLA_C1. The voltage VREAD is applied to the other unselected word lines WL. The voltage VREAD is not limited to this, and is, for example, a voltage higher than VREAD'_E and lower than VREADLA_A. It should be understood that VREAD may be lower than VREAD'_E.

The sense amplifier 13 then senses and strobes data in the period AR1 for a column (bit line) in which the result of the prior-reading is the "E"-level. To "strobe" data means an operation to determine whether read data is "0" or "1" in accordance with the current flowing through the bit line or the voltage of the bit line, and load the data into a latch circuit in the sense amplifier 13. For a column in which the result of the prior-reading is the "B"-level, the sense amplifier 13 senses and strobes data in the period AR2. Moreover, for a column in which the result of the prior-reading is the "B"-level, the sense amplifier 13 senses and strobes data in the period AR3. For a column in which the result of the prior-reading is the "C"-level, the sense amplifier 13 senses and strobes data in the period AR4.

The sequencer 16 then performs reading (read operation CR) to specify a bit having the "C"-level.

In the read operation CR, the row decoder 12 applies the voltage VCGRV_C (e.g., VC) to the selected word line WLn. The row decoder 12 also sequentially applies voltages VREAD'_EAB and VREADLA_C2 to the unselected word lines WL(n+1) (the respective periods are referred to as periods CR1 and CR2). For example, VREAD'_EAB<VREADLA_C2. At least, VREAD'_EAB<VREADLA_C1.

The sense amplifier 13 then senses and strobes data in the period CR1 for columns in which the results of the prior-reading are the "E"-level, the "A"-level, and the "B"-level. For a column in which the result of the prior-reading is the "C"-level, the sense amplifier 13 senses and strobes data in the period CR2.

Consequently, the bits having the thresholds of the "E"-level and the "C"-level are specified for the word line WL targeted for reading.

Figure 9:
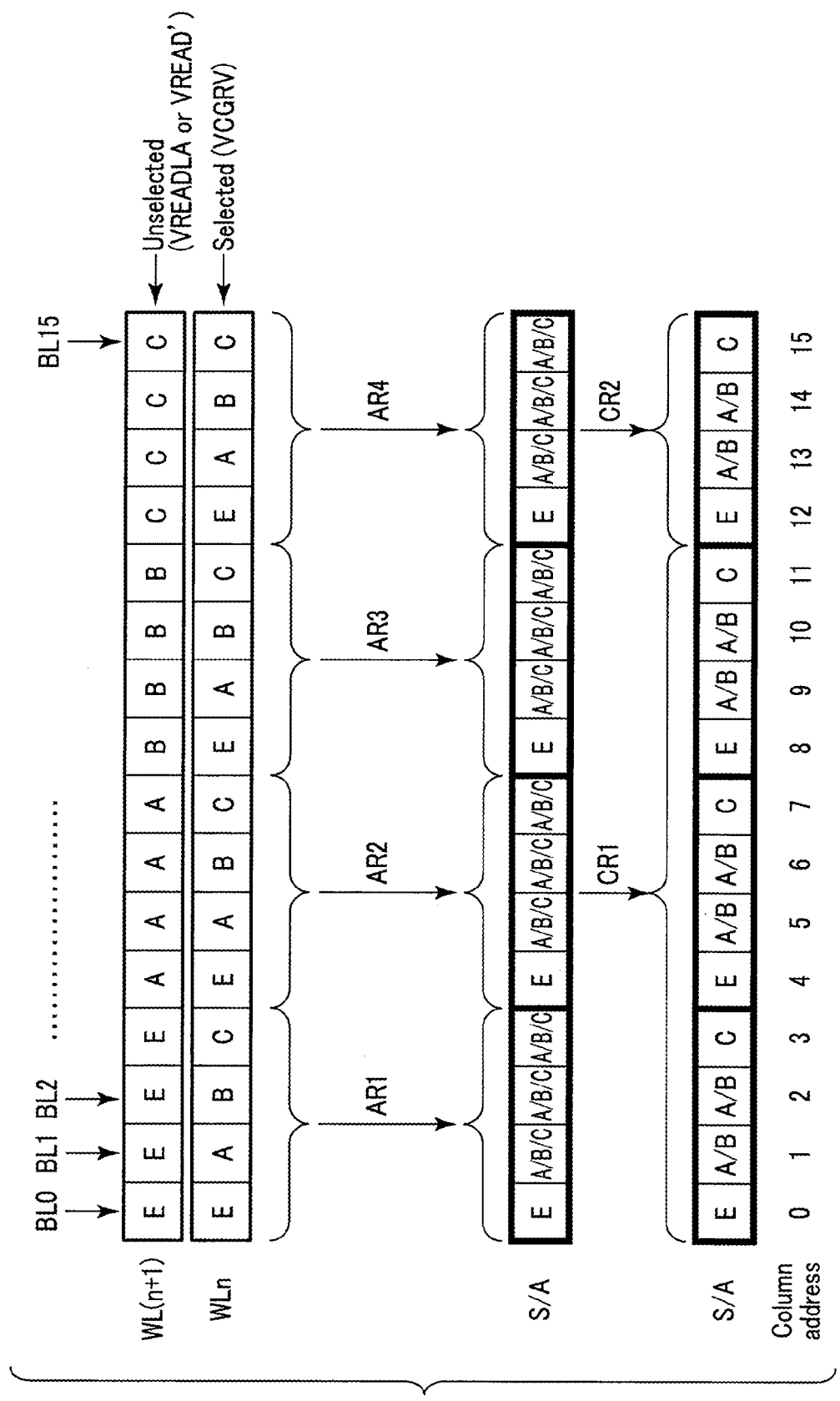
FIG. 9 is a schematic diagram showing page data and data fixed in a latch circuit in a sense amplifier during upper bit reading of the semiconductor memory device according to the first embodiment.

A specific example of the above operation is described with reference to FIG. 9. FIG. 9 is a schematic diagram showing page data corresponding to the word lines WLn and WL(n+1) and data determined by the latch circuit in the sense amplifier 13 during the upper bit reading. In the case assumed in FIG. 9, for simplification of explanation, one page corresponds to data held in 16 memory cell transistors. The memory cell transistors MT connected to the bit lines BL0 to BL15 or the data held in the memory cell transistors MT are referred to as a bit 0 to a bit 15, and column addresses corresponding to these bits are referred to as addresses 0 to 15. This page data is "EABCEABCEABCEABC".

As shown, as a result of the prior-reading, page data corresponding to the word line WL(n+1) is "EEEEAAAABBBBCCCC".

The sequencer 16 then performs the main-reading. In this example, the bit holding the "E"-level is first specified before the main-reading (read operation AR).

In accordance with an instruction from the sequencer 16, the row decoder 12 applies VCGRV_A (e.g., VA) to the selected word line WLn, and applies VREAD'_E to WL(n+1) (period AR1). In this period AR1, the sense amplifier 13 senses and strobes the bit whose adjacent bit data (data in WL(n+1)) is at the "E"-level, that is to say, data read in the bit lines BL0 to BL3. In this example, a cell current flows through the bit line BL0 among the bit lines BL0 to BL3. Therefore, the bit 0="E" is determined, and this data is stored in the latch circuit of the sense amplifier 13. The bit in which the data is determined will not be targeted for reading from now on, and the bit line BL is fixed to a given potential such as 0 V. On the other hand, since no cell currents flow through the bit lines BL1 to BL3, the bits 1 to 3 are determined to be equal to or more than the "A"-level (i.e., it can also be said that data is undetermined). Of course, cell currents may flow through the bit lines BL4, BL8, and BL12 corresponding to the other bits 4, 8, and 12 holding the "E"-level (no currents flow if the threshold is raised by the inter-cell interference). However, the bits adjacent to the above bits are not at the "E"-level, and are therefore not sensed and strobed in the period AR1.

The row decoder 12 subsequently applies VCGRV_A to the selected word line WLn, and steps up the voltage applied to WL(n+1) to VREADLA_A (period AR2). In this period AR2, the sense amplifier 13 senses and strobes the bit whose adjacent bit data is at the "A", that is to say, data read in the bit lines BL4 to BL7. In this example, a cell current flows through the bit line BL4 among the bit lines BL4 to BL7. Therefore, the bit 4="E" is determined, and this data is stored in the latch circuit of the sense amplifier 13. As a result, the bit line BL4 will not be targeted for reading from now on. Since no cell currents flow through the bit lines BL5 to BL7, the bits 5 to 7 are determined to be equal to or more than the "A"-level. The cell currents can also flow through the bit lines BL8 to BL12, but are not sensed and strobed in AR2.

The row decoder 12 further applies VCGRV_A to the selected word line WLn, and steps up the voltage applied to WL(n+1) to VREADLA_B (period AR3). In this period AR3, the sense amplifier 13 senses and strobes the bit whose adjacent bit data is at the "B", that is to say, data read in the bit lines BL8 to BL11. In this example, a cell current flows through the bit line BL8 among the bit lines BL8 to BL11. Therefore, the bit 8="E" is determined, and this data is stored in the latch circuit of the sense amplifier 13. As a result, the bit line BL8 will not be targeted for reading from now on. Since no cell currents flow through the bit lines BL9 to BL11, the bits 9 to 11 are determined to be equal to or more than the "A"-level. The cell current can also flow through the bit line BL12, but is not sensed and strobed in AR3.

The row decoder 12 further applies VCGRV_A to the selected word line WLn, and steps up the voltage applied to WL(n+1) to VREADLA_C1 (period AR4). In this period AR4, the sense amplifier 13 senses and strobes the bit whose adjacent bit data is at the "C", that is to say, data read in the bit lines BL12 to BL15. In this example, a cell current flows through the bit line BL12 among the bit lines BL12 to BL15. Therefore, the bit 12="E" is determined, and this data is stored in the latch circuit of the sense amplifier 13. As a result, the bit line BL12 will not be targeted for reading from now on. Since no cell currents flow through the bit lines BL13 to BL15, the bits 13 to 15 are determined to be equal to or more than the "A"-level.

The sequencer 16 then specifies the bit holding the "C"-level (read operation CR). That is to say, in accordance with an instruction from the sequencer 16, the row decoder 12 applies VCGRV_C (e.g., VC) to the selected word line WLn, and applies VREAD'_EAB to WL(n+1) (period CR1). In this period CR1, the sense amplifier 13 senses and strobes the bits whose adjacent page data are at the "E", "A", and "B", and of which the data has not been determined, that is to say, data read in the bit lines BL1 to BL3, BL5 to BL7, BL9 to BL11, and BL13 to BL15. In this example, cell currents don't flow through the bit lines BL3, BL7, and BL11 among the BL1 to BL3, BL5 to BL7, BL9 to BL11, and BL13 to BL15. Therefore, the data of the bits 3, 7, and 11 is determined as "C", and this data is stored in the latch circuit of the sense amplifier 13. The potentials of these bit lines BL are fixed to given potentials. Of course, the cell current can also be prevented from flowing through the bit line BL15 corresponding to the bit 15 holding the "C"-level. However, the bit adjacent to the bit 15 is not at the "E"-level, and is therefore not sensed and strobed in the period CR1. The bits 1, 2, 5, 6, 9, and 10 other than the bits 0, 4, and 8 that have already been determined to be at the "E"-level are also determined to be at the "A"-level or the "B"-level.

The row decoder 12 subsequently applies VCGRV_C2 to the selected word line WLn, and steps up the voltage applied to WL(n+1) to VREADLA_C2 (period CR2). In this period CR2, the sense amplifier 13 senses and strobes the bit whose adjacent page data is at the "C", and of which the data has not been determined, that is to say, data read in the bit lines BL12 to BL15. In this example, a cell current flows through the bit lines BL12 to BL14 and a cell current is prevented from flowing through the bit line BL15 among the bit lines BL12 to BL15. Therefore, the bit 15="C" is determined, and this data is stored in the latch circuit of the sense amplifier 13. The bits 13 and 14 other than the bit 12 that has already been determined to be at the "E"-level are also determined to be at the "A"-level or the "B"-level.

As a result of the upper bit reading described above, data of the bits 0, 3, 4, 7, 8, 11, 12, and 15 are determined. That is to say, all the bits having the "E"-level and the "C"-level are specified.

<Regarding Lower Bit Reading>

Next, lower bit reading is described with reference to FIG. 10. FIG. 10 is a timing chart showing the potential changes of the word lines WLn and WL(n+1) during the lower bit reading in the prior-reading and the main-reading.

As shown, the sequencer 16 first performs the prior-reading (times t0 to t1). This prior-reading is the same as the operation performed in the upper bit reading. When the upper bit and the lower bit are successively read in the same word line, the prior-reading in the lower bit reading may be omitted.

The sequencer 16 then performs the main-reading (lower bit reading). In the lower bit reading, whether the threshold of each bit is less than or equal to the "A"-level (i.e., has either the "E"-level or the "A"-level) or is equal to or more than the "B"-level (i.e., has either the "B"-level or the "C"-level) is judged (read operation BR).

That is, the row decoder 12 applies the voltage VCGRV_B (e.g., VB) to the selected word line WLn. The row decoder 12 also sequentially applies voltages VREAD'_EA, VREADLA_B, and VREADLA_C to the unselected word lines WL(n+1) (the respective periods are referred to as periods BR1, BR2, and BR3). For example, VREAD'_EA<VREADLA_B<VREADLA_C, and VREAD'_EA may be the same as VREAD, or may be lower than VREAD.

The sense amplifier 13 then senses and strobes data in the period BR1 for a column in which the result of the prior-reading is the "E"-level. For a column in which the result of the prior-reading is the "B"-level, the sense amplifier 13 senses and strobes data in the period BR2. Moreover, for a column in which the result of the prior-reading is the "C"-level, the sense amplifier 13 senses and strobes data in the period BR3.

Consequently, it is specified whether the threshold of each bit is less than or equal to the "A"-level or is equal to or more than the "B"-level.

A specific example of the above operation is described with reference to FIG. 11. FIG. 11 is a schematic diagram showing page data corresponding to the word lines WLn and WL(n+1) and data determined by the latch circuit in the sense amplifier 13 during the lower bit reading.

The sequencer first performs the prior-reading as described with reference to FIG. 9. As a result, page data corresponding to the word line WL(n+1) is "EEEE-AAAABBBBCCCC". The prior-reading can be omitted when the lower bit reading is successively performed after the bits at the "E"-level and the "C"-level are determined in FIG. 9.

The sequencer 16 then performs the main-reading to read the upper bit for the word line WLn. That is to say, in accordance with an instruction from the sequencer 16, the row decoder 12 applies VCGRV_B (e.g., VB) to the selected word line WLn, and applies VREAD'_EA to WL(n+1) (period BR1).

In this period BR1, the sense amplifier 13 senses and strobes the bits whose adjacent data are at the "E" and "A"-levels, that is to say, data read in the bit lines BL0 to BL7. In this example, cell currents flow through the bit lines BL0, BL1, BL4, and BL5 among the above bit lines. Therefore, the bits 0, 1, 4, and 5 are determined to be at the "E"-level or the "A"-level, and the determined data is stored in the latch circuit of the sense amplifier 13. On the other hand, no cell currents flow through the bit lines BL2, BL3, BL6, and BL7. Therefore, the bits 2, 3, 6, and 7 are determined to be at the "B"-level or the "C"-level, and the determined data is stored in the latch circuit.

The row decoder 12 subsequently applies VCGRV_B to the selected word line WLn, and steps up the voltage applied to WL(n+1) to VREADLA_B (period BR2). In this period BR2, the sense amplifier 13 senses and strobes the bit whose adjacent bit data is at the "B", that is, data read in the bit lines BL8 to BL11. In this example, cell currents flow through the bit lines BL8 and BL9. Therefore, the bits 8 and 9 are determined to be at the "E"-level or the "A"-level, and the bits 10 and 11 are determined to be at the "B"-level or the "C"-level, and the determined data is stored in the latch circuit of the sense amplifier 13.

The row decoder 12 further applies VCGRV_A to the selected word line WLn, and steps up the voltage applied to WL(n+1) to VREADLA_C (period BR3). In this period BR3, the sense amplifier 13 senses and strobes the bit whose adjacent bit data is at the "C", that is, data read in the bit lines BL12 to BL15. In this example, cell currents flow through the bit lines BL12 and BL13. Therefore, the bits 12 and 13 are determined to be at the "E"-level or the "A"-level, and the bits 14 and 15 are determined to be at the "B"-level or the "C"-level, and the determined data is stored in the latch circuit of the sense amplifier 13.

Consequently, as shown in the latch circuit in FIG. 11, whether the data of the bits 0 to 15 in the read target page are less than or equal to the "A"-level or are equal to or more than the "B"-level is determined.

1.4 Advantageous Effects According to the Present Embodiment

The semiconductor memory device according to the present embodiment can improve the reliability of the data read operation. These advantageous effects are described in detail below.

Figure 12:
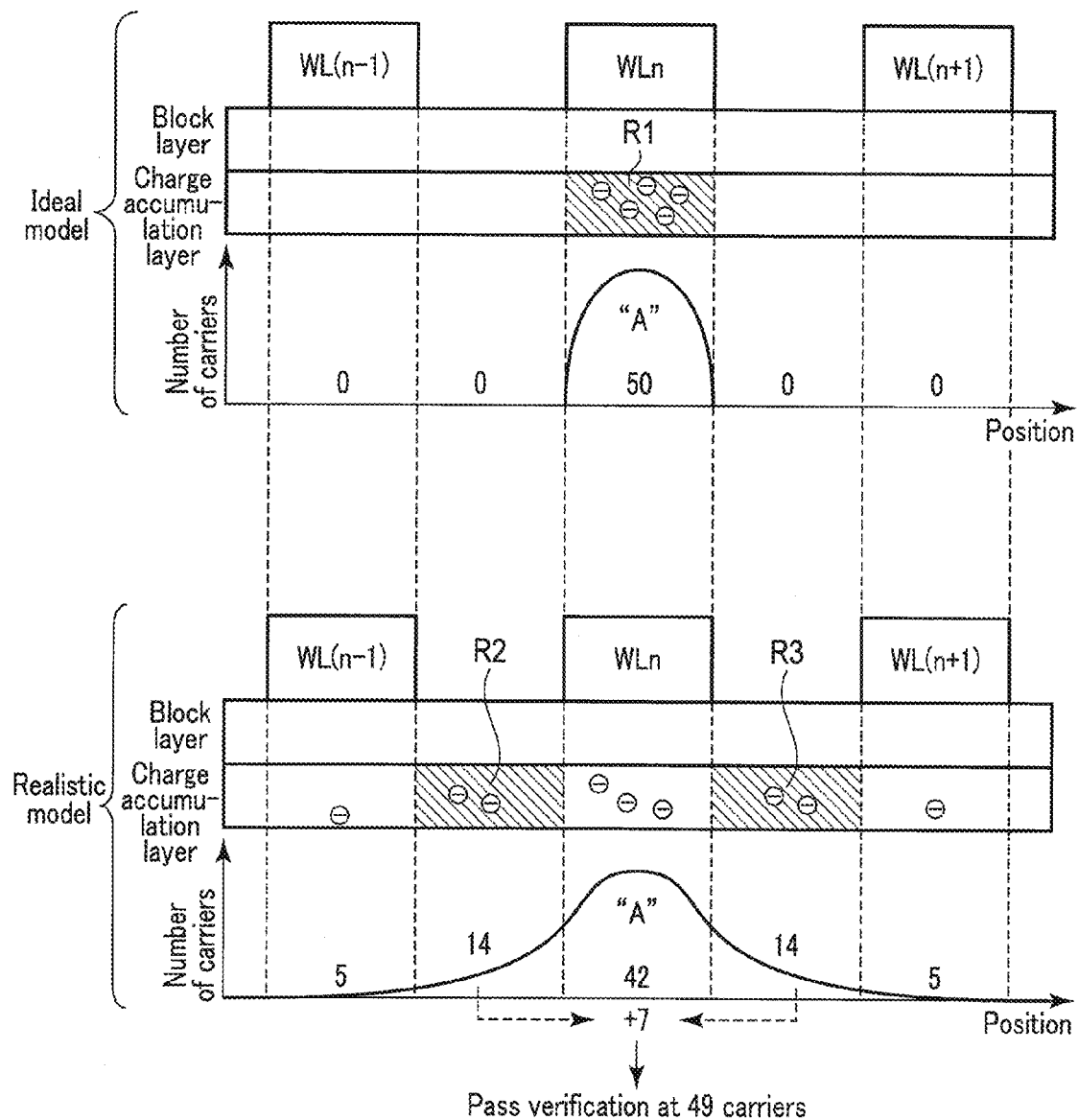
Figure 13:
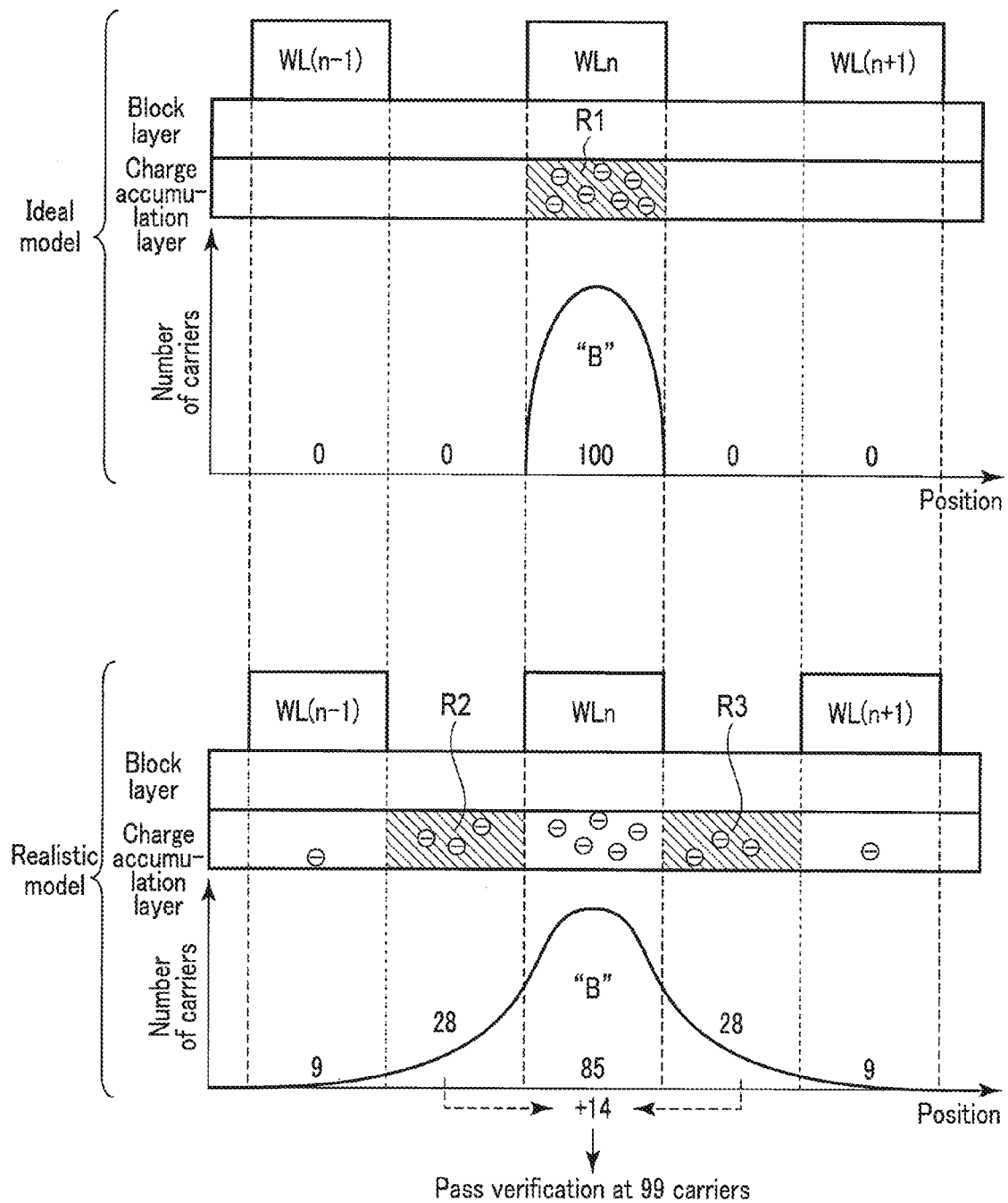

FIG. 12 to FIG. 14 show ideal models and realistic models of charge distributions in the writing of the "A"-level, the "B"-level, and the "C"-level into the word line WLn, respectively.

As shown in FIG. 12, if, for example, the threshold of the "A"-level is achieved by about 50 electrons, it is ideally desirable that all the electrons exist in an area R1 which overlaps the word line WLn. However, in a MONOS structure that uses insulating films as charge storage layers, the charge storage layers are connected to each other between the adjacent memory cell transistors MT. In other words, the charge storage layer is also provided between the neighboring word lines (areas R2 and R3). Therefore, as shown in the realistic model in FIG. 12, some of the electrons are also trapped in the areas R2 and R3.

Suppose that about one third of the electrons to enter the area R1 are trapped in the areas R2 and R3, and about one fourth of the electrons existing in the areas R2 and R3 contribute to a threshold variation. When the "A"-level is written, about 42 electrons, for example, exist in the area R1, and about 14 electrons exist in each of the areas R2 and R3. While the number of electrons in the area R1 is 42 which is less than 50, about seven of the electrons existing in the areas R2 and R3 contribute to the threshold variation. That is to say, this condition is equivalent to the condition in which 42+7=49 electrons exist in the area R1, so that this condition passes a program-verification.

The same also applies to the "B"-level and the "C"-level. FIG. 13 shows the case of the "B"-level. In the example of FIG. 13, the threshold of the "B"-level is achieved by, for example, about 100 electrons trapped in the area R1. Thus, in a realistic model, about 85 electrons exist in the area R1, and about 28 electrons exist in each of the areas R2 and R3. About 14 of the electrons existing in the areas R2 and R3 contribute to the threshold variation. That is, this condition is equivalent to the condition in which 85+14=99 electrons exist in the area R1, so that this condition passes a program-verification.

FIG. 14 shows the case of the "C"-level. In the example of FIG. 14, the threshold of the "C"-level is achieved by, for example, about 150 electrons trapped in the area R1. Thus, in the realistic model, about 130 electrons exist in the area R1, and about 43 electrons exist in each of the areas R2 and R3. About 22 of the electrons existing in the areas R2 and R3 contribute to the threshold variation. That is, this condition is equivalent to the condition in which 130+22=152 electrons exist in the area R1, so that this condition passes a program-verification.

Figure 15:
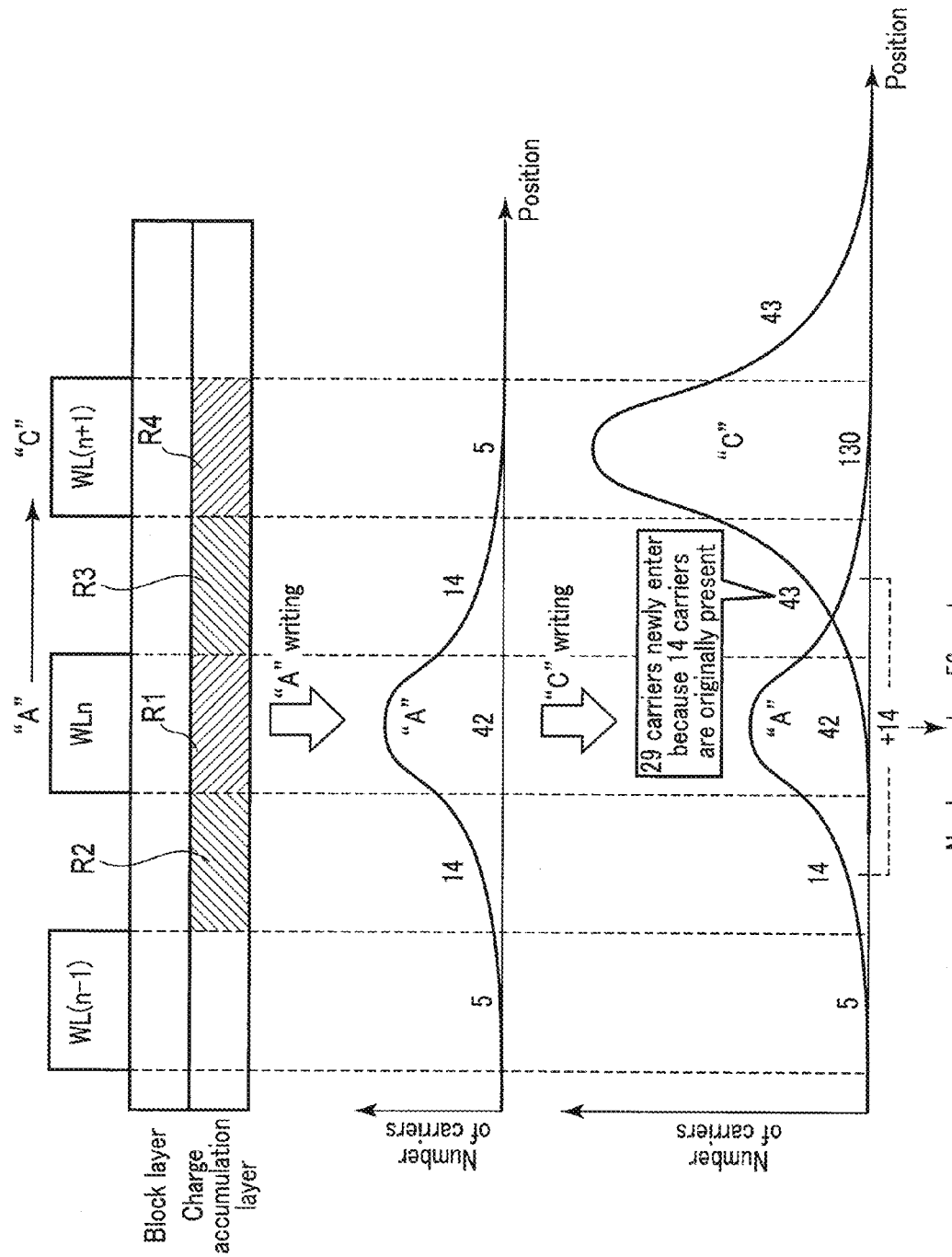
Figure 16:
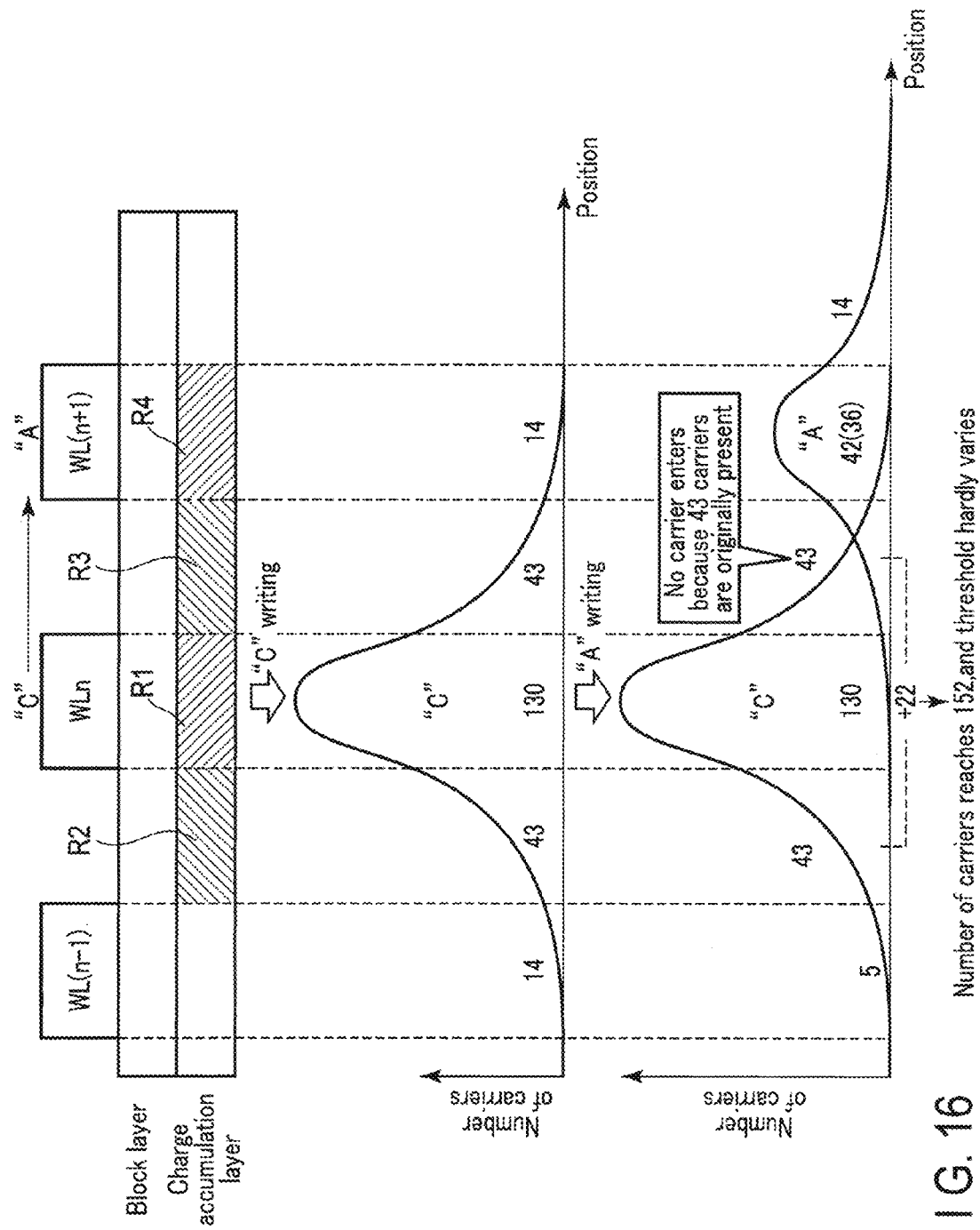

In accordance with the above models, the inter-cell interference between the word lines WLn and WL(n+1) is described with reference to FIG. 15 and FIG. 16. FIG. 15 shows a charge distribution in the case where the "A"-level is written into the word line WLn and then the "C"-level is written into the word line WL(n+1) in the realistic model. FIG. 16 shows a charge distribution in the case where the "C"-level is written into the word line WLn and then the "A"-level is written into the word line WL(n+1).

As shown in FIG. 15, when the "C"-level is written into the word line WL(n+1) after the "A"-level is written into the word line WLn, the number of electrons trapped in the area R3 is, for example, about 43. That is, about 14 electrons are trapped in the area R3 during the "A" writing, and about 29 electrons are newly trapped in the area R3 by the subsequent "C" writing.

As a result, the number of electrons which contribute to the threshold variation of the memory cell transistor MTn in the areas R2 and R3 is about 14. This is equivalent to the case where the number of electrons in the area R1 is 42+14=56. This number of electrons is greater by 10% or more than 50 which is the original number of electrons. As a result, the threshold of the memory cell transistor MTn can be higher than the "A"-level, and may reach the "B"-level.

On the other hand, no such phenomenon is considered to occur when the "A"-level is written into the word line WL(n+1) after the "C"-level is written into the word line WLn. This is because about 43 electrons are trapped in the area R3 at the time of the "C" writing as shown in FIG. 16. Therefore, no electrons are considered to enter the area R3 during the writing of "A" into the word line WL(n+1). Accordingly, the number of electrons which contribute to the "C"-level is about 152 which is substantially the same as the original number of electrons.

As apparent from the above, a certain memory cell transistor MT(n+1) affects the threshold of the memory cell transistor MT when the threshold of the memory cell transistor MT(n+1) is higher than the threshold of the memory cell transistor MTn.

Figure 17:
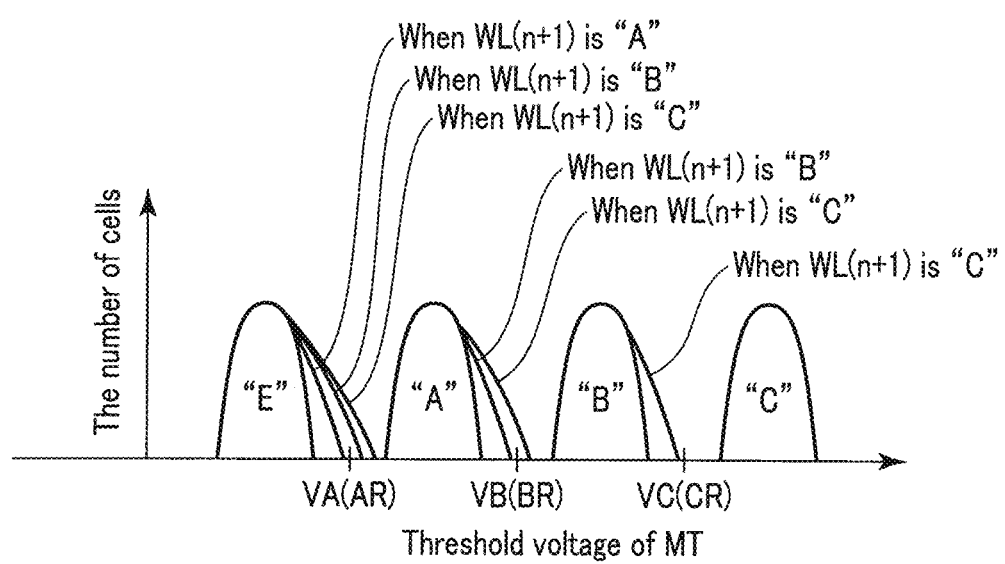
FIG. 17 is a graph showing threshold distributions of the memory cells.

FIG. 17 shows how the threshold distributions of the "E" to "C"-levels vary according to the above-mentioned inter-cell interference. As shown, when the memory cell transistor MTn has the "C"-level, there is no influence from the memory cell transistor MT(n+1) adjacent thereto on the drain side.

On the other hand, the threshold of the "B"-level rises when the memory cell transistor MT(n+1) has the "C"-level. The threshold of the "A"-level rises when the memory cell transistor MT(n+1) has the "B"-level or the "C"-level. Moreover, the threshold of the "E"-level rises when the memory cell transistor MT(n+1) has the "A"-level, the "B"-level, or the "C"-level.

On the assumption that the threshold voltage has risen due to the above inter-cell interference, the voltage VREADLA which is higher (lower in some cases) than VREAD is applied to the word line WL(n+1) adjacent on the drain side in the present embodiment (corrective reading). The voltage difference between VREAD and VREADLA can offset the influence of the threshold variation, and can prevent erroneous reading.

As has been described with reference to FIG. 15 and FIG. 16, the threshold variation can occur when the bit adjacent on the drain side has a threshold level higher than that of the bit targeted for reading. Therefore, the corrective reading is performed in this case, and no correction is made in other cases (i.e., the voltage VREAD' is applied to the word line WL(n+1)).

Thus, according to the present embodiment, it is possible to precisely estimate the degree of the threshold variation attributed to the inter-cell interference, and improve the reliability of data reading.

2. Second Embodiment

Now, a semiconductor memory device according to a second embodiment is described. The present embodiment is based on the assumption that the inter-cell interference also occurs when the threshold levels of the adjacent cells are the same in the first embodiment described above. The differences between the present embodiment and the first embodiment are only described below.

2.1 Regarding Details of Read Operation

The read operation according to the present embodiment is described below separately for the upper bit reading and the lower bit reading as in the first embodiment.

<Regarding Upper Bit Reading>

Figure 18:
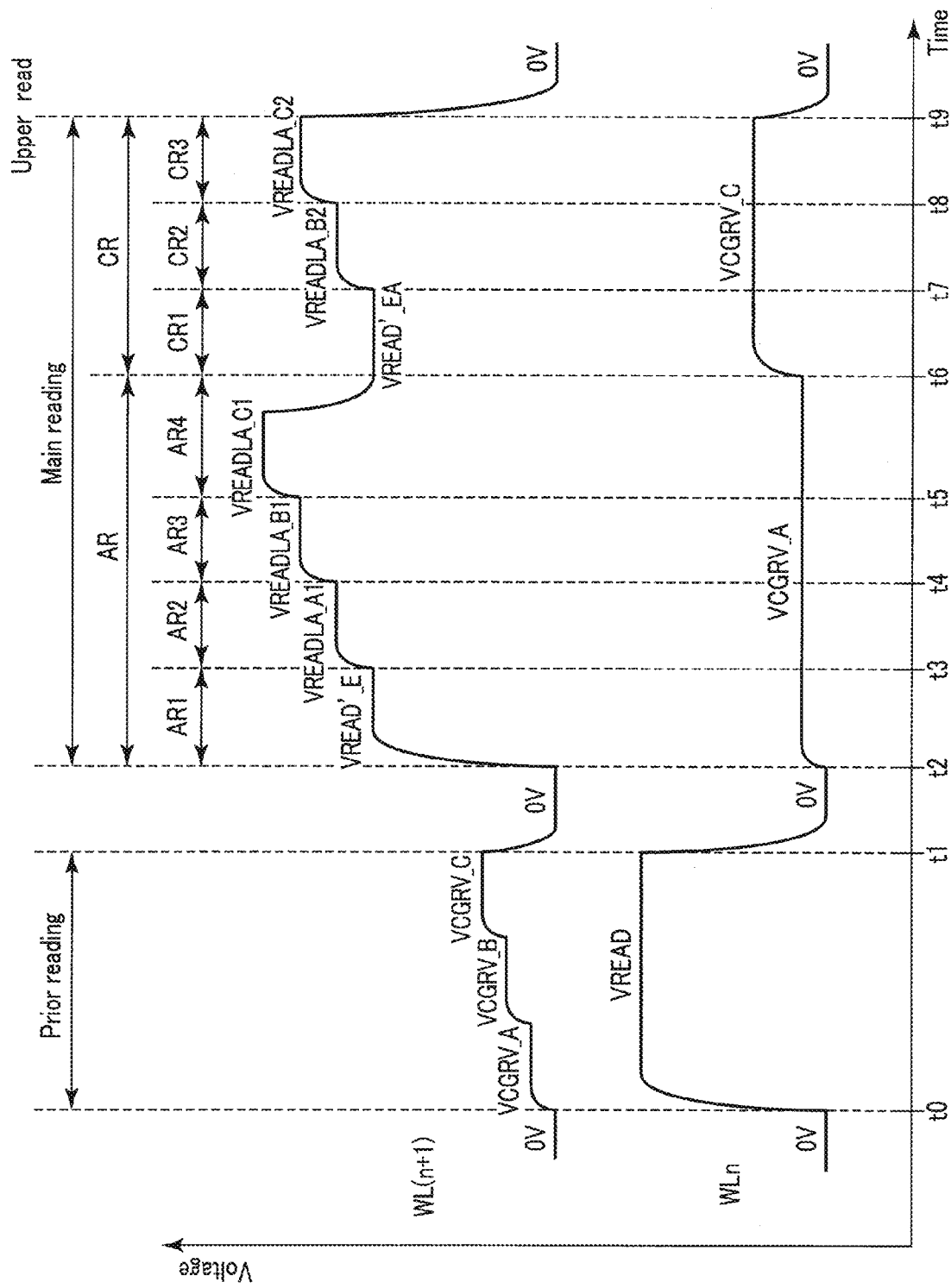
FIG. 18 is a timing chart showing the changes of the word line voltages during data reading of the semiconductor memory device according to the second embodiment.

FIG. 18 is a timing chart showing the potential changes of the word lines WLn and WL(n+1) during the prior-reading and the upper bit reading according to the present embodiment.

As shown, the present embodiment is different from FIG. 8 described in the first embodiment in that the voltage applied to the word line WL(n+1) is stepped up in the order of VREAD'_EA, VREADLA_B2, and VREADLA_C2 in the read operation CR in the main-reading. The voltage VREADLA_B in the read operation AR in this example is referred to as a voltage VREADLA_B1 so that this voltage is distinguished from the voltage during the read operation CR. This voltage is different in value from the voltage VREAD. VREADLA_B1 and VREADLA_B2, and VREADLA_C1 and VREADLA_C2 may have the same value or different values.

Figure 19:
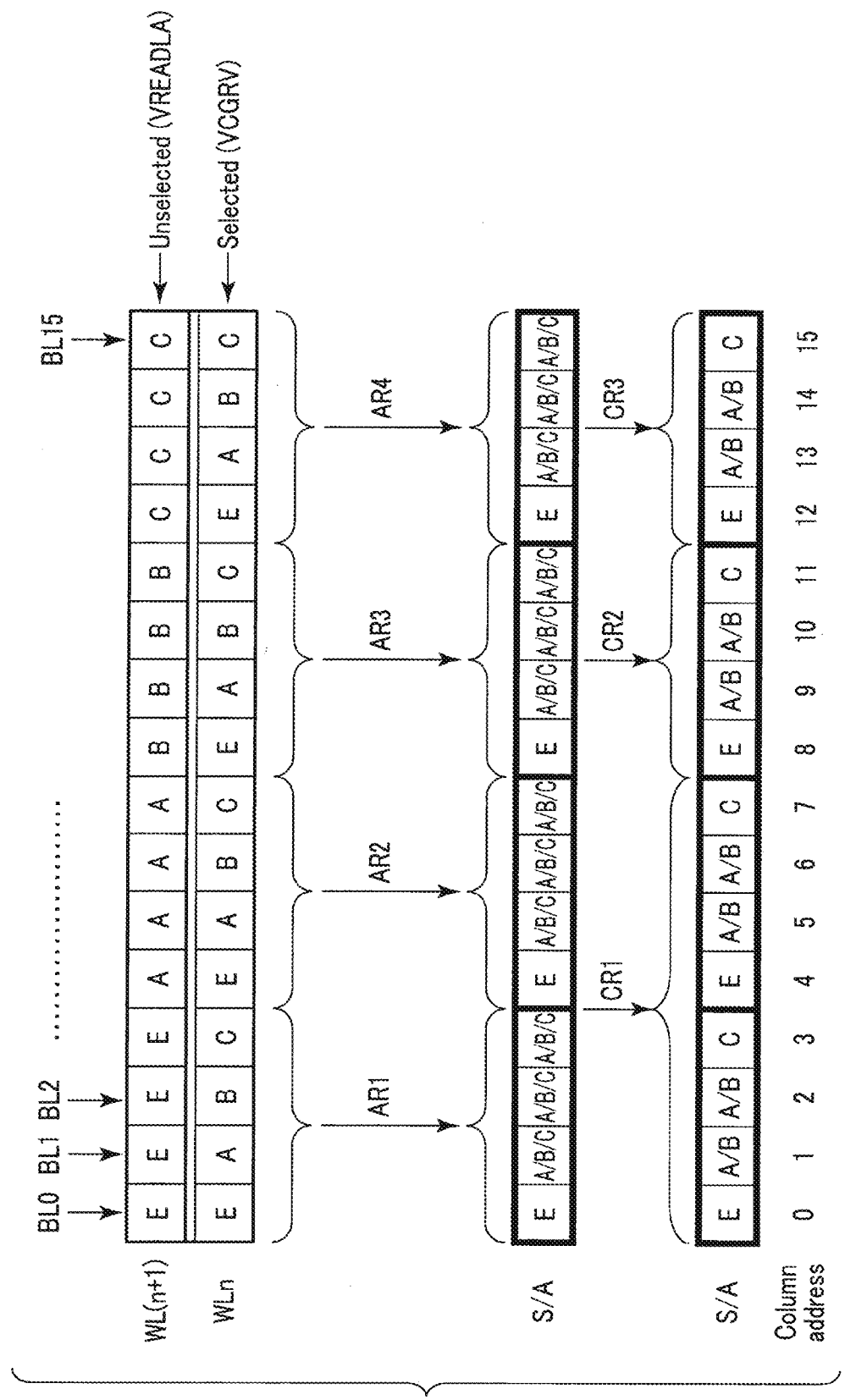
FIG. 19 is a schematic diagram showing page data and data fixed in a latch circuit in a sense amplifier during upper bit reading of the semiconductor memory device according to the second embodiment.

A specific example of the above operation is described with reference to FIG. 19. FIG. 19 corresponds to FIG. 9 described in the first embodiment.

As shown, in the period AR1, it is determined that the bit 0 is at the "E"-level, and the bits 1 to 3 are equal to or more than the "A"-level. In the period AR2, it is determined that the bit 4 is at the "E"-level, and the bits 5 to 7 are equal to or more than the "A"-level. Moreover, in the period AR3, it is determined that the bit 8 is at the "E"-level, and the bits 9 to 11 are equal to or more than the "A"-level. In the period AR4, it is determined that the bit 12 is at the "E"-level, and the bits 13 to 15 are equal to or more than the "A"-level.

In the period CR1, it is determined that the bits 3 and 7 are at the "C"-level, and the bits 1, 2, 5 and 6 are at the "A"-level or the "B"-level. Moreover, in the period CR2, it is determined that the bit 11 is at the "C"-level, and the bits 9 and 10 are at the "A"-level or the "B"-level. In the period CR3, it is determined that the bit 15 is at the "C"-level, and the bits 13 and 14 are at the "A"-level or the "B"-level.

<Regarding Lower Bit Reading>

Next, lower bit reading according to the present embodiment is described with reference to FIG. 20. FIG. 20 is a timing chart showing the potential changes of the word lines WLn and WL(n+1) during the lower bit reading in the prior-reading and the main-reading.

As shown, the present embodiment is different from the first embodiment in that the voltage applied to the word line WLn is changed depending on whether the word line WL(n+1) has the "E"-level or the "A"-level in the main-reading.

While VREAD'_EA, VREADLA_B, and VREADLA_C are prepared as the voltages to be applied to the word line WL(n+1) in the first embodiment, VREAD'_E, VREADLA_A, VREADLA_B, and VREADLA_C are prepared in the present embodiment.

If the periods in which the respective voltages are applied are the periods BR1, BR2, BR3, and BR4, the sense amplifier 13 senses and strobes data in the period BR1 for a column in which the result of the prior-reading is the "E"-level. For a column in which the result of the prior-reading is the "A"-level, the sense amplifier 13 senses and strobes data in the period BR2. Moreover, for a column in which the result of the prior-reading is the "B"-level, the sense amplifier 13 senses and strobes data in the period BR3. For a column in which the result of the prior-reading is the "C"-level, the sense amplifier 13 senses and strobes data in the period BR4.

Figure 21:
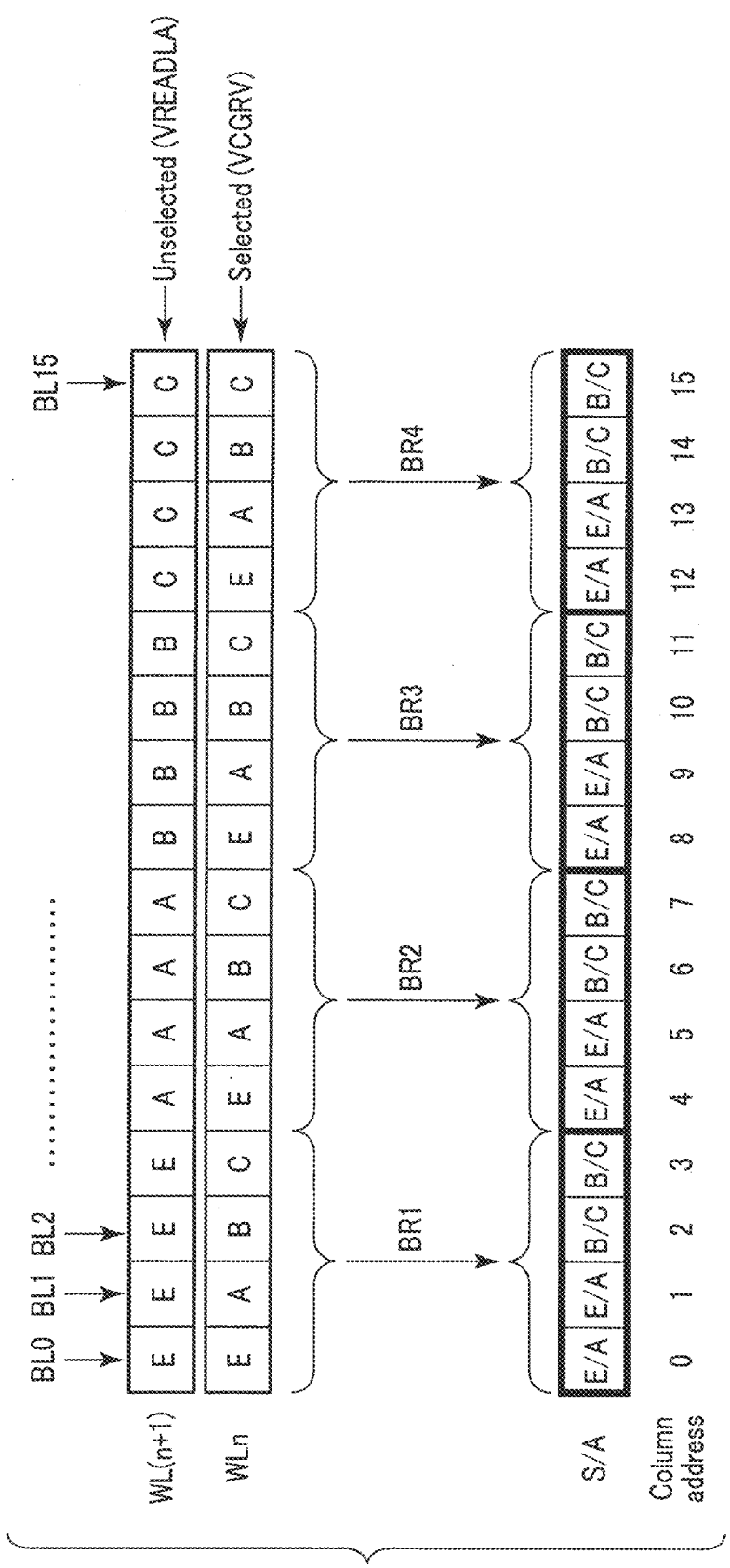
FIG. 21 is a schematic diagram showing page data and data fixed in a latch circuit in a sense amplifier during lower bit reading of the semiconductor memory device according to the second embodiment.

A specific example of the above operation is described with reference to FIG. 21. FIG. 21 corresponds to FIG. 10 described in the first embodiment.

As shown, in the period BR1, it is determined that the bits 0 and 1 are at the "E"-level or the "A"-level, and the bits 2 and 3 are at the "B"-level or the "C"-level. In the period BR2, it is determined that the bits 4 and 5 are at the "E"-level or the "A"-level, and the bits 6 and 7 are at the "B"-level or the "C"-level. Moreover, in the period BR3, it is determined that the bits 8 and 9 are at the "E"-level or the "A"-level, and the bits 10 and 11 are at the "B"-level or the "C"-level. In the period BR4, it is determined that the bits 12 and 13 are at the "E"-level or the "A"-level, and the bits 14 and 15 are at the "B"-level or the "C"-level.

2.2 Advantageous Effects According to the Present Embodiment

According to the present embodiment, it is possible to further improve the reliability of data reading than in the first embodiment. These advantageous effects are described in detail below.

Figure 22:
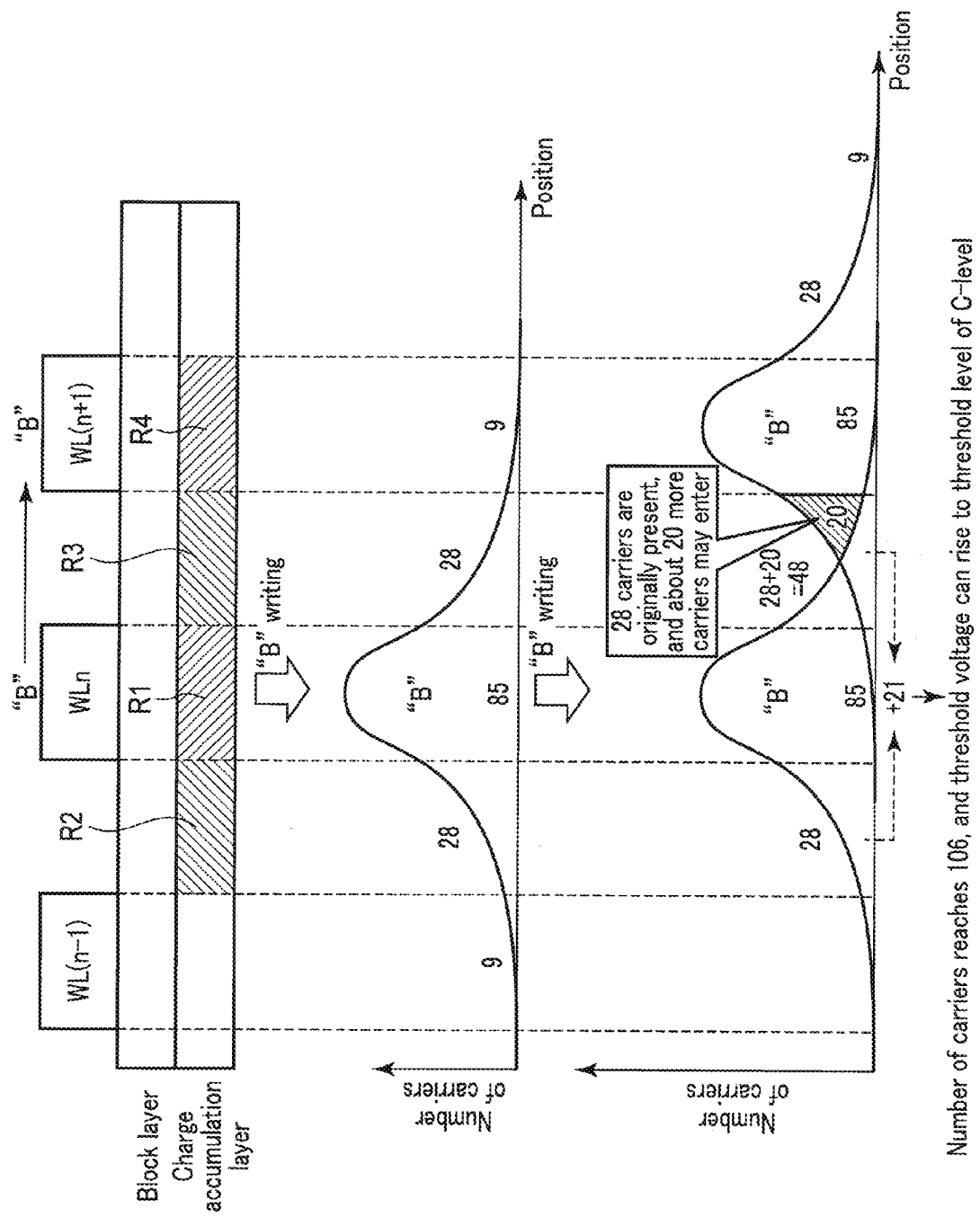
FIG. 22 is a schematic diagram showing a model of a charge distribution during writing.

FIG. 22 shows a charge distribution in the case where the "B"-level is written into the word line WLn and then the "B"-level is also written into the word line WL(n+1) in the models described with reference to FIG. 12 to FIG. 14 in the first embodiment.

As has been described with reference to FIG. 13, when the "B"-level is written into the word line WLn, 28 electrons, for example, are trapped in each of the areas R2 and R3 between the adjacent word lines WL(n−1) and WL(n+1).

Then in the model according to the first embodiment, no more electrons enter the area R3 when the same "B"-level is written into the word line WL(n+1) because about 28 electrons already exist in the area R3. However, it can be more realistic to consider that some electrons enter the area R3 rather than to consider that no more electrons enter. Based on this concept, FIG. 22 shows the case where about 20 electrons are newly trapped in the area R3 in which about 28 electrons already exist. In this case, the number of electrons in the area R1 is equivalently 106. That is to say, the threshold voltage of the "B"-level can rise to the "C"-level.

Figure 23:
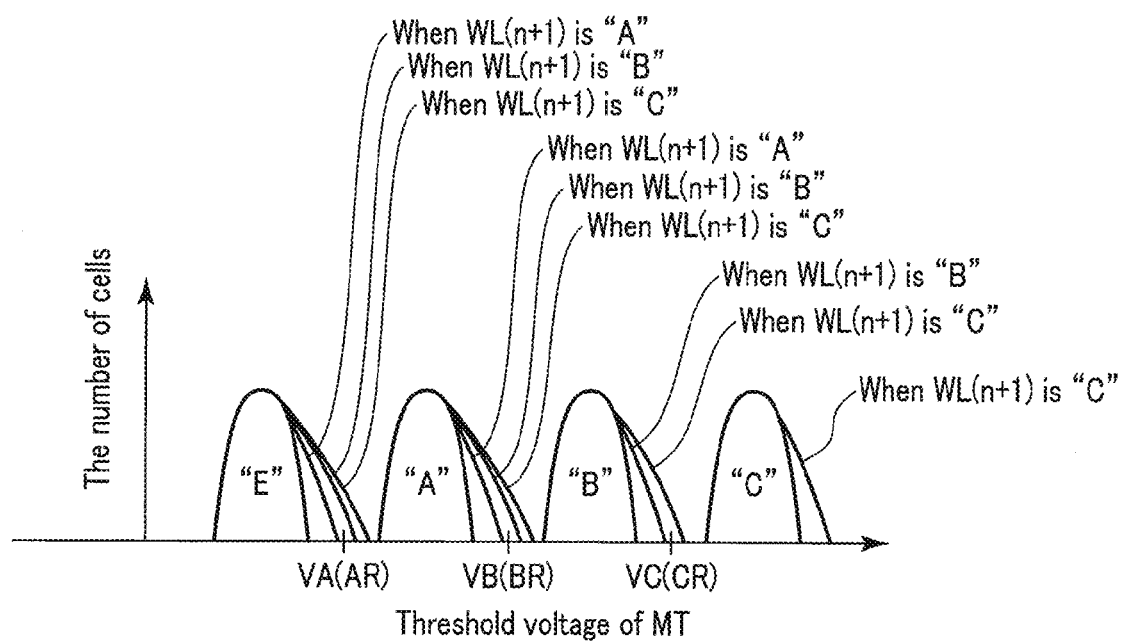
FIG. 23 is a graph showing threshold distributions of the memory cells.

FIG. 23 shows how the threshold distributions of the "E" to "C"-levels vary according to the above-mentioned inter-cell interference. As shown, when the memory cell transistor MTn has the "C"-level, the threshold rises if the memory cell transistor MT(n+1) adjacent thereto on the drain side has the "C"-level. The threshold of the "B"-level rises when the memory cell transistor MT(n+1) has the "B"-level or the "C"-level. The thresholds of the "A"-level and the "B"-level rise when the memory cell transistor MT(n+1) has the "A"-level, the "B"-level, or the "C"-level.

Thus, according to the present embodiment, the corrective reading is also performed when the bit adjacent on the drain side has the same threshold level as that of the bit targeted for reading. For example, in the period BR1 in FIG. 20, the corrective reading is performed by the application of VREADLA_E different from VREAD to the word line WL(n+1).

According to the present embodiment, it is also possible to precisely estimate the degree of the threshold variation attributed to the inter-cell interference, and improve the reliability of data reading.

3. Third Embodiment

Now, a semiconductor memory device according to a third embodiment is described. In the present embodiment, the voltage of the word line WL(n+1) is stepped up during a program-verification in the first or second embodiment described above. The differences between the present embodiment and the first and second embodiments are only described below.

Briefly, the concept of the present embodiment is described. The voltage V(n+1) applied to the unselected word line WL(n+1) in the program-verification corresponds to a program level ("A", "B", or "C" level) of the selected word line WLn. Further, the voltage VREADLA applied to the unselected word line WL(n+1) in the reading corresponds to a result of the prior-reading ("E", "A", "B", or "C" level) of the unselected word line WL(n+1). In the present embodiment, the voltages V(n+1) and VREADLA compensate an effect caused by electrons trapped into the charge storage layer between WLn and WL(n+1).

For example, the voltage V(n+1) is smaller than the voltage VREAD. Therefore, the data writing operation of the word line WLn passes the program-verification in a state with a lower channel conductance than in a case that the voltage VREAD is applied to the unselected word line WL(n+1). After that, when the data is read from the word line WLn, the state in which the program-verification is passed, that is, a low channel conductance state, may be recreated. Consequently, the value of the voltage VREADLA may be lowered than that in the first and second embodiments. In other words, the applying the voltage V(n+1) may be a preparation for lowering the voltage VREADLA.

3.1 Regarding Program-Verification

First, the program-verification according to the present embodiment is described with reference to FIG. 24. Data writing roughly includes a program operation to charge the charge storage layer to vary the threshold, and a program-verification operation to judge whether the threshold has risen to a desired value as a result of the programming. Data is then written by repeating the programming and the program-verification.

As shown in FIG. 24, a row decoder 12 applies a verification voltage Vvfy to the selected word line WL2 during the program-verification. The verification voltage Vvfy has a value corresponding to write data. The verification voltage Vvfy is Vvfy_A when the threshold level is the "A"-level. The verification voltage Vvfy is Vvfy_B when the threshold level is the "B"-level. The verification voltage Vvfy is Vvfy_C when the threshold level is the "C"-level. The verification voltages Vvfy_A, Vvfy_B, and Vvfy_C are voltages that are slightly higher than, for example, the read voltages VA, VB, and VC, respectively.

The row decoder 12 applies a voltage V(n+1) to the unselected word line WL3 adjacent to the selected word line WL2 on the drain side, and applies the voltage VREAD to the other unselected word lines WL0, WL1, and WL4 to WL7. The voltage V(n+1) will be described later.

The row decoder 12 applies the voltage VSG to the selection gate lines SGD and SGS, so that the selection transistors ST1 and ST2 are turned on. In this state, data is read from the memory cell transistor connected to the word line WL2 into the sense amplifier 13. If the memory cell transistor is turned on as a result, the threshold level has not reached a target level, and repeated programming is needed. On the other hand, if the memory cell transistor is turned off, the threshold level has reached the target level, and writing data into this memory cell transistor is completed.

Figure 25:
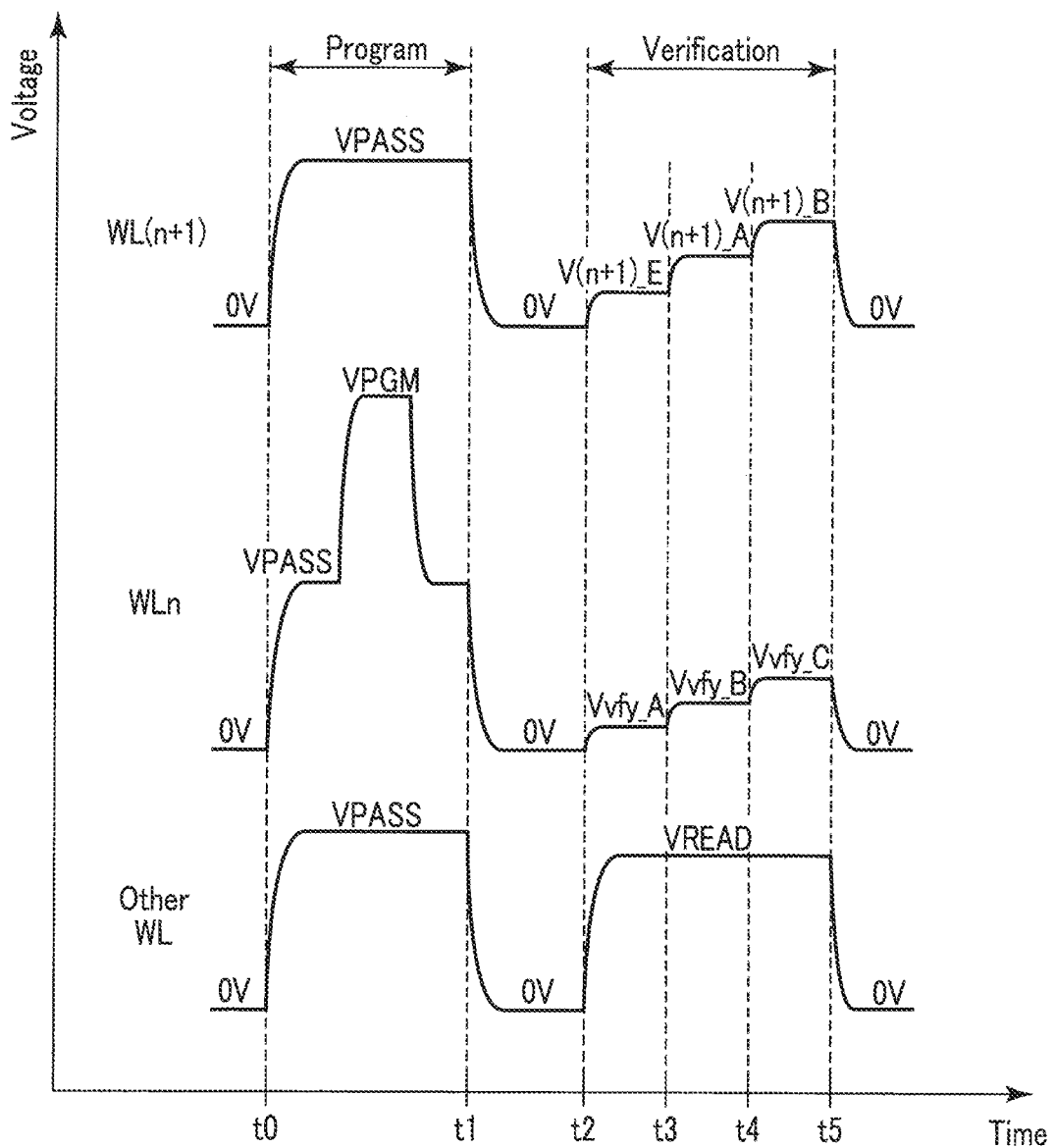
FIG. 25 is a timing chart showing the changes of the word line voltages during data writing of the semiconductor memory device according to the third embodiment.

FIG. 25 is a timing chart showing the potential changes of the word line WLn (WL2 in the example of FIG. 24) targeted for programming, the word line WL(n+1) (WL3 in the example of FIG. 24) adjacent thereto on the drain side and other unselected word lines WL during the data writing.

As shown, during programming, the row decoder 12 applies the program voltage VPGM to the selected word line WLn, and applies the voltage VPASS to the unselected word lines.

After applying the voltage VPGM to the selected word line WLn to perform programming, the program-verification is then performed. As shown in FIG. 25, during the program-verification, the verification voltages Vvfy_A, Vvfy_B, and Vvfy_C are sequentially applied to the selected word line WLn. However, depending on the number of repetitions of the combination of the programming and the program-verification, two or one of the voltages may be only applied. For example, the voltages Vvfy_A, Vvfy_B, and Vvfy_C are lower than the voltage VREAD.

Voltages V(n+1)_E, V(n+1)_A, and V(n+1)_B are applied to the word line WL(n+1) as the voltage V(n+1). The voltages V(n+1)_E, V(n+1)_A, and V(n+1)_B are associated with the verification voltages Vvfy_A, Vvfy_B, and Vvfy_C, respectively. Specifically, the voltage V(n+1)_E is applied to the word line WL(n+1) when the verification voltage Vvfy_A is applied to the word line WLn, the voltage V(n+1)_A is applied to the word line WL(n+1) when the verification voltage Vvfy_B is applied to the word line WLn, and the voltage V(n+1)_B is applied to the word line WL(n+1) when the verification voltage Vvfy_C is applied to the word line WLn.

3.2 Regarding Read Operation

Now, a data read operation according to the present embodiment is described with reference to FIG. 26. As shown, the voltages applied to the selected word line WLn and the unselected word line WL(n+1) during data reading are substantially similar to those described with reference to FIG. 8 in the first embodiment.

Although the upper bit reading is shown in FIG. 26, the same also applies to lower bit reading. That is, in FIG. 10 described in the first embodiment, the voltages VREAD'_EA, VREADLA_B, and VREADLA_C are applied to the unselected word line WL(n+1) when VCGRV_B is applied to the selected word line WLn.

Figure 27:
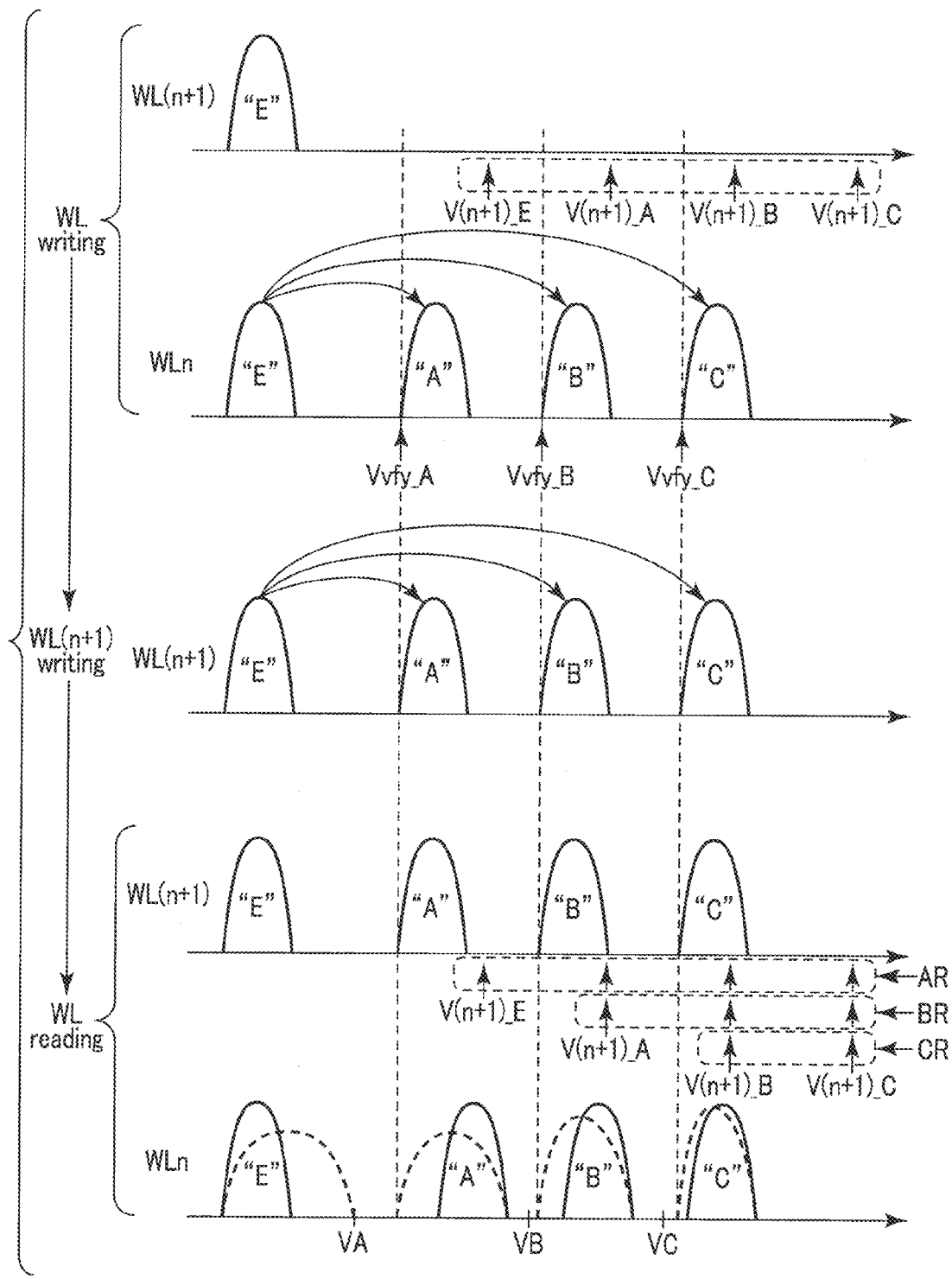
FIG. 27 is a schematic diagram showing the variation of the threshold distribution of the memory cells of the semiconductor memory device according to the third embodiment.

3.3 Regarding Read Operation and Change of Threshold Distribution by Data Writing Now, the variation of the threshold distribution of the memory cell transistor and the voltage V(n+1) according to the present embodiment are described with reference to FIG. 27. In the case shown below, data is written into the memory cell transistor connected to the word line WLn, data is then written into the memory cell transistor connected to the word line WL(n+1), and data is then read from the memory cell transistor connected to the word line WLn.

<Writing into Word Line WLn>

As shown, data is first written into the memory cell transistor connected to the word line WLn. As a result, the threshold voltage of the memory cell transistor whose threshold level is the "A"-level becomes higher than the verification voltage Vvfy_A. The threshold voltage of the memory cell transistor whose threshold level is the "B"-level becomes higher than the verification voltage Vvfy_B. The threshold voltage of the memory cell transistor whose threshold level is the "C"-level becomes higher than the verification voltage Vvfy_C.

During writing into the word line WLn, the voltages V(n+1)_E, V(n+1)_A, and V(n+1)_B are applied to the word line WL(n+1) at the time of the program-verification. As shown in FIG. 27, the verification voltage Vvfy and the voltage V(n+1) have, for example, the following relations:

$$Vvfy\_A < V(n+1)\_E,$$

$$Vvfy\_B < V(n+1)\_A, \text{ and}$$

$$Vvfy\_C < V(n+1)\_B.$$

These relations are by way of example only. For example, V(n+1)_E may be higher than Vvfy_B, and V(n+1)_A may be higher than Vvfy_C. For example, at least V(n+1)_E<V(n+1)_A<V(n+1)_B<VREAD has only to be satisfied. The voltage V(n+1)_C shown in FIG. 27 may be, for example, substantially the same voltage as the voltage VREAD, or may be a voltage higher than VREAD.

<Writing into Word Line WL(n+1)>

Data is then written into the memory cell transistor connected to the word line WL(n+1). The operation in this case is similar to that in the writing into the word line WLn.

<Reading from Word Line WLn>

Data is then read from the memory cell transistor connected to the word line WLn. The read operations AR, BR, and CR are described below.

Regarding Read Operation AR

In the read operation AR, the read voltage VA is applied to the selected word line WLn. When data is read from the selected cell (the memory cell transistor connected to the word line WLn) whose adjacent cell (the memory cell transistor connected to the word line WL(n+1)) is at the "E"-level in the prior-reading, the voltage V(n+1)_E is applied to the word line WL(n+1). When data is read from the selected cell whose adjacent cell is at the "A"-level, the voltage V(n+1)_A is applied to the word line WL(n+1). Moreover, when data is read from the selected cell whose adjacent cell is at the "B"-level, the voltage V(n+1)_B is applied to the word line WL(n+1). When data is read from the selected cell whose adjacent cell is at the "C"-level, the voltage V(n+1)_C is applied to the word line WL(n+1).

That is, in FIG. 26, the voltage of the word line WL(n+1) is set as follows:

$$VREAD'\_E = V(n+1)\_E,$$

$$VREADLA\_A = V(n+1)\_A,$$

$$VREADLA\_B = V(n+1)\_B,$$

$$VREADLA\_C1 = V(n+1)\_C$$

Regarding Read Operation CR

In the read operation CR, the read voltage VC is applied to the selected word line WLn. When data is read from the selected cell whose adjacent cell is at the "E"-, "A"-, or "B"-level, the voltage V(n+1)_B is applied to the word line WL(n+1). When data is read from the selected cell whose adjacent cell is at the "C"-level, the voltage V(n+1) C is applied to the word line WL(n+1).

That is, in FIG. 26, the voltage of the word line WL(n+1) is set as follows:

$$VREAD'\_EAB = V(n+1)\_B,$$

$$VREADLA\_C1 = V(n+1)\_C$$

Regarding Read Operation BR

In the read operation BR, the read voltage VB is applied to the selected word line WLn. When data is read from the selected cell whose adjacent cell is at the "E"- or "A"-level, the voltage V(n+1)_A is applied to the word line WL(n+1). Moreover, when data is read from the selected cell whose adjacent cell is at the "B"-level, the voltage V(n+1)_B is applied to the word line WL(n+1). When data is read from the selected cell whose adjacent cell is at the "C"-level, the voltage V(n+1)_C is applied to the word line WL(n+1).

That is, in FIG. 10, the voltage of the word line WL(n+1) is set as follows:

$$VREAD'\_EA = V(n+1)\_A,$$

$$VREADLA\_B = V(n+1)\_B,$$

$$VREADLA\_C1 = V(n+1)\_C$$

3.4 Advantageous Effects According to the Present Embodiment

According to the present embodiment, it is also possible to compensate the threshold variation attributed to the inter-cell interference, and improve the reliability of data reading, as in the first and second embodiments. These advantageous effects are described below.

According to the present embodiment, the inter-cell interference is canceled by the voltages during the program-verification and reading. That is to say, when the word line WLn is selected, the voltage of the word line WL(n+1) is adjusted both during the program-verification and during reading to cancel the inter-cell interference.

First, in the program-verification, as has been described with reference to FIG. 25 and FIG. 27, the voltages V(n+1)_E, V(n+1)_A, and V(n+1)_B are applied to the word line WL(n+1) in accordance with the verification levels. The degree of the inter-cell interference depends on the threshold level of the word line WLn. That is to say, the easiness of the variation of the threshold voltage varies according to the data held.

Assuming that the voltage applied to the unselected word line WL(n+1) in the program-verification is independent (for example, constant voltage) from the program level of the selected word line WLn, the inter-cell interference on the cell is smaller and the variation of its threshold voltage is also smaller when the word line WLn is set to a higher threshold level (e.g., the "C"-level). In contrast, the inter-cell interference on the cell is greater and the variation of its threshold voltage is also greater when the word line WLn is set to a lower threshold level (e.g., the "A"-level).

According to the present embodiment, the correction amount for the cell having a lower threshold level is greater, and the correction amount for the cell having a higher threshold level is smaller. Specifically, to increase the correction amount, the voltage of the word line WL(n+1) for the program-verification (for example, V(n+1)_E, V(n+1)_A and, V(n+1)_B) is significantly lowered with respect to the voltage VREAD. On the other hand, to decrease the correction amount, the voltage of the word line WL(n+1) for the program-verification is slightly decreased with respect to the voltage VREAD. Thus, in the writing into the word line WLn, the selected cell is subjected to the influence of the voltage varying according to the data to be written from the word line WL(n+1).

In data reading, as has been described with reference to FIG. 26 and FIG. 27, the voltage V(n+1) is applied to the unselected word line WL(n+1) in accordance with the result of the prior-reading. For example, suppose that the threshold of the memory cell connected to the word line WLn is at the "A"-level, and the "C"-level is then written into the memory cell connected to the word line WL(n+1). Since the "C"-level is written into the memory cell connected to the word line WL(n+1), the "A"-level of the memory cell connected to the word line WLn is subjected to the inter-cell interference, and the threshold voltage shifts accordingly. However, it is known that the threshold level of the memory cell is the "C"-level because of the prior-reading when data is read from the memory cell connected to the word line WL(n+1). In this case, rather than the voltage V(n+1)_E used for the program-verification, the voltage VREADLA_C1 (=V(n+1)_C) is applied to the word line WL(n+1). As a result, the threshold voltage shift of the "A"-level can be canceled by the potential difference between the voltages V(n+1)_E and V(n+1)_C.

Figure 28:
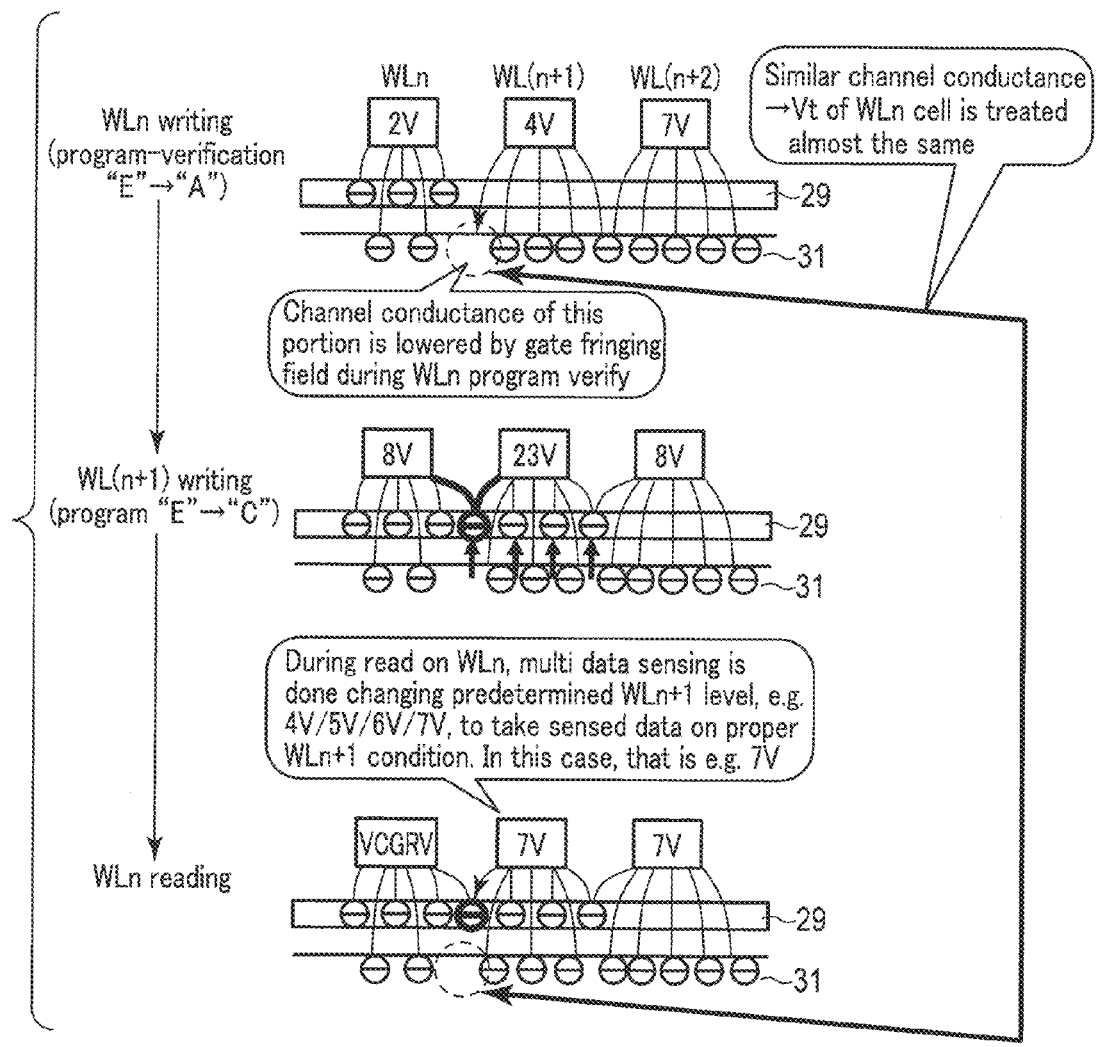
FIG. 28 is a schematic diagram showing the state of a charge in a partial area of the NAND string of the semiconductor memory device according to the third embodiment.

This situation is shown in the schematic diagram of FIG. 28. The uppermost stage in the diagram of FIG. 28 shows the situation of the program-verification when the "A"-level is programmed in the memory cell connected to the word line WLn. As shown, the verification voltage Vvfy_A=2 V is applied to the word line WLn, and the voltage VREAD=7 V is applied to the unselected word line WL(n+2). The voltage V(n+1)_E=4 V lower than VREAD is then applied to the unselected word line WL(n+1). Accordingly, the amount of charge induced between the word lines WLn and WL(n+1) is smaller and channel conductance is lower than when the voltage VREAD is applied. That is to say, programming to the memory cell connected to the word line WLn is performed so that the "A"-level is read under the condition in which the channel conductance is lower.

As shown in the middle stage of FIG. 28, the "C"-level is written into the memory cell connected to the word line WL(n+1). Accordingly, the voltage VPGM=23 V is applied to the selected word line WL(n+1), and the voltage VPASS=8 V is applied to the unselected word lines WLn and WL(n+2). The adjacent memory cells more affect each other as the space therebetween decreases. Therefore, as shown, a charge is trapped in the charge storage layer 29 in the region between the word lines WLn and WL(n+1) due to the voltages VPGM and VPASS. The trap amount varies according to the data to be written into the memory cell connected to the word line WL(n+1), and more charges are trapped when a higher threshold level is set.

As shown in the lower stage of FIG. 28, data is then read from the word line WLn. By a method according to the present embodiment, the state of the channel conductance during this reading is set to be equal to the state in the upper stage in the diagram of FIG. 28. To this end, the voltage of the unselected word line WL(n+1) is adjusted. In this example, the voltage VREADLA_C1(=V(n+1)_C)=7 V is applied to the word line WL(n+1). The influences of the voltage V(n+1)_C and the voltage VCGRV compensate the influence of the charge trapped in the charge storage layer 29 between the word lines WLn and WL(n+1). That is to say, the voltage of the word line WL(n+1) is selected in accordance with the results of the prior-reading of the memory cell connected to the word line WL(n+1). The selecting the voltage of the WL(n+1) cancels an influence of the charges trapped in the charge storage layer 29 between the word line WLn and the word line WL(n+1). For example, the voltage of the word line WL(n+1) is increased if the trap amount is great, and the voltage of the word line WL(n+1) is decreased if the trap amount is small.

As a result, the channel conductance during the reading of data from the memory cell connected to the word line WLn is substantially the same as that during the writing of data into the memory cell connected to the word line WLn, and data can be correctly read.

Figure 29:
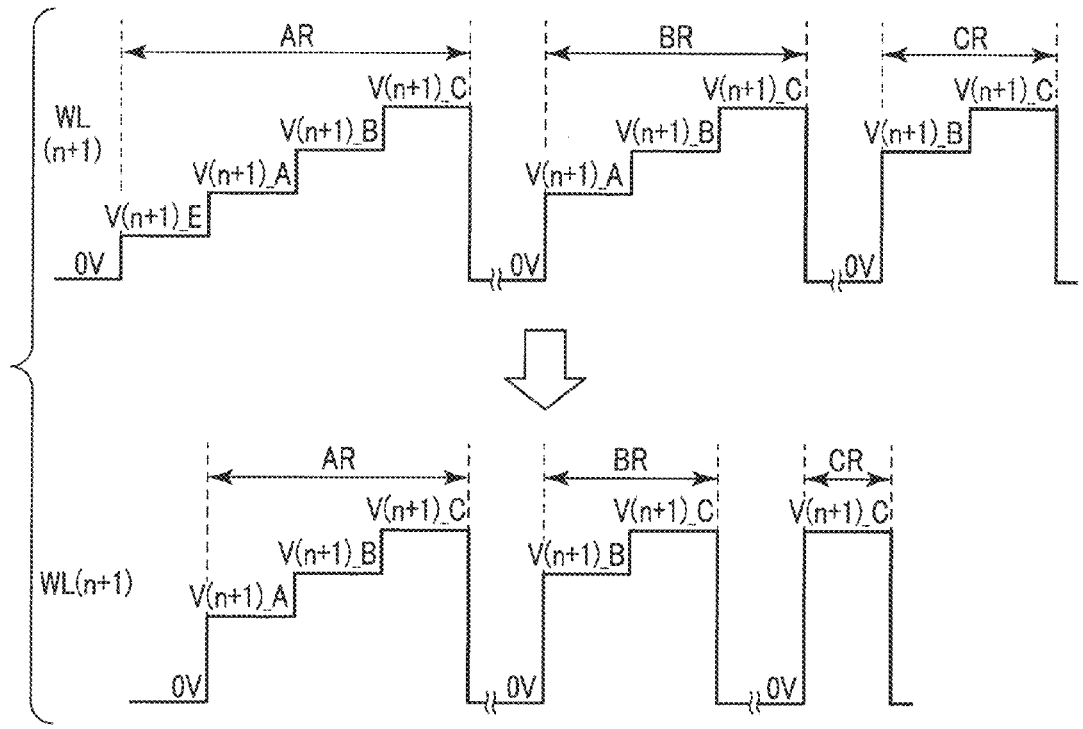
FIG. 29 is a timing chart showing the changes of the word line voltages during data writing of the semiconductor memory device according to the third embodiment.
Figure 30:
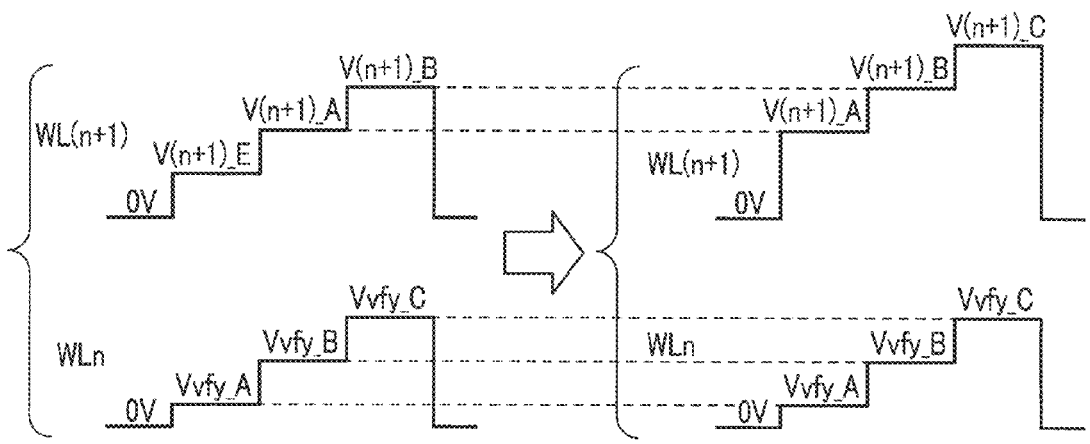
FIG. 30 is a timing chart showing the changes of the word line voltages during a program-verification of the semiconductor memory device according to the third embodiment.

The voltages applied to the word line WL(n+1) during reading are not limited to the voltages in FIG. 26. For example, the voltages may be as shown in FIG. 29. That is, in the example described above, the voltage of the word line WL(n+1) is set to four levels (V(n+1)_E, V(n+1)_A, V(n+1)_B, and V(n+1)_C) in the read operation AR, three levels (V(n+1)_A, V(n+1)_B, and V(n+1)_C) in the read operation BR, and two levels (V(n+1)_B and V(n+1)_C) in the read operation CR.

However, the voltage may be set to three levels (V(n+1)_A, V(n+1)_B, and V(n+1)_C) in the read operation AR, two levels (V(n+1)_B and V(n+1)_C) in the read operation BR, and one level (V(n+1)_C) in the read operation CR.

The voltage may also be set as shown in FIG. 18 and FIG. 20 described in the second embodiment. In this case, the voltage may be set to four levels (V(n+1)_E, V(n+1)_A, V(n+1)_B, and V(n+1)_C) in the read operations AR and BR, three levels (V(n+1)_A, V(n+1) B, and V(n+1)_C) in the read operation CR, and one level (V(n 1)_C) in the read operation CR.

Furthermore, according to the present embodiment, the voltage of the word line WL(n+1) may be set to four levels (V(n+1)_E, V(n+1)_A, V(n+1)_B, and V(n+1)_C) in all the read operations AR, BR, and CR. That is, the correcting operation of the threshold voltage may be performed regardless of the data held in the adjacent cell.

4. Fourth Embodiment

Now, a semiconductor memory device according to a fourth embodiment is described. According to the present embodiment, the value of the voltage VCGRV is shifted to cancel the inter-cell interference in the first or second embodiment.

4.1 Regarding Read Operation

The read operation according to the present embodiment roughly includes a first read operation and a second read operation. The first read operation is performed regardless of the inter-cell interference, and the second read operation is performed to cancel the inter-cell interference.

Therefore, during the first read operation, the prior-reading is not performed, and the main-reading is performed. In this instance, the voltage VREADLA for correction is not used, and, for example, the voltage VREAD is applied to all the unselected word lines.

The second read operation is performed when data cannot be correctly read in the first read operation. That is to say, when the controller issues a read instruction to the NAND flash memory 10, the NAND flash memory 10 performs the first read operation in response to the instruction. However, when the read operation has failed, for example, when read data includes errors that cannot be corrected by ECC, the controller issues a second read instruction. In response to this instruction, the NAND flash memory 10 performs the second read operation.

Details of the second read operation are described with reference to FIG. 31. As shown, the voltage applied to the selected word line WLn and the unselected word line WL(n+1) during the second read operation are substantially similar to those in FIG. 8 described in the first embodiment. However, in contrast to FIG. 8, in the fourth embodiment, the value of the read voltage VCGRV applied to the selected word line WLn is higher than that in the first embodiment (a broken line in the graph indicates the case in the first embodiment, and a solid line indicates the case in the fourth embodiment). The value of the read voltage VCGRV during the second read operation is set to be higher than that of the voltage VCGRV during the first read operation.

Although the upper bit reading is only shown in FIG. 31, the same also applies to lower bit reading. That is to say, in FIG. 10 described in the first embodiment, the voltages VREAD'_EA, VREADLA_B, and VREADLA_C are set to lower values than in the first embodiment, and the read voltage VCGRV is set to a higher value.

4.2 Regarding Variation of Threshold Distribution

Figure 32:
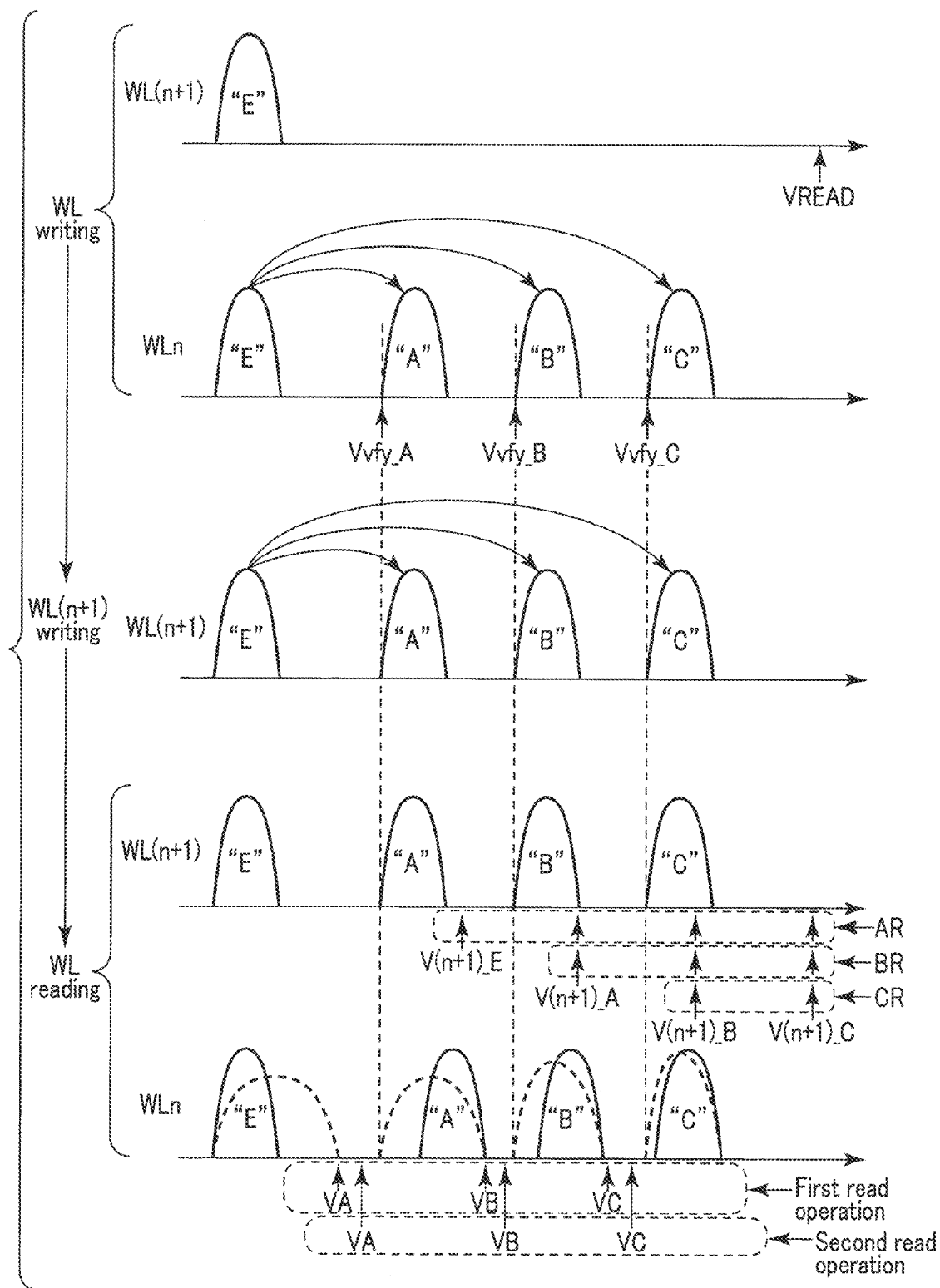
FIG. 32 is a schematic diagram showing the variation of the threshold distribution of the memory cells of the semiconductor memory device according to the fourth embodiment.

Now, the variation of the threshold distribution of the memory cell transistor according to the present embodiment is described with reference to FIG. 32. In the case shown below, data is written into the memory cell transistor connected to the word line WLn, data is then written into the memory cell transistor connected to the word line WL(n+1), and data is then read from the memory cell transistor connected to the word line WLn. The operation according to the present embodiment is substantially similar to that in FIG. 27 described in the fourth embodiment. The differences between FIG. 32 and FIG. 27 are only described below.

First, data is written into the memory cell transistor connected to the word line WLn. In contrast to FIG. 27, the voltage VREAD (or a voltage VREADk higher than VREAD) is applied to the word line WL(n+1) during the program-verification. That is, the word line WL(n+1) is set to a constant value (i.e., does not vary with the verification level) during the program-verification.

Data is then written into the memory cell transistor connected to the word line WL(n+1).

Data is then read from the memory cell transistor connected to the word line WLn. In the read operations AR, BR, and CR, the voltages applied to the unselected word line WL(n+1) are similar to those in FIG. 27. As described above, the voltage applied to the selected word line WLn is different from that in FIG. 27. The voltages VA, VB, and VC in the first read operation have the same values as those in, for example, FIG. 27. However, in the second read operation, the voltages VA, VB, and VC are stepped up. Moreover, in the second read operation, data is correctly read, or data is repeatedly read up to a specified number of times, and the voltages VA, VB, and VC are stepped up every time.

4.3 Advantageous Effects According to the Present Embodiment

According to the present embodiment, it is also possible to compensate the threshold variation attributed to the inter-cell interference, and improve the reliability of data reading, as in the first to third embodiments. These advantageous effects are described below.

As described above, the threshold voltage of the memory cell transistors coupled to the word line WLn rises due to the inter-cell interference during the writing into the word line WL(n+1). The degree of the rise in the memory cells having lower threshold levels is greater than that in the memory cells having higher threshold levels. For example, as shown in FIG. 17, the upper limit value of the threshold distribution shifts to the higher voltage side, and the lower limit value makes almost no change. As a result, the space between the threshold distributions of the neighboring threshold levels becomes narrower (i.e., the distribution width of the individual threshold level becomes greater), and erroneous reading more easily occurs.

Thus, according to the present embodiment, the voltage V(n+1) lower than the voltage VREAD used during the program-verification is applied to the word line WL(n+1) during reading. In this way, the lower limit value of the threshold distribution of the word line WLn is shifted to the higher voltage side. In this instance, the lower limit value of the threshold distribution makes almost no change.

As a result, the width of the threshold distribution during reading can be reduced. That is to say, as shown in the threshold distribution diagram of word line WLn during the reading from the word line WLn in FIG. 32, the threshold distribution that has spread as indicated by broken lines narrows as indicated by solid lines.

That is, all the threshold distributions of the "A"-, "B"- and "C"-levels shift to the higher voltage side. Thus, according to the present embodiment, the read voltage VCGRV (=VA, VB, and VC) is also shifted to the higher voltage side along with the shift of the threshold distributions. Therefore, a suitable voltage between the adjacent threshold distributions can be used as a read voltage, so that data can be correctly read.

This situation is shown in the schematic diagram of FIG. 33. The uppermost stage in the diagram of FIG. 33 shows the situation of the program-verification when the "A"-level is programmed in the word line WLn. As shown, the verification voltage Vvfy_A=2 V is applied to the selected word line WLn, and the voltage VREAD=7 V is applied to the unselected word lines WL(n+1) and WL(n+2). Accordingly, the amount of charge induced between the word lines WLn and WL(n+1) is greater and channel conductance is higher than in the case described with reference to FIG. 28. That is to say, programming of the word line WLn is performed so that the "A"-level is read under the condition in which channel conductance is higher than that in FIG. 28.

As shown in the second stage of FIG. 33, the "C"-level is written into the word line WL(n+1). Accordingly, the voltage VPGM=23 V is applied to the selected word line WL(n+1), and the voltage VPASS=8 V is applied to the unselected word lines WLn and WL(n+2). As has been described with reference to FIG. 28, a charge is trapped in the charge storage layer 29 in the region between the word lines WLn and WL(n+1).

As shown in the third stage of FIG. 33, data is then read from the word line WLn. In the case shown in the third stage of the diagram, VREAD is applied to the word line WL(n+1) in two cases: when the word line WL(n+1) is at the "C"-level and the "E"-level. As shown, when the word line WL(n+1) is at the "C"-level, the influence of the charge trapped in the charge storage layer 29 between the word lines WLn and WL(n+1) is almost offset by VREAD of the word line WL(n+1) and VCGRV of the word line WLn. In contrast, when the word line WL(n+1) is at the "E"-level, no charge is trapped in the charge storage layer 29 between the word lines WLn and WL(n+1), so that a charge is induced between the word lines WLn and WL(n+1). That is to say, the channel conductance varies depending on the level of the word line WL(n+1).

Thus, according to the present embodiment, as shown in the lowermost stage of FIG. 33, the voltage V(n+1) corresponding to the threshold level of the word line WL(n+1) is applied to the word line WL(n+1). In the case shown in FIG. 33, the level of the word line WL(n+1) is the "E"-level, and the voltage V(n+1)_E=4 V is applied to the word line WL(n+1). As shown, the voltage of the word line WL(n+1) is reduced to 4 V from 7 V, so that the induction of a charge between the word lines WLn and WL(n+1) can be inhibited. As a result, the channel conductance when the adjacent cell is at the "C"-level can be substantially equal to the channel conductance when the adjacent cell is at the "E"-level.

In addition, the method of the corrective reading described in the first to third embodiments may also be carried out during the second read operation. That is to say, when the first read operation is performed and data cannot be correctly read, the reading method described in the first to third embodiments may be carried out.

5. Fifth Embodiment

Now, a semiconductor memory device according to a fifth embodiment is described. In the present embodiment, the voltages VREADLA and VREAD' have layer dependence in the first and second embodiments described above. The differences between the present embodiment and the first and second embodiments are only described below.

5.1 Regarding Layer Dependence of Voltages VREADLA and VREAD'

Figures 35, 36:
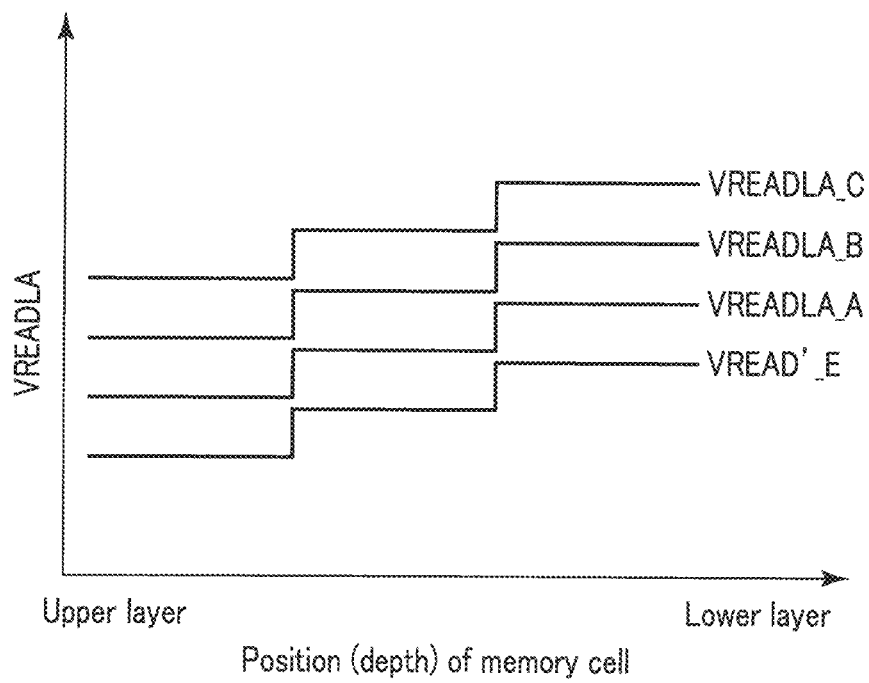

FIG. 34 and FIG. 35 are graphs showing the change of the voltage VREADLA according to the position of a memory cell. Although VREADLA_A, VREADLA_B, and VREADLA_C are shown as the voltages VREADLA in FIG. 34 and FIG. 35, the same also applies to the other voltages VREADLA, for example, VREADLA_EA and VREADLA_C1 described in the first embodiment.

As shown, VREADLA and VREAD' according to the present embodiment have layer dependence. In the example of FIG. 34 and FIG. 35, the voltage values of VREADLA applied to the lower memory cell transistors MT are higher. For example, in the example of FIG. 3, VREADLA and VREAD' applied to the lowermost word line WL0 are the highest, and VREADLA and VREAD' applied to the uppermost word line WL7 is the lowest.

The values of the voltage VREADLA and VREAD' may successively change as shown in FIG. 34 (the values of VREADLA and VREAD' change for every word line). Alternatively, as shown in FIG. 35, the values of the voltages VREADLA and VREAD' may change by a given zone unit (e.g., VREADLA and VREAD' applied to the word lines WL0 to WL1 may have the same value, VREADLA and VREAD' applied to the word lines WL2 to WL5 may have the same value, and VREADLA and VREAD' applied to the word lines WL6 to WL7 may have the same value).

5.2 Regarding Correction Table

FIG. 36 is a conceptual diagram of a correction table held in, for example, the register 17. The NAND flash memory 10 according to the present embodiment holds the correction table shown in FIG. 36 to control the voltages VREADLA and VREAD' as has been described with reference to FIG. 34 and FIG. 35. FIG. 36 shows the correction table corresponding to FIG. 35 by way of example.

The correction table holds correction values for the voltages VREADLA and VREAD'. For example, in the example of FIG. 36, a correction value ΔVE_upper for an upper layer, a correction value ΔVE_mid for a middle layer, and a correction value ΔVE_low for a lower layer are held for the voltage VREAD'. A voltage generating circuit which is not shown in FIG. 1 then applies the correction value to the voltage VREAD in accordance with an instruction from the sequencer 16, and thereby generates the voltage VREAD'_E to be applied to each layer. That is to say, when the voltage VREAD'_E is applied to the upper word line WL, the voltage generating circuit generates VREAD+ΔVE_upper as VREAD'_E. When the voltage VREAD'_E is applied to the middle word line WL, the voltage generating circuit generates VREAD+ΔVE_mid as VREAD'_E. Moreover, when the voltage VREAD'_E is applied to the lower word line WL, the voltage generating circuit generates VREAD+ΔVE_low as VREAD'_E. The same also applies to the other voltages VREADLA_A, VREADLA_B, and VREADLA_C.

Figure 37:
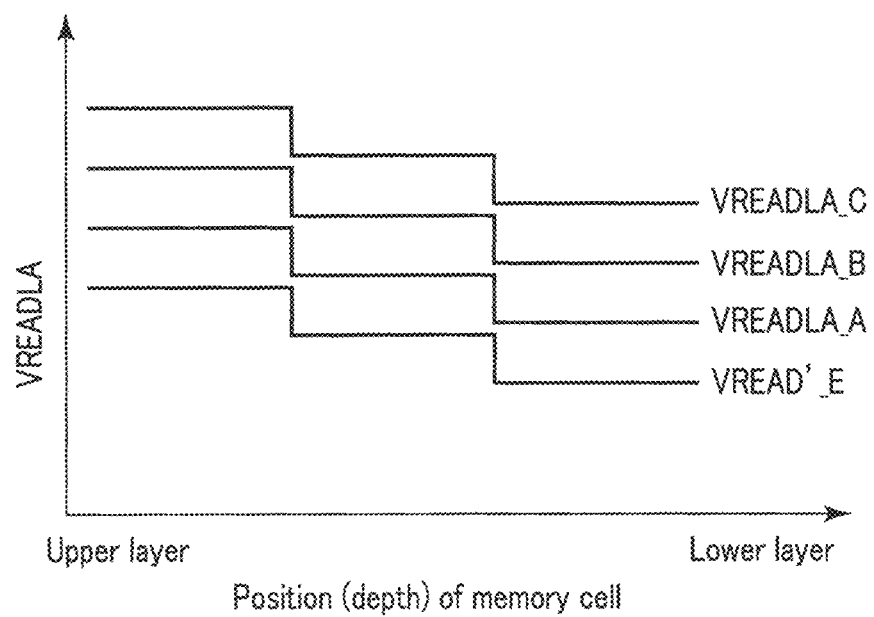
FIG. 37 is a graph showing layer dependence of the voltages VREADLA of the semiconductor memory device according to a modification of the fifth embodiment.

Although the inter-cell interference is greater in the lower layers in the case described above by way of example, the inter-cell interference may be greater in the upper layers. In this case, VREADLA and VREAD' have only to be higher in the upper layers as shown in FIG. 37.

5.3 Advantageous Effects According to the Present Embodiment

The configuration according to the present embodiment can further improve the reliability of data reading than in the first and second embodiments. These advantageous effects are described in detail below.

The memory cell array 11 shown in FIG. 3 is formed by, for example, the following method: First, the conductive layers 27, 23, and 25 are sequentially formed on the semiconductor substrate with unshown insulating films therebetween. The memory hole 26 is then made through the conductive layers 25, 23, and 27 and the insulating films. The insulating films 28, 29, and 30 are then formed inside the memory hole 26, and the conductive layer 31 is further formed to fill the memory hole 26.

Figure 38:
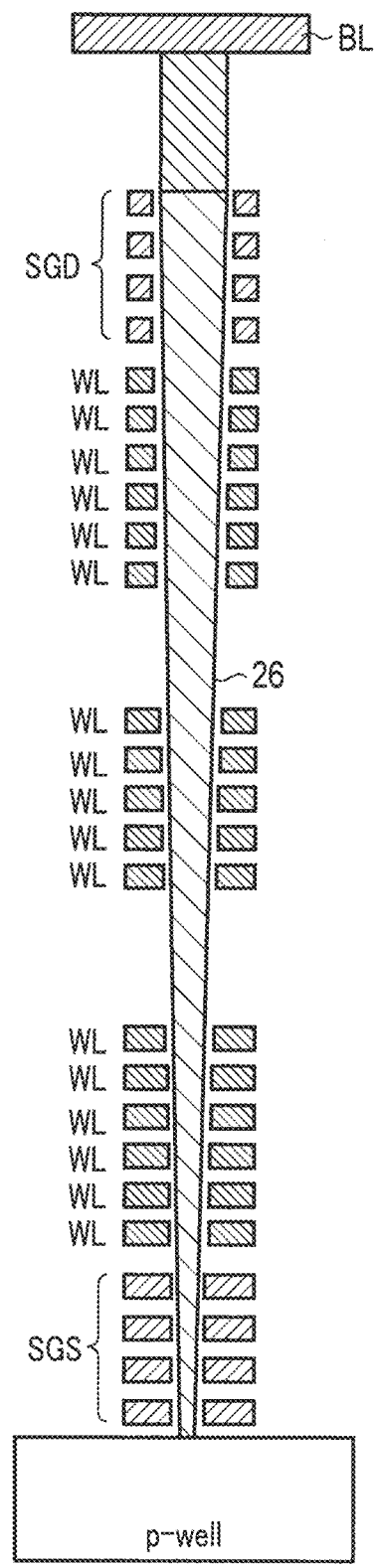
FIG. 38 and FIG. 39 are sectional views of the NAND string, respectively.

When the memory cell transistor MT has the three-dimensionally stacked structure as shown in FIG. 3, the degree of integration can be improved by the increase in the number of layers in the conductive layer 23. However, when the number of layers is greater, it becomes more difficult to make the memory hole 26. Specifically, the memory hole is larger in diameter closer to its upper end and smaller in diameter closer to its lower end. This situation is shown in FIG. 38. That is to say, as shown in FIG. 38, the memory hole 26 is tapered. In other words, the size of the memory cell transistor MT varies according to the layer. As a result, the inter-cell interference may also vary according to the layer.

Thus, according to the present embodiment, the voltage VREADLA also has layer dependence in accordance with the layer dependence of the inter-cell interference. In the example of FIG. 34 and FIG. 35, it is assumed that the inter-cell interference is greater in the lower layers, and the values of VREADLA and VREAD' are higher in the lower layers. Therefore, the inter-cell interference can be effectively suppressed.

Figure 39:
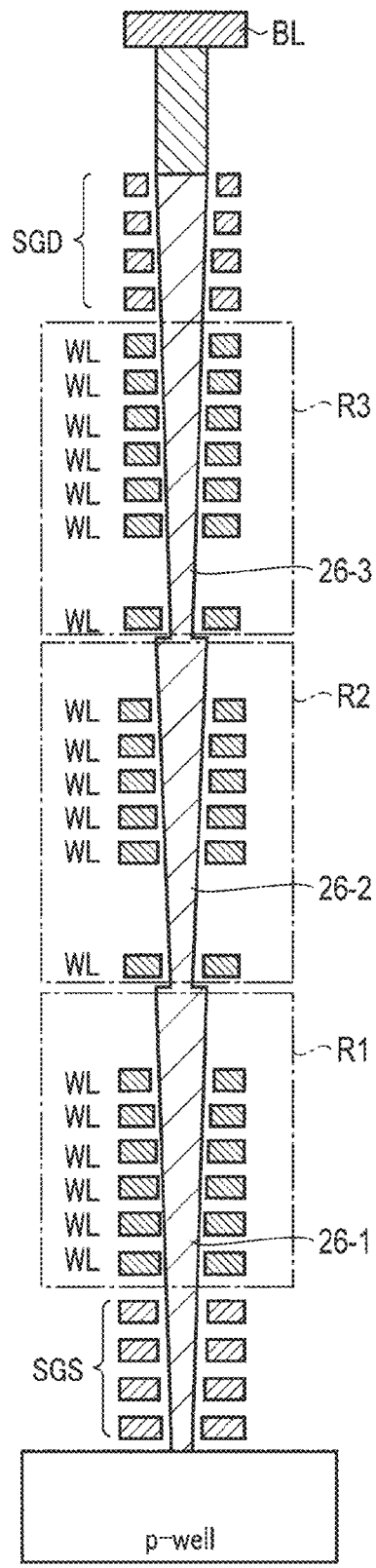

The memory hole 26 is not exclusively made by one etching step, and may be formed by multiple etching steps. The purpose of this is to lessen the size difference of the memory cells in the upper layers and the lower layers when the number of layers is greater. Such an example is shown in FIG. 39. In the example of FIG. 39, the memory hole 26 is made by three etching steps. As shown, tapered memory holes 26-1 to 26-3 are made in three regions R1 to R3 of the NAND string, respectively.

Figure 40:
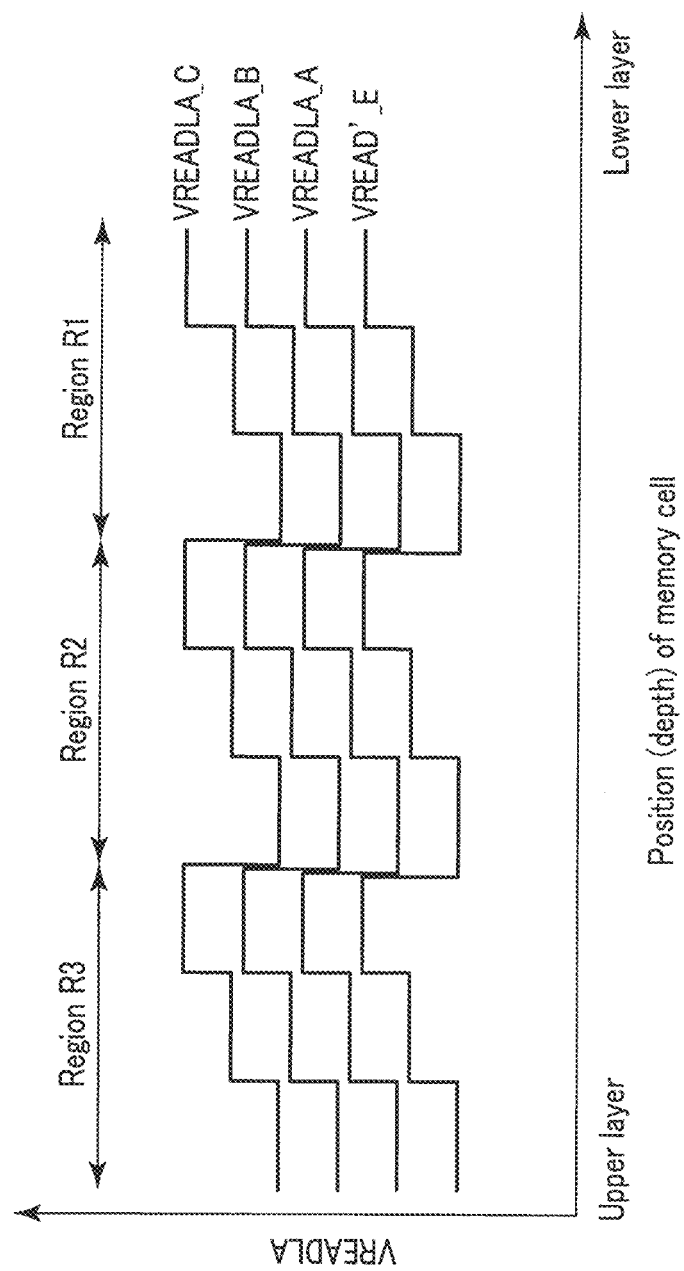
FIG. 40 to FIG. 44 are graphs showing layer dependence of the voltages VREADLA of the semiconductor memory device according to modifications of the fifth embodiment, respectively.
Figure 41:
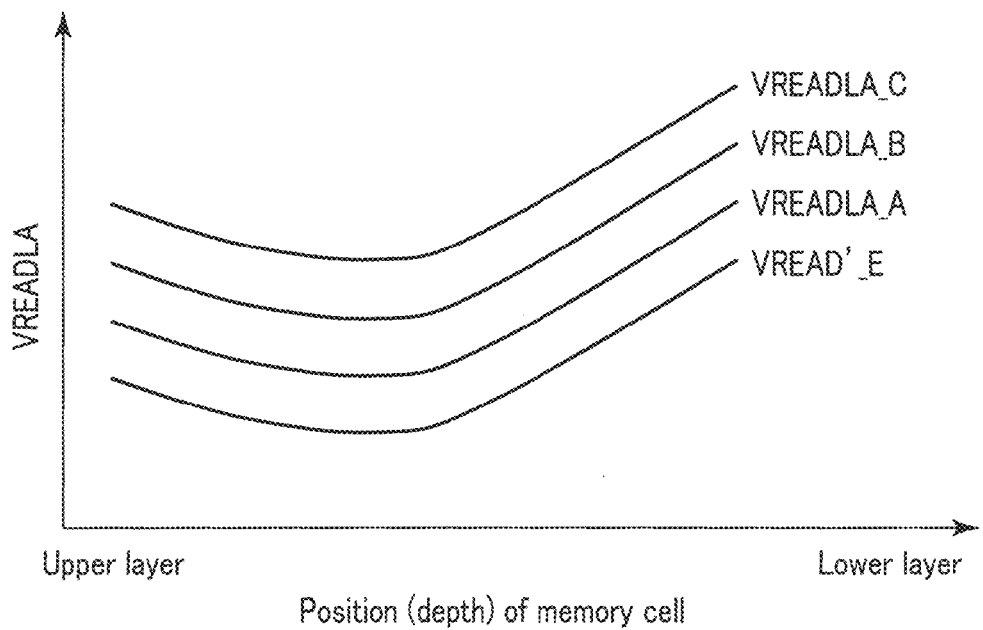
Figure 42:
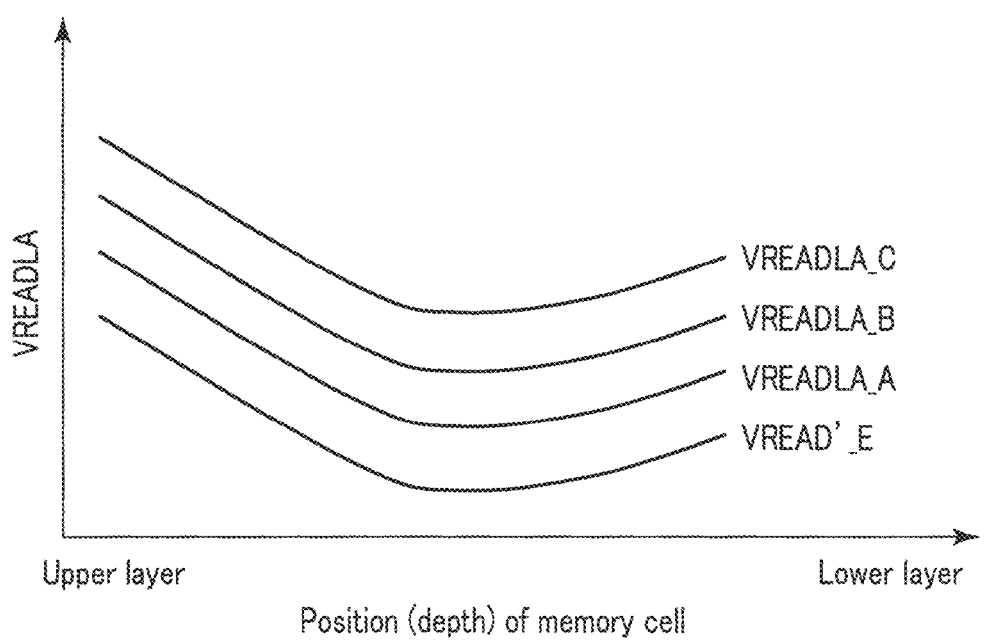
Figure 43:
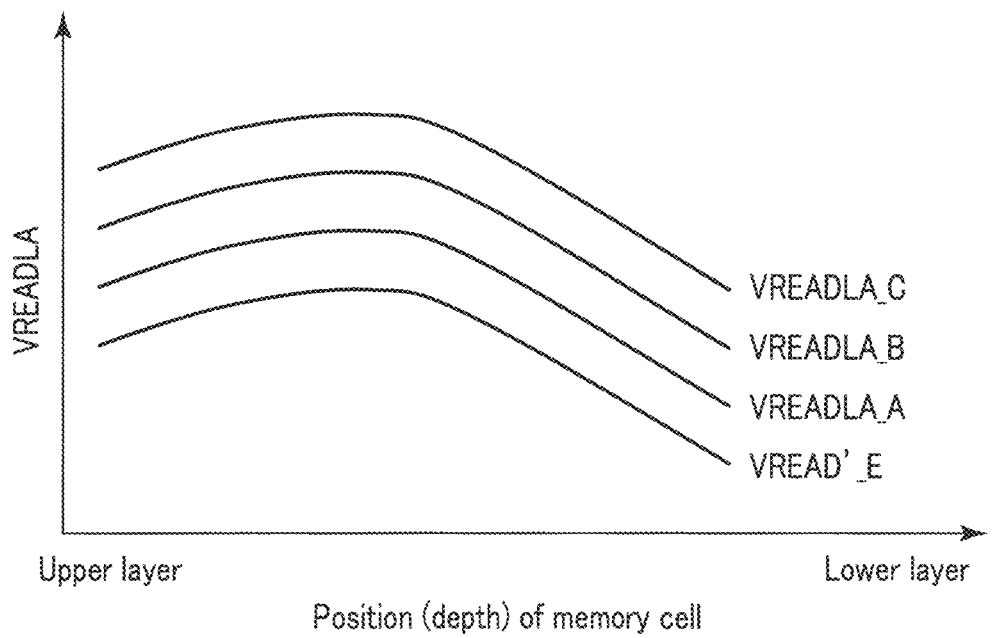
Figure 44:
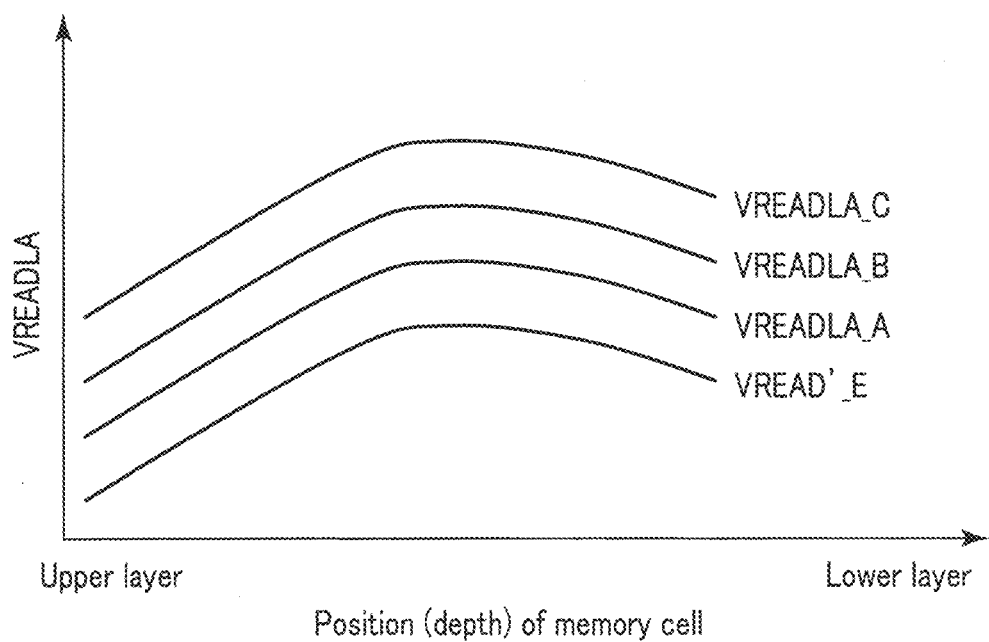

The voltages VREADLA and VREAD' in this case can be set, for example, as shown in FIG. 40. That is to say, VREADLA and VREAD' are not simply dependent on the layers, but may be dependent on the diameters of the memory holes 26, i.e., the sizes of the memory cell transistors MT. The sequencer 16 can recognize the layer in which the word line WL to apply VREADLA and VREAD' to is located, in accordance with the address received from the controller. That is to say, it can also be said that the address is associated with VREADLA and VREAD'.

The correction values shown in FIG. 36 may vary according to the kinds of VREADLA and VREAD' or vary according to the layer. Alternatively, the correction table may have information indicating the values of VREADLA and VREAD' instead of the correction values.

The layer dependence of the voltages VREADLA and VREAD' may be as shown in FIG. 41 to FIG. 44. That is to say, the diameter of the memory hole 26 may be the largest in the middle layer rather than in the upper layer. The values of VREADLA and VREAD' in this case may be set so that the value applied to the middle layer takes the maximum.

6. Sixth Embodiment

Now, a semiconductor memory device according to a sixth embodiment is described. The present embodiment takes into consideration the inter-cell interference from the word line WL(n−1) adjacent on the source side during reading for determining the "E"-level in the first to fifth embodiments. The differences between the present embodiment and the first to fifth embodiments are only described below.

6.1 Regarding Details of Read Operation

Figure 45A:
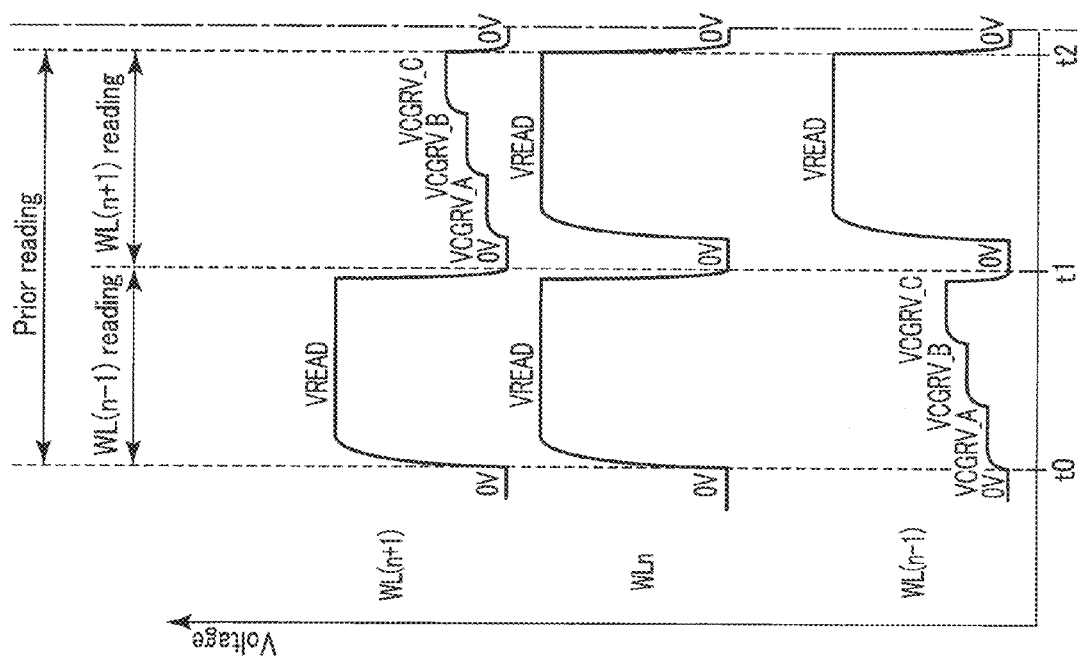

The read operation according to the present embodiment is described with reference to FIG. 45A and FIG. 45B. FIG. 45A and FIG. 45B are timing charts showing the potential changes of the word lines WLn, WL(n+1), and WL(n−1) in the read operation AR during the prior-reading and the main-reading according to the present embodiment. FIG. 45A shows a time period from t0 to t2, and FIG. 45B shows a time period from t3 succeeding time t2 to t20.

As shown, the present embodiment is different from FIG. 8 and FIG. 18 described in the first and second embodiments in the following points:

(1) In the prior-reading, not only the data held in the word line WL(n+1) but also the data held in the word line WL(n−1) is read.

(2) In the read operation AR in the main-reading, the voltages VREAD'_E, VREADLA_A, VREADLA_B, and VREADLA_C are sequentially applied not only to the word line WL(n+1) but also to the word line WL(n−1).

Details are described below.

As shown in FIG. 45A, the sequencer 16 first performs the prior-reading (times t0 to t2). In the prior-reading, the row decoder 12 selects the word line WL(n−1) and then sequentially applies the voltages VCGRV_A, VCGRV_B, and VCGRV_C to WL(n−1). At the same time, the voltage VREAD is applied to the unselected word lines WL. The row decoder 12 then selects the word line WL(n+1) and then sequentially applies the voltages VCGRV_A, VCGRV_B, and VCGRV_C to WL(n+1).

As a result of the above read operation, data in all the memory cell transistors MT connected to the word lines WL(n−1) and WL(n+1) in the selected finger FNG are determined, and held in, for example, the sense amplifier 13 or the sequencer 16.

The word lines WL(n−1) and WL(n+1) may be selected in reverse order.

The sequencer 16 then performs the main-reading (upper bit reading). In the example shown in FIG. 45B, reading to specify the bit which holds the "E"-level (read operation AR) is first performed.

In the read operation AR, the row decoder 12 first applies the voltage VCGRV_A (e.g., VA) to the selected word line WLn, and applies the voltage VREAD'_E to the unselected word line WL(n−1). In this state, the row decoder 12 sequentially applies the voltages VREAD'_E, VREADLA_A, VREADLA_B, and VREADLA_C to the unselected word lines WL(n+1) (the respective periods are referred to as periods AR1, AR2, AR3, and AR4, and these periods are collectively referred to as a period ARE).

In the period AR_E, the bit in which the word line WL(n−1) is at the "E"-level is read. That is to say, in the period AR1, the bit whose two adjacent bits on the source side and drain side are at the "E"-level is read. In the period AR2, the bit whose adjacent bit on the source side is at the "E"-level and whose adjacent bit on the drain side is at the "A"-level is read. Moreover, in the period AR3, the bit whose adjacent bit on the source side is at the "E"-level and whose adjacent bit on the drain side is at the "B"-level is read. In the period AR4, the bit whose adjacent bit on the source side is at the "E"-level and whose adjacent bit on the drain side is at the "C"-level is read.

Furthermore, in the read operation AR, the row decoder 12 maintains the voltage of the selected word line WLn as it is, and at the same time steps up the voltages of the unselected word lines WL(n−1) to VREADLA_A. In this state, the row decoder 12 sequentially applies the voltages VREAD'_E, VREADLA_A, VREADLA_B, and VREADLA_C to the unselected word lines WL(n+1) (the respective periods are referred to as periods AR5, AR6, AR7, and AR8, and these periods are collectively referred to as a period AR_A).

In the period AR_A, the bit in which the word line WL(n−1) is at the "A"-level is read. That is to say, in the period AR5, the bit whose adjacent bit on the source side is at the "A"-level and whose adjacent bit on the drain side is at the "E"-level is read. In the period AR6, the bit whose two adjacent bits on the source side and drain side are at the "A"-level is read. In the period AR7, the bit whose adjacent bit on the source side is at the "A"-level and whose adjacent bit on the drain side is at the "B"-level is read. In the period AR8, the bit whose adjacent bit on the source side is at the "A"-level and whose adjacent bit on the drain side is at the "C"-level is read.

Furthermore, in the read operation AR, the row decoder 12 maintains the voltage of the selected word line WLn as it is, and at the same time steps up the voltages of the unselected word lines WL(n−1) to VREADLA_B. In this state, the row decoder 12 sequentially applies the voltages VREAD'_E, VREADLA_A, VREADLA_B, and VREADLA_C to the unselected word lines WL(n+1) (the respective periods are referred to as periods AR9, AR10, AR11, and AR12, and these periods are collectively referred to as a period AR_B).

In the period AR_B, the bit in which the word line WL(n−1) is at the "B"-level is read. In the periods AR9 to AR12, the bits whose adjacent bit on the drain side are at the "E"-level, "A"-level, "B"-level, and "C"-level are read.

Furthermore, in the read operation AR, the row decoder 12 maintains the voltage of the selected word line WLn as it is, and at the same time steps up the voltages of the unselected word lines WL(n−1) to VREADLA_C. In this state, the row decoder 12 sequentially applies the voltages VREAD'_E, VREADLA_A, VREADLA_B, and VREADLA_C to the unselected word lines WL(n+1) (the respective periods are referred to as periods AR13, AR14, AR15, and AR16, and these periods are collectively referred to as a period AR_C).

In the period AR_C, the bit in which the word line WL(n−1) is at the "C"-level is read. In in the periods AR13 to AR16, the bits whose adjacent bits on the drain side are at the "E"-level, "A"-level, "B"-level, and "C"-level are read.

Consequently, the bits having the "E"-level are specified in the page targeted for reading.

The sequencer 16 then specifies the bit holding the "C"-level (read operation CR). That is to say, in accordance with an instruction from the sequencer 16, the row decoder 12 applies VCGRV_C to the selected word line WLn, and applies VREAD to WL(n−1) and WL(n+1).

Regardless of the result of the prior-reading, the sense amplifier 13 then senses and strobes data for all the columns while VREAD is applied to the word lines WL(n−1) and WL(n+1).

Although the inter-cell interference is not canceled in the read operation CR (VREAD is applied to WL(n+1)) in the case shown in this example, the voltage VREADLA may be applied to the word line WL(n+1) as has been described with reference to FIG. 8 and FIG. 18 as in the first embodiment. Although VREAD is higher than VREAD'_E and lower than VREADLA_A as described above in the case shown in the example of FIG. 45, the relation may be, for example, VREAD=VREADLA_C, or may be VREAD<VREADLA_C or VREAD>VREADLA_C.

The lower bit reading is similar to the read operation BR described in the first or second embodiment.

A specific example of the above operation is described with reference to FIG. 46. FIG. 46 is a schematic diagram showing page data corresponding to the word lines WL(n−1), WLn, and WL(n+1) and data determined by the latch circuit in the sense amplifier 13 in the read operation AR. In the case assumed in FIG. 46, for simplification of explanation, one page is composed of 19 memory cell transistors. The memory cell transistors MT connected to the bit lines BL0 to BL18 or the data held in the memory cell transistors MT are referred to as a bit 0 to a bit 18. The page data targeted for reading is "EEEEEEEEEEEEEEEEABC".

As shown, as a result of the prior-reading, page data corresponding to the word line WL(n−1) is "EEEE-AAAABBBBCCCC***". The mark * in FIG. 46 indicates that any one of the "E"-level, the "A"-level, the "B"-level, and the "C"-level is acceptable. Page data corresponding to the word line WL(n−1) is "EABCEABCEABCEABC***".

As shown in FIG. 46, data of the bit 0 to 15 is determined in the periods AR1 to AR16. Further, in the periods AR1 to AR16, no cell currents flow through the bit lines BL16 to BL18. As a result, the bits 16 to 18 are determined to be equal to or more than the "A"-level. The bits 16 to 18 are determined to be equal to or more than the "A"-level in one of the periods AR1 to AR16 in accordance with the adjacent bits on the source side and drain side.

The sequencer 16 then specifies the bit holding the "C"-level (read operation CR). That is to say, in accordance with an instruction from the sequencer 16, the row decoder 12 applies VCGRV_C to the selected word line WLn, and applies VREAD to WL(n−1) and WL(n+1). Accordingly, cell currents flow through the bit lines BL16 and BL17, and no cell current flows through the bit line BL18. Thus, the bit 18 is determined to be at the "C"-level, and the bits 16 and 17 are determined to be at either the "A"-level or the "B"-level.

6.2 Advantageous Effects According to the Present Embodiment

The configuration according to the present embodiment can further improve the reliability of data reading. This advantageous effect is described in detail below.

FIG. 47 shows the changes of the threshold distributions of the word lines WL(n−1), WLn, and WL(n+1) during data writing.

As shown, data is first written into the word line WL(n−1). Thus, the threshold level of the adjacent word line WLn rises (shaded areas in FIG. 47).

Data is then written into the word line WLn. Subsequently, data is written into the word line WL(n+1). Accordingly, the threshold levels of the adjacent word lines WLn and unshown WL(n+2) rise due to the inter-cell interference.

The spread of the threshold distribution of the "E"-level is not only affected by the writing in the word line WL(n+1) but also affected by the writing in the word line WL(n−1). Further, the memory cell transistor MT at the "E"-level is also disturbed during reading. Therefore, the threshold distribution tends to rise in the memory cell transistor MT in an erased state during both writing and reading.

Therefore, according to the present embodiment, when the bit having the "E"-level is specified (read operation AR), the read operation for the word line WLn is performed in consideration of the influence on not only the word line WL(n+1) but also WL(n−1). That is to say, in the prior-reading, data is also previously read from the word line WL(n−1). When data is read from the word line WLn, a suitable voltage VREADLA is also applied to not only the word line WL(n+1) but also WL(n−1). Thus, it is possible to offset the inter-cell interference associated with the word line WL(n−1) and improve the reading accuracy of the "E"-level.

In the example of FIG. 45A, FIG. 45B, and FIG. 46, all the combinations of the thresholds that can be taken by the word lines WL(n+1) and WL(n−1) are taken into consideration. However, it is not always necessary to take all the combinations into consideration.

Figure 48:
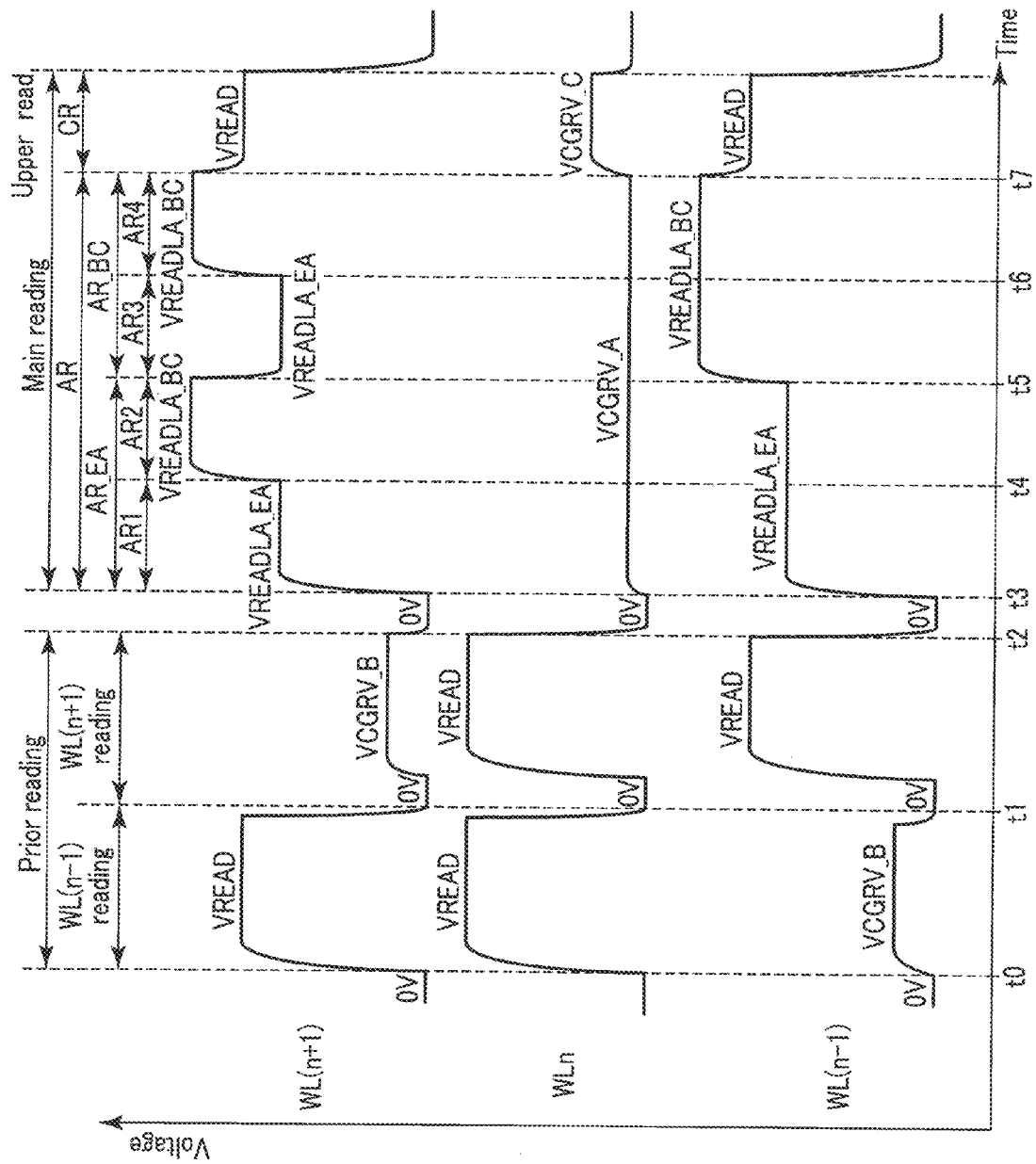
FIG. 48 is a timing chart showing the changes of the word line voltages during data reading of the semiconductor memory device according to a modification of the sixth embodiment.

FIG. 48 shows such an example. FIG. 48 is a timing chart showing the potential changes of the word lines WLn, WL(n+1), and WL(n−1) during the upper bit reading in the prior-reading and the main-reading according to a modification of the present embodiment, and corresponds to FIG. 45 described above.

As shown in FIG. 48, in this example, VCGRV_B alone is used as a read voltage in the prior-reading for the word line WL(n−1). That is to say, for the word line WL(n−1), information indicating whether the bit is less than or equal to the "A"-level or is equal to or more than the "B"-level is obtained.

Subsequently, the prior-reading for the word line WL(n+1) is performed. In this instance as well, VCGRV_B alone is used as a read voltage. Therefore, for the word line WL(n+1) as well, information indicating whether the bit is equal to or more than the "A"-level or is less than or equal to the "B"-level is obtained.

The main-reading is then performed. In the example of FIG. 48, reading to specify the bit which holds the "E"- or "A"-level (read operation AR_EA) is first performed.

In the read operation AR_EA, the row decoder 12 first applies the voltage VCGRV_A to the selected word line WLn, and applies the voltage VREADLA_EA to the unselected word line WL(n−1). In this state, the row decoder 12 sequentially applies the voltages VREADLA_EA and VREADLA_BC to the unselected word lines WL(n+1) (the respective periods are referred to as periods AR1 and AR2).

In the period AR1, the bit whose two adjacent bits on the source side and drain side are at the "E"- or "A"-level is read. In the period AR2, the bit whose adjacent bit on the source side is at the "E"- or "A"-level and whose adjacent bit on the drain side is at the "B"- or "C"-level is read.

Subsequently, reading to specify the bit which holds the "B"- or "C"-level (read operation AR_BC) is performed.

In the read operation AR_BC, the row decoder 12 maintains the voltage of the selected word line WLn at VCGRV_A, and at the same applies the voltage VREAD-LA_BC to the unselected word line WL(n−1), and sequentially applies the voltages VREADLA_EA and VREAD-LA_BC to the unselected word lines WL(n+1) (the respective periods are referred to as periods AR3 and AR4).

In the period AR3, the bit whose adjacent bit on the source side is at the "B"- or "C"-level and whose adjacent bit on the drain side is at the "E"- or "A"-level is read. In the period AR4, the bit whose two adjacent bits on the source side and drain side are at the "B"- or "C"-level is read.

The sequencer 16 then specifies the bit holding the "C"-level (read operation CR). The read operation CR is similar to that in the example of FIG. 45 and is therefore not described. Although VREAD is higher than VREADLA_EA and lower than VREADLA_BC as described above in the case shown in the example of FIG. 48, VREAD may have the same value as, for example, VREADLA_EA or VREADLA_BC.

Figure 49:
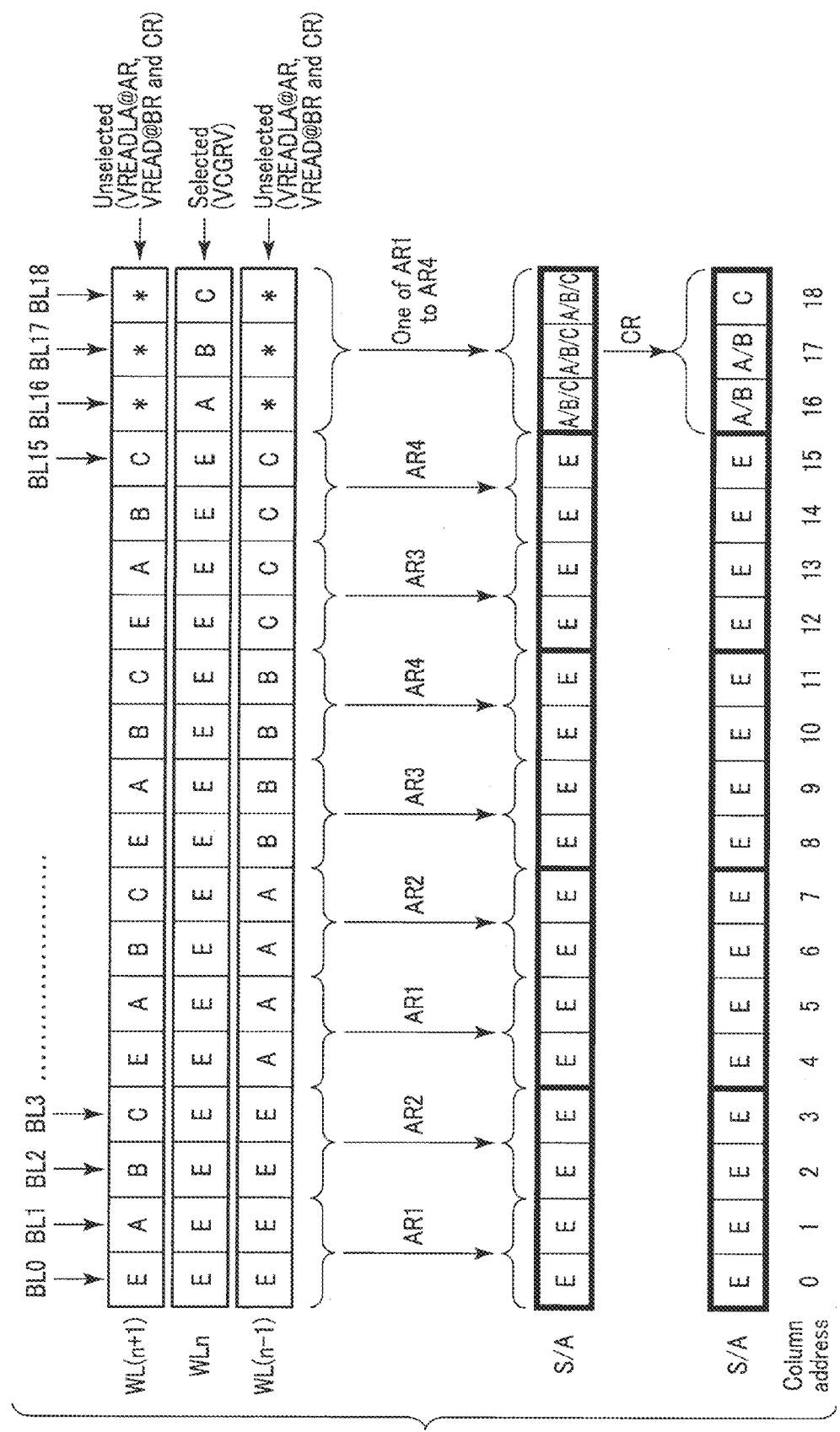
FIG. 49 is a schematic diagram showing page data and data fixed in a latch circuit in a sense amplifier during upper bit reading of the semiconductor memory device according to a modification of the sixth embodiment.

A specific example of the above is shown in FIG. 49. FIG. 49 corresponds to FIG. 46 described in the previous embodiment. As shown, data in the bits 0, 1, 4, and 5 whose adjacent bits on the source side and drain side are at the "E"- or "A"-level are determined in the period AR1. Data in the bits 2, 3, 6, and 7 whose adjacent bits on the source side are at the "E"- or "A"-level and whose adjacent bits on the drain side are at the "B"- or "C"-level are determined in the period AR2. The same applies to the following. The same also applies to the bits 16 to 18. For example, when the data in the word lines WL(n−1) and WL(n+1) are at the "E"- or "A"-level in the bit 16, the bit 16 is determined to be equal to or more than the "A"-level in the period AR1. When the data in the word line WL(n−1) is at the "E"-level or the "A"-level and the data in the word line WL(n+1) is at the "B"-level or the "C"-level, the bit 16 is determined to be equal to or more than the "A"-level in the period AR2.

The bit having the "E"-level may be specified in the method described above. In this example, it is considered that the inter-cell interference caused when the neighboring bits are at the "E"-level is substantially equal to the inter-cell interference caused when the neighboring bits are at the "A"-level, and that the inter-cell interference caused when the neighboring bits are at the "B"-level is substantially equal to the inter-cell interference caused when the neighboring bits are at the "C"-level. Based on this concept, the correction amounts of the inter-cell interference when the neighboring bits are at the "E"-level and the "A"-level are equalized, and the correction amounts of the inter-cell interference when the neighboring bits are at the "B"-level and the "C"-level are equalized. Thus, the number of sense/strobe operations in the operation AR for determining the "E"-level can be reduced to one fourth of that in the case of FIGS. 45A and 45B, and the data reading speed can be improved.

This concept may be applied to the main-reading. That is to say, in the main-reading as well, the degree of correction may be equal when the neighboring bits are at the "E"-level and the "A"-level, and the degree of correction may be equal when the neighboring bits are at the "B"-level and the "C"-level. In this case, the prior-reading for the word line WL(n+1) described with reference to FIG. 48 is similar to that performed for the word line WL(n−1) (the voltage VCGRV_B alone is used).

In FIG. 48 and FIG. 49, the correction amount of the inter-cell interference is changed in accordance with the standard of whether the neighboring bits are less than or equal to the "A"-level or equal to or more than the "B"-level. However, any standard may be used. For example, the inter-cell interference is the greatest when the neighboring bits are at the "C"-level. Therefore, the correction amount may be changed in accordance with the standard of whether the neighboring bits are less than or equal to the "B"-level or are at the "C"-level or whether the neighboring bits are at the "E"-level or are equal to or more than the "A"-level. The same also applies to the main-reading.

7. Seventh Embodiment

Now, a semiconductor memory device according to a seventh embodiment is described. The present embodiment relates to a configuration to efficiently discharge a voltage of the bit line after data writing, reading, and erasing in the first to sixth embodiments. The differences between the present embodiment and the first to sixth embodiments are only described below.

7.1 Regarding Configuration of Memory Cell Array

The configuration of the memory cell array 11 of the NAND flash memory 10 according to the present embodiment is first described with reference to FIG. 50. FIG. 50 is a block diagram of the NAND flash memory 10 according to the present embodiment.

As shown, the memory cell array 11 according to the present embodiment further comprises a discharge block BLK_BLSRC in the configuration described with reference to FIG. 1 in the first embodiment. The discharge block BLK_BLSRC is not a block to store data but a block to provide a current path for releasing the charge in the bit line BL to the source line SL.

The block BLK_BLSRC comprises discharge fingers FNG_BLSRC (FNG_BLSRC0, FNG_BLSRC1, FNG_BLSRC2, . . . ). The finger FNG_BLSRC is substantially similar in configuration to a finger FNG included in a normal block, and is a set of NAND strings.

Figure 51:
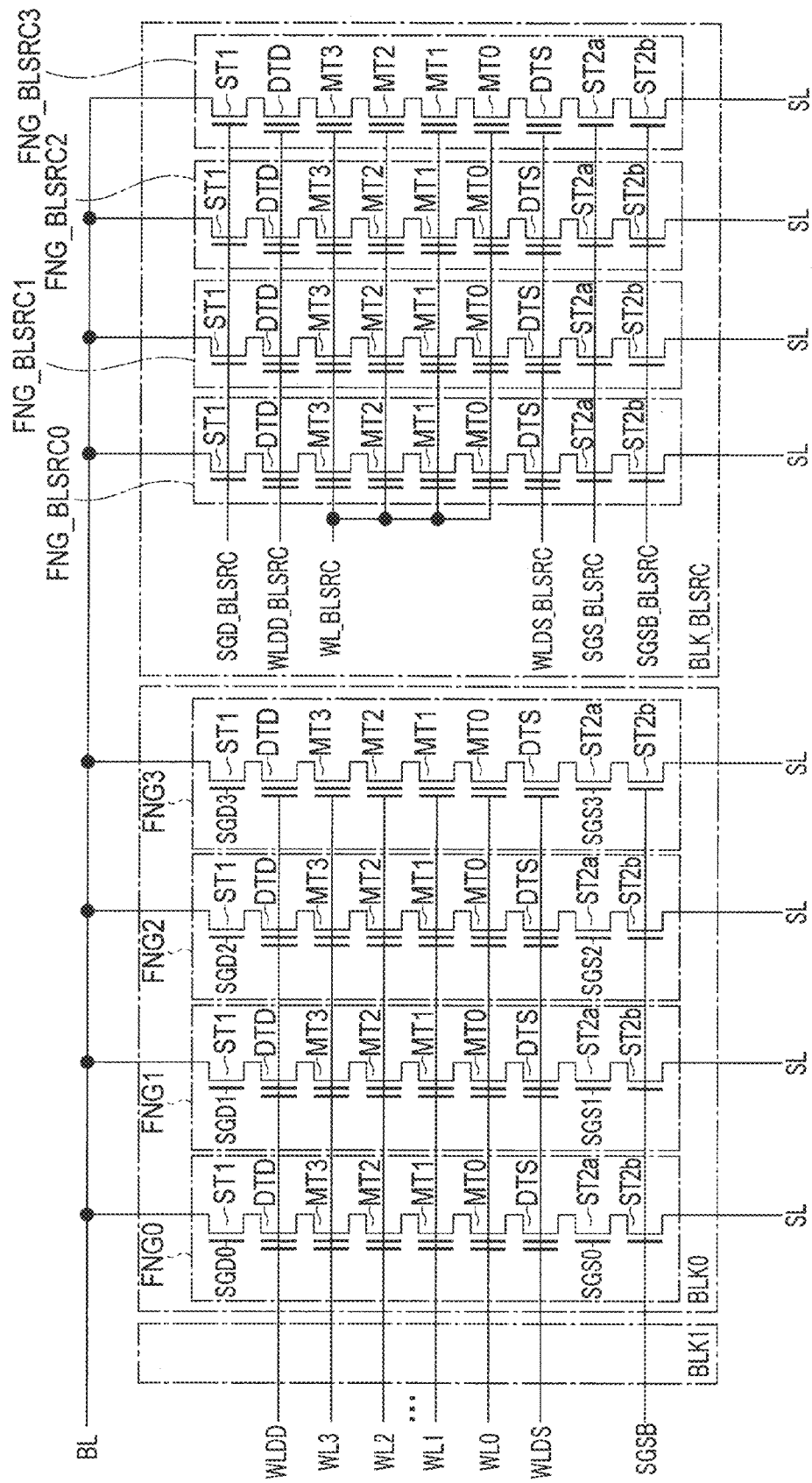
FIG. 51 and FIG. 52 are a circuit diagram and a sectional view of the memory cell array of the semiconductor memory device according to the seventh embodiment, respectively.
Figure 52:
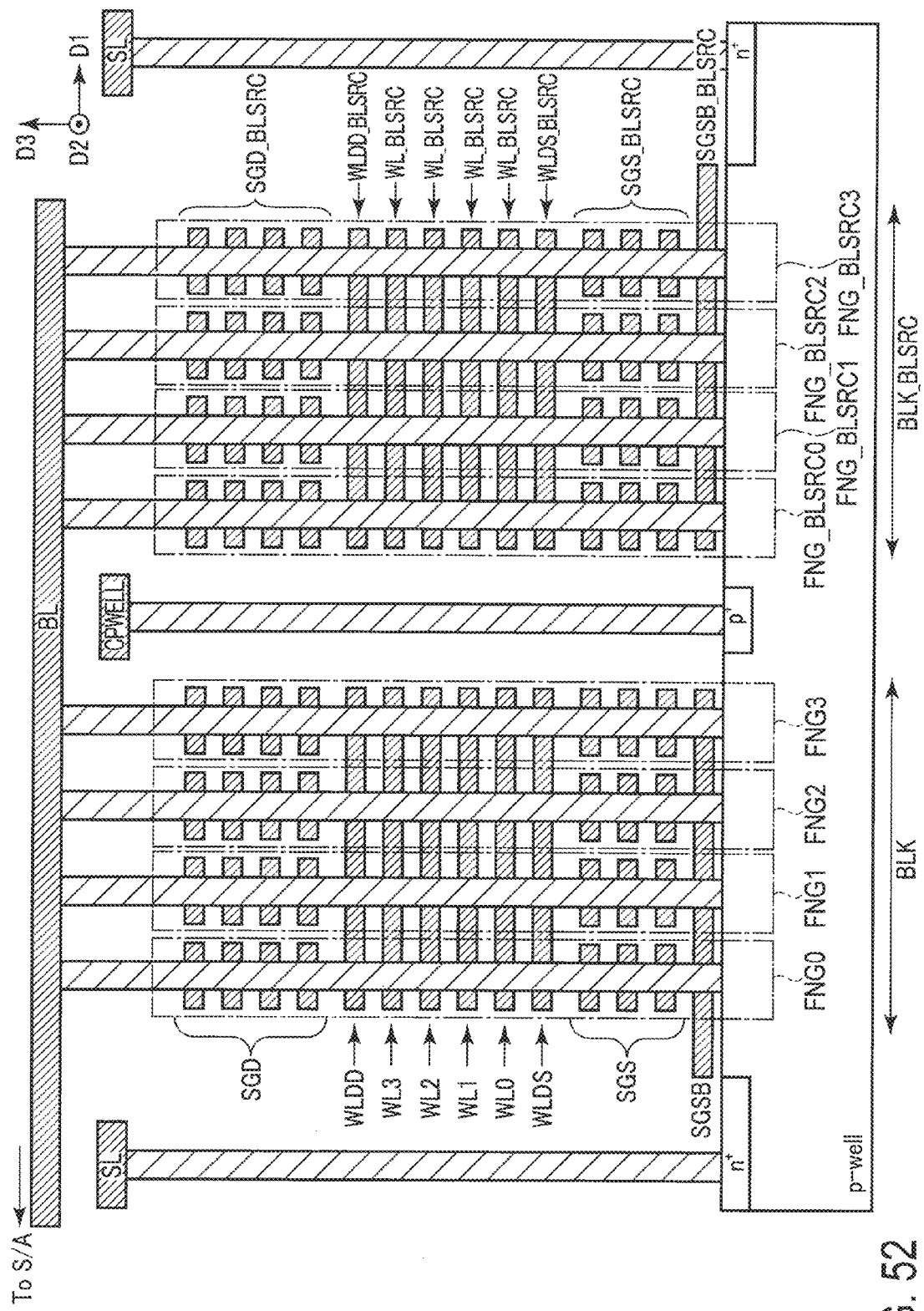

FIG. 51 and FIG. 52 are a circuit diagram and a sectional view of the blocks BLK and BLK_BLSRC, and show a configuration corresponding to one bit line BL. For simplification of explanation, one NAND string includes four memory cell transistors MT in the case of FIG. 51 and FIG. 52.

As shown, in the NAND string of the finger FNG according to the present embodiment, the selection transistor ST2 includes two selection transistors ST2a and ST2b. The selection transistor ST2b is a transistor which uses the lowermost interconnect layer 27 shown in FIG. 52 as a gate, and is connected in common between the fingers FNG and also connected to a selection gate line SGSB. The selection transistor ST2a is a transistor which uses the upper three interconnect layers 27 shown in FIG. 52 as a gate, and is independently controlled in each of the fingers FNG. In this example, a dummy transistor DTD is provided between the selection transistor ST1 and the memory cell transistor MT3, and a dummy transistor DTS is provided between the selection transistor ST3a and the memory cell transistor MT0. This configuration is also applicable to the first to sixth embodiments. The gates of the dummy transistors DTD and DTS are respectively connected to dummy word lines WLDD and WLDS, and the potentials of the dummy word lines WLDD and WLDS are controlled by the row decoder 12.

The discharge finger FNG_BLSRC also has a configuration substantially similar to that of the finger FNG. In the finger FNG_BLSRC, the gate of the selection transistor ST1 is connected to a selection gate line SGD_BLSRC, and the gates of the selection transistors ST2a and ST2b are connected to selection gate lines SGS_BLSRC and SGSB_BLSRC. The selection gate line SGS_BLSRC connects the fingers FNG_BLSRC in common. The gates of the memory cell transistors MT0 to MT3 are connected in common to a word line WL_BLSRC. The gates of the dummy transistors DTD and DTS are respectively connected to dummy word lines WLDD_BLSRC and WLDS_BLSRC. The potentials of these interconnects are also controlled by the row decoder 12.

Figure 53:
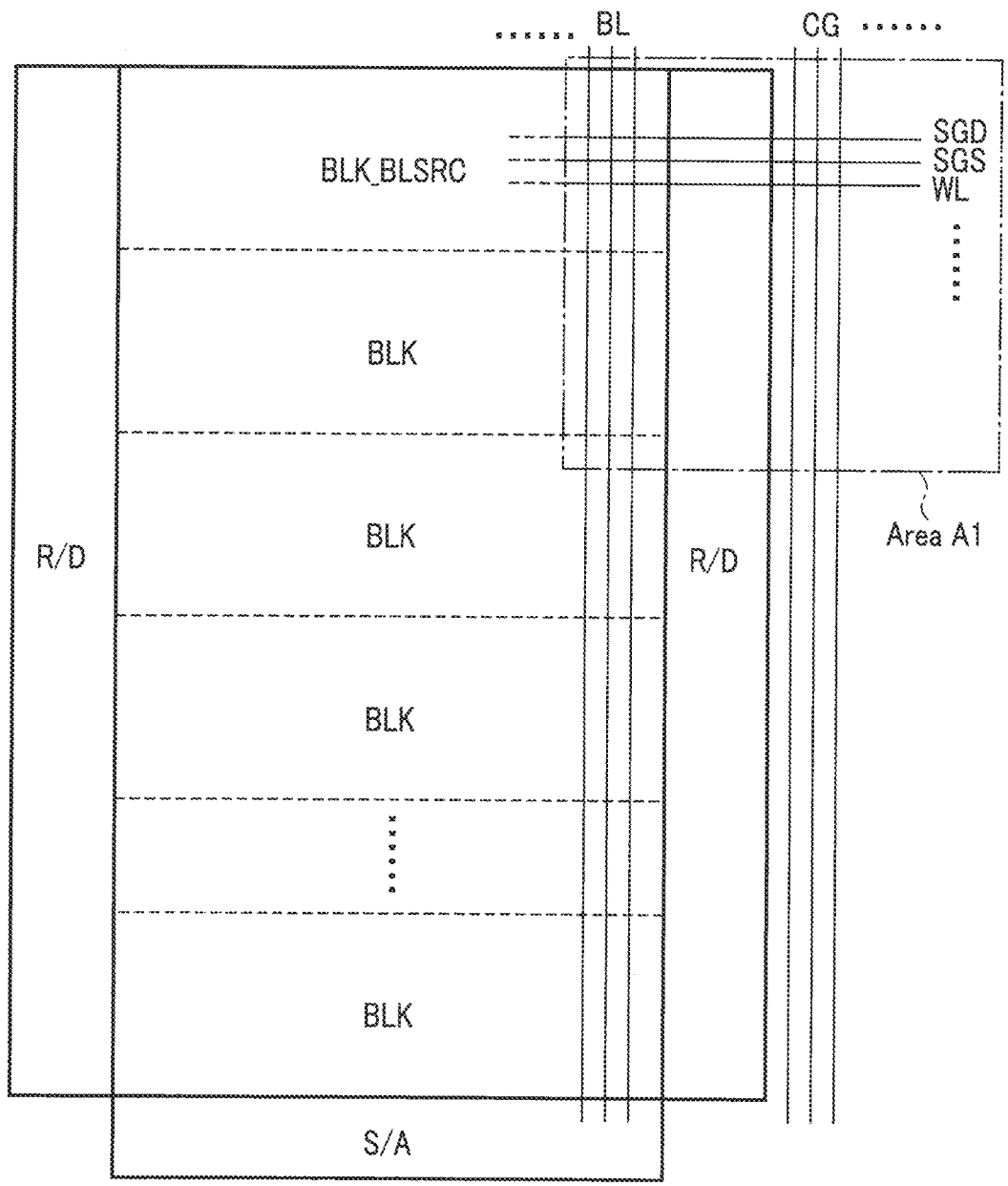
FIG. 53 is a plan view of the semiconductor memory device according to the seventh embodiment.

FIG. 53 is a plan layout view of the memory cell array 11, the row decoder 12, and the sense amplifier 13. As shown, in the memory cell array 11, the blocks BLK are arrayed in a first direction, and the sense amplifier 13 is disposed adjacent to the memory cell array 11 in the first direction. In the memory cell array 11, the finger FNG_BLSRC is disposed at a position farthest from the sense amplifier 13. These blocks BLK and blocks BLK_BLSRC are connected in common by the bit line BL provided along the first direction, and are further connected to the sense amplifier 13. The row decoder 12 is provided at a position across both sides of the memory cell array 11 along a second direction. The word lines WL and WL_BLSRC, the dummy word lines WLDD, WLDS, WLDD_BLSRC, and WLDS_BLSRC, and the selection gate lines SGD, SGS, SGSB, SGD_BLSRC, SGS_BLSRC, and SGSB_BLSRC are provided along the second direction that intersects at right angles with the first direction. These interconnects are connected to a CG interconnect line along the first direction via the row decoder 12.

FIG. 54A and FIG. 54B is a plan view of an area A1 in FIG. 53. FIG. 54A shows the interconnects in one side of the row decoder 12 and FIG. 54B shows the interconnects in another side of the row decoder 12. As shown, each interconnect is separated into the memory cell array 11 side and the peripheral circuit side across the row decoder 12, and the row decoder 12 connects or disconnects the two sides in accordance with an address received from the controller. On the peripheral circuit side, each interconnect is connected to the CG interconnect by the contact plug, and is connected to an unshown driver circuit via the CG interconnect. The driver circuit selects a necessary voltage and applies the voltage to each CG interconnect.

7.2 Regarding Write Operation

Now, a write operation according to the present embodiment is described with reference to FIG. 55. FIG. 55 is a timing chart showing the potential changes of various interconnects during writing.

As shown, at a time t0, the row decoder 12 applies the voltage VSG to the selection gate line SGD of the selected finger FNG. The voltage VSG is a voltage to switch on the selection transistor ST1.

The sense amplifier 13 applies 0 V to the bit line BL which has not yet passed a program-verification, and applies the voltage VDD to the bit line BL which has already passed a program-verification and to the unselected bit lines BL (time t1). The selection transistor ST1 transfers these voltages to the source from the drain.

Subsequently, at a time t2, the row decoder 12 reduces the potential of the selection gate line SGD to VSGD. That is, VSG is lower than VSGD. As a result, the selection transistor ST1 corresponding to the bit line BL which has already passed a verification and to the unselected bit lines BL (i.e., the bit lines to which VDD is applied) is cut off.

The row decoder 12 then applies the voltage VPASS to the selected word line, the unselected word line, and the dummy word lines WLDD and WLDS (time t3). The potential of the unselected word line is then raised to VPGM, so that the program operation is performed (time t5).

On the other hand, the selection transistor ST1 is cut off in the NAND string corresponding to the bit line BL which has already passed a verification and to the unselected bit lines BL, so that the channel is electrically floating. As a result, the potential of the channel rises due to the coupling with the word line, and programming is forbidden.

At a time t6 of the program period, the row decoder 12 applies a voltage VREAD_DATA to the word line WL_BLSRC, applies a voltage VREAD_DMY to WLDD_BLSRC and WLDS_BLSRC, and applies the voltage VSG to the selection gate line SGSB_BLSRC.

At a time t10 when the program operation has finished and the potential of the word line WL decreases to VPASS, the row decoder 12 then applies the voltage VSG to the selection gate lines SGD_BLSRC and SGS_BLSRC. As a result, a current path which reaches the source line SL from the bit line BL is formed in each of the fingers FNG_BLSRC0 to FNG_ELSRC3 shown in FIG. 51, and the potential of the bit line BL is discharged to 0 V.

The timing for applying the voltage VSG to a selection gate line SGSB_BLSRC may be a time t8 after the voltage VREAD_DATA is applied to the word line WL_BLSRC and before the voltage VSG is applied to the selection gate lines SGD_BLSRC and SGS_BLSRC.

7.3 Regarding Read Operation

Now, a read operation according to the present embodiment is described with reference to FIG. 56. FIG. 56 is a timing chart showing the potential changes of various interconnects during reading. In the case shown, reading is continuously performed at two read levels (e.g., the read operations AR and CR of the main-reading in FIG. 8). For simplification of explanation, VREADLA is not shown.

As shown, at a time to, the row decoder 12 applies the voltage VSG to the selection gate lines SGD, SGS, and SGSB of the selected finger FNG. Subsequently, the row decoder 12 applies a voltage VCGRV1 (e.g., the voltage VA) to the word line WL, and applies the voltage VREAD (e.g., 7 V) to the unselected word lines WL. The voltage VREADLA is applied to the word line adjacent to the selected word line on the drain side among the unselected word lines.

At a time t2, the sense amplifier 13 then precharges the bit line BL to the voltage VBL (e.g., 2 V). At the same time, the source line driver 14 and the well driver 15 apply voltages VSRC (e.g., 0 to 0.3 V) to the source line SL and a p-type well region 20, respectively.

The sense amplifier 13 then senses, for example, the cell current flowing through the bit line BL, and the sequencer 16 brings a signal STB to the "H"-level at a certain timing, so that the sense amplifier 13 strobes read data (time t3). The bit line BL in which the memory cell transistor MT has been judged to be switched on as a result of the strobing of the data is fixed at a constant potential by, for example, the sense amplifier 13.

Subsequently, at a time t4, the row decoder 12 sets the voltage to be applied to the selected word line WL to a voltage VCGRV2 (e.g., the voltage VC). The signal STB is also set to the "H"-level at a time t5, so that data is strobed.

After the strobing of the data (after STB is set to "L"), the row decoder 12 applies the voltage VREAD_DATA to the word line WL_BLSRC, applies the voltage VREAD_DMY to WLDD_BLSRC and WLDS_BLSRC, and applies the voltage VSG to the selection gate line SGSB_BLSRC.

At a time t9 when the read operation has finished, the row decoder 12 applies the voltage VSG to the selection gate lines SGD_BLSRC and SGS_BLSRC. As a result, a current path which reaches the source line SL from the bit line BL is formed in the fingers FNG_BLSRC0 to FNG_BLSRC3 shown in FIG. 51, and the potential of the bit line BL is discharged to 0 V.

The timing for applying the voltage VSG to the selection gate line SGSB_BLSRC may be a time t8 after the voltage VREAD_DATA is applied to the word line WL_BLSRC and before the voltage VSG is applied to the selection gate lines SGD_BLSRC and SGS_BLSRC as in writing.

7.4 Advantageous Effects According to the Present Embodiment

The configuration according to the present embodiment can improve the operating speed of the NAND flash memory. This advantageous effect is described below.

Figure 57:
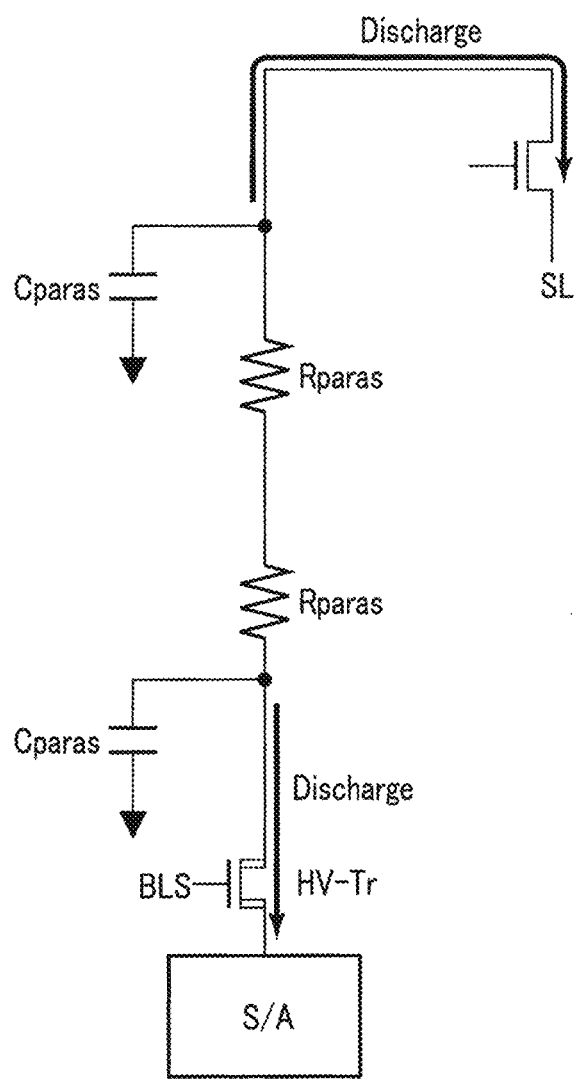
FIG. 57 is an equivalent circuit diagram of a bit line and a sense amplifier of the semiconductor memory device according to the seventh embodiment.

FIG. 57 is an equivalent circuit diagram of the bit line BL and the sense amplifier according to the present embodiment. As shown, a parasitic resistance Rparas exists in the bit line BL, and the block BLK connected to the bit line BL has a parasitic capacitance Cparas. Therefore, the parasitic resistance Rparas increases if the number of blocks BLK is increased for higher memory capacity, and the parasitic capacitance Cparas increases if the number of stacked memory cells is increased for a higher degree of integration without the increase in the number of blocks. If the parasitic resistance Rparas and the parasitic capacitance Cparas increase, it takes more time to discharge the bit line.

In the NAND flash memory, a recovery operation to discharge the bit line BL to bring the potential to 0 V is required after data writing and reading (and erasing). However, for the reasons described above, if the memory capacity is increased, the parasitic resistance and the parasitic capacitance Cparas increase, and the time required for recovery increases.

In this respect, according to the present embodiment, the bit line BL is discharged by the sense amplifier 13 and also discharged in the block BLK_BLSRC. As has been described with reference to FIG. 51, the discharge block BLK_BLSRC is substantially similar in configuration to the normal block BLK, and connects the bit line BL to the source line SL through current paths. The discharge block BLK_BLSRC is provided at a position far from the sense amplifier 13. In this case, it is possible to discharge electricity from both ends of the bit line BL.

Therefore, it is possible to quickly discharge the bit line BL, and reduce the time required for recovery. As a result, the operating speed of the NAND flash memory can be improved.

8. Eighth Embodiment

Now, a semiconductor memory device according to an eighth embodiment is described. In the present embodiment, the voltage of the word line WL is continuously raised, instead of stepwise, in the reading method of data described in the first to seventh embodiments. Only the differences between the present embodiment and the first to seventh embodiments are described below.

8.1 First Example

First, a first example is described. In the present example, the present embodiment is applied to the reading method described in the first embodiment with reference to FIG. 8 and FIG. 10.

FIG. 58 is a timing chart showing potential changes of a word line WLn (n is a natural number equal to 1 or greater) to be read and a word line WL(n+1) adjacent thereto on the drain side during the upper bit reading in prior-reading or main-reading according to the present embodiment and further shows potential changes of a node SEN. The node SEN is, for example, a node contained in a sense amplifier 13 for each bit line and the sense amplifier 13 determines whether data is "0" or "1" based on the potential of the node SEN. In the description below, the word "SEN" may be replaced with a bit line BL, and both words are approximately synonymous.

As shown in FIG. 58, the present example is different from FIG. 8 in that instead of the potential of the word line WL(n+1) being raised stepwise, the potential thereof is continuously raised with time. That is, in prior-reading, while the potential of the word line WLn is fixed to VREAD, the potential of the word line WL(n+1) continuously rises from 0 V to a voltage VCGRV_END (≥VCGRV_C). Then, if the potential of the node SEN corresponding to a memory cell transistor MT having a threshold of the "E"-level first drops and the potential drop is detected in a sense/strobe operation at time t0–1, the threshold of the relevant bit can be determined to be the "E"-level. The "A"-level and the "B"-level are similarly handled and are sensed and strobed at times t0–2, t0–3 respectively. At the times t0–1, t0–2, t0–3, the potential of the word line WL(n+1) becomes VCGRV_A, VCGRV_B, VCGRV_C respectively. The node SEN corresponding to the "C"-level maintains a precharge potential Vpre until prior-reading is finished.

The same also applies to main-reading. In the read operation AR, as shown in FIG. 58, while the potential of the word line WLn is fixed to VCGRV_A, the potential of the word line WL(n+1) continuously rises from, for example, a voltage VREADLA_AR_ST (≤VREAD'_E) to a voltage VREADLA_AR (≥VCGRV_C1). Then, a sense/strobe operation is performed at times t2–1, t3–1, t4–1, t5–1 when the potential of the word line WL(n+1) becomes VREAD'_E, VREADLA_A, VREADLA_B, VREADLA_C1 respectively.

At the time t2–1, a sense/strobe operation is performed for cells adjacent to a cell having the threshold of the "E"-level (AR1). At the time t3–1, a sense/strobe operation is performed for cells adjacent to a cell having the threshold of the "A"-level (AR2). The same applies to the following.

In the read operation CR, while the potential of the word line WLn is fixed to VCGRV_C, the potential of the word line WL(n+1) continuously rises from a voltage VREADLA_CR_ST (VREAD'_EAB) to a voltage VREADLA_CR (≥VCGRV_C2). Then, a sense/strobe operation is performed at times t6–1, t7–1 when the potential of the word line WL(n+1) becomes VREAD'_EAB, VREADLA_C2 respectively.

At the time t6–1, a sense/strobe operation is performed for cells adjacent to a cell having the threshold of the "E"-level, the "A"-level, or the "B"-level (CR1). At the time t7–1, a sense/strobe operation is performed for cells adjacent to a cell having the threshold of the "C"-level (CR1). A varying range (VREADLA_AR–VREADLA_AR_ST) in the read operation AR of the potential of the word line WL(n+1) is larger than a varying range (VREADLA_CR–VREADLA_CR_ST) in the read operation CR.

FIG. 59 is a timing chart showing the potential changes of the word line WLn and the word line WL(n+1) during the lower bit reading.

As shown in FIG. 59, the present example is different from FIG. 10 in that like in FIG. 58, the potential of the word line WL(n+1) is continuously raised. That is, in prior-reading, while the potential of the word line WLn is fixed to VREAD, the potential of the word line WL(n+1) continuously rises from 0 V to a voltage VCGRV_END. In main-reading, while the potential of the word line WLn is fixed to VCGRV_B, the potential of the word line WL(n+1) continuously rises from a voltage VREADLA_BR_ST (≤VREAD'_EA) to a voltage VREADLA_BR (≥VCGRV_BR). Then, data is sensed and strobed at a timing when the potential of the word line WL(n+1) becomes an appropriate value.

Incidentally, a varying range (VREADLA_BR−VREADLA_BR_ST) in the read operation BR of the potential of the word line WL(n+1) may be larger or smaller than or equal to a varying range (VREADLA_AR−VREADLA_AR_ST) in the read operation AR. Also, the varying range (VREADLA_BR−VREADLA_BR_ST) in the read operation BR may be larger or smaller than or equal to the varying range (VREADLA_CR−VREADLA_CR_ST) in the read operation CR.

Incidentally, the above can also be applied to the reading method described using FIG. 18 and FIG. 20 in the second embodiment.

8.2 Second Example

A second example is an example in which the present embodiment is applied to the reading method in FIG. 26 and FIG. 31 described in the third and fourth embodiments.

Figure 60:
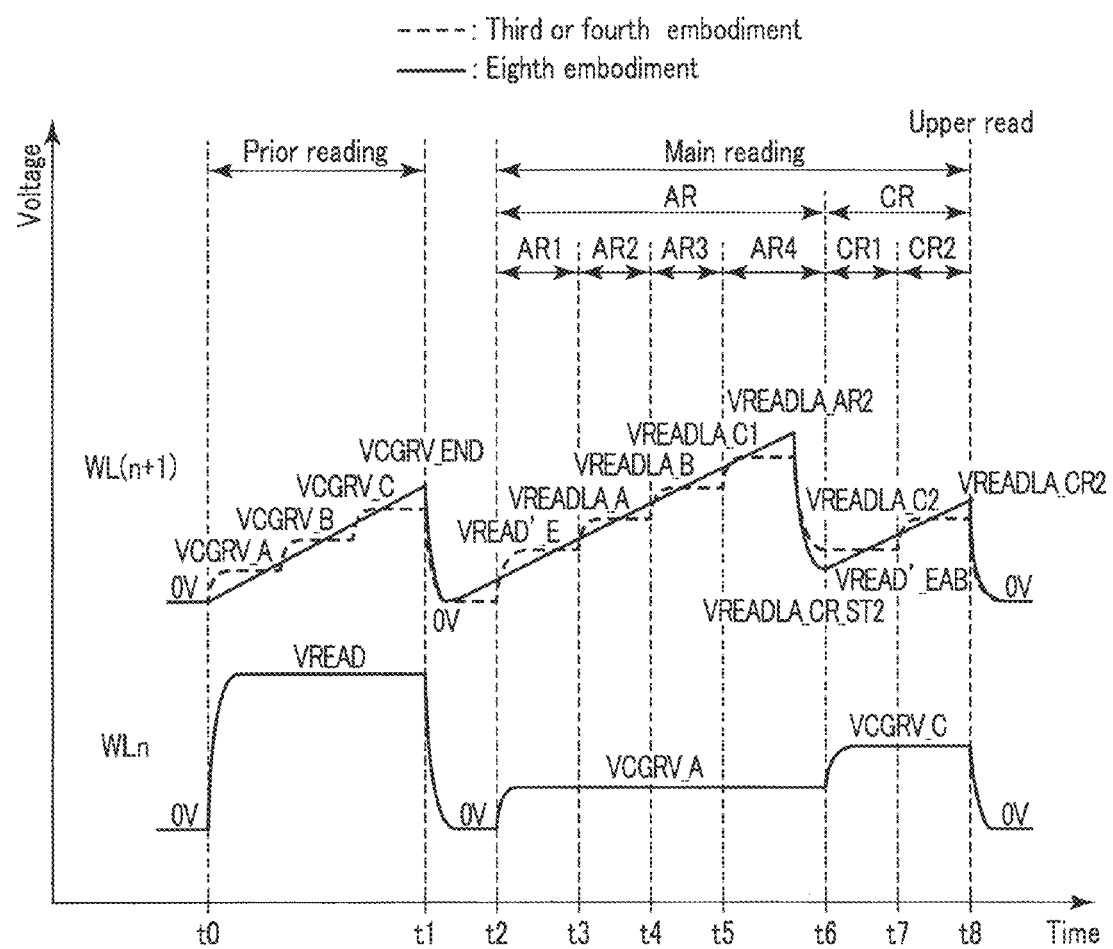

FIG. 60 is a timing chart showing the potential changes of the word lines WLn, WL(n+1) in prior-reading and main-reading according to the present embodiment. As shown, FIG. 60 is different from FIG. 26 and FIG. 31 in that the potential of the word line WL(n+1) is continuously raised with time, instead of being raised stepwise. That is, in the present embodiment, the potential of the word line WL(n+1) in the read operation AR continuously rises from 0 V (<VREADLA_AR_ST) to a voltage VREADLA_AR2 (≥VCGRV_C1>VREADLA_AR). Also in the read operation CR, the potential of the word line WL(n+1) continuously rises from a voltage VREADLA_CR_ST2 (≤VREAD'_EAB<VREADLA_CR_ST) to a voltage VREADLA_CR2 (≥VREADLA_C2>VREADLA_CR).

Also, a varying range VREADLA_AR2 in the read operation AR of the potential of the word line WL(n+1) is larger than a varying range (VREADLA_CR2−VREADLA_CR_ST2) in the read operation CR. The varying range in the read operation BR may be larger or smaller than the varying ranges in the read operations AR, CR or equal to one of the varying ranges.

Otherwise, the second example is the same as the first example.

8.3 Third Example

Next, a third example is described. The present example continuously raises the potential of the word line WLn, instead of the word line WL(n+1), in the above first example with time.

FIG. 61 is a timing chart showing the potential changes of the word lines WLn, WL(n+1) and the node SEN during upper bit reading according to the present embodiment and corresponds to FIG. 8 described in the first embodiment.

As shown, FIG. 61 and FIG. 8 are different in that the potential of the word line WLn is continuously raised with time in each of the read operations AR1 to AR4, CR1, CR2, instead of being maintained constant.

For example, in each of the read operations AR1 to AR4, the potential of the word line WLn is continuously raised from 0 V to a voltage VCGRV_AR (≥VCGRV_A). Then, the sense amplifier 13 senses and strobes data at a timing when the potential of the word line WLn reaches an appropriate value, for example, VCGRV_A.

In each of the read operations CR1, CR2, the potential of the word line WLn is continuously raised from 0 V to a voltage VCGRV_CR (≥VCGRV_C). Then, the sense amplifier 13 senses and strobes data at a timing when the potential of the word line WLn reaches an appropriate value, for example, VCGRV_C.

In this case, a varying range VCGRV_AR of the potential during the read operation AR of the word line WLn is smaller than, for example, a varying range VCGRV_CR of the potential during the read operation CR.

FIG. 62 is a timing chart showing the potential changes of the word line WLn and the word line WL(n+1) during lower bit reading and corresponds to FIG. 10 described in the first embodiment. Also during lower bit reading, the potential of the word line WLn is continuously raised from 0 V to a voltage VCGRV_BR (≥VCGRV_B) in each of the read operations BR1 to BR3. Then, the sense amplifier 13 senses and strobes data at a timing when the potential of the word line WLn reaches an appropriate value, for example, VCGRV_B.

In this case, a varying range VCGRV_BR of the potential during the read operation BR of the word line WLn is larger than the varying range VCGRV_AR of the potential during the read operation AR and smaller than the varying range VCGRV_CR of the potential during the read operation CR.

In FIG. 61 and FIG. 62, a case where the potential of the word line WLn during prior-reading is fixed to VREAD is taken as an example. However, like during main-reading, the potential of the word line WLn may continuously be raised with time during prior-reading. In addition, the third example described above may be applied to the read operation in the second and subsequent embodiments.

The varying range of the word line WLn may be the same during the read operations AR, BR, CR as long as an appropriate read voltage VCGRV can be applied to the word line WLn.

8.4 Fourth Example

Next, a fourth example is described. The present example is an example in which both potentials of the word lines WLn and WL(n+1) are continuously raised with time during verification operation described in the third embodiment.

FIG. 63 is a timing chart showing the potential changes of the word lines WLn, WL(n+1) and other unselected word lines WL during data writing according to the fourth example and corresponds to FIG. 25 described in the third embodiment.

In the present example, as shown in FIG. 63, the potentials of the word lines WL(n+1), WLn are continuously raised with time from 0 V to a voltage V(n+1)_vfy (≥V(n+1)_B). Also, the potential of the word line WLn is continuously raised with time from 0 V to a voltage Vn_vfy (≥Vvfy_C).

Then, verification reading for the "A"-level, "B"-level, and "C"-level is performed at a timing when the potentials of the word lines WL(n+1), WLn become appropriate values. For example, verification reading for the "A"-level is performed at a timing when the potential of the word line WL(n+1) becomes V(n+1)_E and the potential of the word line WLn becomes Vvfy_A. Also, verification reading for the "B"-level is performed at a timing when the potential of the word line WL(n+1) becomes V(n+1)_A and the potential of the word line WLn becomes Vvfy_B. Then, verification reading for the "C"-level is performed at a timing when the potential of the word line WL(n+1) becomes V(n+1)_B and the potential of the word line WLn becomes Vvfy_C.

In the example of FIG. 63, the increase rate of the potential of the word line WL(n+1) is larger than that of the potential of the word line WLn. In this case, a varying range V(n+1)_vfy of the word line WL(n+1) is larger than a varying range Vn_vfy of the word line WLn. However, both may be the same or reversed.

In FIG. 63, a case where the potential of the word line WL(n+1) during program-verification operation is lower than VREAD is taken as an example. However, the maximum value of the potential of the word line WL(n+1) may be equal to VREAD or larger than VREAD.

8.5 Fifth Example

Figure 64A:
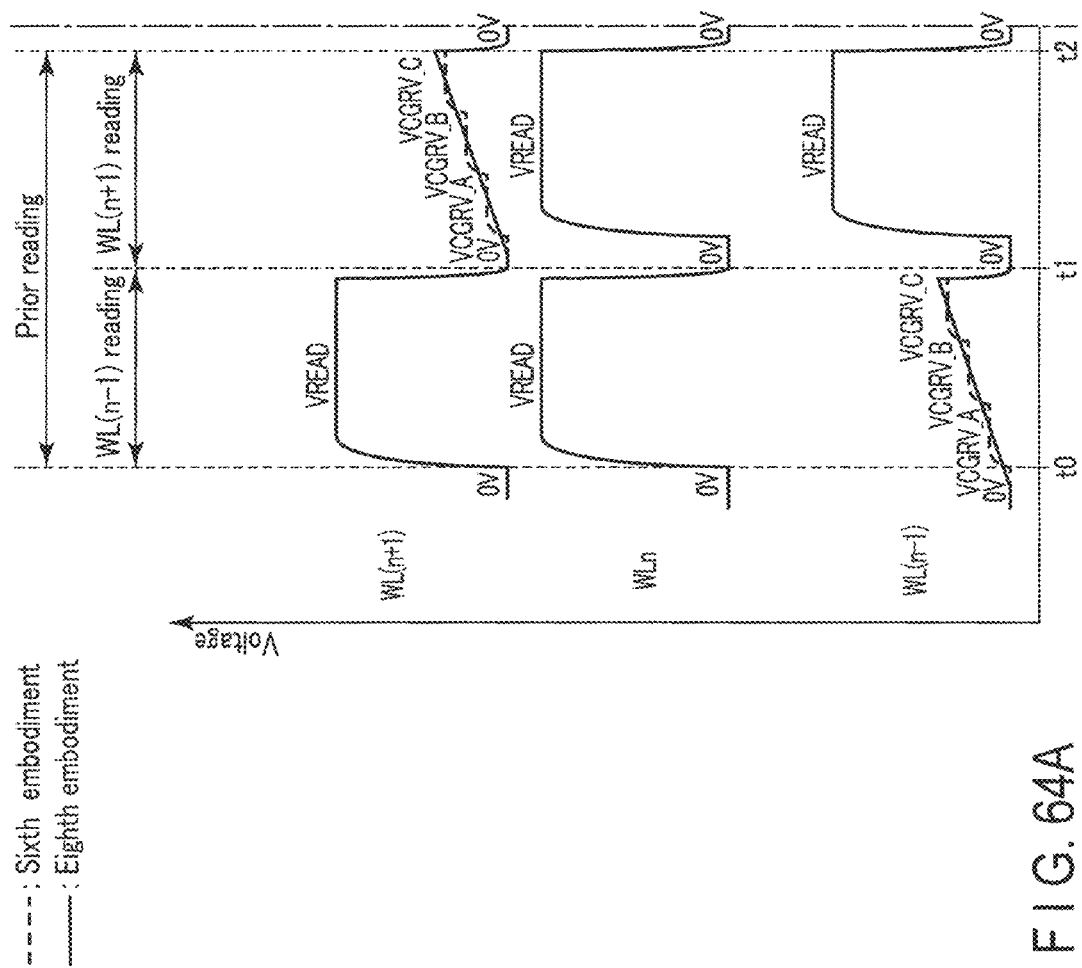

Next, a fifth example is described. In the present example, the present embodiment is applied to the read operation described in the sixth embodiment. FIG. 64A and FIG. 64B are timing charts showing the potential changes of the word lines WLn, WL(n+1), WL(n−1) in the read operation AR during prior-reading and during main-reading according to the fifth example and correspond to FIG. 45A and FIG. 45B described in the sixth embodiment respectively.

As shown in FIG. 64A, FIG. 64A is different from FIG. 45A described in the sixth embodiment in that when the word line WL(n−1) is selected in prior-reading, like the first example, the potential of the word line WL(n−1) continuously rises with time. Similarly, when the word line WL(n+1) is selected, the potential of the word line WL(n+1) continuously rises with time.

The same also applies to main-reading. As shown in FIG. 64B, FIG. 64B is different from FIG. 45B described in the sixth embodiment in that a voltage VREADLA applied to the word lines WL(n+1), WL(n−1) continuously rises with time. In this case, the varying range of the word line WL(n+1) is larger than the varying range of the word line WL(n−1) in each of read operations AR1 to AR16. Also, the varying range of the word line WL(n+1) is larger than the varying range of the word line WL(n−1) in each of read operations AR_E to AR_C. However, when viewed throughput the read operation AR period (time t3 through t19), the varying range of the word line WL(n+1) may be equal to the varying range of the word line WL(n−1) or either may be larger or smaller than the other. In the example of FIG. 64B, the potentials of the word lines WL(n+1), WL(n−1) increase with time even in the read operation CR, but may also be fixed to VREAD.

8.6 Advantageous Effects According to the Present Embodiment

Like the present embodiment, the potentials of the word lines WL(n+1) and WLn may continuously rise with time during data reading.

In the above embodiments, a case where the increase rate of the word line potential in each read operation (operation units of AR, BR, and CR or AR1, AR2, BR1, BR2, . . . , and CR1, CR2, . . . ) is constant is taken as an example. However, the increase rate may vary within each operation. For example, the increase rate of the word line potential may increase or decrease from some midpoint of each operation or a time zone in which the word line potential is constant may be included in each operation.

The word line potential may continuously rise only in one of prior-reading and main-reading or both. That is, the present embodiment and the first to seventh embodiments may be combined and carried out.

In the fourth example, a case where the potentials of both of, the word lines WL(n+1) and WLn continuously rise during program-verification operation is described. However, the potential of only one of both may continuously rise and the potential of the other may rise stepwise.

Further in the fifth example, a case where the potentials of both of the word lines WL(n+1) and WL(n−1) continuously change is taken as an example. However, the potential of only one of both may continuously change and the potential of the other may change stepwise. Even in the fifth example, as described with reference to FIG. 61 and FIG. 62, the potential of the selected word line WLn, instead of the word lines WL(n+1) and WL(n−1), may change with time.

Further, whether to raise the voltage of the word line WL continuously or stepwise may be selected by a controller that controls a NAND flash memory 10. When the controller issues, for example, a normal read instruction, the NAND flash memory 10 steps up the word line voltage and when the controller issues a read instruction together with a prefix command, the NAND flash memory 10 continuously raises the word line voltage. Alternatively, the NAND flash memory 10 may make a spontaneous selection in accordance with the state of a memory cell array regardless of the instruction issued by the controller.

The order of the read operations AR and BR may be interchanged. Further, when the potential of the word line WL is continuously changed in the above examples, a case where the potential rises is taken as an example. However, the potential may continuously be changed such that the potential falls. Then, whether to raise or lower the potential may be selected by the controller.

9. Ninth Embodiment

Now, a semiconductor memory device according to a ninth embodiment is described. The present embodiment relates to a specific example of a sense amplifier 13. More concretely, the present embodiment relates to a configuration that determines data by sensing the voltage of a node SEN and is desired to be used in the eighth embodiment.

9.1 Regarding Configuration of Sense Amplifier 13

A sense amplifier 13 according to the present embodiment senses voltage variations of a bit line and so performs a sense operation by shielding adjacent bit lines. That is, when one bit line is discharged, bit lines adjacent thereto are affected by potential variations of the discharged bit line due to coupling. As a result, data may erroneously be read. Therefore, in a voltage sensing system, data is read from even bit lines and odd bit lines separately. Then, when data is read from even bit lines, odd bit lines are fixed (shielded) to a constant potential and when data is read from odd bit lines, even bit lines are fixed (shielded) to a constant potential.

In a method of shielding adjacent bit lines (hereinafter, called a "bit line shield method"), as shown in FIG. 65, the sense amplifier 13 includes a plurality of sense circuits (S/A & latch), and one sense circuit (S/A & latch) is shared by two bit lines. That is, a configuration in which adjacent bit lines are classified into even and odd bit lines and adjacent even and odd bit lines share one sense circuit is adopted.

In a read operation of the bit line shield method, when data of even bit lines is read, an even bit line transfer gate (BLSe) is turned on and even bit lines are connected to the sense amplifier. At this point, by turning on a grounding transistor (BIASo), odd bit lines are connected to BLCRL and set to a predetermined potential. If the sense amplifier (S/A) precharges even bit lines in this state, the potential of odd bit lines is maintained at the predetermined potential and thus, even bit lines are precharged appropriately without being affected by odd bit lines. The precharge potential is determined by a gate voltage called a signal BLC and is, for example, 0.7 V.

On the other hand, when data of odd bit lines is read, an odd bit line transfer gate (BLSo) is turned on and odd bit lines are connected to the sense amplifier. At this point, by turning on a grounding transistor (BIASe), even bit lines are connected to BLCRL. If the sense amplifier (S/A) precharges odd bit lines in this state, the potential of even bit lines is maintained at the predetermined potential and thus, odd bit lines are precharged appropriately without being affected by even bit lines. The precharge potential is also a voltage clamped by the signal BLC just like when even bit lines are precharged.

Thus, in the bit line shield method, a correct read operation can be performed without being affected by signals of neighboring bit lines by grounding adjacent unselected bit lines during read operation.

FIG. 66 is a circuit diagram of a sense circuit (S/A & latch) corresponding to a set of a bit line pair BLe, BLo (for example, BL0 and BL1) shown in FIG. 65.

As shown in FIG. 66, the sense circuit includes a primary data cache (PDC) 430, a secondary data cache (SDC) 431, three dynamic data caches (DDC) 433 (433-1 to 433-3), and a temporary data cache (TDC) 434. The dynamic data cache 433 and the temporary data cache 434 may be provided when needed. The dynamic data cache 433 can also be used as a cache that holds data to write an intermediate potential (VQPW) of VDD (high potential) and VSS (low potential) to a bit line during programming.

The primary data cache 430 includes clocked inverters CLI1, CLI2, and an n-channel transistor NMOS5. The secondary data cache 431 includes clocked inverters CLI3, CLI4, and n-channel transistors NMOS6, NMOS7. The dynamic data cache 433 includes n-channel transistors NMOS4, NMOS9. The temporary data cache 434 has a capacitance element C1. Incidentally, the circuit configuration of the primary data cache 430, the secondary data cache 431, the dynamic data cache 433, and temporary data cache 434 is not limited to the circuit configuration shown in FIG. 66 and other circuit configurations may also be adopted.

In the example of FIG. 66, an n-channel MOS transistor is used as a transistor that controls the input/output of data in the data cache, but a p-channel MOS transistor may also be used.

Then, the sense amplifier is connected to the corresponding even bit line BLe and odd bit line BLo by re-channel MOS transistors HN2e, HN2o respectively. Signals BLSe, BLSo are input to gates of the transistors HN2e, HN2o. Sources of n-channel MOS transistors HN1e and HN1o are connected to the even bit line BLe and the odd bit line BLo respectively. Signals BIASe and BIASo are input to gates of the transistors HN1e and HN1o respectively and a signal BLCRL is input to drains thereof.

9.2 Regarding Read Operation

Figure 67:
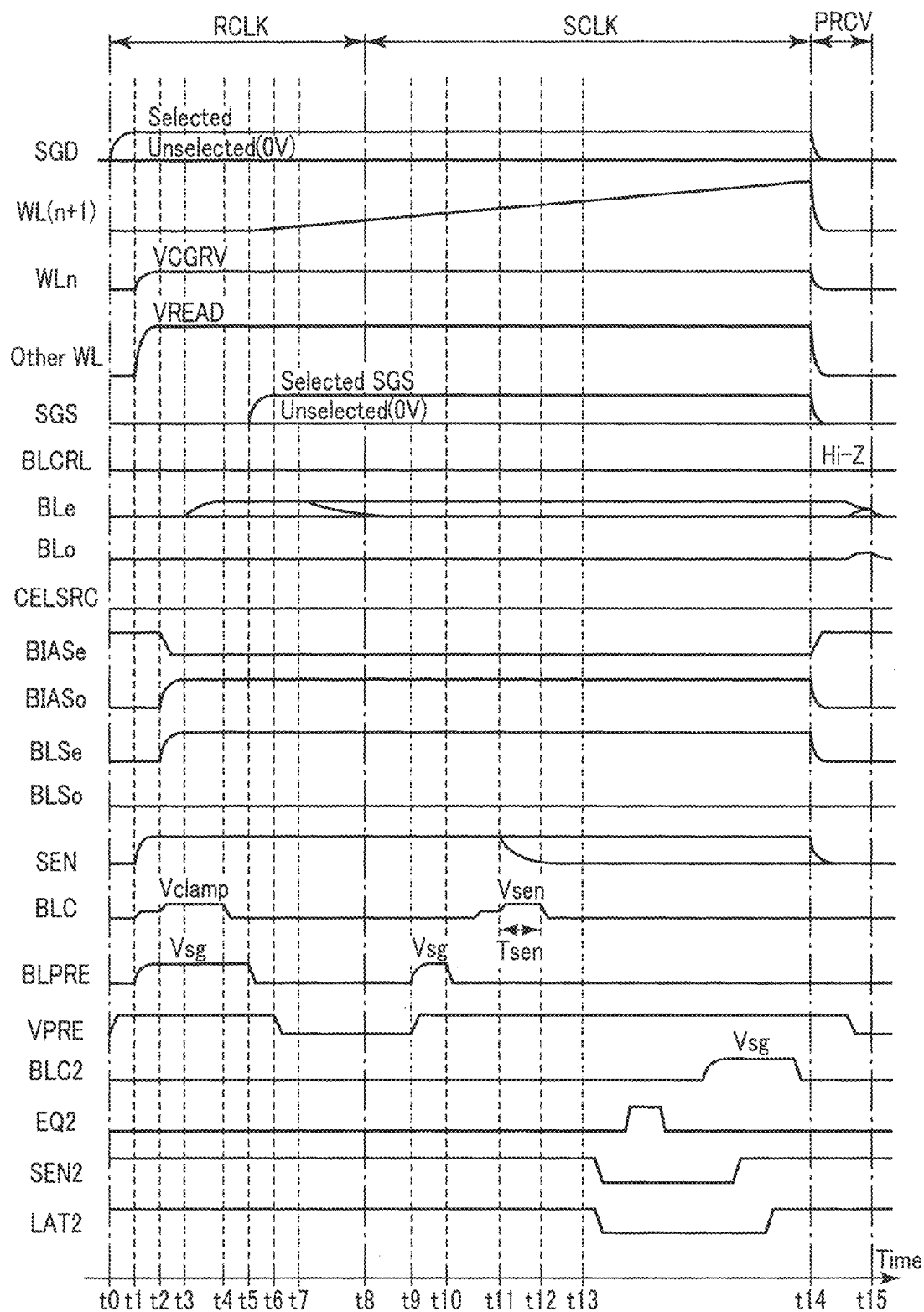
FIG. 67 is a timing chart of various signals during reading according to the ninth embodiment.

FIG. 67 shows a timing chart of various signals during read operation of the sense amplifier according to the present example. Each signal is provided by, for example, a sequencer 16 described with reference to FIG. 1.

As shown, at a time t0, a selection gate line (SGD) of a selected string unit of a selected block is first set to a "High" level. In the sense amplifier, a precharge power supply potential VPRE is set to VDD. 0 V or a non-selection voltage VBB (for example, a negative voltage) is applied to a unselected selection gate line SGD.

Subsequently, at a time t1, word lines WL are set up. That is, a row decoder 12 applies a read voltage VCGRV to the selected word line WLn and a voltage VREAD to unselected word lines excluding WL(n+1). At this point, WL (n+1) is at 0 V.

The sense amplifier precharges the bit line to be read (even bit line BLe in the example of FIG. 67). More specifically, the temporary data cache (TDC) 434 is precharged to the voltage VDD by setting a signal BLPRE to the "High" level to turn on a transistor NMOS11. Accordingly, the potential of the node SEN is VDD.

Next, at times t2 to t3, bit line selection signals BLSe, BLSo and bias selection signals BIASe, BIASo are set. In the example of FIG. 66, the even BLe is selected and thus, the even bit line selection signal BLSe is set to the "High" level and the signal BIASo is set to the "High" level to fix the odd bit line BLo to BLCRL (=Vss).

In addition, a clamp voltage Vclamp for bit line precharge is applied to the signal BLC and the even bit line BLe is thereby precharged to, for example, 0.7 V.

As described above, the even bit line BLe is charged to 0.7 V and the odd bit line BLo is fixed to Vss.

Next, at a time t4, the signal BLC is set to 0 V and the bit line BLe is put into an electrically floating state.

Next, at a time t5, Vsg is applied to the selection gate line SGS on the source side of a selected finger FNG. 0 V or a non-selection voltage VBB (for example, a negative voltage) is applied to the other unselected selection gate lines SGS. A voltage continuously rising with time is applied to the word line WL(n+1). Then, if the threshold of memory cells is higher than the read voltage VCGRV, the bit line is not discharged and if the threshold is lower than the read voltage VCGRV, a read current flows to discharge the bit line.

Next, at times t9 to t10, the temporary data cache TDC is precharged to VDD by the signal BLPRE being set to Vsg while a signal VPRE is set to VDD.

Subsequently, at times t11 to t12, a sense voltage Vsen is applied to the signal BLC. At this point, if the potential of the selected bit line BLe is higher than (Vsen−Vth), a transistor NMOS10 (transistor to which the signal BLC is provided) remains cut off and the potential of the node SEN is maintained at VDD. Vth is a threshold voltage of the memory cell transistor.

On the other hand, if the potential of the selected bit line BLe is lower than (Vsen−Vth), the transistor NMOS10 is turned on and thus, the node SEN is discharged and the potential thereof is nearly equal to the potential (for example, 0.4 V) of the bit line BLe.

Next, at times t13 to t14, sensed data is transferred into the secondary data cache SDC. More specifically, a node SEN1 and a node N2 are once made at the same potential by turning off signals SEN2, LAT2 and setting a signal EQ2 to VDD. Then, a signal BLC2 is set to VDD+Vth and data in the node SEN is transferred to SDC.

As described above, data is read from the even bit line BLe in the manner described above. Then, at times t14 to t15, a recovery operation is performed and nodes and signals are reset.

Reading of the odd bit line BLo is performed in the same manner. In this case, contrary to the example of FIG. 66, the signal BLSo is set to "High" and the signal BLSe is set to "Low". Also, the signal BIASe is set to "High" and the signal BIASo is set to "Low".

9.3 Advantageous Effects According to the Present Embodiment

A sense amplifier described in the present embodiment can be used in semiconductor memory devices described in the first to eighth embodiments.

In the present example, a sense period Tsen of data is a period in which the voltage Vsen is applied to the signal BLC. That is, if the potential of the node SEN drops below a certain data determination threshold in the period Tsen, the memory cell transistor is determined to be turned on and if the potential of the node SEN is equal to or more than the data determination threshold, the memory cell transistor is determined to be turned off. This period Tsen can appropriately be set by, for example, a sequencer 16.

The definition of a "continuously rising" voltage described in the eighth embodiment can be defined, for example, as described below using FIG. 68. FIG. 67 shows the potential of the word line WL(n+1) and shows a continuous rise of the potential. Even if the potential "continuously" rises, when viewed from an extremely microscopic viewpoint, the potential may be stepped up in a time interval and a voltage rise width that are extremely small. In the present specification, however, even if the potential is actually stepped up as shown in FIG. 67, if the potential changes at least in the sense period Tsen, such a change is defined as "continuous".

10. Tenth Embodiment

Now, a semiconductor memory device according to a tenth embodiment is described. The present embodiment achieves the same effect as that of the first embodiment by strobing data at a plurality of timings in the eighth embodiment while maintaining the potential of unselected word lines constant at VREAD during read operation and continuously changing the potential of the selected word line. Hereinafter, only differences from the first to ninth embodiments are described.

10.1 Regarding Threshold Distribution of Memory Cell Transistor

FIG. 69 shows data and threshold distributions that can be taken by a memory cell transistor MT according to the present embodiment.

As shown, each of the memory cell transistors MT according to the present example is capable of holding, for example, 3-bit data. The 3-bit data is, for example, "111", "110", "100", "000", "010", "011", "001", and "101" in ascending order of threshold.

The threshold of a memory cell holding "111" data is the "Er"-level. The "Er"-level corresponds to the "E"-level described with reference to FIG. 4 and a positive or negative value (for example, less than a voltage VA).

"110", "100", "000", "010", "011", "001" and "101" correspond to the states in which data is written by injecting charges into a charge storage layer. The threshold of a memory cell holding "110" data is the "A"-level and higher than the "Er"-level (for example, equal to or more than the voltage VA and less than VB). The threshold of a memory cell holding "100" data is the "B"-level and higher than the "A"-level (for example, equal to or more than the voltage VB and less than VC). The threshold of a memory cell holding "000" data is the "C"-level and higher than the "B"-level (for example, equal to or more than the voltage VC and less than VD, VC<VD). The threshold of a memory cell holding "010" data is the "D"-level and higher than the "C"-level (for example, equal to or more than the voltage VD and less than VE, VD<VE). The threshold of a memory cell holding "011" data is the "E"-level and higher than the "D"-level (for example, equal to or more than the voltage VE and less than VF, VE<VF). The threshold of a memory cell holding "001" data is the "F"-level and higher than the "E"-level (for example, equal to or more than the voltage VF and less than VG, VF<VG). The threshold of a memory cell holding "101" data is the "G"-level and higher than the "F"-level (for example, equal to or more than the voltage VG and less than VREAD, VG<VREAD).

Naturally, the relation between 3-bit data and the threshold is not limited to the above relation and an appropriate relation may be selected. In the present example, only one bit of three bits changes between data corresponding to two adjacent states in the threshold distribution.

Therefore, when a lower bit is read, a voltage corresponding to a boundary where the value ("0" or "1") of the lower bit changes may be used and the same also applies to a middle bit and an upper bit.

That is, as shown in FIG. 69, lower page reading uses the voltage VA distinguishing the "Er"-level and the "A"-level and the voltage VE distinguishing the "D"-level and the "E"-level as read levels. The read operations using the voltages VA and VE are called read operations AR and ER respectively.

The read operation AR determines whether the threshold voltage of the memory cell transistor MT is less than the voltage VA. That is, the memory cell transistor MT in an erased state is identified by the read operation AR. The read operation ER determines whether the threshold voltage of the memory cell transistor MT is less than the voltage VE.

Middle page reading uses the voltage VB distinguishing the "A"-level and the "B"-level, the voltage VD distinguishing the "C"-level and the "D"-level, and the voltage VF distinguishing the "E"-level and the "F"-level as read levels. The read operations using the voltages VB, VD, and VF are called read operations BR, DR, and FR respectively.

The read operation BR determines whether the threshold voltage of the memory cell transistor MT is less than the voltage VB. The read operation DR determines whether the threshold voltage of the memory cell transistor MT is less than the voltage VD. The read operation FR determines whether the threshold voltage of the memory cell transistor MT is less than the voltage VF.

Then, upper page reading uses the voltage VC distinguishing the "B"-level and the "C"-level and the voltage VG distinguishing the "F"-level and the "G"-level as read levels. The read operations using the voltages VC and VG are called read operations CR and GR respectively.

The read operation CR determines whether the threshold voltage of the memory cell transistor MT is less than the voltage VC. The read operation GR determines whether the threshold voltage of the memory cell transistor MT is less than the voltage VG. That is, the memory cell transistor MT at a "G"-level is identified by the read operation GR.

10.2 Regarding Configuration of NAND Flash Memory 10

Next, the configuration of a NAND flash memory 10 according to the present embodiment is described using FIG. 70. FIG. 70 is a block diagram of a partial region of the NAND flash memory 10 according to the present embodiment. Hereinafter, only differences from the first to ninth embodiments are described.

First, the configuration of a sense amplifier 13 is described using FIG. 70. As shown, the sense amplifier 13 includes a sense amplifier unit SAU (SAU0 to SAU(L−1)) provided for each bit line BL.

Each of the sense amplifier units SAU includes a sense unit SA, an arithmetic operation unit OP, and, for example, seven latch circuits ADL, BDL, CDL, DDL, UDL, LDL, and XDL.

The sense unit SA senses data read in the corresponding bit line BL and also applies a voltage to the bit line BL in accordance with write data. That is, the sense unit SA is a module that directly controls the bit line BL. Then, a strobe signal STB is provided to the sense unit SA by, for example, a sequencer 16 during reading. The sense unit SA determines read data at a timing when the signal STB is asserted (in the present example, data "0" is defined for a memory cell that is turned on and data "1" is defined for a memory cell that is turned off). Then, the sense unit SA holds data in an internal latch circuit (not shown in FIG. 70) of the sense unit SA and further transfers the data to one of the latch circuits ADL, BDL, CDL, DDL, UDL, LDL, and XDL.

The latch circuits ADL, BDL, CDL, DDL, UDL, LDL, and XDL temporarily hold read data and write data. The arithmetic operation unit OP performs various logical operations such as a NOT operation, an OR operation, an AND operation, and an XOR operation on data held in the sense unit SA and the latch circuits ADL, BDL, CDL, DDL, UDL, LDL, and XDL.

The sense unit SA, the latch circuits ADL, BDL, CDL, DDL, UDL, LDL, and XDL, and the arithmetic operation unit OP are connected by a bus so as to be able to mutually transmit and receive data. The bus is further connected to the latch circuit XDL. Then, data is input into and output from the sense amplifier 13 via the latch circuit XDL. The latch circuit XDL functions also as a cache memory of a NAND flash memory 140. Thus, even if the latch circuits ADL, BDL, CDL, DDL, UDL, and LDL are in use, a NAND flash memory 100 can be made ready state if the latch circuit XDL is available.

In the configuration described with reference to FIG. 1, a NAND flash memory 10 further includes a counter 19 and 14 registers REG0 to REG13. The counter 19 counts the number of latch circuits LDL holding "1" data during read operation. The registers REG0 to REG13 hold count results by the counter 19. The operations of the counter 19 and the registers REG0 to REG13 are described in detail in an eleventh embodiment described below.

10.3 Regarding Read Operation

Figure 71:
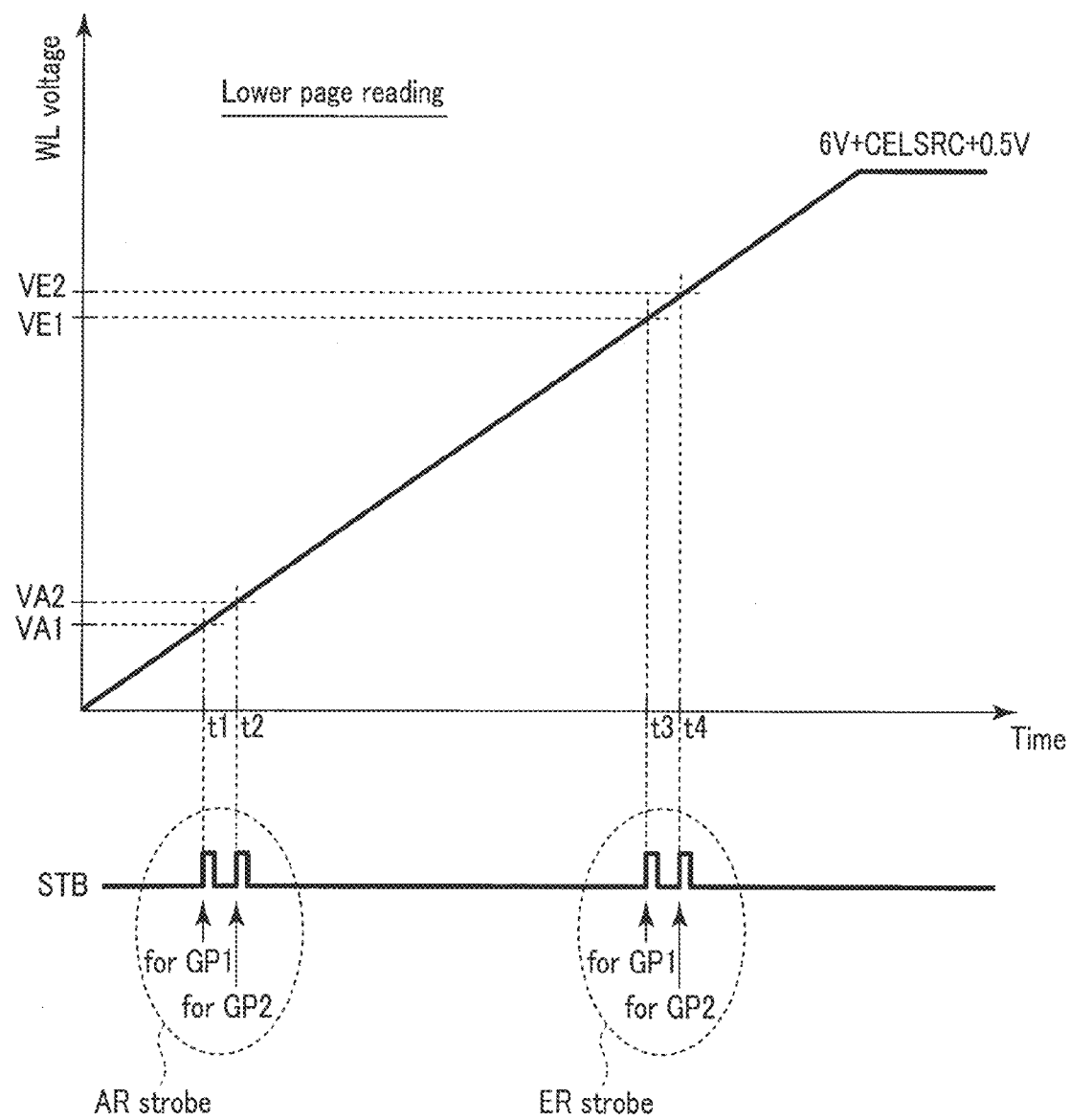
FIG. 71 shows an overview of a reading method according to the tenth embodiment and is a timing chart of a selected word line and a strobe signal.

Next, a rough concept of the read operation according to the present embodiment is described using FIG. 71. FIG. 71 is a timing chart of the potential of a selected word line WLn and a strobe signal STB during main-reading and shows a situation when lower page data is read.

As shown, a row decoder 12 continuously raises a read voltage VCGRV applied to the selected word line WLn and applies a constant voltage VREAD to unselected word lines WL.

As described above, lower page reading includes the read operations AR and ER. The lower page data is determined by the two read levels.

Therefore, a sequencer 17 asserts the strobe signal STB in the read operation AR and further asserts the strobe signal STB in the read operation ER. In this case, the strobe STB is asserted at different timings for each group GP. The group GP is a set of selected memory cells distinguished based on the threshold level of a memory cell connected to the unselected word line WL(n+1) adjacent to the selected word line WLn on the drain side. In the example of FIG. 71, the memory cell belongs to one of two groups GP1 and GP2. For example, a selected memory cell for which an adjacent memory cell has a low threshold ("Er"- to "C"-level) belongs to the group GP1 and a selected memory cell for which an adjacent memory cell has a high threshold ("D"- to "G"-level) belongs to the group GP2. To which of the groups GP1 and GP2 each memory cell belongs is determined based on a result of prior-reading.

As shown in FIG. 71, the sequencer 17 asserts the strobe signal STB at a time t1 (VCGRV=VA1) and a time t2 (VCGRV=VA2, VA2>VA1) for the read operation AR. That is, for a selected memory cell belonging to the group GP2, data is determined using the read voltage VCGRV higher than that of a selected memory cell belonging to the group GP1.

Further, the sequencer 17 asserts the strobe signal STB at a time t3 (VCGRV=VE1) later than the time t2 and a time t4 (VCGRV=VE2, VE2>VE1) for the read operation ER.

That is, in the read operation ER just like the read operation AR, for a selected memory cell belonging to the group GP2, data is determined using the read voltage VCGRV higher than that of a selected memory cell belonging to the group GP1.

FIG. 72 is a timing chart of the potentials of the selected word line WLn and the unselected word line WL(n+1), and the strobe signal STB during prior-reading and main-reading according to the present embodiment and particularly shows lower page reading.

As shown, prior-reading is performed in a period of time t0 to t2. In this period, the voltage VCGRV of the word line WL(n+1) is continuously raised with time and at a time t1, data for one page is strobed. The value of VCGRV at this time t1 is, for example, VD. Accordingly, the sense amplifier 13 can determine whether the threshold of a memory cell connected to the word line WL(n+1) is the "C"-level or below, or the "D" or above. Among memory cells connected to the word line WLn, memory cells adjacent to a memory cell of the "C"-level or below correspond to the group GP1 and memory cells adjacent to a memory cell of the "D"-level or above correspond to the group GP2. This information is held by one of latch circuits (for example, the latch circuit UDL) of the sense amplifier 13.

Next, main-reading is performed in a period of time t3 to t8. The main-reading is as described with reference to FIG. 71. That is, the voltage VCGRV of the word line WLn is continuously raised with time. Then, the strobe signal STB is asserted at the time t4 when the value of the voltage VCGRV reaches the voltage VA1 and a result of the read operation AR (this is called AR1) for a memory cell belonging to the group GP1 is strobed. Subsequently, the strobe signal STB is asserted at the time t5 when the value of the voltage VCGRV reaches the voltage VA2 (where VA1<VA2) and a result of the read operation AR (this is called AR2) for a memory cell belonging to the group GP2 is strobed.

Subsequently, the strobe signal STB is asserted at the time t6 when the value of the voltage VCGRV reaches the voltage VE1 and a result of the read operation ER (this is called ER1) for a memory cell belonging to the group GP1 is strobed. Further, the strobe signal STB is asserted at the time t7 when the value of the voltage VCGRV reaches the voltage VE2 (where VE1<VE2) and a result of the read operation ER (this is called ER2) for a memory cell belonging to the group GP2 is strobed.

10.4 Regarding Read Operation

Specific examples of the read operation are described using FIG. 73. FIG. 73 is a schematic diagram showing threshold levels of memory cells connected to the selected word line WLn and the unselected word line WL(n+1) adjacent thereto on the drain side. In FIG. 73, for the sake of simplicity, a case where the number of bit lines is 16 (BL0 to BL15) is taken as an example.

As shown, among memory cells connected to the word line WLn, memory cells connected to the bit lines BL0 to BL7 have the thresholds of the "Er", "A", "B", "C", "D", "E", "F", and "G"-levels respectively and also memory cells connected to the bit lines BL8 to BL15 are alike.

In the present configuration, prior-reading is performed using, for example, the read level VD. That is, the strobe signal STB is asserted at a timing when the voltage VD is applied to the word line WL(n+1). It is assumed that, as a result, the potentials of the bit lines BL0 to BL7 fall and the potentials of the bit lines BL8 to BL15 almost maintain precharge levels. Then, it is clear that, among memory cells connected to the word line WL(n+1), memory cells connected to the bit lines BL0 to BL7 have the thresholds of one of the "Er"- to "C"-levels and memory cells connected to the bit lines BL8 to BL15 have the thresholds of one of the "D"- to "G"-levels. That is, among memory cells connected to the word line WLn, memory cells connected to the bit lines BL0 to BL7 belong to the group GP1 and memory cells connected to the bit lines BL8 to BL15 belong to the group GP2. The result is held in the latch circuit UDL of the sense amplifier 13.

Figure 74:
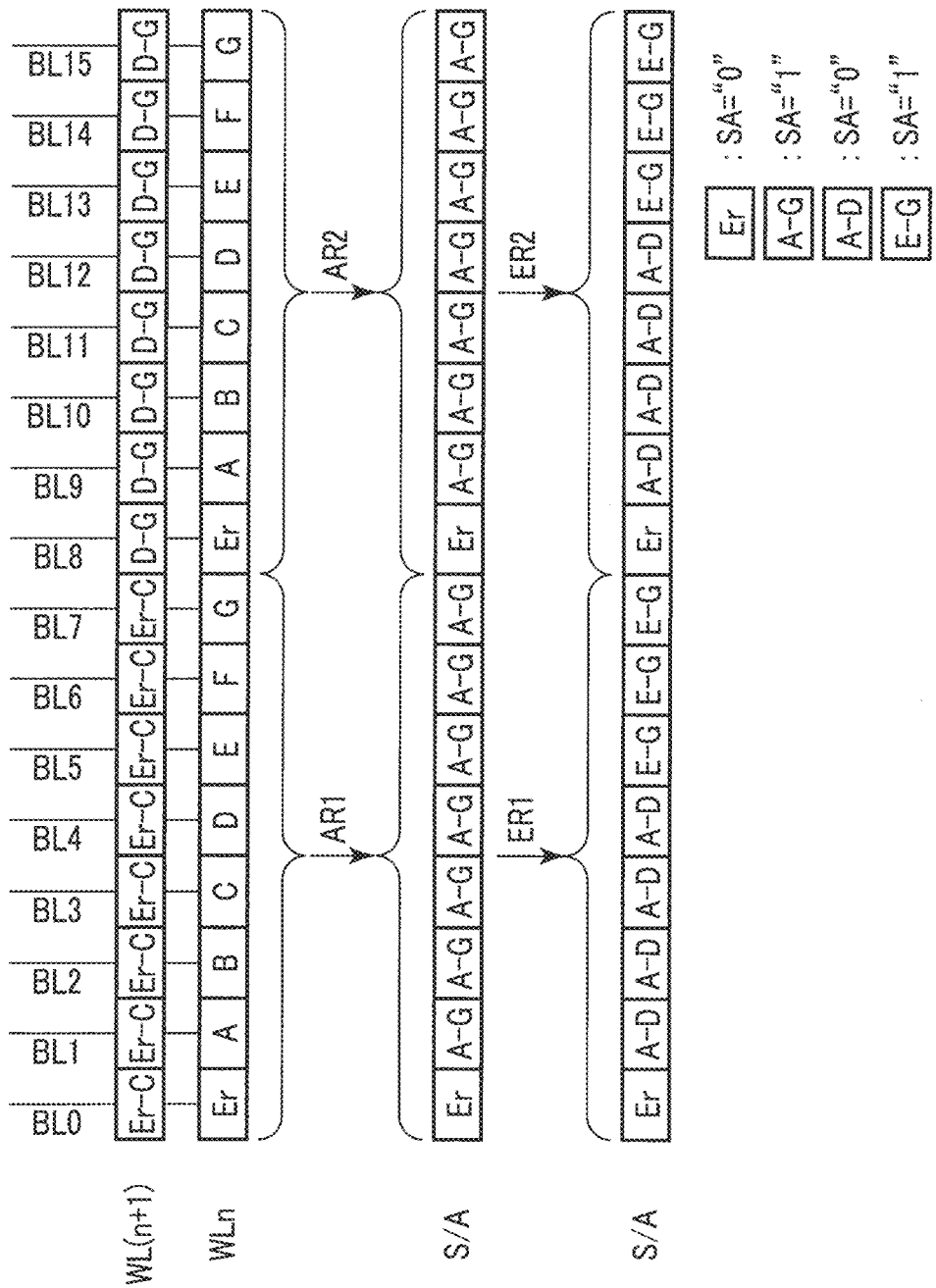

Next, main-reading is performed as shown in FIG. 74. FIG. 74 further shows changes of information held inside the sense amplifier 13 by the read operations AR1, AR2, ER1, and ER2 in FIG. 73.

As shown, first the read operation AR1 is performed. In the read operation AR1, data is read in units of pages using the read voltage VA1. Then, the sense amplifier 13 strobes data read from memory cells belonging to the group GP1. When the voltage VA1 is applied to the selected word line WLn, the potential of the bit line BL0 falls and the potentials of the bit lines BL1 to BL7 almost maintain the precharge levels. As a result, the threshold of the memory cell connected to the bit line BL0 is determined to be the "Er"-level and this information is held in a latch circuit of the sense amplifier 13. Incidentally, the potential of the bit line BL8 may also fall in the read operation AR1. However, the sense amplifier 13 is aware that the bit line BL8 (and BL9 to BL15) is not to be read based on prior-reading results. Thus, the result is not held in a latch circuit and the threshold of the memory cell connected to the bit line BL8 is undefined.

Next, the read operation AR2 is performed. In the read operation AR2, data is read in units of pages using the read voltage VA2. Then, the sense amplifier 13 strobes data read from memory cells belonging to the group GP2. When the voltage VA2 is applied to the selected word line WLn, the potential of the bit line BL8 falls and the potentials of the bit lines BL9 to BL15 almost maintain the precharge levels. As a result, the threshold of the memory cell connected to the bit line BL8 is determined to be the "Er"-level and this information is held in a latch circuit of the sense amplifier 13. Naturally, the bit lines BL0 to BL7 are not to be strobed.

From the above result, data held in the latch circuits (sense unit SA) of the sense amplifier 13 is "0111111101111111" in the order of correspondence starting with the bit line BL0.

Next, when the voltage of the selected word line WLn reaches VE1 and VE2, the read operations ER1 and ER2 are performed respectively. The read operations ER1 and ER2 are almost the same as the read operations AR1 and AR2 described above. The read operations ER1 and ER2 are different from the read operations AR1 and AR2 in that the bit lines BL0 and BL8 for which data has been determined are excluded from read target and fixed to a constant voltage (for example, 0 V).

In the present example, the potentials of the bit lines BL1 to BL4 fall and the bit lines BL5 to BL7 almost maintain the precharge potentials in the read operation ER1. As a result, the thresholds of memory cells connected to the bit lines BL1 to BL4 are determined to be one of the "A"- to "D"-levels, the thresholds of memory cells connected to the bit lines BL5 to BL7 are determined to be one of the "E"- to "G"-levels, and the result is held in a latch circuit of the sense amplifier 13. Data read from memory cells connected to the bit lines BL9 to BL15 is held in a latch circuit in the read operation ER2.

As a result of the above, as shown in FIG. 74, the lower page data is determined and held in a latch circuit of the sense amplifier 13.

10.5 Advantageous Effects According to the Present Embodiment

According to the present embodiment, even a method of continuously raising the read voltage VCGRV can reduce the influence of disturbance from the word line WL(n+1) adjacent on the drain side in a simplified manner.

That is, according to the present method, a sequencer 16 categorized memory cells to be read in main-reading into a plurality of groups by prior-reading. The grouping is based on the result of prior-reading and in an example of the present embodiment, for example, memory cells adjacent on the drain side are categorized into the group GP1 of a low threshold and the group GP2 of a high threshold.

Then, in main-reading, the sequencer 16 asserts the strobe signal STB at different timings for each group. More specifically, data of the group (group GP2 in the present example) of a high threshold of memory cells adjacent on the drain side is strobed at a timing later than the group of a low threshold (group GP1 in the present example).

The read voltage VCGRV is continuously raised with time and if the strobe timing is delayed, data is read at a higher voltage. That is, according to the present embodiment, by asserting the strobe signal STB at a plurality of timings, data is read using a low voltage for a group (group GP1 in the present example) with small disturbances and data is read using a high voltage for a group (group GP2 in the present example) with large disturbances. Accordingly, even if the threshold of a memory cell connected to the word line WLn is varied due to writing into the word line WL(n+1), data can be read correctly.

The definition of a "continuously rising" voltage described in the present embodiment can be defined as described below using FIG. 75. FIG. 75 shows a timing chart of the potential of the word line WL(n+1) and the strobe signal STB during main-reading. Also described in FIG. 68, even if the potential "continuously" rises, when viewed from an extremely microscopic viewpoint, the potential may be stepped up in a time interval and a voltage rise width that are extremely small. In the present specification, however, even if the potential is actually stepped up as shown in FIG. 75, if the potential changes at least in a sense period Tsen in which the strobe signal STB is asserted, such a change is defined as "continuous".

Further in the above embodiment, a case where data in one page is categorized into two groups is taken as an example, but data may also be categorized into three or more groups. FIG. 76 is a timing chart of the unselected word line WL(n+1), the selected word line WLn, and the strobe signal STB during prior-reading and main-reading when page data is divided into three groups GP1 to GP3.

As shown, the strobe signal STB is twice asserted at different timings (times t1 and t2) during the prior-reading. At the strobe timing of the time t1, bit lines BL in which the potential of the node SEN falls are registered on the group GP1 of a low threshold. The potential of the word line WL(n+1) at the time t1 is, for example, VB and memory cells for which the threshold of adjacent memory cells is the "Er"-level or the "A"-level belong to the group GP1.

At the strobe timing of the time t2, bit lines BL in which the potential of the node SEN falls are registered on the group GP2 of an intermediate threshold. The potential of the word line WL(n+1) at the time t2 is, for example, VF and memory cells for which the threshold of neighboring memory cells is the "B"- to "E"-levels belong to the group GP2.

Other bit lines BL are registered on the group GP3 of a high threshold. That is, memory cells for which the threshold of neighboring memory cells is the "F"-level or the "G"-level belong to the group GP3. Naturally, the grouping described in the present example is only an example and other groupings may also be adopted.

Then, in main-reading, as shown in FIG. 76, data read from memory cells belonging to the groups GP1 to GP3 is strobed at mutually different timings. For example, the strobe timings of the read operation AR of the groups GP1 to GP3 are times t5, t6, t7 respectively and the read voltage VCGRV applied to the selected word line WLn is the lowest at the time t5 and the highest at the time t7. The same applies to the read operation ER.

In the example of FIG. 76, the strobe timings of the read operation ER of the groups GP1 to GP3 are times t8, t9, t10 respectively and the read voltage VCGRV applied to the selected word line WLn is the lowest at the time t8 and the highest at the time t10.

In the above example, lower page reading is taken as an example, but it is needless to say that a similar method can be applied to other page reading.

11. Eleventh Embodiment

Now, a semiconductor memory device according to an eleventh embodiment is described. In the present embodiment, the reading method described in the tenth embodiment is applied to distribution reading. Hereinafter, only differences from the tenth embodiment are described.

11.1 Regarding Distribution Reading

In the tenth embodiment, the threshold distribution of the memory cell transistor MT is described using FIG. 69. In FIG. 69, the threshold distribution of each piece of data is independent of each other and thus, data can correctly be determined using voltages VA to VG.

Figure 77:
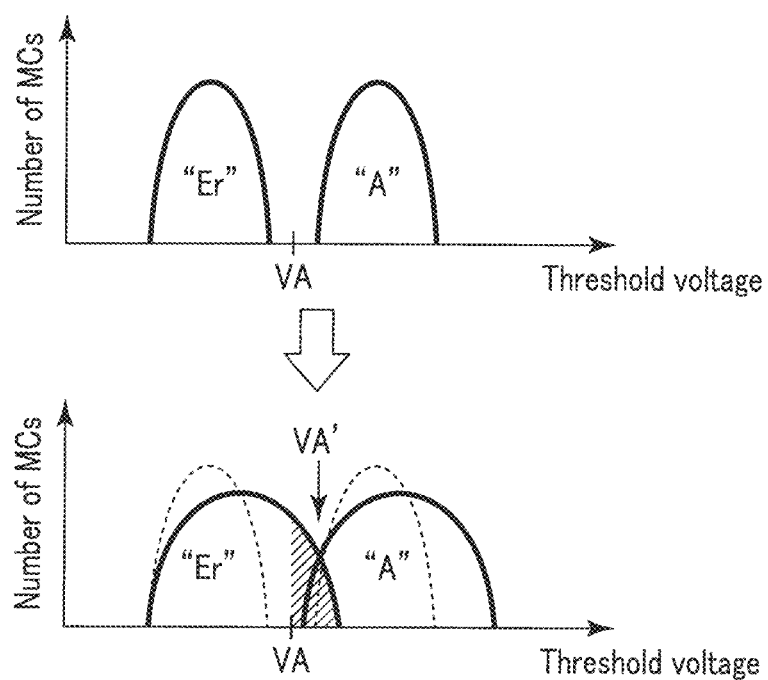
FIG. 77 is a graph showing the threshold distribution of the memory cells.

However, as has been described in the first and subsequent embodiments, the threshold of the memory cell transistor MT is influenced by various disturbances. As a result, the threshold distribution of each piece of data in FIG. 69 may overlap with adjacent distributions with an expanded distribution width or movement of the distribution. Such a situation is shown in FIG. 77. The upper diagram in FIG. 77 shows an ideal threshold distribution, for example, immediately after data is written. The lower diagram in FIG. 77 shows a state in which threshold distributions of the "Er"-level and the "A"-level overlap due to disturbance. Then, data of memory cells in a shaded area in the lower diagram of FIG. 77 is erroneously read and if the number of fail bits thereof exceeds the number of ECC correctable bits, the read operation fails.

In such a case, correct data may be obtainable by checking how the distribution width is expanded (in other words, the position (voltage) as an intersection of two distributions where the number of read fail bits is minimized is identified and this is sometimes called Vth tracking) and finding thereby an appropriate read voltage. In the example of FIG. 77, a voltage VA' is an appropriate read voltage. One of methods used to search for an appropriate read voltage is distribution reading.

Figure 78:
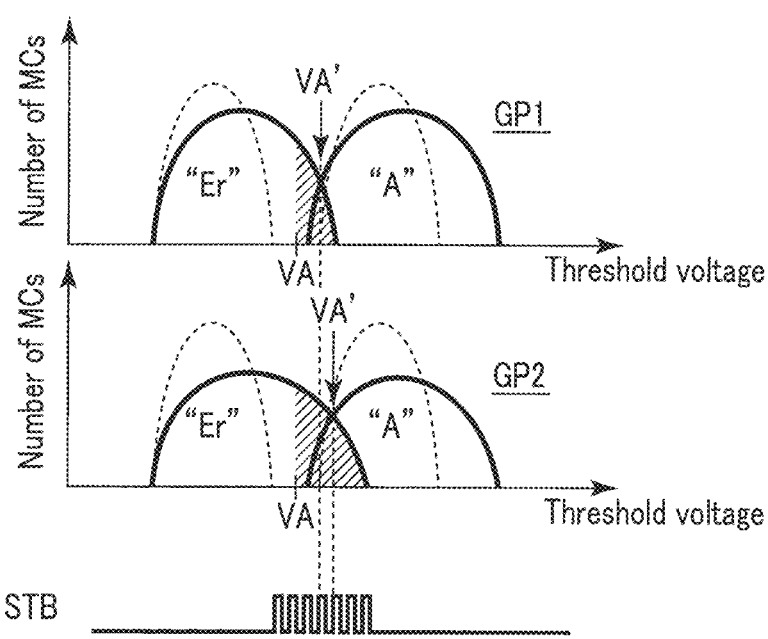
FIG. 78 shows a concept of the read operation in the eleventh embodiment and is a graph showing the threshold distributions of the memory cells and the strobe signal.

The concept of distribution reading according to the present example is briefly described using FIG. 78. FIG. 78 is a timing chart of threshold distributions of the "Er"-level and the "A"-level of memory cells belonging to groups GP1 and GP2 and a strobe signal STB.

As shown, memory cells belonging to the group GP2 generally have wider expansion of the threshold distribution than those belonging to the group GP1. This is because the threshold of memory cells adjacent to each other on the drain side is high and thus, the influence of disturbance affected during write operation to neighboring memory cells is correspondingly larger.

In distribution reading in the present example, like in the tenth embodiment, a read voltage VCGRV applied to the selected word line WLn is continuously raised. Then, a sequencer 16 asserts the strobe signal STB a plurality of times near a voltage VA. Then, it is possible to predict that the voltage VCGRV corresponding to the strobe timing when the number of on cells is the smallest is the voltage corresponding to an intersection of two threshold distributions. In other words, data strobed in the strobe timing can be said to be read data with the highest precision.

11.2 Regarding Details of Read Operation

Next, the read operation according to the present embodiment is described together with the distribution reading using FIG. 79. FIG. 79 is a flow chart of the read operation according to the present embodiment.

As shown, prior-reading is first performed (step S10). Step S10 is the same as in the tenth embodiment. That is, in the prior-reading, all read operations (AR to GR) described with reference to FIG. 69 do not necessarily have to be performed and it is only necessary to perform at least one read operation. When, for example, as shown in FIGS. 69 and 72, only the read operation DR is performed, adjacent cells are categorized by the voltage VD on cells of a lower threshold and cells of a higher threshold. Prior-reading results are held in, for example, the latch circuit UDL or the like.

Next, main-reading is performed (step S11). Also in the main-reading, like in the tenth embodiment, the voltage applied to the selected word line WL is continuously raised (see FIGS. 71 and 72). Then, data related to the selected word line WL is read in units of pages and the read data is held in a latch circuit of a sense amplifier 13. At this point, like in the tenth embodiment, read operations of a plurality of read levels related to some page are performed. More specifically, the read operations AR and ER are both performed in lower page reading.

The eleventh embodiment is different from the tenth embodiment in that the strobe signal STB is asserted a plurality of times. More specifically, the strobe signal STB is asserted a number of times larger than at least the number of groups distinguished by prior-reading and data is held in a latch circuit inside the sense amplifier 13 each time. In the main-reading, as described above, the voltage VCGRV is continuously raised with time and thus, the data strobed the plurality of times is data based on mutually different voltages VCGRV.

From the above, in the case of, for example, lower page reading, results of the read operation AR based on the voltage VCGRV of a plurality of values and results of the read operation ER based on the voltage VCGRV of the plurality of values are held in the sense amplifier 13 or the register REG.

Next, the optimal read voltage VCGRV related to each read level is searched for. In other words, the strobe timing corresponding to an intersection of threshold distributions described with reference to FIGS. 77 and 78 is searched for.

First, for example, a sequencer 16 focuses on one of read levels (one of AR and ER for lower page reading) (step S12) and further focuses on one of the groups GPi (for example, GP1) (step S13). As described with reference to FIGS. 72 to 74 in the tenth embodiment, the group GP is a set of bits distinguished by prior-reading in step S10. In the present example, it is assumed that the group GP1 is first selected.

Then, the optimal read voltage VCGRV (that is, the optimal strobe timing) for the group GP1 selected in step S13 is searched for (step S14). More specifically, a counter 19 counts the number of cells turned on from an off state in each strobe timing for the read data obtained in step S11 and the read voltage VCGRV of the timing when the difference of the number of on cells is the smallest is selected as the optimal value. That is, the counter 19 or sequencer 16 calculates the difference between the number of on cells at (j−1)-th read operation ((j−1)-th STB) and the number of on cells at j-th read operation (j-th STB), and the sequencer determines the timing (j-th STB) in which the difference is the smallest as the optimal strobe timing. Note that the j is a natural number and indicates the order of data strobe in the Vth tracking. This process is performed for the remaining groups GP (for example, GP2) (step S15, YES, step S16) and the optimal read voltage VCGRV for all groups GP is thereby determined (step S17).

Subsequently, processes of steps S13 to S16 described above are repeated for the remaining read levels (another of AR and ER in lower page reading) (step S18, YES, step S19). Accordingly, the optimal read voltage VCGRV is determined for each group GP regarding all read levels corresponding to the focused page.

Then, for example, the sequencer 16 reads data corresponding to the optimal read voltage VCGRV determined as described above for each group GP from the sense amplifier 13 or the register REG (step S20). Then, the sequencer 16 completes data for one page by combining data corresponding to each group GP read in step S20 (step S21).

Figure 80:
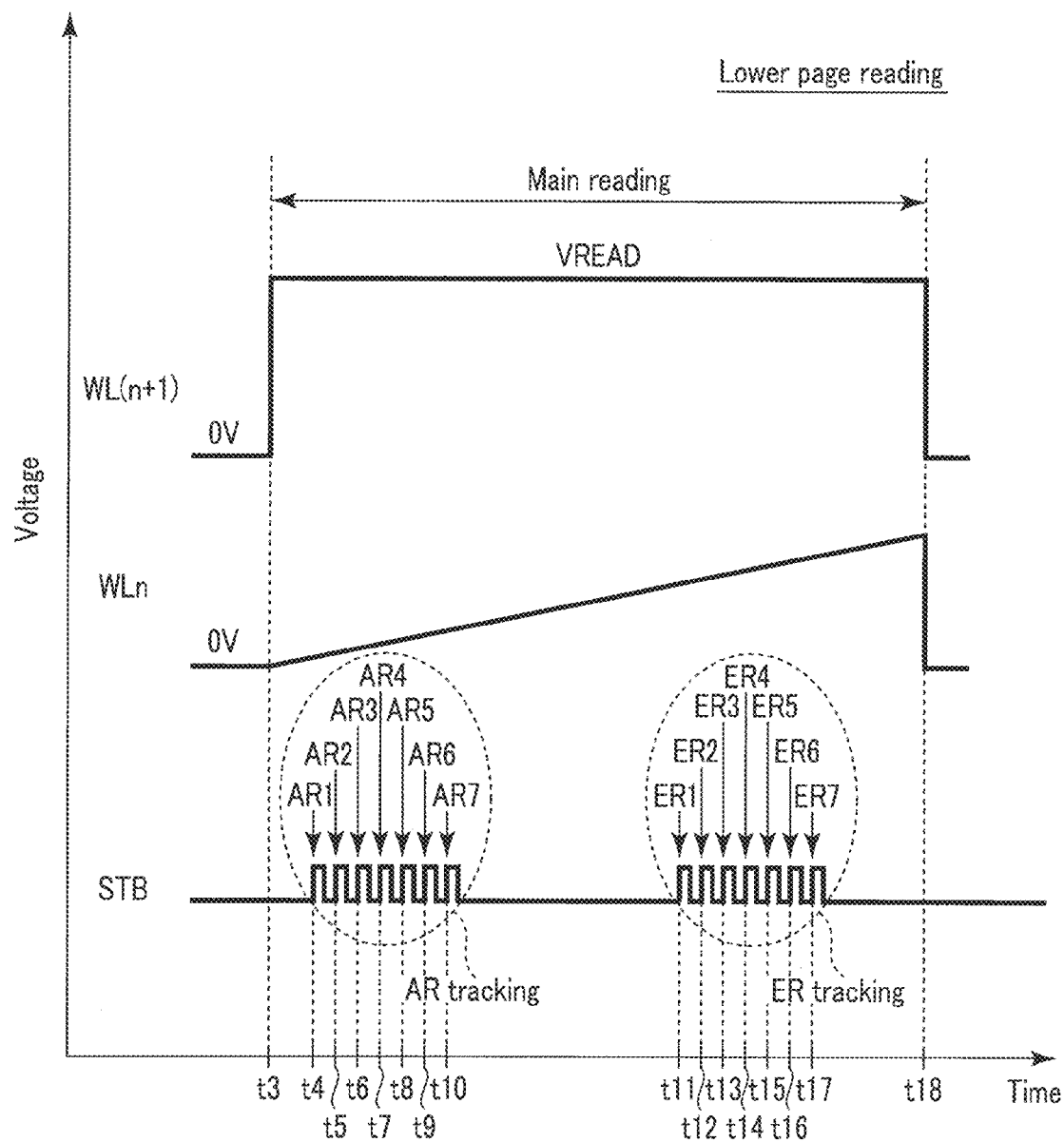
FIG. 80 is a timing chart showing the word line voltages and the strobe signal during reading according to the eleventh embodiment.

A specific example of the above read operation is described using FIG. 80. FIG. 80 is a timing chart of the potentials of a unselected word line WL(n+1) and a selected word line WLn and the strobe signal STB during lower page reading. In the example of FIG. 80, a case when the strobe signal STB is asserted seven times for each of read operations AR and ER is shown. Hereinafter, Vth tracking for the read operation AR is called AR tracking and Vth tracking for the read operation ER is called ER tracking.

As shown, AR tracking is started at a time t4. Seven strobe operations in AR tracking are called read operations AR1 to AR7 (step S10). The voltage VCGRV in the read operation AR1 is lower than, for example, the voltage VA and the voltage VCGRV in the read operation AR7 is higher than the voltage VA. However, the voltage VCGRV at times of seven data strobes is not limited to this example if the value thereof is near the voltage VA. Then, seven read results are held in the sense amplifier 13 or the register REG.

Subsequently, ER tracking is started at a time t11. Strobe operations in ER tracking are similarly called read operations ER1 to ER7 (step S10). The voltage VCGRV in the read operation ER1 is lower than, for example, the voltage VE and the voltage VCGRV in the read operation ER7 is higher than the voltage VE, but may be, like in AR tracking, a value near the voltage VE. Then, seven read results are held in the sense amplifier 13 or the register REG.

Then, the optimal strobe timing for each group GP is searched for at each read level (steps S12 to S18). For example, it is assumed that, as described using FIG. 73 in the tenth embodiment, one page is divided into two groups GP1, GP2. First, the counter 19 counts the number of on cells in each of the seven read operations AR1 to AR7. In AR tracking, as a result, it is assumed that the optimal strobe timing (timing when the number of on cells is the smallest) of the group GP1 is AR3 and the optimal strobe timing of the group GP2 is AR4. Further, the counter 19 counts the number of on cells in each of the seven read operations ER1 to ER7. In ER tracking, as a result, it is assumed that the optimal strobe timing of the group GP1 is ER5 and the optimal strobe timing of the group GP2 is ER6.

Then, the sequencer 16 determines lower bit data for memory cells belonging to the group GP1 from results of the read operations AR3 and ER5 and determines lower bit data for memory cells belonging to the group GP2 from results of the read operations AR4 and ER6. Then, data for one page (lower page) is generated by combining data determined for the groups GP1 and GP2.

A more specific example of the above operation is described as a twelfth embodiment.

11.3 Advantageous Effects According to the Present Embodiment

As described above, higher reading precision is obtained by considering the threshold of memory cells connected to the unselected word line WL(n+1) when searching for the optimal strobe timing by distribution reading.

12. Twelfth Embodiment

Now, a semiconductor memory device according to a twelfth embodiment is described. The present embodiment describes an example of a specific method to execute the eleventh embodiment and particularly relates to operations of a sense unit SAU, a counter 19, and registers REG0 to REG13. Hereinafter, only differences from the eleventh embodiment are described.

12.1 Regarding Threshold Distribution

Figure 81:
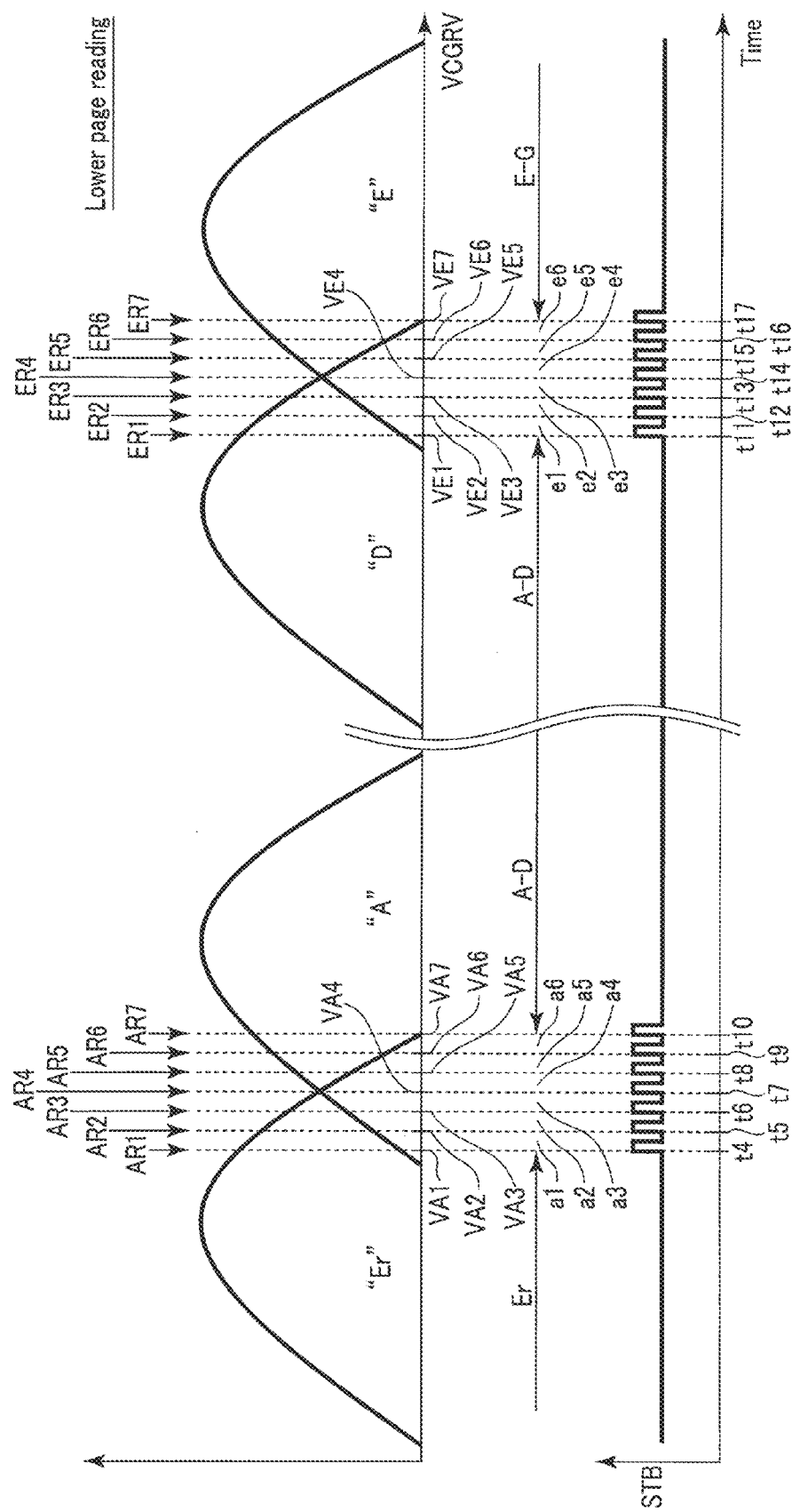
FIG. 81 is a timing chart showing threshold voltages of memory cells, the word line voltages and the strobe signal during reading according to a twelfth embodiment.

The threshold distribution and strobe timing in a specific example described in the present embodiment are described using FIG. 81 by taking a case of lower page reading as an example.

FIG. 81 schematically shows the relation between the threshold distributions of the "ER"-level, the "A"-level, the "D"-level, and the "E"-level and the strobe signal STB.

As shown, the threshold distribution of the "ER"-level and the threshold distribution of the "A"-level are partially overlapped. In AR tracking, the optimal strobe timing is searched for by asserting the strobe signal STB seven times in a period of times t4 to t10. More specifically, at the time t4, data read under the condition of VCGRV=VA1 is strobed (read operation AR1), at the time t5, data read under the condition of VCGRV=VA2 (>VA1) is strobed (read operation AR2), at the time t6, data read under the condition of VCGRV=VA3 (>VA2) is strobed (read operation AR3), and the same applies below.

Also, the threshold distribution of the "D"-level and the threshold distribution of the "E"-level are partially overlapped. In ER tracking, the optimal strobe timing is searched for by asserting the strobe signal STB seven times in a period of times t11 to t17. More specifically, at the time t11, data read under the condition of VCGRV=VE1 is strobed (read operation ER1), at the time t12, data read under the condition of VCGRV=VE2 (>VE1) is strobed (read operation ER2), at the time t13, data read under the condition of VCGRV=VE3 (>VE2) is strobed (read operation ER3), and the same applies below.

Further, the threshold voltages of selected memory cells in the description below according to the present embodiment are mentioned as shown below:

"Er"-level: threshold below the voltage VA1
"a1"-level: threshold of VA1≤Vth<VA2
"a2"-level: threshold of VA2≤Vth<VA3
"a3"-level: threshold of VA3≤Vth<VA4
"a4"-level: threshold of VA4≤Vth<VA5
"a5"-level: threshold of VA5≤Vth<VA6
"a6"-level: threshold of VA6≤Vth<VA7
"A-D"-level: threshold of VA7≤Vth<VE1

"e1"-level: threshold of VE1≤Vth<VE2
"e2"-level: threshold of VE2≤Vth<VE3
"e3"-level: threshold of VE3≤Vth<VE4
"e4"-level: threshold of VE4≤Vth<VE5
"e5"-level: threshold of VE5≤Vth<VE6
"e6"-level: threshold of VE6≤Vth<VE7
"E-G"-level: threshold of VE7 or above 12.2 Regarding Details of Read Operation Next, details of the read operation are described.

<Prior-Reading>

First, prior-reading is performed as shown in FIG. 82.

In FIG. 82, only 30 bit lines BL (BL0 to BL29) and memory cells and latch circuits corresponding thereto are shown due to limited space, but 31 or more bit lines BL may also be provided. Even in such a case, processing similar to processing of any of the bit lines BL0 to BL29 is performed.

Prior-reading is assumed to be performed, like in FIG. 73, using the voltage VD. Then, as shown in FIG. 82, it is assumed that the threshold of, among memory cells connected to the word line WL(n+1), memory cells connected to the bit lines BL0 to BL14 is the "C"-level or below and the threshold of memory cells connected to the bit lines BL15 to BL29 is the "D"-level or below.

Then, the potentials of the bit lines BL0 to BL14 fall and "0" data is held in latch circuits of sense units SA corresponding thereto and the "0" data is transferred to a latch circuit UDL. On the other hand, the potentials of the bit lines BL15 to BL29 approximately maintain the precharge potential and thus, "1" data is held in latch circuits of sense units SA corresponding thereto and the "1" data is transferred to the latch circuit UDL. As a result, among memory cells connected to the word line WLn, memory cells connected to the bit lines BL0 to BL14 are handled as belonging to the group GP1 and memory cells connected to the bit lines BL15 to BL29 are handled as belonging to the group GP2.

<Main-Reading>

Next, main-reading (distribution reading) is performed. As shown in FIG. 82, among memory cells connected to the word line WLn, the threshold of a memory cell connected to the bit line BL0 or BL15 is the "Er"-level, the thresholds of memory cells connected to the bit lines BL1 to BL6 are the "a1", "a2", "a3", "a4", "a5", and "a6"-levels respectively, and the threshold of a memory cell connected to the bit line BL7 or BL22 is the "A-D"-level. The thresholds of memory cells connected to the bit lines BL8 to BL13 are assumed to be the "e1", "e2", "e3", "e4", "e5", and "e6"-levels respectively and the threshold of a memory cell connected to the bit line BL14 or BL29 is assumed to be the "E-G"-level.

Further, the thresholds of memory cells connected to the bit lines BL16 to BL21 are assumed to be the "a1", "a2", "a3", "a4", "a5", and "a6"-levels respectively and the thresholds of memory cells connected to the bit lines BL23 to BL28 are assumed to be the "e1", "e2", "e3", "e4", "e5", and "e6"-levels respectively.

First, as shown in FIG. 83, latch circuits ADL, BDL, CDL, DDL are reset in response to an instruction from, for example, the sequencer 16 to hold "0" data. A latch circuit LDL is also reset and data held by the latch circuit is undefined. A result of prior-reading is held in the latch circuit UDL.

Read Operation AR1 (1st STB)

Figure 84:
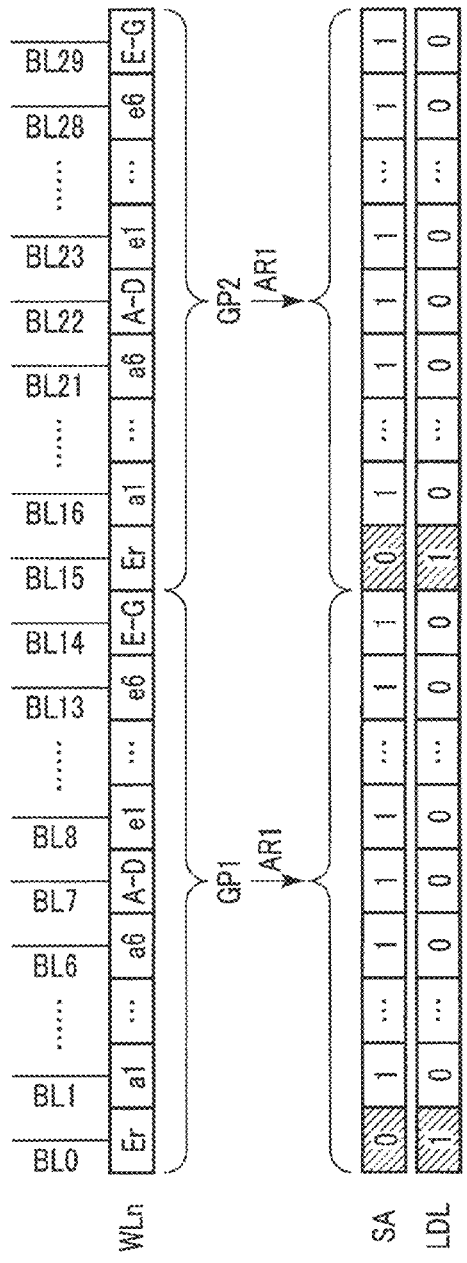

First, the read operation AR1 is performed at a timing when the voltage VCGRV applied to the selected word line WLn reaches the voltage VA1. That is, the first strobe signal STB is asserted. In the read operation AR1, as shown in FIG. 84, memory cells having the threshold of the "Er"-level are turned on and other memory cells are turned off. Thus, the potentials of the bit lines BL0 and BL15 fall and "0" data is held in the sense units SA corresponding thereto. Also, the following arithmetic operation is performed by, for example, an arithmetic operation unit OP:

~SA & ~LDL

The operation result is stored in the latch circuit LDL. As a result, data in the latch circuits LDL corresponding to the bit lines BL0 and BL15 is inverted from "0" to "1". The fact that "1" is set to the latch circuit LDL means that data in the other corresponding latch circuits ADL, BDL, CDL, DDL is determined. That is, at this point, read data from memory cells connected to the bit lines BL0, BL15 is determined.

In this specification, "~" indicates a logical inversion (NOT) operation, "&" indicates a logical multiplication (AND) operation, and "|" indicates a logical sum (OR) operation.

Read Operation AR2 (2nd STB)

Figure 85:
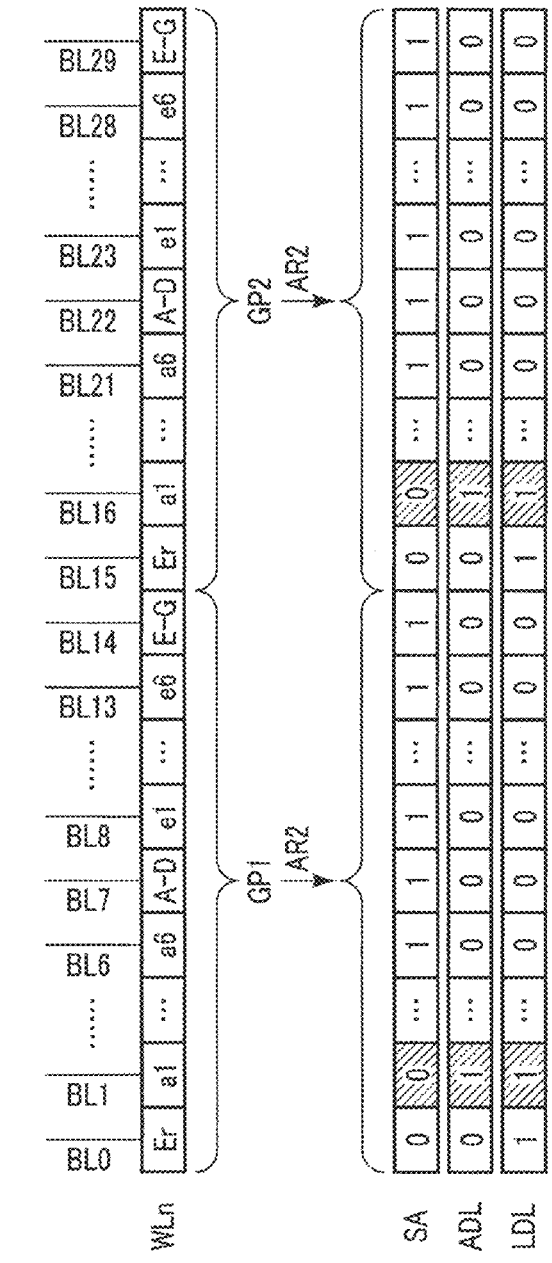

Next, the read operation AR2 is performed at a timing when the voltage VCGRV reaches the voltage VA2. That is, the second strobe signal STB is asserted. Incidentally, the bit lines BL0 and BL15 for which data has been determined are fixed to a constant voltage and substantially excluded from read target. In the read operation AR2, as shown in FIG. 85, memory cells having the threshold of the "a1"-level are turned on and other memory cells are turned off. Thus, the potentials of the bit lines BL1 and BL16 fall and "0" data is held in the sense units SA corresponding thereto. Also, the following arithmetic operation is performed by, for example, the arithmetic operation unit OP:

~SA & ~LDL

The operation result is stored in the latch circuit ADL. As a result, data in the latch circuits ADL corresponding to the bit lines BL1 and BL16 is inverted from "0" to "1". Further, the following arithmetic operation is performed:

~SA|~LDL

The operation result is stored in the latch circuit LDL. As a result, data in the latch circuits LDL corresponding to the bit lines BL1 and BL16 is inverted from "0" to "1".

Read Operation AR3 (3rd STB)

Figures 86, 87:
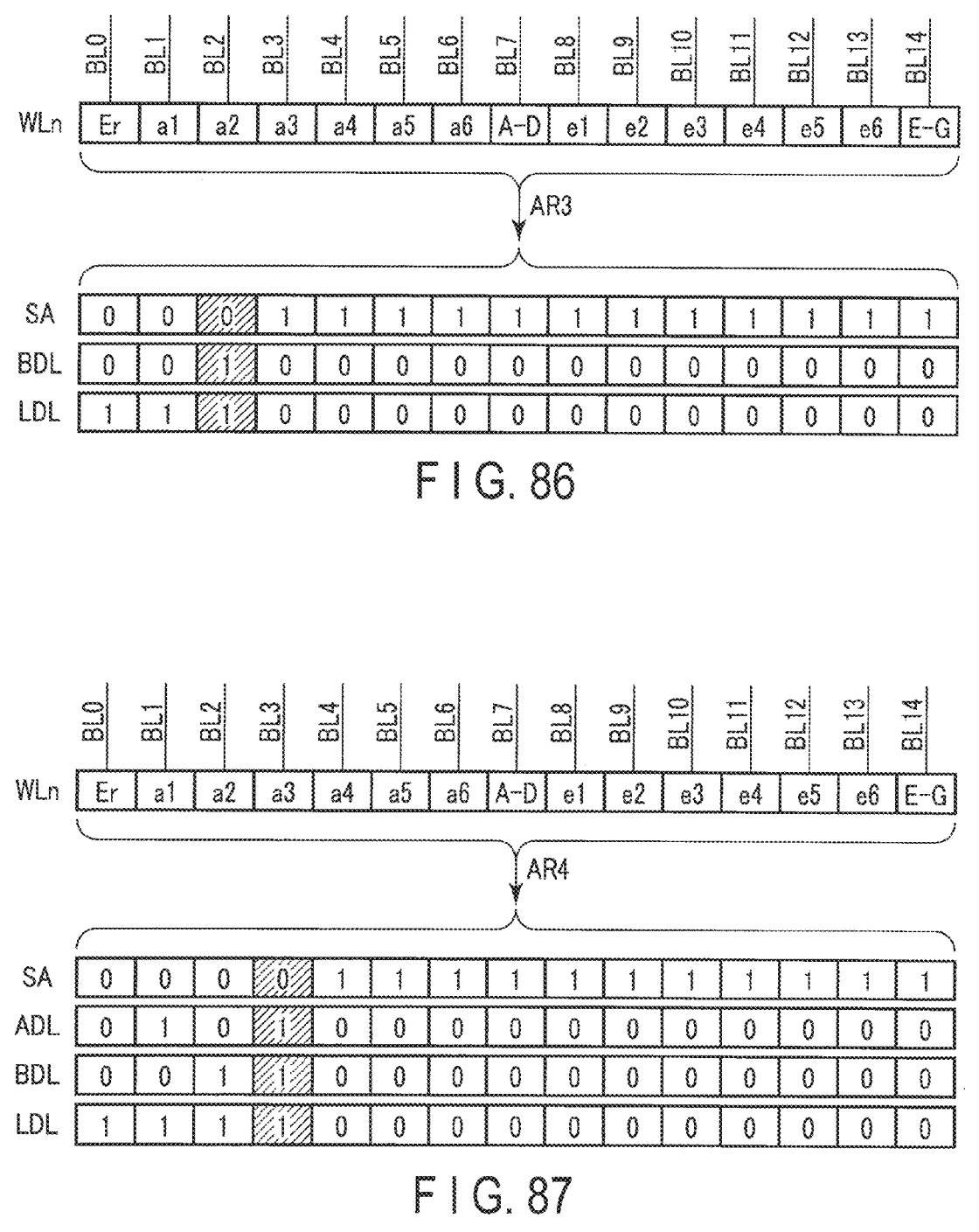

Next, the read operation AR3 is performed at a timing when the voltage VCGRV reaches the voltage VA3. However, the bit lines BL0, BL1, BL15, and BL16 for which data has been determined are substantially excluded from read target. In the read operation AR3, as shown in FIG. 86, memory cells having the threshold of the "a2"-level are turned on and other memory cells are turned off. Thus, the potentials of the bit lines BL2 and BL17 fall and "0" data is held in the sense units SA corresponding thereto. Incidentally, operations related to the group GP2 are similar to those of the group GP1 and thus, the illustration of the configuration related to the group GP2 is omitted in FIG. 86. The same also applies to FIGS. 87 to 94 described below.

Also, the following arithmetic operation is performed by, for example, the arithmetic operation unit OP:

~SA & ~LDL

The operation result is stored in the latch circuit BDL. As a result, data in the latch circuits BDL corresponding to the bit lines BL2, BL17 is inverted from "0" to "1". Further, the following arithmetic operation is performed:

~SA|~LDL

The operation result is stored in the latch circuit LDL. As a result, data in the latch circuits LDL corresponding to the bit lines BL2 and BL17 is inverted from "0" to "1".

Read Operation AR4 (4th STB)

Next, the read operation AR4 is performed at a timing when the voltage VCGRV reaches the voltage VA4. The bit lines BL0 to BL2, and BL15 to BL17 for which data has been determined are substantially excluded from read target. In the read operation AR4, as shown in FIG. 87, memory cells having the threshold of the "a3"-level are turned on and other memory cells are turned off. Thus, the potentials of the bit lines BL3 and BL18 fall and "0" data is held in the sense units SA corresponding thereto. Also, the following arithmetic operation is performed by, for example, the arithmetic operation unit OP:

~SA & ~LDL

The operation result is stored in the latch circuits ADL and BDL. As a result, data in the latch circuits BDL corresponding to the bit lines BL3 and BL18 is inverted from "0" to "1". Further, the following arithmetic operation is performed:

~SA|~LDL

The operation result is stored in the latch circuit LDL. As a result, data in the latch circuits LDL corresponding to the bit lines BL3 and BL18 is inverted from "0" to "1".

Read Operations AR5 to AR7 (5th STB to 7th STB)

Then, as shown in FIGS. 88 to 90, the read operations AR5 to AR7 are performed at timings when the voltage VCGRV reaches the voltages VA5 to VA7. As a result, data corresponding to the read data is set to latch circuits corresponding to memory cells whose threshold is the "a4"- to "a6"-levels. At this point, values held in the latch circuits ADL, BDL, CDL are set such that bits of the "Er", "a1", "a2", "a3", "a4" "a5", and "a6"-levels can be distinguished from each other. That is, in the present example, as shown in FIG. 90, if the latch circuit CDL represents an upper bit and the latch circuit ADL represents a lower bit, each threshold level is represented by the following 3-bit data:

"Er"-level: "000"
"a1"-level: "001"
"a2"-level: "010"
"a3"-level: "011"
"a4"-level: "100"
"a5"-level: "101"
"a6"-level: "110"

"0" is held in the latch circuit DDL.

Read operation ER1 (8th STB)

Next, the read operation ER1 is performed at a timing when the voltage VCGRV reaches the voltage VE1. That is, the eighth strobe signal STB is asserted. As is evident from FIG. 81, memory cells whose threshold is the "A-D"-level are identified by the present operation. Then, as shown in FIG. 91, (~SA & ~LDL)="1" is stored in the latch circuit DDL and (~SA|~LDL)="1" is stored in the latch circuit LDL corresponding to the bit line BL7.

Read Operation ER2 (9th STB)

Next, the read operation ER2 is performed at a timing when the voltage VCGRV reaches the voltage VE2. That is, the ninth strobe signal STB is asserted. Memory cells whose threshold is the "e1"-level are identified by the present operation. Then, as shown in FIG. 92, (~SA & ~LDL)="1" is stored in the latch circuits ADL and DDL and (~SA|~LDL)="1" is stored in the latch circuit LDL corresponding to the bit line BL7.

Read Operations ER3 to ER7 (10th STB to 15th STB)

Subsequently, the read operations ER3 to ER7 are similarly performed. As a result, values corresponding to the threshold level are set to the latch circuits ADL to DDL. That is, in the present example, as shown in FIG. 93, if the latch circuit DDL represents an upper bit and the latch circuit ADL represents a lower bit, each threshold level is represented by the following 4-bit data:

"Er"-level: "0000"
"a1"-level: "0001"
"a2"-level: "0010"
"a3"-level: "0011"
"a4"-level: "0100"
"a5"-level: "0101"
"a6"-level: "0110"
"A-D"-level: "1000"
"e1"-level: "1001"
"e2"-level: "1010"
"e3"-level: "1011"
"e4"-level: "1100"
"e5"-level: "1101"
"e6"-level: "1110"
"E-G"-level: "1111"

With the above operations, lower page data is read from the word line WLn and held in latch circuits ADL to DDL. Threshold information of adjacent memory cells is stored in UDL. Also, "1" is held in LDL corresponding to all bits of the read target page.

Figure 94:

Then, as shown in FIG. 94, LDL corresponding to all bits is reset.

<Optimal Read Voltage Search of the Group GP1>

Figure 95:
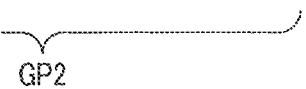

Next, the optimal read voltage, that is, the optimal strobe timing for the read operations AR and ER of the group GP1 is searched for. First, as shown in FIG. 95, the arithmetic operation unit OP performs the following arithmetic operation and stores the operation result in LDL.

~ADL & ~BDL & ~CDL & ~DDL & ~UDL

That is, "1" is set to LDL in bits belonging to the group GP1 (UDL="0") and in which the latch circuits ADL, BDL, CDL, and DDL all hold "0". In the example of FIG. 95, "1" is set to LDL corresponding to the bit line BL0.

All of the latch circuits ADL, BDL, CDL, and DDL corresponding to the bit line BL15 also hold "0", but the bit line BL15 belongs to the group GP2 (UDL="1") and thus, "0" is set to LDL without "1" being set thereto.

Then, the counter 19 counts the number of LDL to which "1" is set and sets the count result to the register REG0.

Subsequently, as shown in FIG. 96, the arithmetic operation unit OP performs the following arithmetic operation and stores the operation result in LDL:

ADL & ~BDL & ~CDL & ~DDL & ~UDL

That is, "1" is set to LDL in bits belonging to the group GP1 (UDL="0") and in which the latch circuit ADL holds "1" and the latch circuits BDL, CDL, and DDL hold "0". In the example of FIG. 96, "1" is set to LDL corresponding to the bit line BL1. Regarding also the bit line BL16, the latch circuit ADL holds "1" and latch circuits BDL, CDL, and DDL hold "0", but the bit line BL16 belongs to the group GP2 (UDL="1") and thus, "0" is set to LDL without "1" being set thereto.

Then, the counter 19 counts the number of LDL to which "1" is set and sets the count result to the register REG1.

Further, as shown in FIG. 97, the arithmetic operation unit OP performs the following arithmetic operation and stores the operation result in LDL:

~ADL & BDL & ~CDL & ~DDL & ~UDL

That is, "1" is set to LDL in bits belonging to the group GP1 (UDL="0") and in which the latch circuit BDL holds "1" and the latch circuits ADL, CDL, and DDL hold "0". In the example of FIG. 97, "1" is set to LDL corresponding to the bit line BL2. The bit line BL17 belongs to the group GP2 and thus, "0" is set to LDL.

Then, the counter 19 counts the number of LDL to which "1" is set and sets the count result to the register REG2.

Subsequently, the following arithmetic operations are performed in the same manner and operation results are stored in the respective registers REG3 to REG13:

ADL & BDL & ~CDL & ~DDL & ~UDL
~ADL & ~BDL & CDL & ~DDL & ~UDL
ADL & ~BDL & CDL & ~DDL & ~UDL
~ADL & ~BDL & CDL & ~DDL & ~UDL
~ADL & ~BDL & ~CDL & DDL & ~UDL
ADL & ~BDL & ~CDL & DDL & ~UDL
~ADL & BDL & ~CDL & DDL & ~UDL
ADL & BDL & ~CDL & DDL & ~UDL
~ADL & ~BDL & CDL & DDL & ~UDL
ADL & ~BDL & CDL & DDL & ~UDL (see FIG. 98)
~ADL & BDL & CDL & DDL & ~UDL (see FIG. 99)

From the above operation results, as shown in FIG. 100, the following information is stored in the registers REG0 to REG13. That is:

REG0: total number of memory cells with the "Er"-level among the group GP1
REG1: total number of memory cells with the "a1"-level among the group GP1
REG2: total number of memory cells with the "a2"-level among the group GP1
REG3: total number of memory cells with the "a3"-level among the group GP1
REG4: total number of memory cells with the "a4"-level among the group GP1
REG5: total number of memory cells with the "a5"-level among the group GP1
REG6: total number of memory cells with the "a6"-level among the group GP1
REG7: total number of memory cells with the "A-D"-level among the group GP1
REG8: total number of memory cells with the "e1"-level among the group GP1
REG9: total number of memory cells with the "e2"-level among the group GP1
REG10: total number of memory cells with the "e3"-level among the group GP1
REG11: total number of memory cells with the "e4"-level among the group GP1
REG12: total number of memory cells with the "e5"-level among the group GP1
REG13: total number of memory cells with the "e6"-level among the group GP1

Then, the voltage among the registers REG1 to REG6 from which the smallest total number of memory cells is obtained is the optimal read voltage regarding the read operation AR of the group GP1. In other words, if the total number of cells whose threshold is the "ai"-level is the smallest, the read operation ARi (that is, (i+1)th STB) is the optimal read timing. The same also applies to the read operation ER and the voltage among the registers REG8 to REG13 from which the smallest total number of cells is obtained is the optimal read voltage, that is, the optimal strobe timing for the read operation ER of the group GP1.

In the present example, it is assumed as an example that AR3 (4th STB) is optimal regarding the read operation AR and ER3 (11th STB) is optimal regarding the read operation ER.

<Optimal Read Voltage Search of the Group GP2>

Figure 104:
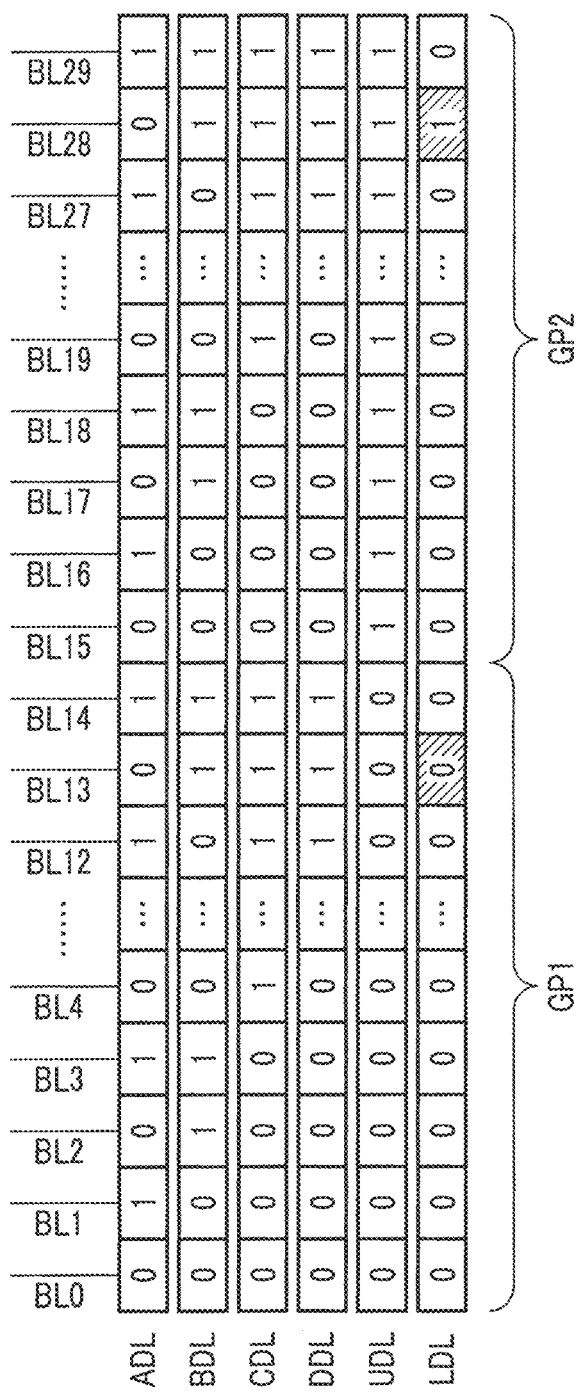

Next, the optimal read voltage, that is, the optimal strobe timing for the read operations AR and ER of the group GP2 is searched for. The search method regarding the group GP2 uses, instead of ~UDL, UDL in the arithmetic operation described using FIG. 95 to FIG. 99. That is, the arithmetic operation unit OP performs the following arithmetic operations and stores operation results in LDL:

~ADL & ~BDL & ~CDL & ~DDL & UDL (see FIG. 101)
ADL & ~BDL & ~CDL & ~DDL & UDL (see FIG. 102)
~ADL & BDL & ~CDL & ~DDL & UDL
ADL & BDL & ~CDL & ~DDL & UDL
~ADL & ~BDL & CDL & ~DDL & UDL
ADL & ~BDL & CDL & ~DDL & UDL
~ADL & BDL & CDL & ~DDL & UDL
~ADL & ~BDL & ~CDL & DDL & UDL
ADL & ~BDL & ~CDL & DDL & UDL
~ADL & BDL & ~CDL & DDL & UDL
ADL & BDL & ~CDL & DDL & UDL
~ADL & ~BDL & CDL & DDL & UDL
ADL & ~BDL & CDL & DDL & UDL (see FIG. 103)
~ADL & BDL & CDL & DDL & UDL (see FIG. 104)

The number of LDL to which "1" is set in each of the above operation results is stored in the registers REG0 to REG13. From the operation results, as shown in FIG. 105, among memory cells of the group GP2, the total numbers of cells whose threshold is "Er", "a1" to "a6", "A-D", and "e1" to "e6" are stored in the registers REG0 to REG13 respectively.

Then, the voltage among the registers REG1 to REG6 from which the smallest total number of cells is obtained is the optimal read voltage, that is, the optimal strobe timing regarding the read operation AR of the group GP2. Also, the voltage among the registers REG8 to REG13 from which the smallest total number of cells is obtained is the optimal read voltage, that is, the optimal strobe timing regarding the read operation ER of the group GP2.

In the present example, it is assumed as an example that AR4 (5th STB) is optimal regarding the read operation AR and ER4 (12th STB) is optimal regarding the read operation ER.

<Data Recovery of the Group GP1>

Next, data read at the optimal read voltage regarding the group GP1 determined by the above method is restored. The situation thereof is shown in FIG. 106. As described above, the optimal timing of the read operation AR in the group GP1 is AR3, that is, the fourth strobe timing.

Thus, an arithmetic operation that sets "1" to LDL corresponding to the "Er"-, "a1"-, "a2"-, and "a3"-levels is performed. That is, for example, the arithmetic operation unit OP performs the following arithmetic operation and stores the operation result in LDL:

~CDL & ~DDL & ~UDL (see FIG. 106)

Also, the optimal timing of the read operation ER in the group GP1 is ER3, that is, the eleventh strobe timing.

Thus, an arithmetic operation that sets "1" to LDL corresponding to the "e4"-, "e5"-, "e6"-, and "E-G"-levels is performed. That is, for example, the arithmetic operation unit OP performs the following arithmetic operation and stores the operation result in LDL:

CDL & DDL & ~UDL (see FIG. 107)

Data obtained as a result of the above operation, that is, 15-bit data "111100000001111" in the latch circuit LDL corresponding to the bit lines BL0 to BL14 is transferred to a latch circuit XDL as the optimal data restored for the group GP1.

<Data Recovery of the Group GP2>

Next, data read at the optimal read voltage regarding the group GP2 is restored. As described above, the optimal timing of the read operation AR in the group GP2 is AR4, that is, the fifth strobe timing.

Thus, an arithmetic operation that sets "1" to LDL corresponding to the "Er"-, "a1"-, "a2"-, "a3"-, and "a4"-levels is performed. That is, for example, the arithmetic operation unit OP performs the following arithmetic operation and stores the operation result in LDL:

(~CDL & ~DDL)|(~ADL & ~BDL & CDL & ~DDL) & ~UDL (see FIG. 109)

Also, the optimal timing of the read operation ER in the group GP2 is ER4, that is, the twelfth strobe timing.

Thus, an arithmetic operation that sets "1" to LDL corresponding to the "e5"-, "e6"-, and "E-G"-levels is performed. That is, for example, the arithmetic operation unit OP performs the following arithmetic operation and stores the operation result in LDL:

CDL & DDL & (ADL & ~BDL|~ADL & BDL) & UDL|LDL (see FIG. 110)

Data obtained as a result of the above operation, that is, 15-bit data "111110000000111" in the latch circuit LDL corresponding to the bit lines BL15 to BL29 is transferred to the latch circuit XDL as the optimal data restored for the group GP2.

<Generation of Page Data>

Lastly, data for one page is generated by the 15-bit data described with reference to FIG. 108 and the 15-bit data described with reference to FIG. 111 being combined in XDL (see FIG. 112). Then, the 30-bit data "111100000001111111110000000111" is transmitted to the controller as lower page data.

Incidentally, shaded bits in FIG. 112 are locations where values are different between the group GP1 and the group GP2 due to the influence of adjacent cells.

12.3 Advantageous Effects According to the Present Embodiment

Distribution reading described in the eleventh embodiment can be implemented by, for example, the method described in the present embodiment. Naturally, the present example is only one method to implement the reading method described in the eleventh embodiment and a different method may also be used.

According to the present embodiment, the number of latch circuits inside the sense amplifier unit SAU can also be reduced. That is, when, as shown in FIG. 81, 14 strobe operations are performed to read data for one page and the read data is directly stored in a latch circuit, 14 latch circuits are needed in each sense unit SAU. In the present embodiment, however, as shown in FIG. 93, each threshold level is converted into 4-bit data and the latch is caused to hold the data. Therefore, the number of latch circuits in each sense unit SAU can substantially be reduced.

13. Thirteenth Embodiment

Now, a semiconductor memory device according to a thirteenth embodiment is described. In the eleventh and twelfth embodiments, an intersection of threshold distributions is determined for a plurality of groups and the optimal read voltage of each group is searched for based on the intersection. In the present embodiment, by contrast, the optimal read voltage is determined by distribution reading for some group and the optimal read voltage for other groups is determined based on the obtained optimal read voltage. Hereinafter, only differences from the twelfth embodiment are described.

13.1 Regarding Read Operation

FIG. 113 is a flow chart of the read operation according to the present embodiment. As shown, steps S10 to S14 described using FIG. 79 in the eleventh embodiment are performed. In step S14, however, the group GP for which the optimal read voltage is searched for may be any one group. Hereinafter, the group is called a focused group GPi and, as an example, a case where the focused group is the group GP1 (i=1) is taken as an example for the description that follows.

Then, the above operation is performed for each read level (step S18, YES, step S19). As a result, the optimal read voltage VCGRV for the group GP1 is determined for the read operations AR and ER in the case of lower page reading. A specific example of the present method is, for example, as described in the twelfth embodiment using FIGS. 82 to 100. In this stage, the optimal read voltage VCGRV for other groups GP (for example, GP2) is not yet been determined.

Next, for example, the sequencer 16 determines the optimal strobe timing for another group GP2 based on the optimal strobe timing for the group GP1 determined in step S14 (step S22). As an example, the next timing of the optimal strobe timing for the group GP1 is set as the optimal strobe timing for the group GP2 and the next timing of the optimal strobe timing for the group GP2 is set as the optimal strobe timing for the group GP3.

Next, like in the eleventh embodiment, data on the group GP1 is generated based on the optimal strobe timing obtained in step S14 and further, data on the group GP2 is generated based on the optimal strobe timing obtained in step S20 (step S20). A specific example of the method is, for example, as described using FIG. 106 to FIG. 111 in the twelfth embodiment.

Then, lastly, like in the eleventh embodiment, data for one page is generated by restored data for each group GP being combined (step S21).

Figure 114:
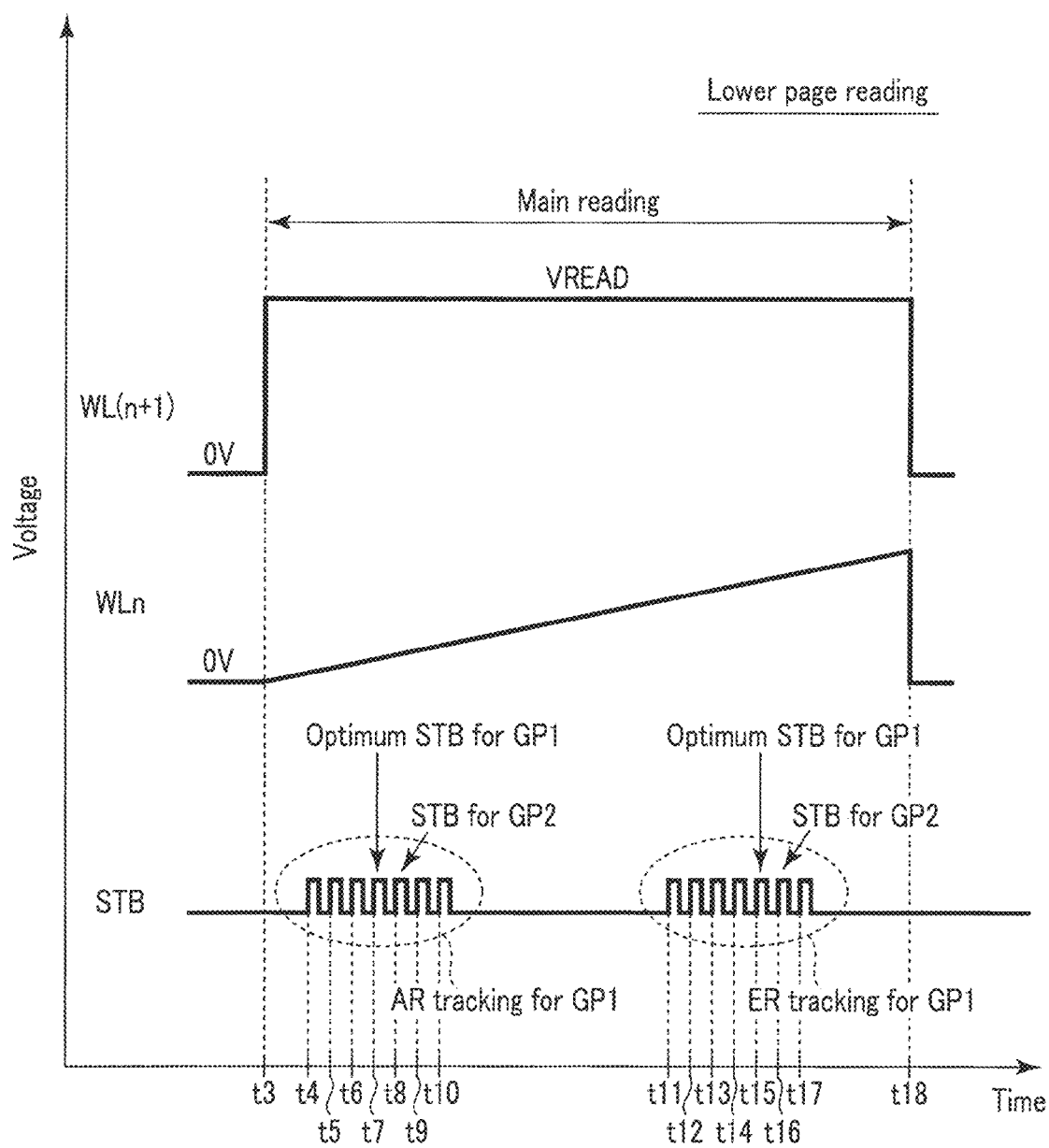
FIG. 114 is a timing chart showing the threshold voltages of memory cells, the word line voltages and the strobe signal during reading according to the thirteenth embodiment.

A specific example of the reading method is described using FIG. 114. FIG. 114 is a timing chart of the potentials of the unselected word line WL(n+1) and the selected word line WLn and the strobe signal STB and shows, like in the eleventh and twelfth embodiments, a situation of main-reading during reading of a lower page including the two groups GP1 and GP2.

As described above, first the optimal strobe timing for the group GP1 is searched for. It is assumed that, as a result, as shown in FIG. 114, the fourth strobe signal at a time t7 turns out to be the optimal strobe timing for the read operation AR and the fifth strobe signal at a time t15 turns out to be the optimal strobe timing for the read operation ER.

Then, based on the result of the fourth timing and the fifth timing, a sequencer 16 determines the optimal strobe timing for the remaining group GP2 without searching for an intersection position of threshold distributions. The group GP2 is more affected by disturbances from adjacent cells than the group GP1. Thus, the sequencer 16 determines the optimal strobe timing for the group GP2 at a timing later than that for the group GP1. In the example of FIG. 114, the fifth timing at a time t8 is selected as the optimal strobe timing for the read operation AR and the sixth timing at a time t15 is selected as the optimal strobe timing for the read operation ER.

13.2 Advantageous Effects According to the Present Embodiment

In the eleventh and twelfth embodiments, for each of the groups GP, an intersection of threshold distributions is searched for and the optimal strobe timing is determined based on the intersection. However, like in the present embodiment, an intersection of threshold distributions may be searched for regarding any one group GP only to set the timing as a reference timing so that for other groups GP, timings obtained by shifting a fixed time from the obtained reference timing are used for strobing. According to the present method, advantageous effects similar to those of the eleventh and twelfth embodiments can be obtained by a simple method.

In the example of FIG. 114, a case where the number of groups is two is taken as an example, but the number of groups may be three or more. Depending on the group for which the optimal timing is determined by distribution reading, the optimal timing for another group may be earlier than the reference timing (when, for example, distribution reading is performed for GP2 in FIG. 114).

14. Fourteenth Embodiment

Now, a semiconductor memory device according to a fourteenth embodiment is described. In the present embodiment, the influence of memory cells connected to not only the word line WL(n+1), but also the word line WL(n−1) is considered during the read operation AR in the tenth embodiment. Hereinafter, only differences from the tenth embodiment are described.

14.1 Regarding Timing Table

A sequencer 16 according to the present embodiment holds a timing table as shown, for example, in FIG. 115. FIG. 115 shows an example of the timing table. The timing table holds information indicating how far to shift the strobe timing from the reference timing in accordance with the threshold level of unselected cells adjacent on the drain side and the source side.

In FIG. 115, "+0" indicates that the appropriate strobe timing is the same as the reference timing. "+1" indicates that the timing shifted by one strobe signal from the reference timing, in other words, the next timing from the reference timing is an appropriate strobe timing. "+2" indicates that the timing shifted by two shifts from the reference timing, in other words, the timing after the next timing is to be selected.

In the example of FIG. 115, if the threshold of unselected memory cells connected to the word line WL(n+1) is a low level (for example, the "Er"-level or the "A"-level) for each of the read operations AR to GR, the strobe timing does not change from the reference timing. In contrast, if the threshold is an intermediate level (for example, the "B"- to "E"-level), the strobe timing is "+1" and if the threshold is a high level (for example, the "F"-level or the "G"-level), the strobe timing is "+2".

Further, in the read operation AR, the influence of unselected cell adjacent on the source side is considered. That is, if the threshold of unselected memory cells connected to the word line WL(n−1) is an intermediate level, "+1" is further applied to the strobe timing and if the threshold thereof is a high level, "+2" is further applied.

In the read operation AR, therefore, if the threshold of unselected memory cell adjacent on the source side and the threshold of unselected memory cells adjacent on the drain side are high levels, the optimal strobe timing is the timing shifted by four shifts from the reference timing.

14.2 Regarding Read Operation

Figure 117:
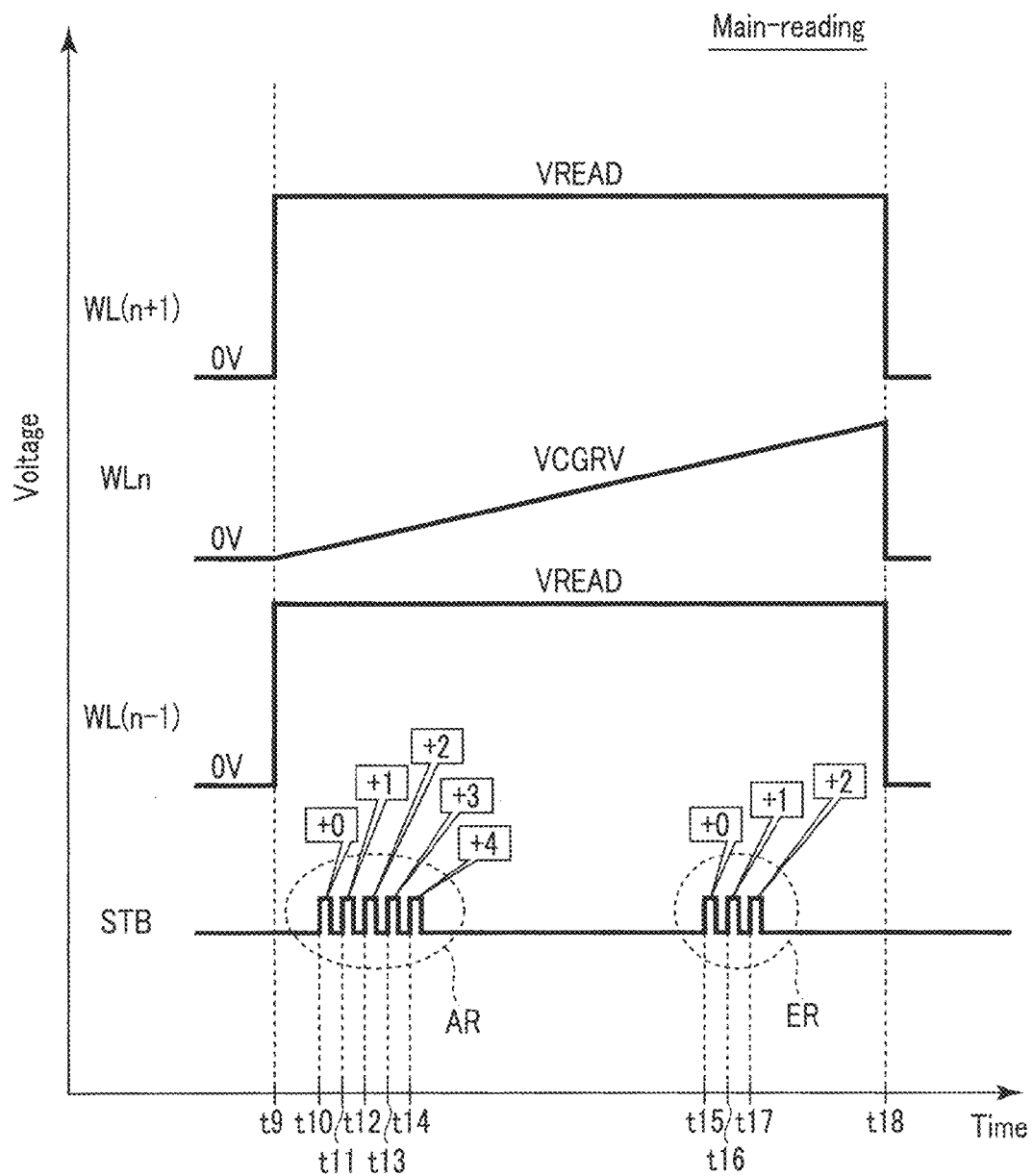

The read operation according to the present embodiment is described using FIG. 116 and FIG. 117. FIG. 116 and FIG. 117 show situations during prior-reading and main-reading when a lower page is read respectively and are timing charts of the potentials of the unselected word lines WL(n+1) and WL(n−1), the potential of the selected word line WLn, and the strobe signal STB.

First, as shown in FIG. 116, prior-reading is performed. In the prior-reading, data is read for each of the word lines WL(n+1) and WL(n−1). In the present example, when prior-reading is performed for the word line WL(n+1), the strobe signal STB is asserted, for example, at a time t2 when a voltage VCGRV applied to the word line WL(n+1) reaches a voltage VB and further the strobe signal STB is asserted, for example, at a time t3 when the voltage VCGRV reaches a voltage VF. The same also applies when prior-reading is performed for the word line WL(n−1).

From the above, whether the threshold of unselected memory cells adjacent on the source side and the drain side is a low level, an intermediate level, or a high level. The result thereof is held in one of latch circuits in a sense amplifier unit SAU.

Next, as shown in FIG. 117, main-reading is performed. As shown, the read operation AR is first performed. In this case, the strobe signal STB is asserted five times at each of times t10 to t14. The values of the voltage VCGRV at each of times t10 to t14 are VA1, VA2, VA3, VA4, and VA5 respectively and VA1<VA2<VA3<VA4<VA5 holds. Target memory cells from which data is fetched into the latch circuit by the strobe signal STB asserted at each timing are the following memory cells:

First STB (t10): Memory cell adjacent to a low threshold memory cells on both of the source side and the drain side Second STB (t11): Memory cell adjacent to a low threshold memory cell on the source or drain side and adjacent to an intermediate threshold memory cell on the another side Third STB (t12): Memory cell adjacent to a high threshold memory cell on the source or drain side and adjacent to a low threshold memory cell on the another side, or Memory cell adjacent to an intermediate threshold memory cells on both of the source side and the drain side Fourth STB (t13): Memory cell adjacent to a high threshold memory cell on the source or drain side and adjacent to an intermediate threshold memory cell on the another side Fifth STB (t14): Memory cell adjacent to a high threshold memory cells on both of the source side and the drain side The read operation AR for data for one page is performed by the above five strobe operations.

Next, the read operation ER is performed. In this case, there is no need to consider the influence of an adjacent cell on the source side and thus, the strobe signal STB is asserted three times at each of times t15 to t17. The values of the voltage VCGRV at each of times t15 to t17 are VE1, VE2, and VE3 respectively and VE1<VE2<VE3 holds. Target memory cells from which data is fetched into the latch circuit by the strobe signal STB asserted at each timing are the following memory cells:

First STB (t15): Memory cell adjacent to a low threshold memory cell on the drain side Second STB (t16): Memory cell adjacent to an intermediate threshold memory cell on the drain side Third STB (t17): Memory cell adjacent to a high threshold memory cell on the drain side The read operation ER for data for one page is performed by the above three strobe operations.

14.3 Advantageous Effects According to the Present Embodiment

According to the present embodiment, when compared with the tenth embodiment, a read operation with still higher precision can be performed. This effect is described below.

As described above, if data is written into some word line, the influence thereof spreads to adjacent word lines and varies the threshold of unselected memory cells connected thereto. If, for example, a memory cell connected to the word line WLn is focused on, the threshold of the memory cell connected to the word line WLn varies when data is written into a memory cell connected to the word line WL(n−1) positioned on the source line side of the word line WLn.

However, data is written into the word line WLn thereafter and thus, this threshold variation becomes invisible. To describe more specifically, the threshold of a memory cell connected to the word line WLn is set to a value still higher than a value varied due to disturbances when writing into the word line WL(n−1) by a write operation into the word line WLn. Therefore, the influence of disturbances from the word line WL(n−1) becomes invisible immediately after the write operation into the word line WLn is completed.

However, the above condition does not apply to a memory cell intended for "1" programming, in other words, a memory cell whose threshold level is maintained at an "Er"-level. The threshold of such a memory cell maintains, after the write operation, the state before writing. That is, after being written into the word line WLn, the influence of disturbances exerted when written into the word line WL(n−1) remains. Thus, the threshold distribution of the "Er"-level and the threshold distribution of the "A"-level may overlap under the influence when written into the word line WL(n−1), which could cause erroneous reading.

In this point, according to the present embodiment, when the read operation AR distinguishing the "Er"-level and the "A"-level is performed, prior-reading is performed for memory cells connected to not only the word line WL(n+1), but also the word line WL(n−1). Then, if the threshold of a memory cell connected to the word line WL(n−1) is high, that is, a memory cell connected to the word line WLn is considered to be subjected to significant disturbances from the word line WL(n−1), the strobe timing is delayed in accordance with the degree of disturbances. Accordingly, a read operation taking the influence of not only the word line WL(n+1), but also the word line WL(n−1) into consideration can be performed so that data can be read with high precision.

The strobe timing to be a reference for each read operation (for example, times t10 and t15 in FIG. 117) may be determined by distribution reading described in the eleventh to thirteenth embodiments. In such a case, reading precision can further be improved.

The table of FIG. 115 described in the present embodiment is described by taking a case where how much the optimal timing is delayed from the reference timing is indicated as an example. However, depending on the setting value of the reference timing, a case where how much the optimal timing is advanced from the reference timing is indicated may also be adopted. Also, the present embodiment is described by taking a case where the threshold of unselected adjacent cells is divided into three categories of low, middle, and high as an example, but the threshold may also be divided into two categories of low and high or into four categories or more. Further, a similar operation may be performed on not only the read operation AR, but also other read operations.

15. Modification, etc.

As described above, a semiconductor memory device according to the embodiment includes a first memory cell, a second memory cell coupled to the first memory cell, a first word line (WLn in FIG. 8) coupled to the first memory cell, and a second word line (WL(n+1) in FIG. 8) coupled to the second memory cell. When data is read from the first memory cell, a first voltage (≥VCGRV_A in FIG. 8) and second voltage (≥VCGRV_C in FIG. 8) different from the first voltage are applied to the first word line. A voltage (VREAD' and VREADLA in FIG. 8) applied to the second word line (WL(n+1)) varies continuously with time by a first potential difference (VREADLA_AR−VREADLA_AR_ST in FIG. 58) while the first voltage (≥VCGRV_A) is applied to the first word line (WLn), and the voltage (VREAD' and VREADLA) applied to the second word line (WL(n+1)) varies continuously with time by a second potential difference (VREADLA_CR−VREADLA_CR_ST in FIG. 58) different from the first potential difference (CR1−CR2 in FIG. 8) while the second voltage (VCGRV_C) is applied to the first word line (WLn). In other words, the threshold voltage of the first memory cell is compensated by controlling the value of the voltage (VREADLA) applied to the second word line when the threshold level of the second memory cell is higher than the threshold level of the first memory cell. In this way, the inter-cell interference is effectively suppressed, and the operating performance of the NAND flash memory can be improved.

Figure 118:
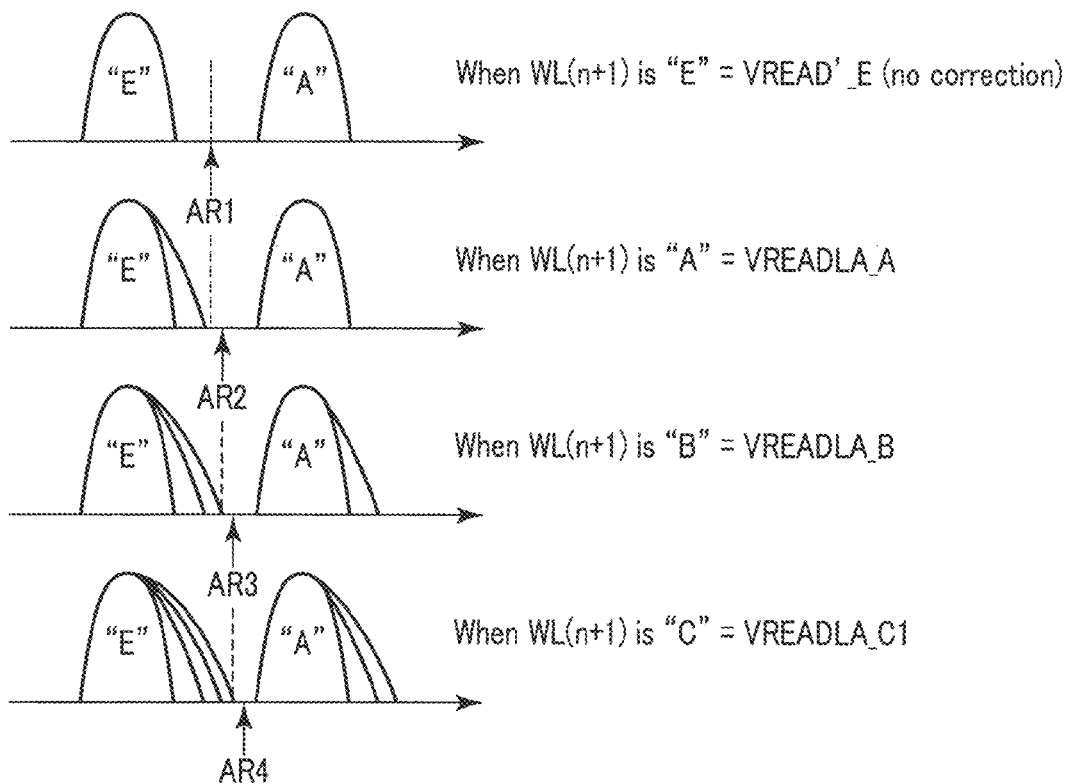
Figure 119:
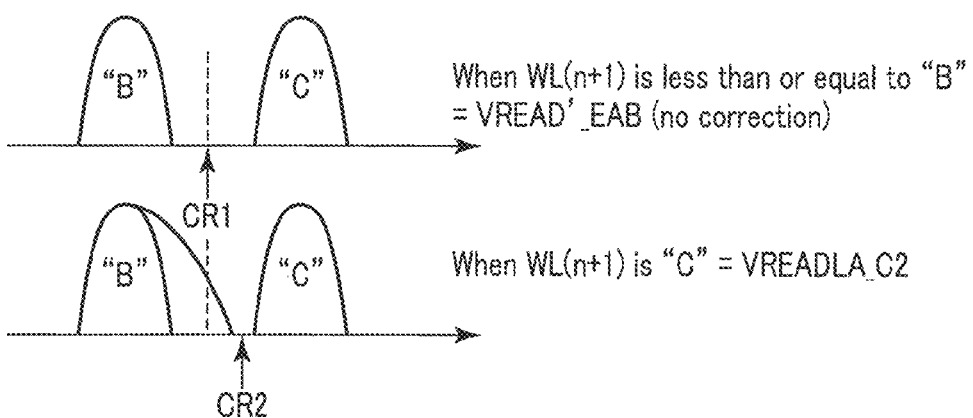

This situation is shown in FIG. 118 to FIG. 120. FIG. 118 to FIG. 120 are threshold distribution diagrams showing the concepts of the read operations AR, CR, and BR described in the first to eighth embodiments. As shown in FIG. 118, in the read operation AR, whether the threshold level is equal to or more than the "E"-level is judged. In this instance, there is no threshold variation caused by the inter-cell interference if the adjacent cell is at the "E"-level, so that the corrective reading is not performed (WLn=VREAD'_E). In contrast, if the adjacent cell is equal to or more than the "A"-level, the threshold of the "E"-level rises due to the inter-cell interference. The degree of the rise is the lowest when the adjacent cell is at the "A"-level, and the degree of the rise is the highest when the adjacent cell is at the "C"-level. Therefore, to correct the above, VREADLA_A, VREADLA_B, and VREADLA_C1 are applied to the word line WLn. As a result, judgment thresholds for the "E"-level and the "A"-level are substantially raised. In other words, the threshold distribution spread by the inter-cell interference can be the same as the distribution before spread.

FIG. 119 shows an example of CR. The "B"-level is subjected to the inter-cell interference only when the adjacent cell is written to the "C"-level. Therefore, the corrective reading is not performed when the adjacent cell is less than or equal to the "B"-level. When the adjacent cell is at the "C"-level, VREADLA_C2 is applied to WLn, so that the corrective reading is performed. The same also applies to BR shown in FIG. 120.

The controller may also compensate the threshold level of the first memory cell by controlling the value of the voltage (VREADLA) applied to the second word line when the data held in the second memory cell is the same as the data held in the first memory cell. This situation is shown in FIG. 121 and FIG. 122. FIG. 121 and FIG. 122 are threshold distribution diagrams showing the concepts of the read operations CR and BR described in the second and eighth embodiments. The read operation AR is similar to that in FIG. 118. As shown in FIG. 121, in the read operation CR, there is no threshold variation caused by the inter-cell interference if the adjacent cell is less than or equal to the "A"-level, so that the corrective reading is not performed (WLn=VREAD'_EA). In contrast, if the adjacent cell is equal to or more than the "B"-level, the threshold of the "B"-level rises due to the inter-cell interference. Therefore, to correct the above, VREADLA_B2 and VREADLA_C2 are applied to the word line WLn. As a result, judgment thresholds for the "B"-level and the "C"-level are substantially raised. In other words, the threshold distribution spread by the inter-cell interference can be the same as the distribution before spread. FIG. 122 shows an example of BR. As shown, in the BR, the corrective reading is performed when the adjacent cell is equal to or more than the "A"-level.

The same also applies to the third and fourth embodiments.

The embodiments are not limited to the above description, but can be variously modified, and can be suitably combined or independently carried out. For example, the configuration described in the seventh embodiment may be carried out independently of the first to sixth and eighth embodiments.

The tenth to fourteenth embodiments may be carried in combination if possible or independently. In the above embodiments, a case where the group GP whose threshold is low is close to a row decoder is described, but naturally the above embodiments are not limited to such a case and memory cells with a low threshold, memory cells with an intermediate threshold, and memory cells with a high threshold are mixed in one page. At which timing the sense amplifier strobes is determined in accordance with the threshold of adjacent cells. However, if the word line WL is long, a propagation delay of the voltage through the word line WL may be considered. That is, the strobe timing may be delayed with an increasing distance of the memory cell from the row decoder. That is, the optimal strobe timing for each bit may be determined by considering both of the threshold of adjacent cells and the distance from the row decoder (word line length from the row decoder to the memory cell).

Figures 123, 124:
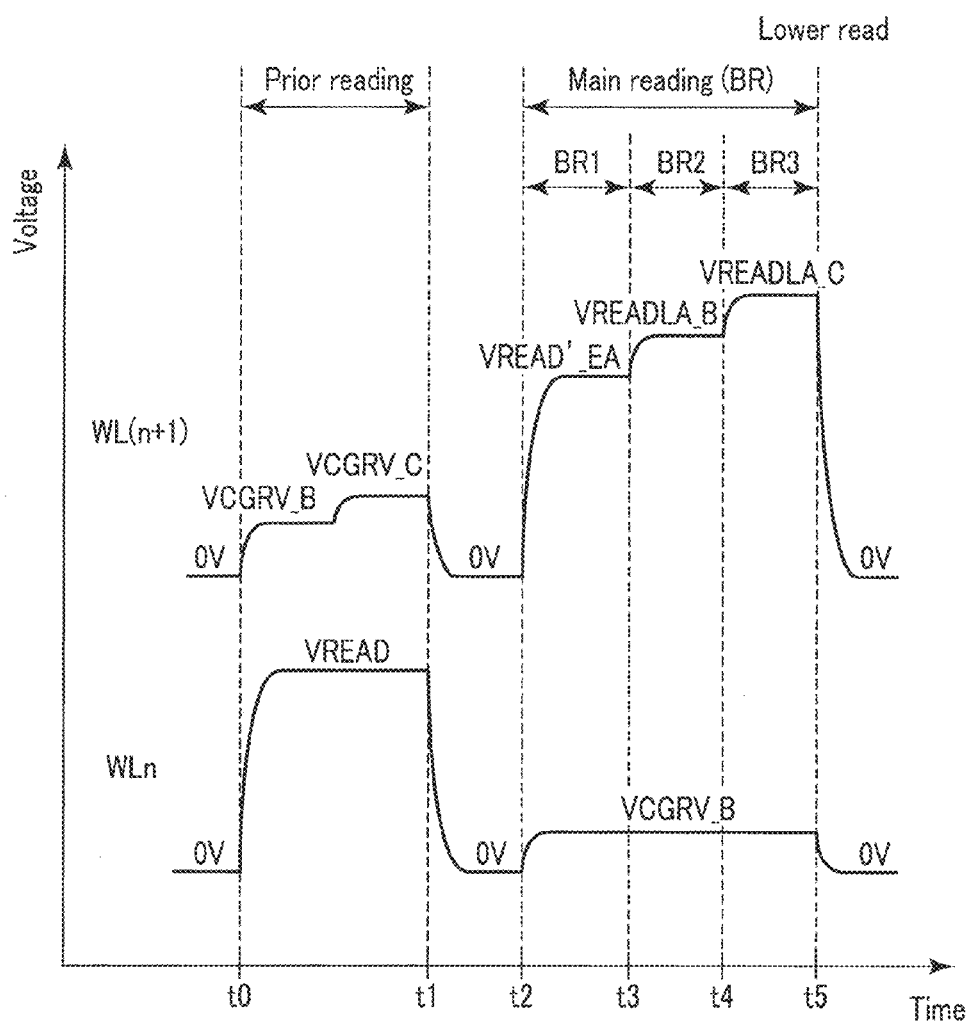
FIG. 123 is a timing chart showing the changes of the word line voltages during data reading of the semiconductor memory device according to a modification of the first embodiment.
FIG. 124 is a conceptual diagram of a correction table of the semiconductor memory device according to a modification of the fifth embodiment.

For example, in the lower bit reading described with reference to FIG. 10 in the first embodiment, the read operation using the voltage VCGRV_A in the prior-reading may be omitted. An example of this case is shown in FIG. 123. In the lower bit reading according to the first embodiment, VREADLA applied to the column whose adjacent bit is at the "E"-level and the column whose adjacent bit is at the "A"-level are not distinguished from each other. That is to say, it is only necessary to know whether the adjacent bit is less than or equal to the "A"-level, is at the "B"-level, or is at the "C"-level, and information indicating whether the adjacent bit is at the "E"-level or the "A"-level is not needed. Thus, reading that uses VCGRV_A may be omitted, which leads to a reduction in the time required for reading. The same also applies to the first example of the eighth embodiment.

The layer dependence of VREADLA and VREAD' described in the fifth embodiment is not limited to the cases in FIG. 34 to FIG. 40. FIG. 124 shows a modification of the correction table described with reference to FIG. 36. As shown, the correction table may hold the correction amounts of VREADLA and VREAD'(or information regarding the values of VREADLA and VREAD') for each of the word lines WL. That is to say, the shape of the memory hole 26 may not necessarily be such a simple shape which decreases in diameter with the increase in depth. In this case, the layer dependence of VREADLA and VREAD' is also preferably controlled with accuracy per word line WL rather than monotonously decreasing or increasing with the depth.

Figure 125:
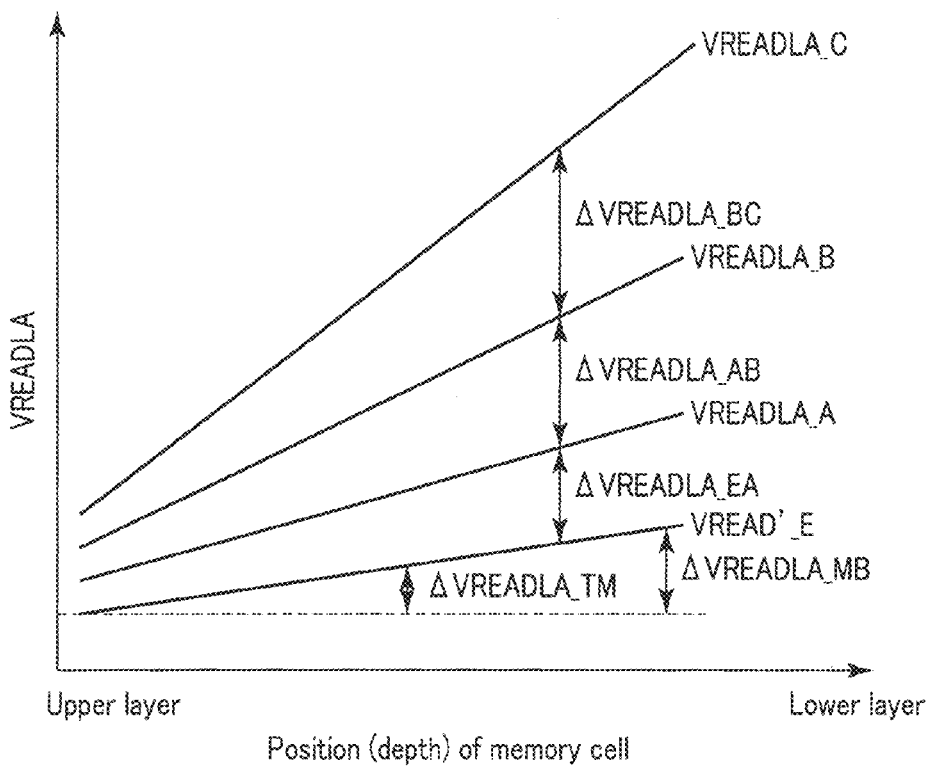
FIG. 125 is a graph showing layer dependence of the voltages VREADLA of the semiconductor memory device according to a modification of the fifth embodiment.

The layer dependence of VREADLA and VREAD' may also be as shown in FIG. 125. That is to say, the values of VREADLA and VREAD' increase as the position of the memory cell becomes deeper. The increase rate of VREADLA may be such that VREADLA_C is the highest and VREADLA_A is the lowest. This is because the influence of the inter-cell interference on the threshold is considered to be greatest during the writing to the "C"-level. The increase rate of VREAD' is lower than, for example, that of VREADLA_A.

Figure 126:
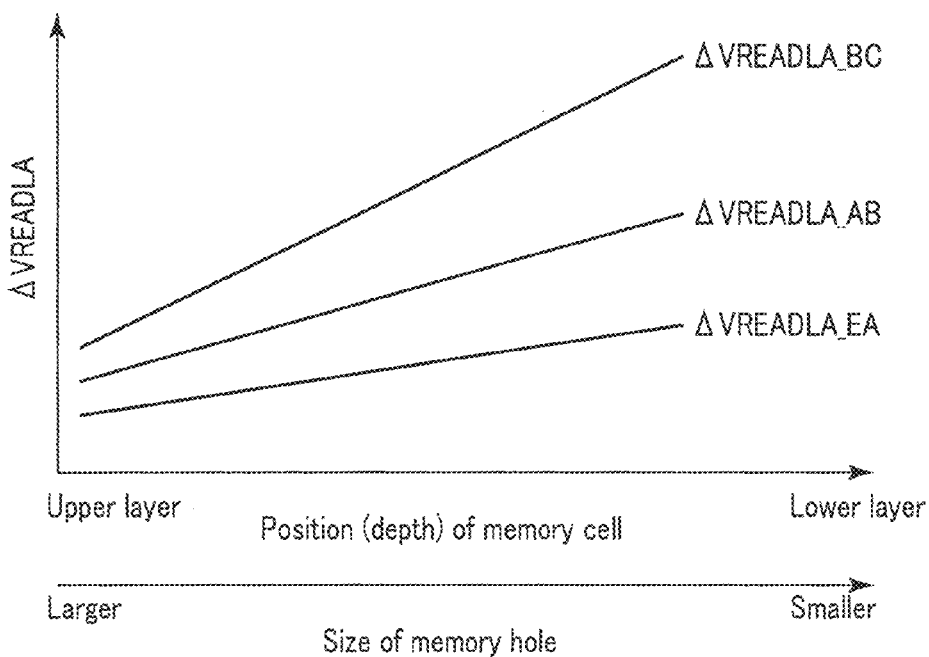
FIG. 126 is a graph showing layer dependence of change amounts of the voltages VREADLA of the semiconductor memory device according to the fifth embodiment.

That is to say, the difference $\Delta$VREADLA_EA between VREAD'_E and VREADLA_A, the difference $\Delta$VREADLA_AB between VREADLA_A and VREADLA_B, and the difference $\Delta$VREADLA_BC between VREADLA_B and VREADLA_C may have layer dependence shown in FIG. 126. This layer dependence may be as size dependence of the memory hole 26 as shown in FIG. 126.

VREAD'_E may have layer dependence, or may decrease in value in the lower layers. That is to say, the difference $\Delta$VREADLA_TM between VREAD'_E of the upper layer and VREAD'_E of the middle layer, and/or the difference $\Delta$VREAD'_MB between VREAD'_E of the middle layer and VREAD'_E of the lower layer may be a positive value or a negative value. In the case of the negative value, VREAD'_E decreases in value in the lower layers. $\Delta$VREADLA_TM and/or $\Delta$VREADLA_MB may be zero. In this case, VREAD'_E does not have layer dependence.

The above relation also applies to the case in FIG. 41 to FIG. 44 described in the fifth embodiment. FIG. 127 shows the relation between VREADLA and VREAD' and the position of the memory cell when the values of the voltages VREADLA and VREAD' are higher at the position where the memory hole is larger in the example of FIG. 41. FIG. 128 shows the relation between $\Delta$VREADLA and VREAD' and the position of the memory cell in FIG. 127.

As shown, in the example of FIG. 127 and FIG. 128, the diameter of the memory hole takes the maximum value in the middle layer, so that $\Delta$VREADLA is also highest in the middle layer.

The graphs shown in FIG. 125 to FIG. 128 are by way of example only. The level relation between the depth and the voltage may be reversed, and the value of VREADLA can be set suitably in accordance with the characteristics of the memory cell transistor MT located in each layer.

Furthermore, the three-dimensionally stacked NAND flash memory has been described above by way of example in the embodiments. However, the present invention is also applicable to a planar NAND flash memory in which memory cell transistors having a MONOS structure are two-dimensionally arrayed on a semiconductor substrate. It should be understood that each memory cell transistor MT may have three or more bits of data, and the present invention is applicable to semiconductor memories in general in which the inter-cell interference is a problem.

It should be understood that the specific values of the voltages used in FIG. 28 and FIG. 33 are by way of example only, and the values are not limited to those shown in the drawings.

In the embodiments according to the present invention:

(1) The voltage applied to the word line selected for the read operation at the "A"-level in FIG. 4 may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5 V.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

Further, the above embodiments include following aspects:

[1] A semiconductor memory device comprising:
a first memory cell;
a second memory cell adjacent to the first memory cell;
a first word line (WLn in FIG. 58) coupled to the first memory cell; and
a second word line (WL(n+1) in FIG. 58) coupled to the second memory cell,
wherein when data is read from the first memory cell, a first voltage (≥VCGRV_A in FIG. 58) and a second voltage (VCGRV_C in FIG. 58) different from the first voltage are applied to the first word line, and
a voltage (VREAD' and VREADLA in FIG. 58) applied to the second word line (WL(n+1)) varies continuously by a first potential difference (VREADLA_AR−VREADLA_AR_ST in FIG. 58) with time while the first voltage (VCGRV_A) is applied to the first word line (WLn), and the voltage (VREAD' and VREADLA) applied to the second word line (WL(n+1)) varies continuously by a second potential difference (VREADLA_CR−VREADLA_CR_ST in FIG. 58) different from the first potential difference with time while the second voltage (VCGRV_C) is applied to the first word line (WLn).

[2] The device of [1], wherein the first voltage (≥VCGRV_A) is lower than the second voltage (VCGRV_C), and
the first potential difference (VREADLA_AR−VREADLA_AR_ST) is larger than the second potential difference (VREADLA_CR−VREADLA_CR_ST).

[3] The device of [1], wherein the second voltage (VCGRV_A) is lower than the first voltage (VCGRV_C), and
the second potential difference (VREADLA_AR−VREADLA_AR_ST) is larger than the first potential difference (VREADLA_CR−VREADLA_CR_ST).

[4] The device of [1], further comprising:
a third memory cell coupled to the first word line (WLn); and
a fourth memory cell adjacent to the third memory cell and coupled to the second word line (WL(n+1)),
wherein when the data held in the first memory cell is read, data held in the third memory cell is also read,
data read from the first memory cell at a time when the voltage (VREAD' and VREADLA) applied to the second word line varies by a third potential difference (first one of AR1-AR4) is fetched in a sense amplifier,
data read from the third memory cell at a time when the voltage (VREAD' and VREADLA) applied to the second word line varies by a fourth potential difference (second one of AR1-AR4) is fetched in the sense amplifier, and
the third potential difference is different from the fourth potential difference.

[5] The device of [4], wherein data is read (prior-reading) from the second and fourth memory cells before the first and second voltages are applied to the first word line,
the third potential difference depends on the data read from the second memory cell, and
the fourth potential difference depends on the data read from the fourth memory cell.

[6] The device of [1], wherein in a program-verification operation of the first memory cell,
a voltage (Vvfy_A−Vvfy_C in FIG. 63) applied to the first word line (WLn in FIG. 63) and a voltage (V(n+1)_E−V(n+1)_B in FIG. 63) applied to the second word line (WL(n+1) in FIG. 25) vary continuously with time.

[7] The device of [6], wherein in the program-verification operation, a varying range of the voltage (Vvfy_A−Vvfy_C) applied to the first word line is different from a varying range of the voltage (V(n+1)_E−V(n+1)_B) applied to the second word line.

[8] The device of [7], wherein in the program-verification operation, at a time, the voltage (V(n+1)_E−V(n+1)_B) applied to the second word line is higher than the voltage (Vvfy_A−Vvfy_C) applied to the first word line.

[9] The device of [8], further comprising:
a third memory cell adjacent to the second memory cell; and
a third word line (other WL in FIG. 25) coupled to the third memory cell,
wherein in the program-verification operation of the first memory cell (WLn),
a fifth voltage (VREAD in FIG. 63) is applied to the third word line, and a maximum voltage (V(n+1)_B or V(n+1) vfy) applied to the second word line is less than or equal to the fifth voltage.

[10] The device of [1], wherein a data read operation of the first memory cell includes a first read operation (normal read) and a second read operation (retry read),
in the first read operation, a third voltage (≥VCGRV_A) lower than the first voltage and a fourth voltage (≥VCGRV_C) lower than the second voltage are applied to the first word line and a constant voltage (VREAD) is applied to the second word line, and
in the second read operation, the first and second voltages are applied to the first word line and the voltage of the second word line is changed.

[11] The device of [1], further comprising:
a third memory cell; and
a third word line (WL(n−1) in FIG. 45) coupled to the third memory cell,
wherein the first word line is arranged between the second word line and the third word line,
data is read (prior-reading) from the second and third memory cells before the first and second voltages (≥VCGRV) are applied to the first word line (WLn), and
a voltage (VREAD' and VREADLA) applied to the third word line (WL(n−1)) varies continuously by a third potential difference (AR_E−AR_C in FIG. 45) different from the first potential difference (AR1−AR16 in FIG. 45) and the second potential difference (CR in FIG. 45) with time while the first voltage is applied to the first word line.

[12] The device of [11], wherein the first voltage (≥VCGRV_A=VA) is for determining whether a threshold voltage of the first memory cell is in an erase level.

[13] The device of [1], wherein the first and second word lines are stacked, and
the voltage (VREAD' and VREADLA) of the second word line depends on a layer position in which the second word line is provided.

[14] The device of [1], further comprising:
a bit line electrically coupled to the second memory cell;
a sense amplifier coupled to the sense amplifier;
a first block (BLK0 . . . in FIG. 50) including the first and second memory cells; and
a second block (BLK_BLSRC in FIG. 50) discharging the bit line,
wherein the first block is arranged between the sense amplifier and the second block, and
the bit line is discharged by the sense amplifier and the second block after a data read operation.

[15] The device of [1], wherein when a threshold level of the second memory cell is higher than that of the first memory cell, the voltage (VREAD' and VREADLA) of the second word line is controlled to correct a threshold voltage of the first memory cell.

[16] The device of [15], wherein when the threshold level of the second memory cell is the same as that of the first memory cell, the voltage (VREAD' and VREADLA) of the second word line is controlled to correct the threshold voltage of the first memory cell.

[17] A semiconductor memory device comprising:
a first memory cell;
a second memory cell;
a first word line (WLn in FIG. 72) coupled to the first memory cell and the second memory cell;
a first bit line electrically connected to the first memory cell;
a second bit line electrically connected to the second memory cell and different from the first bit line;
a first sense amplifier associated with the first bit line; and
a second sense amplifier associated with the second bit line and different from the first sense amplifier,
wherein when data is read from the first memory cell and the second memory cell, a voltage applied to the first word line varies continuously with time, and
the first sense amplifier strobes data (AR1 in FIG. 72) at a first time (t4 in FIG. 72) and the second sense amplifier strobes data (AR2 in FIG. 72) at a second time (t5 in FIG. 72) different from the first time.

[18] The device of [17], further comprising:
a third memory cell between the first memory cell and the first bit line;
a fourth memory cell between the second memory cell and the second bit line; and
a second word line (WL(n+1) in FIG. 72) coupled to the third memory cell and the fourth memory cell,
wherein the first time (t4 or t6 in FIG. 72) is earlier than the second time (t5 or t7 in FIG. 72), and
a threshold (Er-C in FIG. 73) of the third memory cell is lower than that (D-G in FIG. 73) of the fourth memory cell.

[19] The device of [18], wherein a voltage (VA1 or VE1) applied to the first word line (WLn in FIG. 72) at the first time (t4 or t6 in FIG. 72) is lower than a voltage (VA2 or VE2) applied to the first word line (WLn in FIG. 72) at the second time (t5 or t6 in FIG. 72).

[20] The device of [17], further comprising:
a third memory cell between the first memory cell and the first bit line;
a fourth memory cell between the second memory cell and the second bit line;
a second word line (WL(n+1) in FIG. 72) coupled to the third memory cell and the fourth memory cell; and
a row decoder capable of applying the voltage to the first word line,
wherein the second time (t4 or t6 in FIG. 72) is earlier than the first time (t5 or t7 in FIG. 72),
a threshold (Er-C) of the fourth memory cell is lower than that (D-G) of the third memory cell, and
a length of the first word line from the row decoder to the second memory cell is longer than that of the first word line from the row decoder to the first memory cell.

[21] The device of [18], further comprising:
a fifth coupled to the first word line;
a third bit line electrically connected to the fifth memory cell;
a sixth memory cell between the fifth memory cell and the third bit line;
a seventh memory cell, wherein the first memory cell is between the third memory cell and the seventh memory cell;
an eighth memory cell, wherein the second memory cell is between the fourth memory cell and the eighth memory cell;
a ninth memory cell, wherein the fifth memory cell is between the sixth memory cell and the ninth memory cell;
a third word line (WL(n−1) in FIG. 115-117) coupled to the seventh memory cell, the eighth memory cell, and the ninth memory cell; and a third sense amplifier associated with the third bit line and different from the first sense amplifier and the second sense amplifier, wherein data is read from the first memory cell, the second memory cell, and the fifth memory cell, a voltage applied to the first word line varies continuously with time, the first sense amplifier strobes data (+0 in FIG. 117) at the first time (t10 in FIG. 117), the second sense amplifier strobes data (+1, +2, or +3 in FIG. 117) at the second time (t11–13 in FIG. 117), and the third sense amplifier strobes data (+4 in FIG. 117) at the third time (t14 in FIG. 117) different from the first time and the second time, the third time (t14 in FIG. 117) is later than the second time (t11–13 in FIG. 117), a threshold (High in FIG. 115) of the sixth memory cell is lower than that (Middle in FIG. 115) of the fourth memory cell, and a threshold (High in FIG. 115) of the ninth memory cell is higher than those (Low or Middle in FIG. 115) of the seventh memory cell and the eighth memory cell.

[22] The device of [21], wherein a threshold (Low in FIG. 115) of the eighth memory cell is lower than that (Middle in FIG. 115) of the fourth memory cell.

[23] The device of [22], wherein a voltage (VA1) applied to the first word line (WLn in FIG. 117) at the first time (t10 in FIG. 71172) is lower than a voltage (VA2-VA4) applied to the first word line at the second time (t11–13 in FIG. 117), and a voltage (VA2-VA4) applied to the first word line (WLn in FIG. 117) at the second time (t11–13 in FIG. 117) is lower than a voltage (VA5) applied to the first word line at the third time (t14 in FIG. 117).

[24] The device of [23], wherein the voltage applied to the first word line is for determining whether thresholds of the first memory cell, the second memory cell, and the fifth memory cell are at an erase level or not (read operation AR in FIG. 117).

[25] A semiconductor memory device comprising:
a first memory cell;
a second memory cell;
a third memory cell;
a fourth memory cell;
a first word line (WLn in FIG. 80) coupled to the first memory cell and the second memory cell;
a second word line (WL(n+1) in FIG. 80) coupled to the third memory cell and the fourth memory cell; and
a first bit line electrically connected to the first memory cell and the third memory cell, wherein the third memory cell is between the first memory cell and the first bit line;
a second bit line electrically connected to the second memory cell and the fourth memory cell, and different from the first bit line, wherein the fourth memory cell is between the second memory cell and the second bit line;
a first sense amplifier associated with the first bit line; and
a second sense amplifier associated with the second bit line and different from the first sense amplifier,
wherein when data is read from the first memory cell and the second memory cell, a voltage applied to the first word line varies continuously with time, a strobe signal to strobe data is asserted at a first time(t4 in FIG. 80), a second time (t5 in FIG. 80) different from the first time, and a third time (t6 in FIG. 80) different from the second time, the first sense amplifier stores results strobed at the first time, the second time, and the third time for data read onto the first bit line from the first memory cell (S11-S14 in FIG. 79, FIG. 84-86), the second sense amplifier stores results strobed at the first time, the second time, and the third time for data read onto the second bit line from the second memory cell (S11-S14 in FIG. 79, FIG. 84-86), the first sense amplifier further stores data based on a threshold of the third memory cell (S10 in FIG. 79, FIG. 82), and the second sense amplifier further stores data based on a threshold of the fourth memory cell (S10 in FIG. 79, FIG. 82).

[26] The device of [25], wherein the a result strobed at the first time for the first bit line and a result strobed at the second time for the second bit line are output as a one page data (S15-19 in FIG. 79, FIG. 112).

[27] The device of [26], wherein a threshold level of the first memory cell is the same as that of the second memory cell, a threshold level of the third memory cell (GP1 in FIG. 82) is lower than that of the fourth memory cell (GP2 in FIG. 82), and the first time is earlier than the second time.

[28] The device of [27], wherein a voltage (VA1 or VE1) applied to the first word line (WLn in FIG. 80) at the first time (t4 or t11 in FIG. 80) is lower than a voltage (VA2 or VE2) applied to the first word line at the second time (t5 or t12 in FIG. 80), and the voltage (VA2 or VE2) applied to the first word line at the second time (t5 or t12 in FIG. 80) is lower than a voltage (VA3 or VE3) applied to the first word line at the third time (t6 or t13 in FIG. 80).

[29] The device of [27], wherein one of the first time, the second time, and the third time is selected based on the number of on-cells as an optimal strobe timing

[30] The device of [29], data read at the selected one of the first time, the second time, and the third time as the optimal strobe timing is output.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell;
a second memory cell adjacent to the first memory cell;
a first word line coupled to the first memory cell; and
a second word line coupled to the second memory cell,
wherein when data is read from the first memory cell,
a first voltage and a second voltage different from the first voltage are applied to the first word line, and
a voltage applied to the second word line varies continuously by a first potential difference with time during a first duration included in a duration during which the first voltage is applied to the first word line, and the voltage applied to the second word line varies continuously by a second potential difference different from the first potential difference with time during a second duration included in a duration during which the second voltage is applied to the first word line, and wherein the data is read from the first memory cell during the first duration and the second duration.

2. The device according to claim 1, wherein
the first voltage is lower than the second voltage, and
the first potential difference is larger than the second potential difference.

3. The device according to claim 1, wherein
the second voltage is lower than the first voltage, and
the second potential difference is larger than the first potential difference.

4. The device according to claim 1, further comprising:
a third memory cell coupled to the first word line; and
a fourth memory cell adjacent to the third memory cell and coupled to the second word line, wherein
when the data held in the first memory cell is read, data held in the third memory cell is also read,
data read from the first memory cell at a time when the voltage applied to the second word line varies by a third potential difference is fetched in a sense amplifier,
data read from the third memory cell at a time when the voltage applied to the second word line varies by a fourth potential difference is fetched in the sense amplifier, and
the third potential difference is different from the fourth potential difference.

5. The device according to claim 4, wherein
data is read from the second and fourth memory cells before the first and second voltages are applied to the first word line,
the third potential difference depends on the data read from the second memory cell, and
the fourth potential difference depends on the data read from the fourth memory cell.

6. The device according to claim 1, wherein in a program-verification operation of the first memory cell,
a corresponding voltage applied to the first word line and a corresponding voltage applied to the second word line vary continuously with time.

7. The device according to claim 6, wherein in the program-verification operation, a varying range of the corresponding voltage applied to the first word line is different from a varying range of the corresponding voltage applied to the second word line.

8. The device according to claim 7, wherein in the program-verification operation, at a time, the corresponding voltage applied to the second word line is higher than the corresponding voltage applied to the first word line.

9. The device according to claim 8, further comprising:
a third memory cell adjacent to the second memory cell; and
a third word line coupled to the third memory cell,
wherein in the program-verification operation of the first memory cell,
a fifth voltage is applied to the third word line, and a maximum voltage applied to the second word line is less than or equal to the fifth voltage.

10. The device according to claim 1, wherein
a data read operation of the first memory cell includes a first read operation and a second read operation,
in the first read operation, a third voltage lower than the first voltage and a fourth voltage lower than the second voltage are applied to the first word line and a constant voltage is applied to the second word line, and
in the second read operation, the first and second voltages are applied to the first word line and the voltage of the second word line is changed.

11. The device according to claim 1, further comprising:
a third memory cell; and
a third word line coupled to the third memory cell, wherein
the first word line is arranged between the second word line and the third word line,
data is read from the second and third memory cells before the first and second voltages are applied to the first word line, and
a voltage applied to the third word line varies continuously by a third potential difference different from the first potential difference and the second potential difference with time while the first voltage is applied to the first word line.

12. The device according to claim 11, wherein the first voltage is for determining whether a threshold voltage of the first memory cell is in an erase level.

13. The device according to claim 1, wherein
the first and second word lines are stacked, and
the voltage of the second word line depends on a layer position in which the second word line is provided.

14. The device according to claim 1, further comprising:
a bit line electrically coupled to the second memory cell;
a sense amplifier coupled to the bit line;
a first block including the first and second memory cells; and
a second block discharging the bit line,
wherein the first block is arranged between the sense amplifier and the second block, and
the bit line is discharged by the sense amplifier and the second block after a data read operation.

15. The device according to claim 1, wherein when a threshold level of the second memory cell is higher than that of the first memory cell, the voltage of the second word line is controlled to correct a threshold voltage of the first memory cell.

16. The device according to claim 15, wherein when the threshold level of the second memory cell is the same as that of the first memory cell, the voltage of the second word line is controlled to correct the threshold voltage of the first memory cell.

\* \* \* \* \*